US012588290B2

(12) United States Patent
Ohno et al.

(10) Patent No.: US 12,588,290 B2
(45) Date of Patent: Mar. 24, 2026

(54) SEMICONDUCTOR DEVICE AND METHOD FOR MANUFACTURING THE SEMICONDUCTOR DEVICE

(71) Applicant: SEMICONDUCTOR ENERGY LABORATORY CO., LTD., Atsugi (JP)

(72) Inventors: Masakatsu Ohno, Utsunomiya (JP); Masataka Nakada, Tochigi (JP); Yukinori Shima, Tatebayashi (JP); Masayoshi Dobashi, Shimotsuga (JP); Junichi Koezuka, Tochigi (JP); Masami Jintyou, Shimotsuga (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 172 days.

(21) Appl. No.: 18/224,383

(22) Filed: Jul. 20, 2023

(65) Prior Publication Data

US 2024/0038777 A1     Feb. 1, 2024

(30) Foreign Application Priority Data

Jul. 29, 2022     (JP) ................................. 2022-121215

(51) Int. Cl.
*H10D 86/60*          (2025.01)
*H10D 86/01*          (2025.01)
(Continued)

(52) U.S. Cl.
CPC ........... *H10D 86/60* (2025.01); *H10D 86/021* (2025.01); *H10D 86/441* (2025.01); *H10H 20/0364* (2025.01); *H10H 20/857* (2025.01)

(58) Field of Classification Search
CPC .... H10D 86/60; H10D 86/021; H10D 86/441; H10D 30/6755; H10D 30/6757;
(Continued)

(56) References Cited

U.S. PATENT DOCUMENTS

2008/0157219 A1*  7/2008  Fujiwara ............ H10D 84/0186
                                                            257/E21.507
2023/0354643 A1   11/2023  Sato et al.
(Continued)

FOREIGN PATENT DOCUMENTS

WO     WO-2016/038508         3/2016

*Primary Examiner* — Tan N Tran
(74) *Attorney, Agent, or Firm* — NIXON PEABODY LLP; Jeffrey L. Costellia

(57)          ABSTRACT

To provide a semiconductor device that occupies a small area. The semiconductor device includes a first conductive layer, first to fifth insulating layers, and a second conductive layer that are stacked in this order and further includes a semiconductor layer, a third conductive layer, and a sixth insulating layer. The semiconductor layer is in contact with the top surface of the first conductive layer, the side surfaces of the first to fifth insulating layers, and the second conductive layer. The sixth insulating layer is over the semiconductor layer. The third conductive layer is over the sixth insulating layer and overlaps with the semiconductor layer with the sixth insulating layer between the third conductive layer and the semiconductor layer. The first insulating layer includes a region having a higher hydrogen content than the second insulating layer. The fifth insulating layer includes a region having a higher hydrogen content than the fourth insulating layer. The third insulating layer contains oxygen.

17 Claims, 39 Drawing Sheets

(51) Int. Cl.
    *H10D 86/40*         (2025.01)
    *H10H 20/01*         (2025.01)
    *H10H 20/857*      (2025.01)

(58) Field of Classification Search
    CPC .............. H10D 30/6728; H10D 86/40; H10D
             30/6734; H10D 99/00; H10H 20/0364;
         H10H 20/857; H10K 50/00; H10K 59/00;
               H10K 59/12; H10K 59/1201
    See application file for complete search history.

(56)                References Cited

U.S. PATENT DOCUMENTS

2023/0369344 A1    11/2023   Kusunoki et al.
2024/0036427 A1     2/2024   Kusunoki et al.

\* cited by examiner

<u>100</u>

<u>100</u>

100B

100B

100B

100C

100C

100C

100D

FIG. 12A
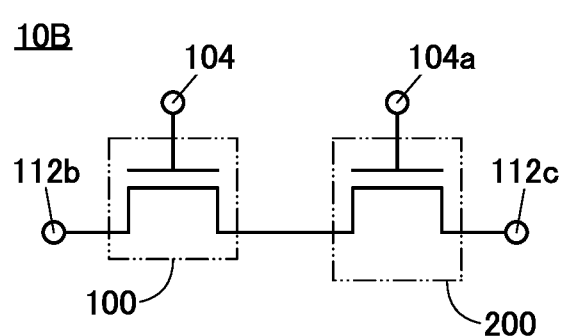
FIG. 12B
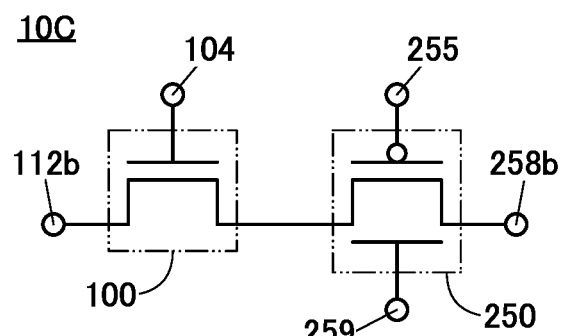
FIG. 12C
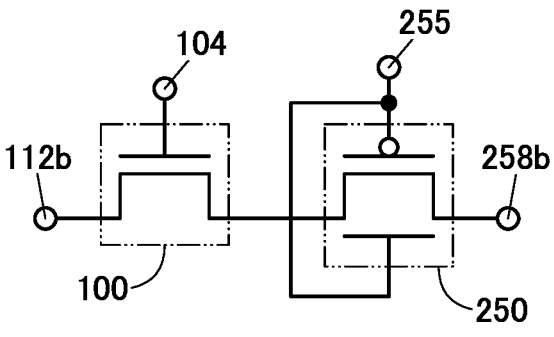
FIG. 12D
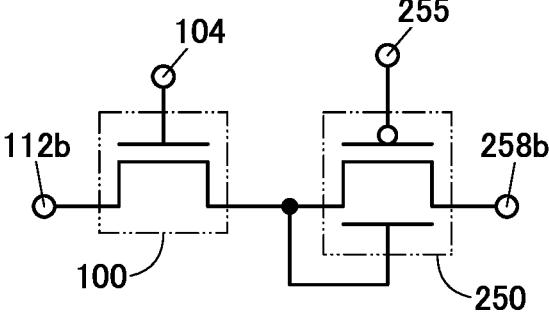
FIG. 12E
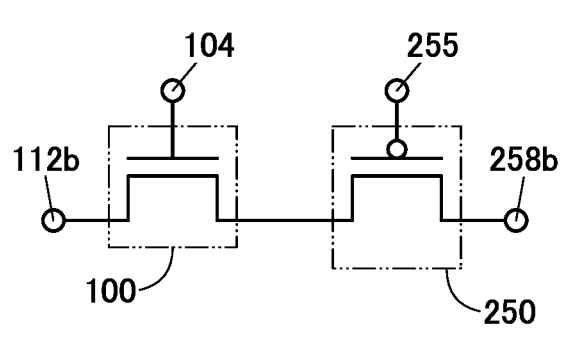
FIG. 12F
FIG. 12G
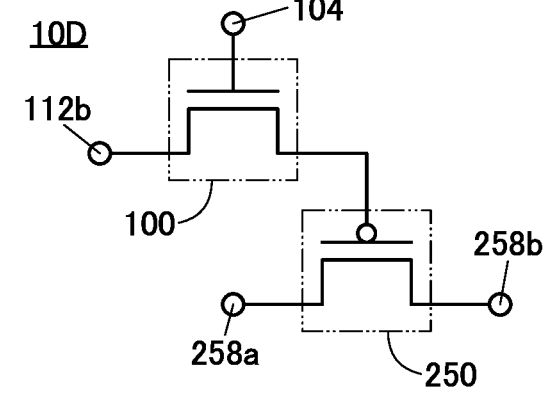
FIG. 12H

10D

10D

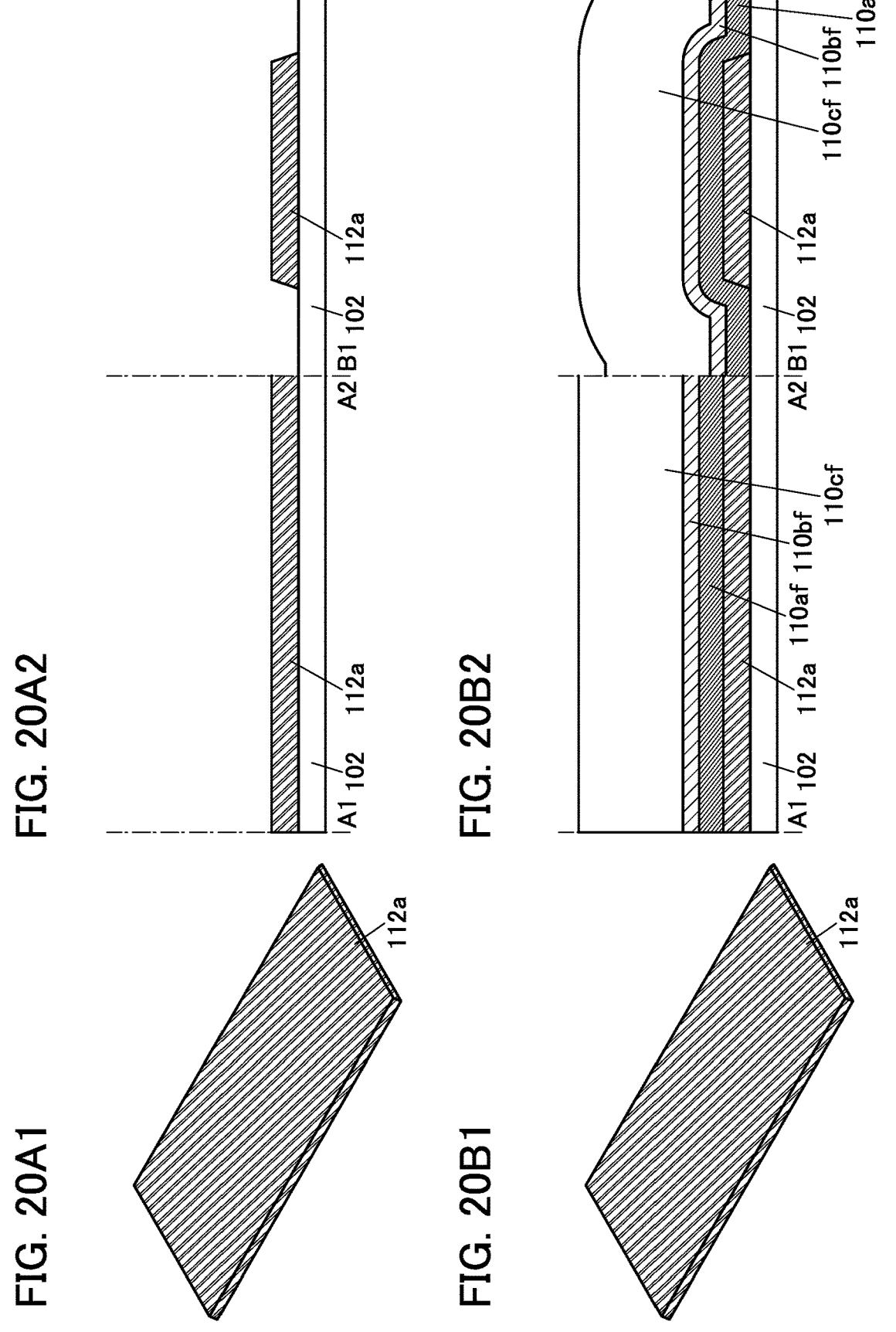
FIG. 20A1
FIG. 20A2
FIG. 20B1
FIG. 20B2

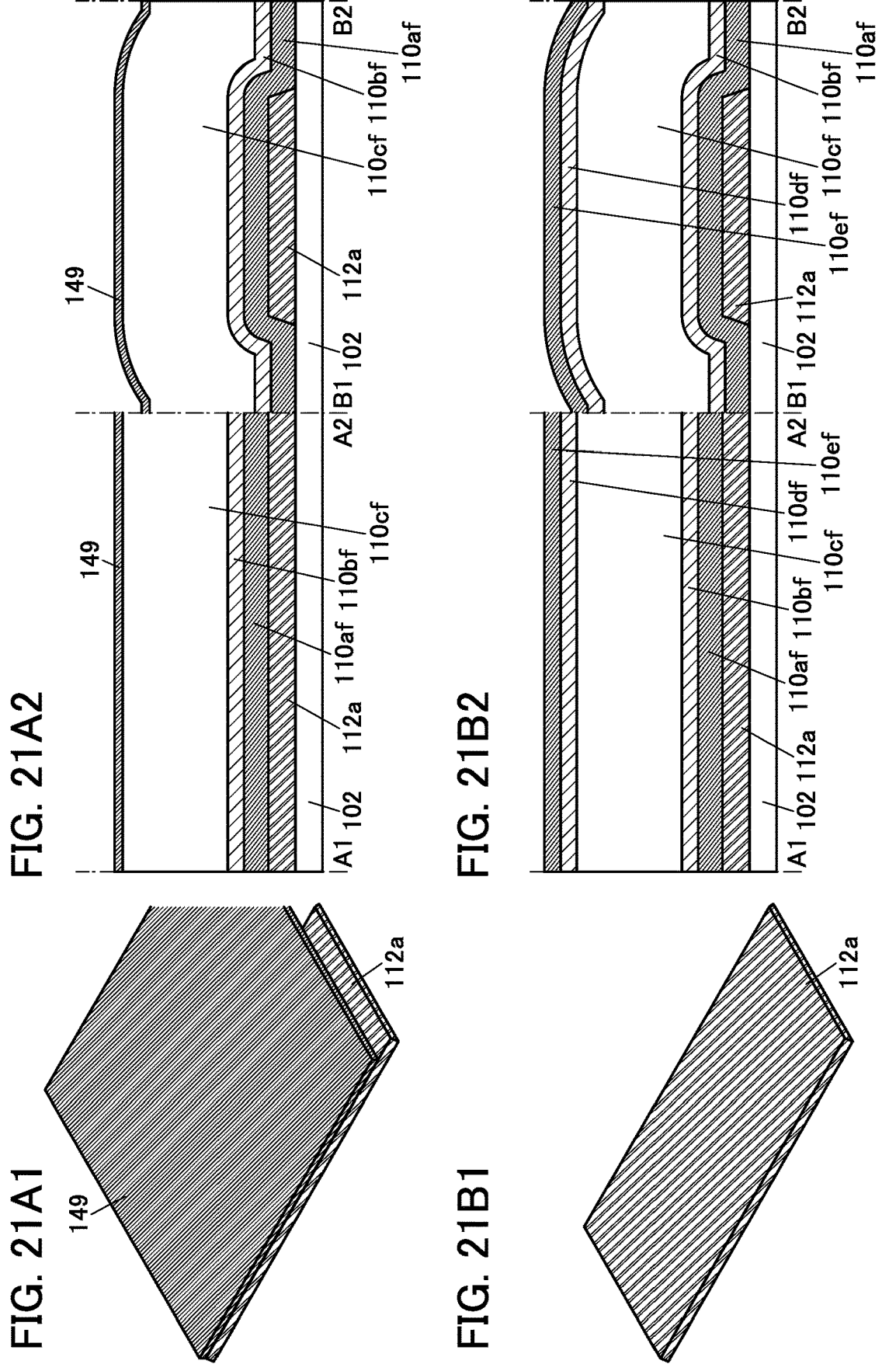

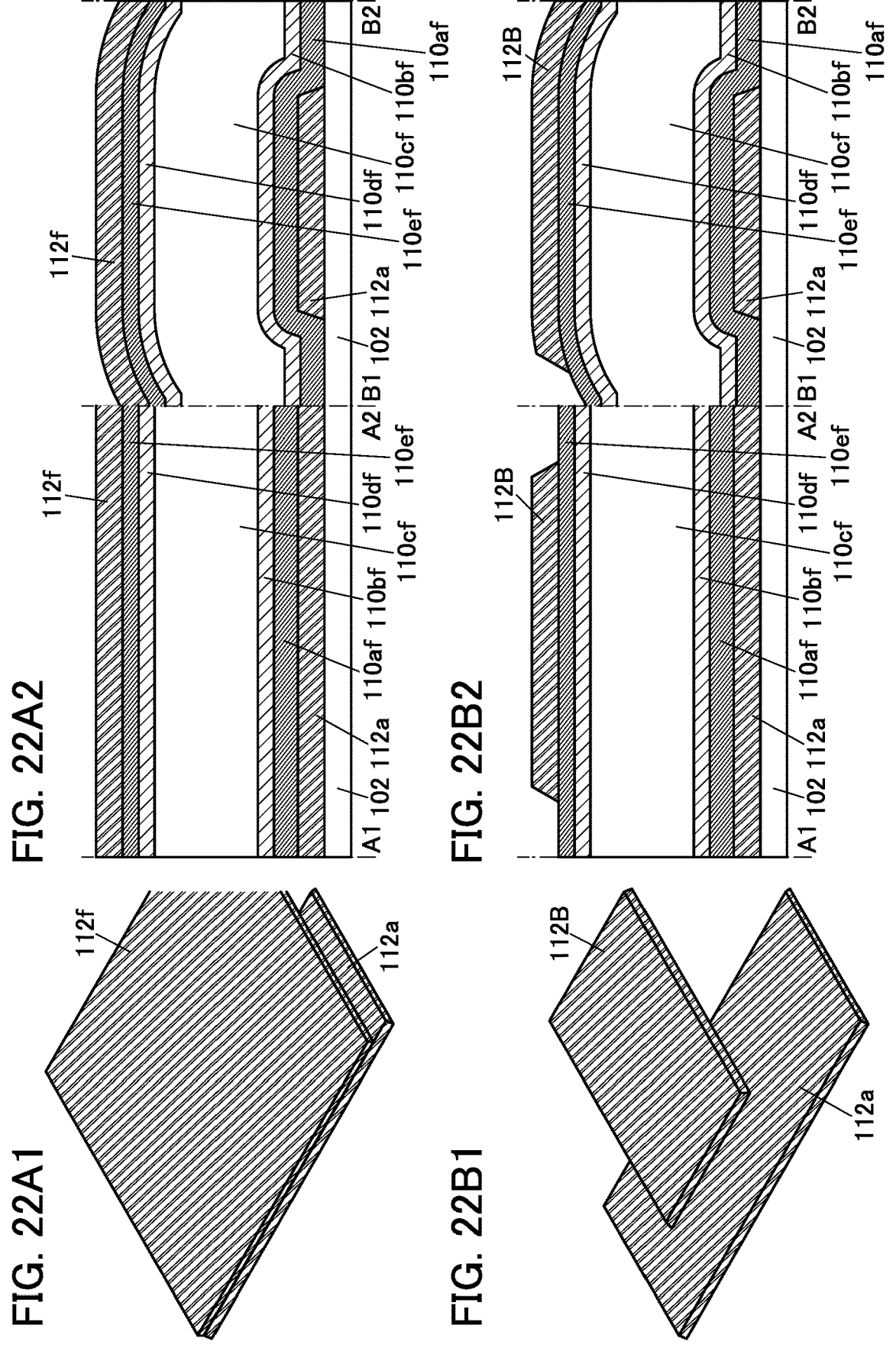
FIG. 22A2
FIG. 22B2
FIG. 22A1
FIG. 22B1

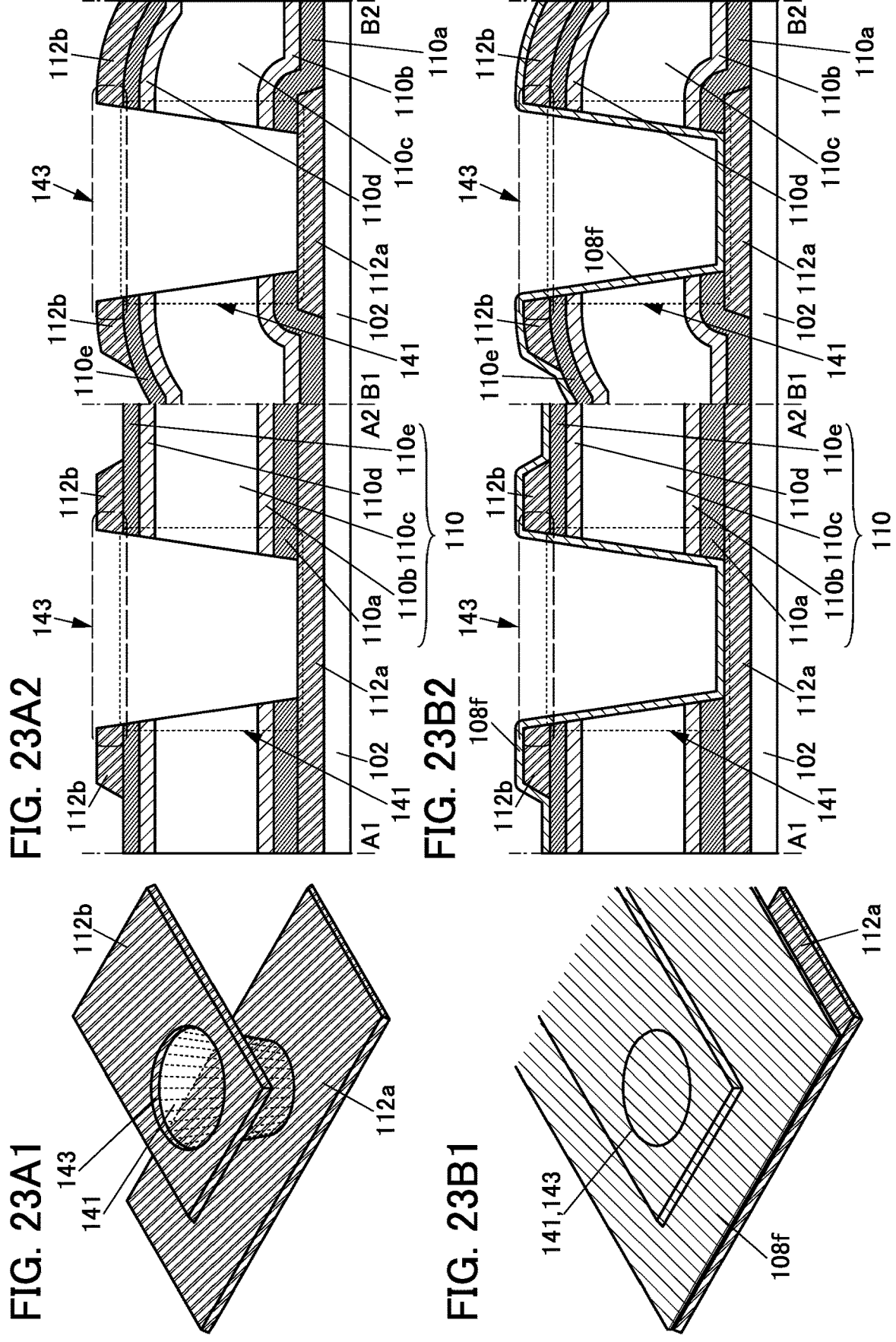

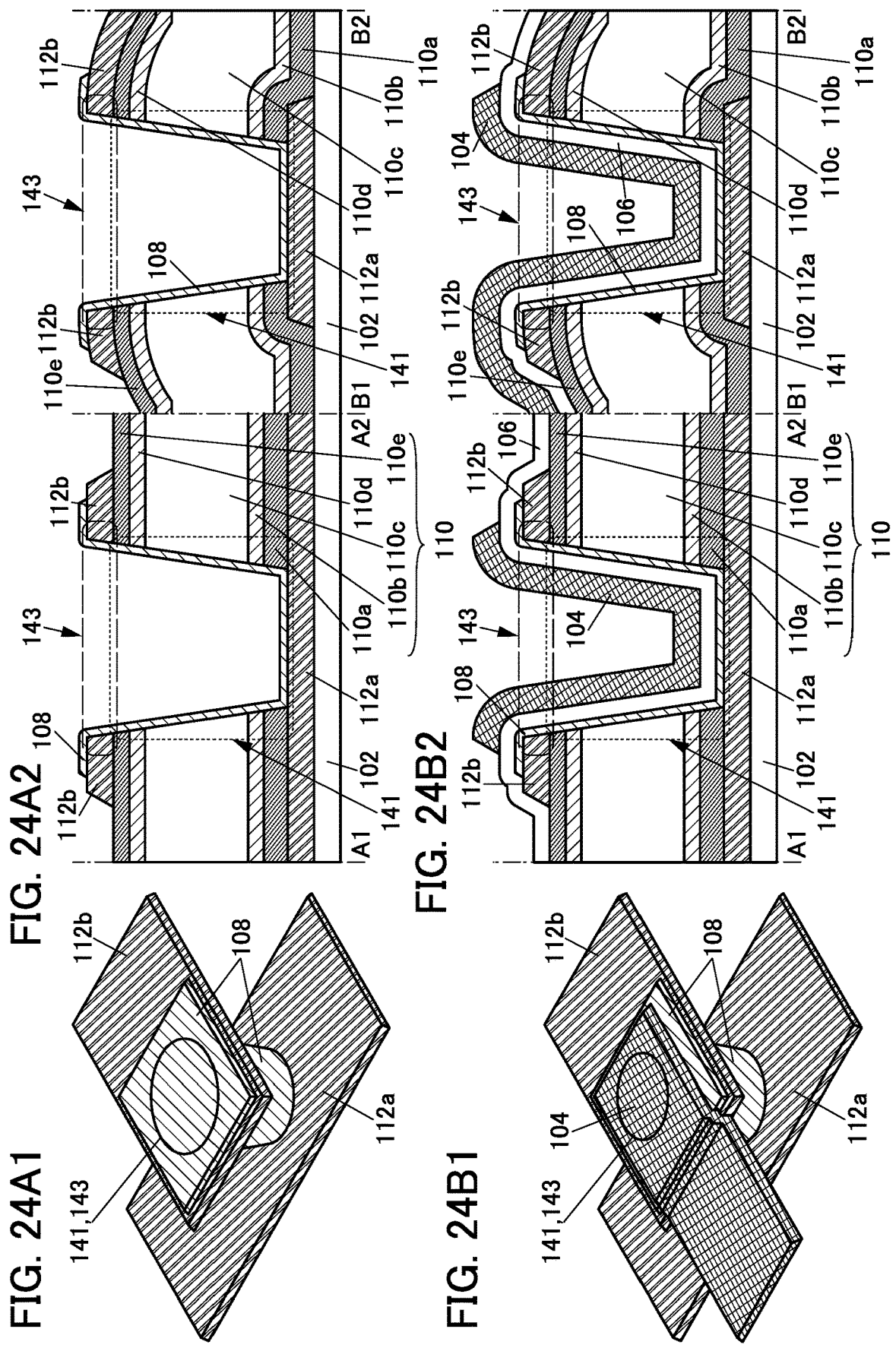
FIG. 24A2
FIG. 24B2
FIG. 24A1
FIG. 24B1

FIG. 32

FIG. 35A
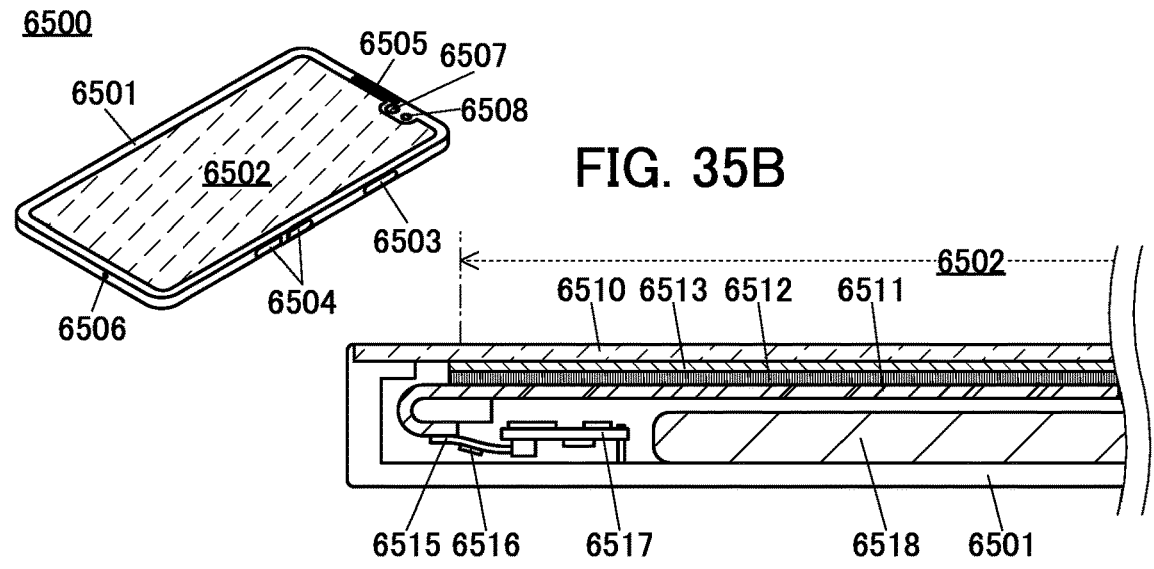
FIG. 35B
FIG. 35C
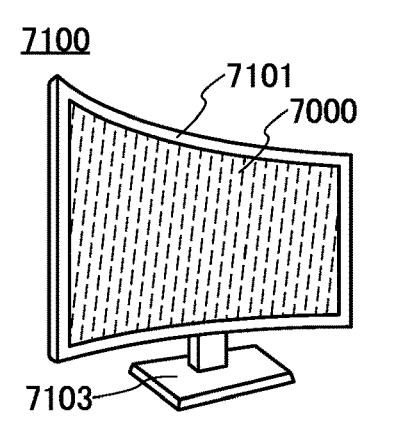
FIG. 35D
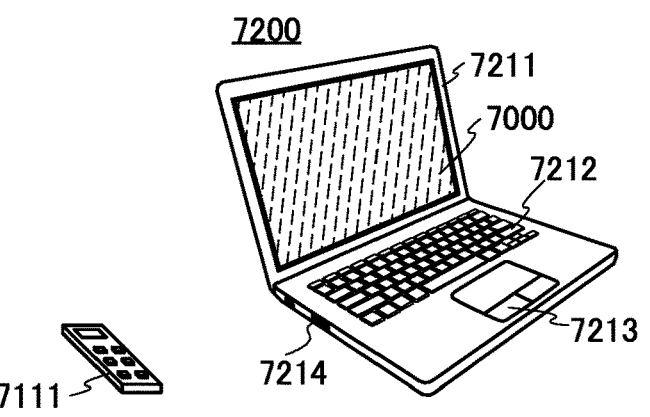
FIG. 35E
FIG. 35F
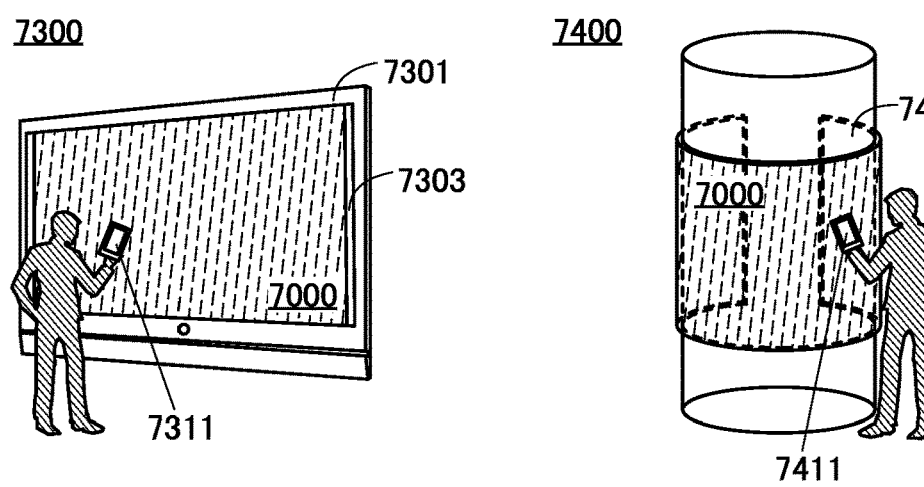

9101

9102

9103

9200

9201

9201

9201

SEMICONDUCTOR DEVICE AND METHOD FOR MANUFACTURING THE SEMICONDUCTOR DEVICE

BACKGROUND OF THE INVENTION

1. Field of the Invention

One embodiment of the present invention relates to a semiconductor device and a method for manufacturing the semiconductor device. One embodiment of the present invention relates to a transistor and a method for manufacturing the transistor. One embodiment of the present invention relates to a display device that includes a semiconductor device.

Note that one embodiment of the present invention is not limited to the above technical field. Examples of the technical field of one embodiment of the present invention include a semiconductor device, a display device, a light-emitting apparatus, a power storage device, a memory device, an electronic device, a lighting device, an input device (e.g., a touch sensor), an input/output device (e.g., a touch panel), a method for driving any of them, and a method for manufacturing any of them.

In this specification and the like, a semiconductor device means a device that utilizes semiconductor characteristics, and refers to a circuit including a semiconductor element (e.g., a transistor, a diode, or a photodiode), a device including the circuit, and the like. The semiconductor device also means devices that can function by utilizing semiconductor characteristics. For example, an integrated circuit, a chip including an integrated circuit, and an electronic component including a chip in a package are examples of the semiconductor device. In some cases, a memory device, a display device, a light-emitting apparatus, a lighting device, and an electronic device themselves are semiconductor devices and also include a semiconductor device.

2. Description of the Related Art

Semiconductor devices that include transistors are applied to a wide range of electronic devices. In a display device, for example, when transistors occupy smaller areas, the pixel size can be smaller and higher resolution can be achieved. Therefore, miniaturization of transistors has been required.

As devices requiring high-resolution display devices, for example, devices for virtual reality (VR), augmented reality (AR), substitutional reality (SR), or mixed reality (MR) have been actively developed.

As display devices, for example, light-emitting apparatuses that include organic electroluminescence (EL) elements or light-emitting diodes (LEDs) have been developed.

Patent Document 1 discloses a high-resolution display device that includes an organic EL element.

REFERENCE

Patent Document

[Patent Document 1] International Publication No. 2016/038508

SUMMARY OF THE INVENTION

An object of one embodiment of the present invention is to provide a transistor having a minute size. Another object is to provide a transistor having a small channel length.

Another object is to provide a transistor having a high on-state current. Another object is to provide a transistor having favorable electrical characteristics. Another object is to provide a semiconductor device that occupies a small area. Another object is to provide a semiconductor device having low wiring resistance. Another object is to provide a semiconductor device or a display device having low power consumption. Another object is to provide a highly reliable transistor, a highly reliable semiconductor device, or a highly reliable display device. Another object is to provide a display device that can easily achieve higher resolution. Another object is to provide a method for manufacturing a semiconductor device or a display device with high productivity. Another object is to provide a novel transistor, a novel semiconductor device, a novel display device, and manufacturing methods thereof.

Note that the description of these objects does not preclude the existence of other objects. One embodiment of the present invention does not need to achieve all of these objects. Other objects can be derived from the description of the specification, the drawings, and the claims.

One embodiment of the present invention is a semiconductor device which includes a semiconductor layer, a first conductive layer, a second conductive layer, a third conductive layer, a first insulating layer, a second insulating layer, a third insulating layer, a fourth insulating layer, a fifth insulating layer, and a sixth insulating layer and in which the first insulating layer is in contact with the top surface of the first conductive layer; the second insulating layer is in contact with the top surface of the first insulating layer; the third insulating layer is in contact with the top surface of the second insulating layer; the fourth insulating layer is in contact with the top surface of the third insulating layer; the fifth insulating layer is in contact with the top surface of the fourth insulating layer; the second conductive layer is positioned over the fifth insulating layer; the semiconductor layer is in contact with the top surface of the first conductive layer, the side surface of the first insulating layer, the side surface of the second insulating layer, the side surface of the third insulating layer, the side surface of the fourth insulating layer, the side surface of the fifth insulating layer, and the second conductive layer; the sixth insulating layer is positioned over the semiconductor layer; the third conductive layer is positioned over the sixth insulating layer and overlaps with the semiconductor layer with the sixth insulating layer provided between the third conductive layer and the semiconductor layer; the first insulating layer includes a region having a higher hydrogen content than the second insulating layer; the fifth insulating layer includes a region having a higher hydrogen content than the fourth insulating layer; and the third insulating layer contains oxygen.

Another embodiment of the present invention is a semiconductor device which includes a semiconductor layer, a first conductive layer, a second conductive layer, a third conductive layer, a first insulating layer, a second insulating layer, a third insulating layer, a fourth insulating layer, a fifth insulating layer, and a sixth insulating layer and in which the first insulating layer is in contact with the top surface of the first conductive layer; the second insulating layer is in contact with the top surface of the first insulating layer; the third insulating layer is in contact with the top surface of the second insulating layer; the fourth insulating layer is in contact with the top surface of the third insulating layer; the fifth insulating layer is in contact with the top surface of the fourth insulating layer; the second conductive layer is positioned over the fifth insulating layer; the first to fifth insulating layers and the second conductive layer include an opening reaching the first conductive layer; the semiconductor layer is in contact with the top surface of the first conductive layer, the side surface of the first insulating layer, the side surface of the second insulating layer, the side surface of the third insulating layer, the side surface of the fourth insulating layer, and the side surface of the fifth insulating layer in the opening and is in contact with the second conductive layer; the sixth insulating layer is positioned over the semiconductor layer; the third conductive layer is positioned over the sixth insulating layer; the third conductive layer in a position overlapping with the opening overlaps with the semiconductor layer with the sixth insulating layer provided between the third conductive layer and the semiconductor layer; the first insulating layer includes a region having a higher hydrogen content than the second insulating layer; the fifth insulating layer includes a region having a higher hydrogen content than the fourth insulating layer; and the third insulating layer contains oxygen.

In a transmitted electron image obtained with a scanning transmission electron microscope, the first insulating layer preferably has higher lightness than the second insulating layer.

In a transmitted electron image obtained with a scanning transmission electron microscope, the fifth insulating layer preferably has higher lightness than the fourth insulating layer.

It is preferable that each of the first insulating layer and the fifth insulating layer be a layer from which hydrogen is released by heating and the third insulating layer be a layer from which oxygen is released by heating.

The third insulating layer preferably includes a region having a higher oxygen content than the second insulating layer. The third insulating layer is preferably an oxide insulating layer or an oxynitride insulating layer.

It is preferable that each of the first insulating layer, the second insulating layer, the fourth insulating layer, and the fifth insulating layer be a silicon nitride layer or a silicon nitride oxide layer and the third insulating layer be a silicon oxide layer or a silicon oxynitride layer.

Alternatively, it is preferable that each of the first insulating layer and the fifth insulating layer be a silicon nitride layer or a silicon nitride oxide layer, each of the second insulating layer and the fourth insulating layer be an aluminum oxide layer, and the third insulating layer be a silicon oxide layer or a silicon oxynitride layer.

The semiconductor layer is preferably in contact with the top surface and the side surface of the second conductive layer.

The semiconductor layer preferably contains a metal oxide.

One embodiment of the present invention is a method for manufacturing a semiconductor device which includes the following steps: forming a first conductive layer; forming a first insulating film over the first conductive layer; forming a second insulating film over the first insulating film; forming a third insulating film over the second insulating film; forming a fourth insulating film over the third insulating film; forming a fifth insulating film over the fourth insulating film; forming, over the fifth insulating film, a second conductive layer that includes a first opening in a region overlapping with the first conductive layer; processing the first insulating film, the second insulating film, the third insulating film, the fourth insulating film, and the fifth insulating film to form a first insulating layer, a second insulating layer, a third insulating layer, a fourth insulating layer, and a fifth insulating layer that include a second opening reaching the first conductive layer; forming a semiconductor layer in contact with the top surface of the first conductive layer, the side surface of the first insulating layer, the side surface of the second insulating layer, the side surface of the third insulating layer, the side surface of the fourth insulating layer, and the side surface of the fifth insulating layer, and the top surface and the side surface of the second conductive layer; forming a sixth insulating layer over the semiconductor layer; and forming a third conductive layer over the sixth insulating layer, and in which the proportion of the flow rate of a $NH_3$ gas is higher in a film formation gas for the first insulating film than in a film formation gas for the second insulating film, and the proportion of the flow rate of a $NH_3$ gas is higher in a film formation gas for the fifth insulating film than in a film formation gas for the fourth insulating film.

It is preferable that a metal oxide layer be formed after the third insulating film is formed to supply oxygen to the third insulating film, and the fourth insulating film be formed after the metal oxide layer is removed.

It is preferable that plasma treatment be performed in an atmosphere containing a $N_2O$ gas without exposure to the air after the third insulating film is formed.

One embodiment of the present invention can provide a transistor having a minute size. A transistor having a small channel length can be provided. A transistor having a high on-state current can be provided. A transistor having favorable electrical characteristics can be provided. A semiconductor device that occupies a small area can be provided. A semiconductor device having low wiring resistance can be provided. A semiconductor device or a display device having low power consumption can be provided. A highly reliable transistor, a highly reliable semiconductor device, or a highly reliable display device can be provided. A display device that can easily achieve higher resolution can be provided. A method for manufacturing a semiconductor device or a display device with high productivity can be provided. A novel transistor, a novel semiconductor device, a novel display device, and manufacturing methods thereof can be provided.

Note that the description of these effects does not preclude the existence of other effects. One embodiment of the present invention does not necessarily have all of these effects. Other effects can be derived from the description of the specification, the drawings, and the claims.

BRIEF DESCRIPTION OF THE DRAWINGS

FIGS. 12A to 12H are circuit diagrams each showing an example of a semiconductor device.

FIGS. 20A1 and 20B1 are perspective views showing an example of a method for manufacturing a semiconductor device. FIGS. 20A2 and 20B2 are cross-sectional views showing the example of the method for manufacturing the semiconductor device.

FIGS. 21A1 and 21B1 are perspective views showing an example of a method for manufacturing a semiconductor device. FIGS. 21A2 and 21B2 are cross-sectional views showing the example of the method for manufacturing the semiconductor device.

FIGS. 22A1 and 22B1 are perspective views showing an example of a method for manufacturing a semiconductor device. FIGS. 22A2 and 22B2 are cross-sectional views showing the example of the method for manufacturing the semiconductor device.

FIGS. 23A1 and 23B1 are perspective views showing an example of a method for manufacturing a semiconductor device. FIGS. 23A2 and 23B2 are cross-sectional views showing the example of the method for manufacturing the semiconductor device.

FIGS. 24A1 and 24B1 are perspective views showing an example of a method for manufacturing a semiconductor device. FIGS. 24A2 and 24B2 are cross-sectional views showing the example of the method for manufacturing the semiconductor device.

FIG. 32 is a cross-sectional view showing an example of a display device.

FIGS. 35A to 35F show examples of electronic devices.

DETAILED DESCRIPTION OF THE INVENTION

Figures 1A, 1B, 1C:
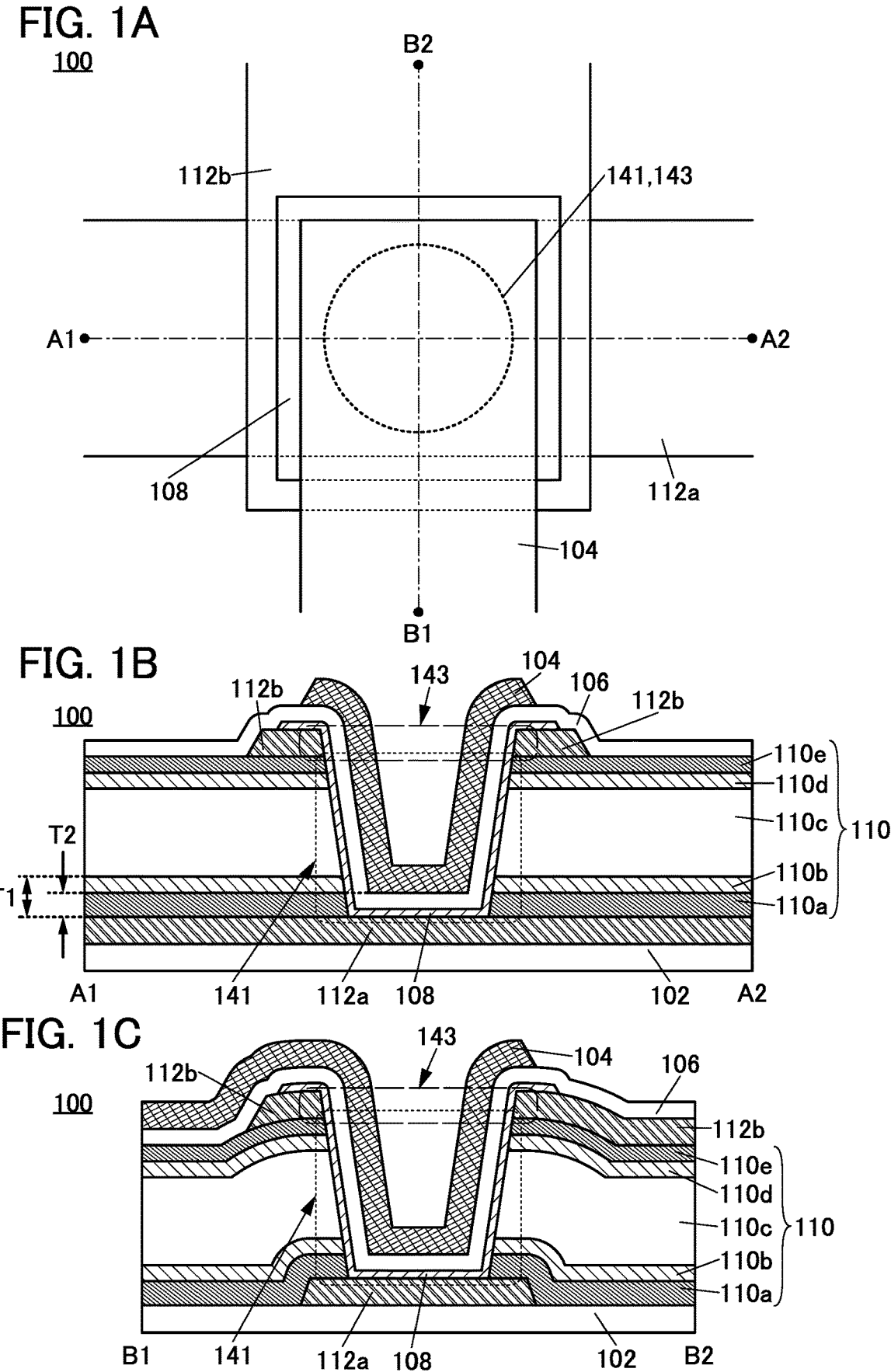
FIG. 1A is a top view showing an example of a semiconductor device.
FIGS. 1B and 1C are cross-sectional views showing the example of the semiconductor device.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in structures of the invention described below, the same portions or portions having similar functions are denoted by the same reference numerals in different drawings, and the description thereof is not repeated. The same hatching pattern is used for portions having similar functions, and the portions are not especially denoted by reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

Note that ordinal numbers such as "first" and "second" in this specification and the like are used for convenience and do not limit the number or the order (e.g., the order of steps or the stacking order) of components. The ordinal number added to a component in a part of this specification may be different from the ordinal number added to the component in another part of this specification or the scope of claims.

Note that the terms "film" and "layer" can be used interchangeably depending on the case or the circumstances. For example, the term "conductive layer" can be replaced with the term "conductive film". For another example, the term "insulating film" can be replaced with the term "insulating layer".

A transistor is a kind of semiconductor element and enables amplification of a current or a voltage, switching operation for controlling conduction or non-conduction, and the like. A transistor in this specification includes, in its category, an insulated-gate field effect transistor (IGFET) and a thin film transistor (TFT).

The functions of a "source" and a "drain" are sometimes replaced with each other when a transistor of different polarity is used or when the direction of current flow is changed in circuit operation, for example. Thus, the terms "source" and "drain" can be used interchangeably in this specification.

In this specification and the like, the term "electrically connected" includes the case where components are connected to each other through an object having any electric action. There is no particular limitation on an "object having any electric function" as long as electric signals can be transmitted and received between components that are connected through the object. Examples of the "object having any electric function" include a switching element such as a transistor, a resistor, a coil, a capacitor, and other elements with any of a variety of functions as well as an electrode and a wiring.

Unless otherwise specified, an off-state current in this specification and the like refers to a leakage current between a source and a drain generated when a transistor is in an off state (also referred to as a non-conducting state or a cutoff state). Unless otherwise specified, the off state of an n-channel transistor means that a gate-source voltage $V_{gs}$ is lower than a threshold voltage $V_{th}$, and the off state of a p-channel transistor means that $V_{gs}$ is higher than $V_{th}$.

In this specification and the like, the expression "having substantially the same top-view shapes" means that the outlines of stacked layers at least partly overlap with each other. For example, the expression encompasses the case of processing or partly processing an upper layer and a lower layer with the use of the same mask pattern. The expression "having substantially the same top-view shapes" also sometimes encompasses the case where the outlines do not completely overlap with each other; for instance, the outline of the upper layer may be located inward or outward from the outline of the lower layer. The state of "having the same top-view shape" or "having substantially the same top-view shapes" can be rephrased as the state where "end portions are aligned with each other" or "end portions are substantially aligned with each other".

In this specification and the like, a tapered shape refers to a shape such that at least part of a side surface of a component is inclined with respect to a substrate surface or a formation surface of the component. For example, a tapered shape preferably includes a region where the angle between the inclined side surface and the substrate surface or formation surface (such an angle is also referred to as a taper angle) is greater than 0° and less than 90°. Note that the side surface of the component, the substrate surface, and the formation surface are not necessarily completely flat and may be substantially flat with a slight curvature or with slight unevenness.

Note that in this specification and the like, an oxynitride refers to a material in which an oxygen content is higher than a nitrogen content. A nitride oxide refers to a material in which a nitrogen content is higher than an oxygen content.

The content of hydrogen, oxygen, nitrogen, or any other element can be analyzed by secondary ion mass spectrometry (SIMS) or X-ray photoelectron spectroscopy (XPS), for example. Note that XPS is suitable when the content percentage of a target element is high (e.g., 0.5 atomic % or higher, or 1 atomic % or higher). By contrast, SIMS is suitable when the content percentage of a target element is low (e.g., 0.5 atomic % or lower, or 1 atomic % or lower). To compare the contents of elements, analysis with a combination of SIMS and XPS is preferably used.

In this specification and the like, when the expression "A is in contact with B" is used, at least part of A is in contact with B. In other words, A includes a region in contact with B, for example.

In this specification and the like, when the expression "A is positioned over B" is used, at least part of A is positioned over B. In other words, A includes a region positioned over B, for example.

In this specification and the like, when the expression "A overlaps with B" is used, at least part of A overlaps with B. In other words, A includes a region overlapping with B, for example.

In this specification and the like, a device formed using a metal mask or a fine metal mask (FMM) may be referred to as a device having a metal mask (MM) structure. In this specification and the like, a device formed without using a metal mask or an FMM may be referred to as a device having a metal maskless (MML) structure.

In this specification and the like, a structure in which light-emitting layers of light-emitting elements (also referred to as light-emitting devices) having different emission wavelengths are separately formed may be referred to as a side-by-side (SBS) structure. The SBS structure can optimize materials and structures of light-emitting elements and thus can extend freedom of choice of materials and structures, whereby the luminance and the reliability can be easily improved.

In this specification and the like, a hole or an electron is sometimes referred to as a carrier. Specifically, a hole-injection layer or an electron-injection layer may be referred to as a carrier-injection layer, a hole-transport layer or an electron-transport layer may be referred to as a carrier-transport layer, and a hole-blocking layer or an electron-blocking layer may be referred to as a carrier-blocking layer. Note that the above-described carrier-injection layer, carrier-transport layer, and carrier-blocking layer cannot be distinguished from each other depending on the cross-sectional shape or properties in some cases. One layer may have two or three functions of the carrier-injection layer, the carrier-transport layer, and the carrier-blocking layer in some cases.

In this specification and the like, a light-emitting element includes an EL layer between a pair of electrodes. The EL layer includes at least a light-emitting layer. Examples of layers (also referred to as functional layers) in the EL layer include a light-emitting layer, carrier-injection layers (a hole-injection layer and an electron-injection layer), carrier-transport layers (a hole-transport layer and an electron-transport layer), and carrier-blocking layers (a hole-blocking layer and an electron-blocking layer). In this specification and the like, a light-receiving element (also referred to as a light-receiving device) includes at least an active layer functioning as a photoelectric conversion layer between a pair of electrodes. In this specification and the like, one of the pair of electrodes may be referred to as a pixel electrode and the other may be referred to as a common electrode.

In this specification and the like, a sacrificial layer (which may also be referred to as a mask layer) refers to a layer that is positioned above at least a light-emitting layer (specifically, a layer processed into an island shape among layers included in an EL layer) and has a function of protecting the light-emitting layer in the manufacturing process.

In this specification and the like, step disconnection refers to a phenomenon in which a layer, a film, or an electrode is split because of the shape of its formation surface (e.g., a step).

Embodiment 1

In this embodiment, semiconductor devices of embodiments of the present invention will be described with reference to FIG. 1A to FIG. 19B.

A semiconductor device of one embodiment of the present invention includes a semiconductor layer, a first conductive layer, a second conductive layer, a third conductive layer, a first insulating layer, a second insulating layer, a third insulating layer, a fourth insulating layer, a fifth insulating layer, and a sixth insulating layer.

The first conductive layer functions as one of a source electrode and a drain electrode of a transistor.

The first insulating layer is in contact with the top surface of the first conductive layer; the second insulating layer is in contact with the top surface of the first insulating layer; the third insulating layer is in contact with the top surface of the second insulating layer; the fourth insulating layer is in contact with the top surface of the third insulating layer; and the fifth insulating layer is in contact with the top surface of the fourth insulating layer. The first to fifth insulating layers may include a first opening (which may also be referred to as a first opening portion) that reaches the first conductive layer. In this specification and the like, the term "opening" may be replaced with the term "opening portion".

The second conductive layer is positioned over the fifth insulating layer. The second conductive layer may include a second opening (which may also be referred to as a second opening portion) that overlaps with the first opening. The second conductive layer functions as the other of the source electrode and the drain electrode of the transistor.

The semiconductor layer is in contact with the top surface of the first conductive layer and the side surfaces of the first to fifth insulating layers. In the case where the first to fifth insulating layers are provided with the first opening, the semiconductor layer is in contact with the top surface of the first conductive layer and the side surfaces of the first to fifth insulating layers inside the first opening. The semiconductor layer is in contact with the second conductive layer. The semiconductor layer preferably contains a metal oxide.

The sixth insulating layer is positioned over the semiconductor layer. The sixth insulating layer functions as a gate insulating layer.

The third conductive layer is positioned over the sixth insulating layer and overlaps with the semiconductor layer with the sixth insulating layer provided between the third conductive later and the semiconductor layer. In the case where the first to fifth insulating layers are provided with the first opening and the second conductive layer is provided with the second opening, the third conductive layer in a position overlapping with the first opening and the second opening overlaps with the semiconductor layer with the sixth insulating layer provided between the third conductive layer and the semiconductor layer. The third conductive layer functions as a gate electrode of the transistor.

The first insulating layer includes a region having a higher hydrogen content than the second insulating layer. The fifth insulating layer includes a region having a higher hydrogen content than the fourth insulating layer.

The third insulating layer contains oxygen. The third insulating layer preferably includes a region having a higher oxygen content than the first insulating layer. The third insulating layer preferably includes a region having a higher oxygen content than the fifth insulating layer. The third insulating layer preferably includes a region having a higher oxygen content than the second insulating layer. The third insulating layer preferably includes a region having a higher oxygen content than the fourth insulating layer.

The first insulating layer is in contact with the region of the semiconductor layer to which a gate electric field is not easily applied (also referred to as an offset region). When the offset region has high resistance, the field-effect mobility of the transistor might decrease. The first insulating layer having a high hydrogen content can reduce the resistances of the region of the semiconductor layer that is in contact with the first insulating layer and the vicinity of the region. Accordingly, a decrease in field-effect mobility due to the offset region can be inhibited.

The fifth insulating layer having a high hydrogen content can reduce the resistances of the region of the semiconductor layer that is in contact with the fifth insulating layer and the vicinity of the region.

In the semiconductor layer, the region in contact with the first insulating layer and the region in contact with the fifth insulating layer can be regarded as low-resistance regions (also referred to as $n^+$-type regions or $n^+$ regions).

The third insulating layer is in contact with a channel formation region of the semiconductor layer. The channel formation region is a high-resistance region having a low carrier concentration. The channel formation region can be regarded as an i-type (intrinsic) or substantially i-type region. By having a high oxygen content, the third insulating layer can facilitate formation of an i-type region in the region of the semiconductor layer that is in contact with the third insulating layer and the vicinity of this region.

In the semiconductor layer in the transistor of one embodiment of the present invention, the low-resistance region in contact with the first insulating layer is provided between the region in contact with the first conductive layer and the i-type region in contact with the third insulating layer. Here, in the case where the first conductive layer functions as the drain electrode and the second conductive layer functions as the source electrode, the semiconductor layer can be regarded as including the low-resistance region between the region in contact with the drain electrode and the channel formation region. In this structure, a high electric field is not easily generated in the vicinity of a drain region, and generation of hot carriers and degradation of the transistor are inhibited.

Likewise, in the semiconductor layer in the transistor of one embodiment of the present invention, the low-resistance region in contact with the fifth insulating layer is provided between the region in contact with the second conductive layer and the i-type region in contact with the third insulating layer. Here, in the case where the first conductive layer functions as the source electrode and the second conductive layer functions as the drain electrode, the semiconductor layer can be regarded as including the low-resistance region between the region in contact with the drain electrode and the channel formation region. In this structure, a high electric field is not easily generated in the vicinity of a drain region, and generation of hot carriers and degradation of the transistor are inhibited.

As described above, the transistor of one embodiment of the present invention can have high reliability irrespective of whether the first conductive layer or the second conductive layer is the drain electrode. Accordingly, the design flexibility of the semiconductor device can be increased.

The second insulating layer has a lower hydrogen content than the first insulating layer. Likewise, the fourth insulating layer has a lower hydrogen content than the fifth insulating layer. It is thus possible to inhibit diffusion of hydrogen from the second insulating layer or the fourth insulating layer to the third insulating layer and the region of the semiconductor layer to which a gate electric field is sufficiently applied (the region that is intended to be of an i-type).

As described above, when the semiconductor layer is provided in contact with the first to fifth insulating layers, the channel formation region of the semiconductor layer can be in a position to which a gate electric field is sufficiently applied. Furthermore, the resistance of the offset region of the semiconductor layer can be reduced. Thus, the field-effect mobility of the transistor can be inhibited from decreasing, and the transistor can have favorable electrical characteristics.

In the semiconductor layer, the regions in contact with the first to fifth insulating layers are provided between the region in contact with the first conductive layer and the region in contact with the second conductive layer. These five insulating layers form a stacked-layer structure having symmetry with respect to the third insulating layer; thus, the semiconductor layer can have an appropriate carrier concentration distribution in the channel length direction. This also enables the transistor to have favorable electrical characteristics. In addition, the reliability of the transistor can be improved.

Each of the first insulating layer and the fifth insulating layer is preferably a layer from which hydrogen is released by heating. In that case, the first insulating layer and the fifth insulating layer can easily supply hydrogen to the semiconductor layer.

Each of the second insulating layer and the fourth insulating layer is preferably a layer that does not easily allow diffusion of oxygen. In that case, oxygen can be inhibited from being released from the third insulating layer through the second insulating layer or the fourth insulating layer.

Each of the second insulating layer and the fourth insulating layer is preferably a layer that does not easily allow diffusion of hydrogen. In that case, hydrogen can be inhibited from being diffused from outside the transistor to the semiconductor layer (specifically, the channel formation region) through the second insulating layer or the fourth insulating layer.

The third insulating layer is preferably a layer from which oxygen is released by heating. In that case, the third insulating layer can easily supply oxygen to the semiconductor layer.

The third insulating layer is preferably an oxide insulating layer or an oxynitride insulating layer.

For example, it is preferable that each of the first insulating layer, the second insulating layer, the fourth insulating layer, and the fifth insulating layer be a silicon nitride layer or a silicon nitride oxide layer and the third insulating layer be a silicon oxide layer or a silicon oxynitride layer.

For another example, it is preferable that each of the first insulating layer and the fifth insulating layer be a silicon nitride layer or a silicon nitride oxide layer, each of the second insulating layer and the fourth insulating layer be an aluminum oxide layer, and the third insulating layer be a silicon oxide layer or a silicon oxynitride layer.

The hydrogen content of the insulating layer is lower than the content of each of the main components of the insulating layer (e.g., nitrogen and silicon in a silicon nitride layer); thus, the hydrogen contents of the first insulating layer, the second insulating layer, the fourth insulating layer, and the fifth insulating layer are preferably compared through SIMS analysis.

Even when the main components of the first insulating layer are the same as those of the second insulating layer (e.g., even when both of the insulating layers are silicon nitride layers), these insulating layers can be distinguished from each other through cross-sectional observation in some cases. For example, in a transmitted electron (TE) image obtained by scanning transmission electron microscopy (STEM), the first insulating layer is observed as having higher lightness than the second insulating layer. Likewise, even when the same main components of the fourth insulating layer are the same as those of the fifth insulating layer, these insulating layers can be distinguished from each other through cross-sectional observation in some cases. For example, in a TE image obtained by STEM, the fifth insulating layer is observed as having higher lightness than the fourth insulating layer.

It is preferable that the semiconductor layer include a first portion that is in contact with the third insulating layer, and the shortest distance from the top surface of the first conductive layer to the first portion of the semiconductor layer be longer than the shortest distance from the top surface of the first conductive layer to the bottom surface of the third conductive layer. In that case, application of a gate electric field to the channel formation region is ensured and the transistor can have favorable electrical characteristics.

The semiconductor layer is preferably in contact with the top surface and the side surface of the second conductive layer. In other words, the transistor of one embodiment of the present invention preferably has a bottom-contact structure. In that case, the semiconductor layer can be formed after the second conductive layer is formed (e.g., after a film to be the second conductive layer is processed or after the second opening is formed), so that damage to the semiconductor layer can be inhibited. The bottom-contact structure is preferred also because the formation step of the first opening and that of the second opening can be successively performed (with no film formation step or the like performed therebetween) and accordingly the openings can be easily formed.

Grooves (slits) may be provided instead of the first opening and the second opening.

[Transistor 100]

Figure 4A:
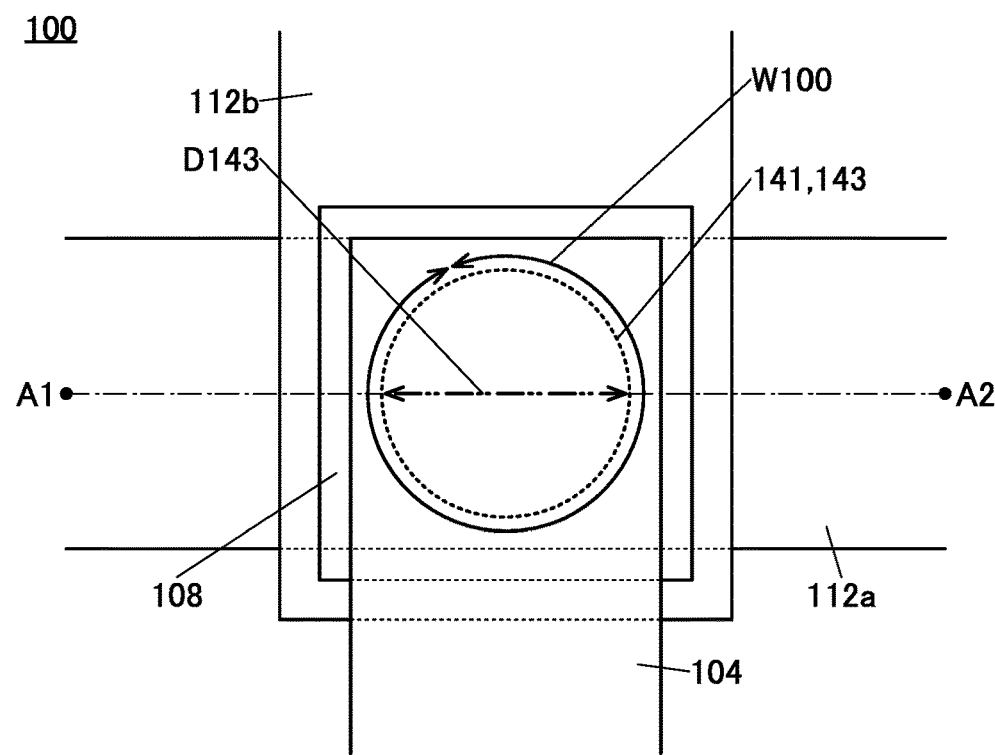
FIG. 4A is a top view showing an example of a semiconductor device.

FIG. 1A and FIG. 4A are top views of a transistor 100. FIG. 4A is different from FIG. 1A in that a diameter D143 and a channel width W100 are shown and dashed-dotted line B1-B2 is not shown. FIG. 1A and FIG. 4A omit insulating layers. Note that other top views also omit some components.

Figure 4B:
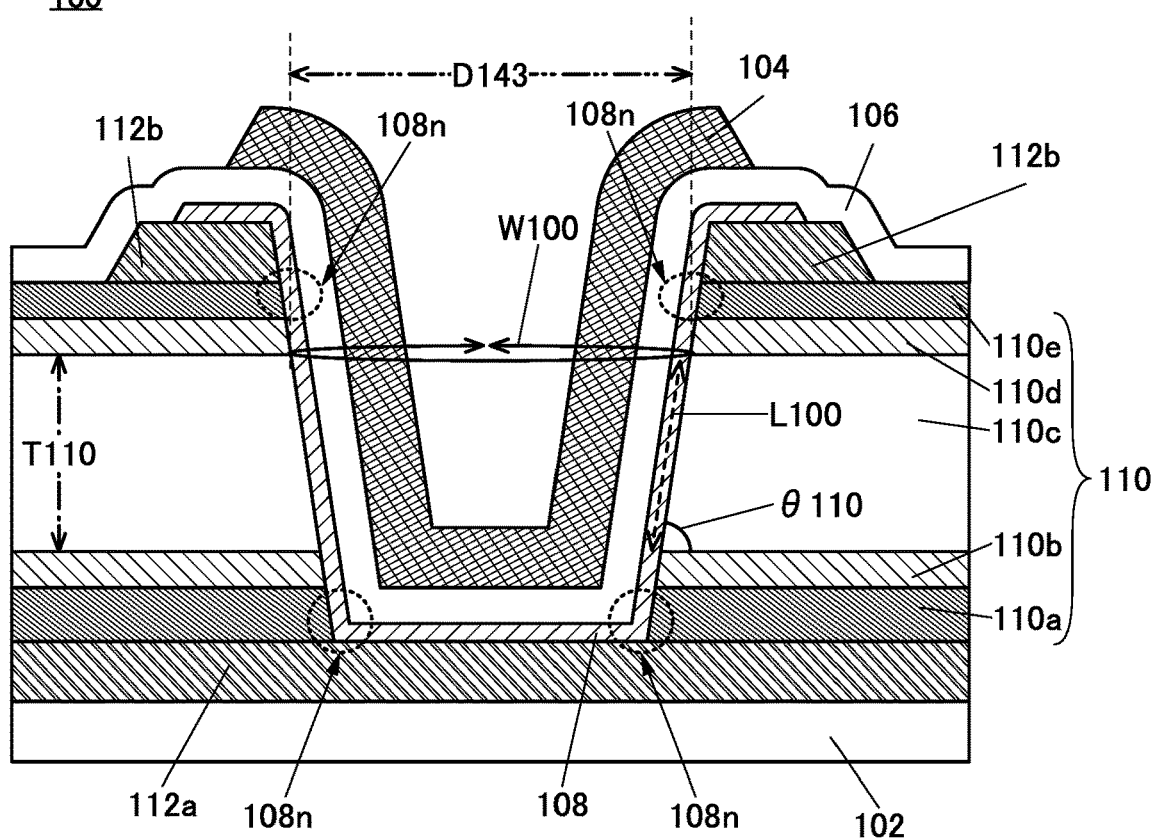
FIG. 4B is a cross-sectional view showing the example of the semiconductor device.

FIG. 1B and FIG. 4B are cross-sectional views along dashed-dotted lines A1-A2 in FIG. 1A and FIG. 4A, respectively. FIG. 4B may be regarded as an enlarged view of FIG. 1B. FIG. 1B shows an opening 141, an opening 143, a shortest distance T1, and a shortest distance T2, and FIG. 4B shows the diameter D143, the channel width W100, a channel length L100, a region $108n$, a thickness T110, and an angle $\theta 110$. The other components are common between FIG. 1B and FIG. 4B. FIG. 1C is a cross-sectional view taken along dashed-dotted line B1-B2 in FIG. 1A.

Figure 2:
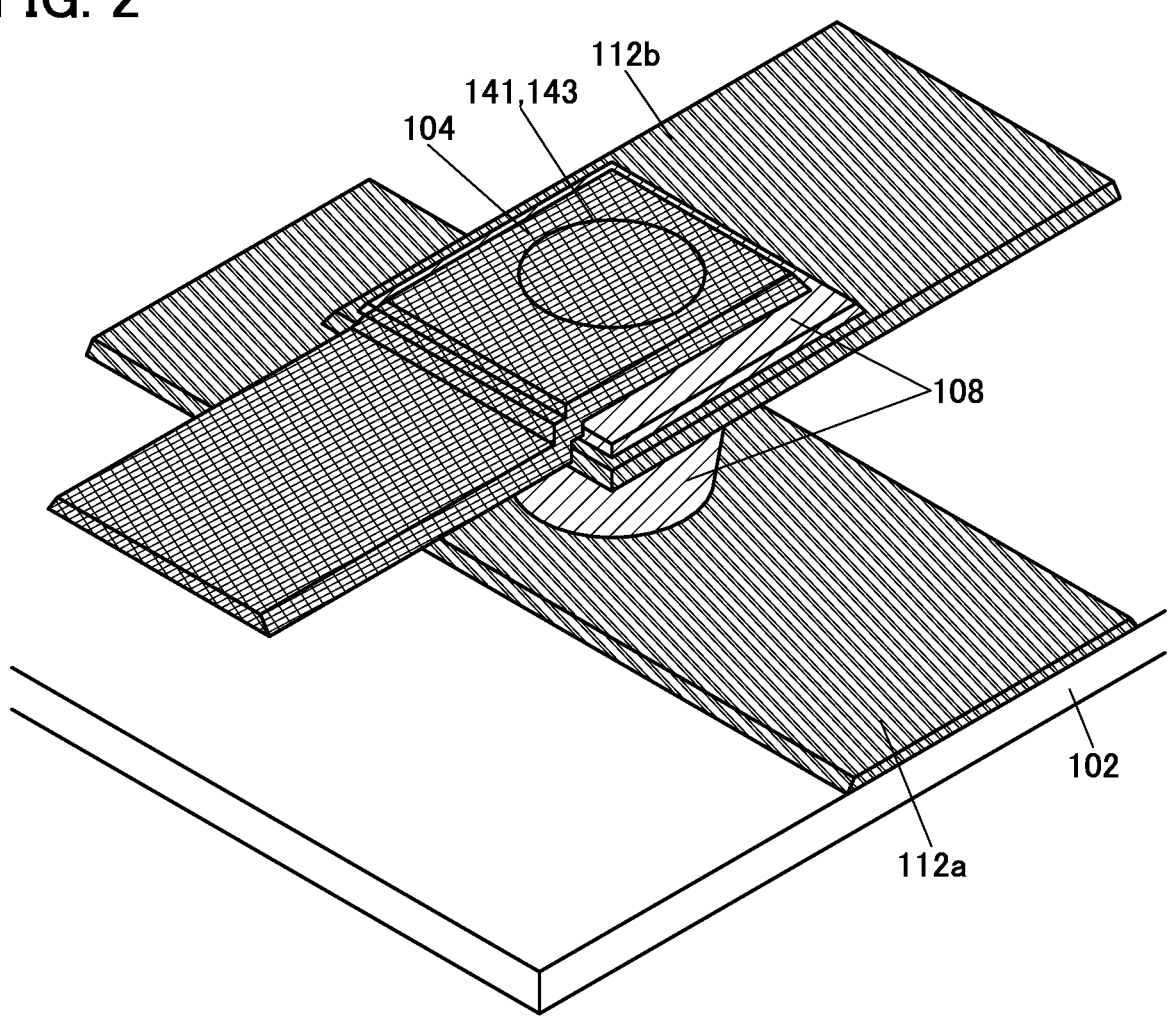
FIG. 2 is a perspective view showing an example of a semiconductor device.
Figure 3A:
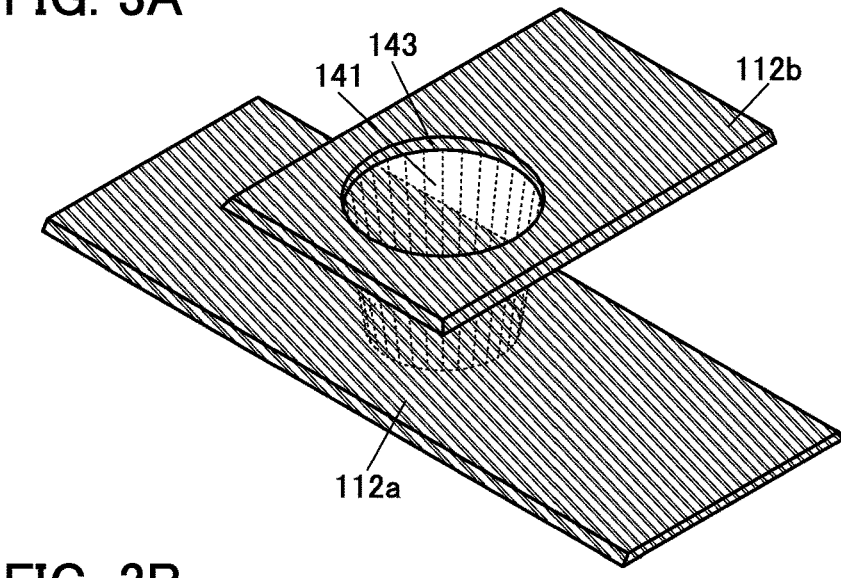
FIGS. 3A to 3C are perspective views showing an example of a semiconductor device.
Figure 3B:
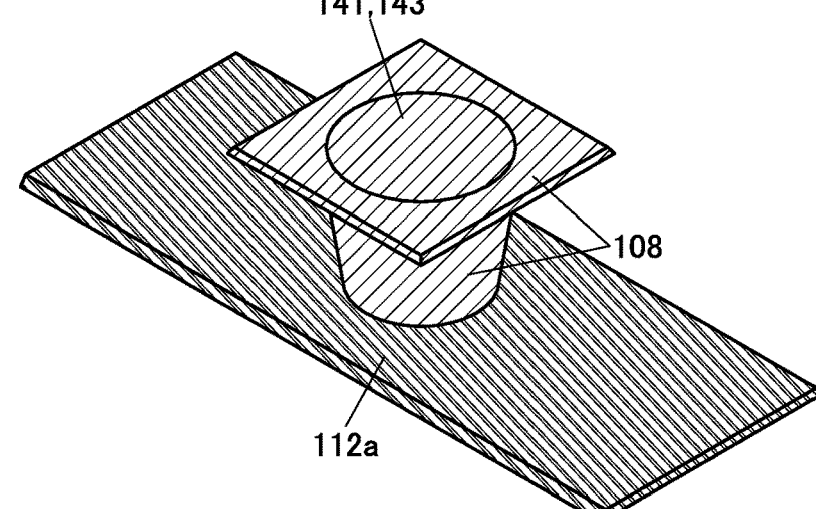
Figure 3C:
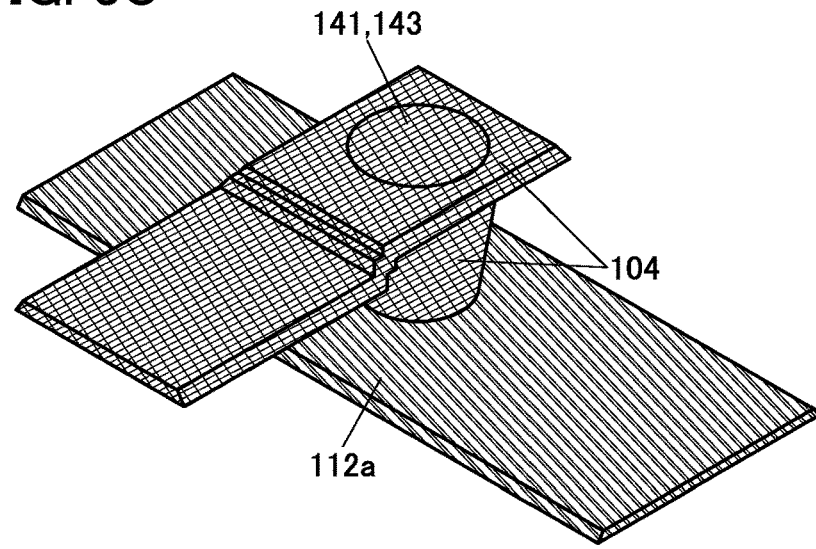

FIG. 2 is a perspective view of the transistor 100. The insulating layers are not shown in FIG. 2. FIGS. 3A to 3C are each a perspective view showing some components of the transistor 100.

The transistor 100 is provided over a substrate 102. The transistor 100 includes a conductive layer $112a$, an insulating layer 110 (an insulating layer $110a$, an insulating layer $110b$, an insulating layer $110c$, an insulating layer $110d$, and an insulating layer $110e$), a semiconductor layer 108, a conductive layer $112b$, an insulating layer 106, and a conductive layer 104. The layers constituting the transistor 100 may each have a single-layer structure or a stacked-layer structure. The insulating layer 110 is not necessarily regarded as a component of the transistor 100. In other words, a semiconductor device of one embodiment of the present invention may be regarded as including the transistor 100 and the insulating layer 110.

The conductive layer 112a is provided over the substrate 102. The conductive layer 112a functions as one of a source electrode and a drain electrode of the transistor 100.

The insulating layer 110 is positioned over the substrate 102 and the conductive layer 112a. The insulating layer 110 is in contact with the conductive layer 112a. The insulating layer 110 includes the opening 141 reaching the conductive layer 112a.

The insulating layer 110 has a stacked-layer structure formed by the insulating layer 110a over the substrate 102 and the conductive layer 112a, the insulating layer 110b over the insulating layer 110a, the insulating layer 110c over the insulating layer 110b, the insulating layer 110d over the insulating layer 110c, and the insulating layer 110e over the insulating layer 110d.

The conductive layer 112b is positioned over the insulating layer 110. The conductive layer 112b includes the opening 143 overlapping with the opening 141. The conductive layer 112b functions as the other of the source electrode and the drain electrode of the transistor 100.

FIG. 3A is a perspective view showing the conductive layer 112a, the conductive layer 112b, the opening 141, and the opening 143. Note that the opening 141 provided in the insulating layer 110 is indicated by dashed lines. As shown in FIG. 3A, the conductive layer 112b includes the opening 143 in a region overlapping with the conductive layer 112a. It is preferable that the conductive layer 112b not be provided inside the opening 141. In other words, it is preferable that the conductive layer 112b not include a region that is in contact with the side surface of the insulating layer 110 on the opening 141 side.

The semiconductor layer 108 is in contact with the top surface of the conductive layer 112a, the side surface of the insulating layer 110, and the top surface and the side surface of the conductive layer 112b. The semiconductor layer 108 is provided in contact with the end portion of the insulating layer 110 on the opening 141 side (which may be regarded as the side wall of the opening 141) and the end portion of the conductive layer 112b on the opening 143 side (which may be regarded as the side wall of the opening 143). The semiconductor layer 108 is in contact with the conductive layer 112a through the opening 141 and the opening 143.

FIG. 3B is a perspective view showing the conductive layer 112a and the semiconductor layer 108. As shown in FIG. 3B, the semiconductor layer 108 is provided to cover the opening 141 and the opening 143.

Although the end portion of the semiconductor layer 108 is in contact with the top surface of the conductive layer 112b in the example shown in FIG. 1B, the present invention is not limited to this example. The semiconductor layer 108 may cover an end portion of the conductive layer 112b, and the end portion of the semiconductor layer 108 may be in contact with the top surface of the insulating layer 110 (see a later-described transistor 100B shown in FIG. 6B and the like).

The insulating layer 106 is positioned over the insulating layer 110, the semiconductor layer 108, and the conductive layer 112b. The insulating layer 106 is provided along the side wall of the opening 141 and the side wall of the opening 143 with the semiconductor layer 108 between the insulating layer 106 and the side walls. The insulating layer 106 functions as a gate insulating layer (also referred to as a first gate insulating layer) of the transistor 100.

The conductive layer 104 is positioned over the insulating layer 106. The conductive layer 104 overlaps with the semiconductor layer 108 with the insulating layer 106 provided therebetween, in a position overlapping with the opening 141 and the opening 143. The conductive layer 104 functions as a gate electrode (also referred to as a first gate electrode) of the transistor 100.

FIG. 3C is a perspective view showing the conductive layer 112a and the conductive layer 104. As shown in FIG. 3C, the conductive layer 104 is provided to cover the opening 141 and the opening 143.

[Insulating Layer 110]

Although this embodiment mainly describes examples in which the insulating layer 110 has a stacked-layer structure formed by five layers, the insulating layer 110 may have a stacked-layer structure formed by six or more layers.

The layers constituting the insulating layer 110 are preferably formed using inorganic insulating films. Examples of the inorganic insulating film include an oxide insulating film, a nitride insulating film, an oxynitride insulating film, and a nitride oxide insulating film. Examples of the oxide insulating film include a silicon oxide film, an aluminum oxide film, a magnesium oxide film, a gallium oxide film, a germanium oxide film, an yttrium oxide film, a zirconium oxide film, a lanthanum oxide film, a neodymium oxide film, a hafnium oxide film, a tantalum oxide film, a cerium oxide film, a gallium zinc oxide film, and a hafnium aluminate film. Examples of the nitride insulating film include a silicon nitride film and an aluminum nitride film. Examples of the oxynitride insulating film include a silicon oxynitride film, an aluminum oxynitride film, a gallium oxynitride film, an yttrium oxynitride film, and a hafnium oxynitride film. Examples of the nitride oxide insulating film include a silicon nitride oxide film and an aluminum nitride oxide film.

The insulating layer 110 includes a portion that is in contact with the semiconductor layer 108. In the case where the semiconductor layer 108 is formed using an oxide semiconductor, at least part of the portion of the insulating layer 110 that is in contact with the semiconductor layer 108 is preferably formed using an oxide to improve the characteristics of the interface between the semiconductor layer 108 and the insulating layer 110. Specifically, the portion of the insulating layer 110 that is in contact with a channel formation region of the semiconductor layer 108 is preferably formed using an oxide. The channel formation region is a high-resistance region having a low carrier concentration. The channel formation region can be regarded as an i-type (intrinsic) or substantially i-type region.

As the insulating layer 110c, which is in contact with the channel formation region of the semiconductor layer 108, a layer containing oxygen is preferably used. It is preferable that the insulating layer 110c include a region having a higher oxygen content than at least one of the insulating layers 110a, 110b, 110d, and 110e. It is particularly preferable that the insulating layer 110c include a region having a higher oxygen content than each of the insulating layers 110a, 110b, 110d, and 110e.

The insulating layer 110c is preferably formed using any one or more of the oxide insulating films and oxynitride insulating films described above. Specifically, the insulating layer 110c is preferably formed using one or both of a silicon oxide film and a silicon oxynitride film. By having a high oxygen content, the insulating layer 110c can facilitate formation of an i-type region in the region of the semiconductor layer 108 that is in contact with the insulating layer 110c and the vicinity of this region.

It is further preferable that a film from which oxygen is released by heating be used for the insulating layer 110c. When the insulating layer 110c releases oxygen by being heated during the manufacturing process of the transistor 100, the oxygen can be supplied to the semiconductor layer 108. The oxygen supply from the insulating layer 110c to the semiconductor layer 108, particularly to the channel formation region of the semiconductor layer 108, reduces the amount of oxygen vacancies in the semiconductor layer 108, so that the transistor can have favorable electrical characteristics and high reliability.

For example, the insulating layer 110c can be supplied with oxygen when heat treatment or plasma treatment is performed in an oxygen-containing atmosphere. Alternatively, an oxide film may be formed over the top surface of the insulating layer 110c by a sputtering method in an oxygen atmosphere to supply oxygen. After that, the oxide film may be removed. Note that Embodiment 2 describes an example in which the insulating layer 110c is supplied with oxygen through nitrous oxide ($N_2O$) plasma treatment and the formation of a metal oxide layer 149.

The insulating layer 110c is preferably formed by a film formation method such as a sputtering method or a plasma-enhanced chemical vapor deposition (PECVD) method. It is particularly preferable to employ a sputtering method, in which a hydrogen gas does not need to be used as a film formation gas, to form a film having an extremely low hydrogen content. In that case, supply of hydrogen to the semiconductor layer 108 is inhibited and the electrical characteristics of the transistor 100 can be stabilized.

The semiconductor layer 108 includes a region (offset region) to which a gate electric field is not easily applied. The insulating layer 110a is preferably provided to be in contact with the offset region.

The insulating layer 110a includes a region having a higher hydrogen content than the insulating layer 110b. The insulating layer 110a preferably includes a region having a higher hydrogen content than the insulating layer 110d.

When the offset region has high resistance, the field-effect mobility of the transistor 100 might decrease. The insulating layer 110a having a high hydrogen content can reduce the resistances of the region of the semiconductor layer 108 that is in contact with the insulating layer 110a and the vicinity of the region (see lower two of the regions 108n in FIG. 4B). Accordingly, a decrease in field-effect mobility due to the offset region can be inhibited.

The insulating layer 110a is preferably a layer from which hydrogen is released by heating. When the insulating layer 110a releases hydrogen by being heated during the manufacturing process of the transistor 100, the hydrogen can be supplied to the semiconductor layer 108. When supplied with hydrogen, the offset region of the semiconductor layer 108 can have lower resistance, whereby the field-effect mobility can be inhibited from decreasing.

Likewise, the insulating layer 110e includes a region having a higher hydrogen content than the insulating layer 110d. The insulating layer 110e preferably includes a region having a higher hydrogen content than the insulating layer 110b.

The insulating layer 110e having a high hydrogen content can reduce the resistances of the region of the semiconductor layer 108 that is in contact with the insulating layer 110e and the vicinity of the region (see upper two of the regions 108n in FIG. 4B).

The insulating layer 110e is preferably a layer from which hydrogen is released by heating. When the insulating layer 110e releases hydrogen by being heated during the manufacturing process of the transistor 100, the hydrogen can be supplied to the semiconductor layer 108. In that case, a low-resistance region can be formed in the vicinity of the region of the semiconductor layer 108 that is contact with the conductive layer 112b.

In the semiconductor layer 108 of the transistor 100, the low-resistance region in contact with the insulating layer 110a is provided between the region in contact with the conductive layer 112a and the i-type region in contact with the insulating layer 110c. Here, in the case where the conductive layer 112a functions as the drain electrode and the conductive layer 112b functions as the source electrode, the semiconductor layer 108 can be regarded as including the low-resistance region between the region in contact with the drain electrode and the channel formation region. In this structure, a high electric field is not easily generated in the vicinity of a drain region, and generation of hot carriers and degradation of the transistor are inhibited.

Likewise, in the semiconductor layer 108 of the transistor 100, the low-resistance region in contact with the insulating layer 110e is provided between the region in contact with the conductive layer 112b and the i-type region in contact with the insulating layer 110c. Here, in the case where the conductive layer 112a functions as the source electrode and the conductive layer 112b functions as the drain electrode, the semiconductor layer 108 can be regarded as including the low-resistance region between the region in contact with the drain electrode and the channel formation region. In this structure, a high electric field is not easily generated in the vicinity of a drain region, and generation of hot carriers and degradation of the transistor are inhibited.

As described above, the transistor of one embodiment of the present invention can have high reliability irrespective of whether the conductive layer 112a or the conductive layer 112b is the drain electrode. Accordingly, the design flexibility of the semiconductor device can be increased.

The insulating layer 110b has a lower hydrogen content than the insulating layer 110a. The insulating layer 110d has a lower hydrogen content than the insulating layer 110e. It is thus possible to inhibit diffusion of hydrogen from the insulating layer 110b or the insulating layer 110d to the insulating layer 110c and the region of the semiconductor layer 108 to which a gate electric field is sufficiently applied (the region that is intended to be of an i-type).

Each of the insulating layers 110b and 110d is preferably formed using a film that does not easily allow diffusion of oxygen. In that case, it is possible to prevent oxygen contained in the insulating layer 110c from being diffused toward the substrate 102 side and the insulating layer 110e side respectively through the insulating layer 110b and the insulating layer 110d owing to heating. In other words, when the insulating layers 110b and 110d that do not easily allow diffusion of oxygen are respectively provided below and above the insulating layer 110c so that the insulating layer 110c is held therebetween, oxygen can be enclosed in the insulating layer 110c. Accordingly, oxygen can be effectively supplied to the semiconductor layer 108.

Each of the insulating layers 110b and 110d is preferably formed using a film that does not easily allow diffusion of hydrogen. In that case, hydrogen can be inhibited from being diffused from outside the transistor to the semiconductor layer 108 through the insulating layer 110b or 110d. Likewise, hydrogen can be inhibited from being diffused from the insulating layer 110a to the semiconductor layer 108 through the insulating layer 110b. Furthermore, hydrogen can be inhibited from being diffused from the insulating layer 110e to the semiconductor layer 108 through the insulating layer 110d.

It is preferable that the insulating layer 110a, the insulating layer 110b, the insulating layer 110d, and the insulating layer 110e be each formed using any one or more of the oxide insulating film, nitride insulating film, oxynitride insulating film, and nitride oxide insulating film described above. Specifically, it is preferable that the insulating layer 110a, the insulating layer 110b, the insulating layer 110d, and the insulating layer 110e be each formed using any one or more of a silicon nitride film, a silicon nitride oxide film, a silicon oxynitride film, an aluminum oxide film, an aluminum oxynitride film, an aluminum nitride film, a hafnium oxide film, and a hafnium aluminate film.

It is preferable that the insulating layer 110a, the insulating layer 110b, the insulating layer 110d, and the insulating layer 110e be each formed using any one or more of the nitride insulating film and nitride oxide insulating film described above. Specifically, it is preferable that the insulating layer 110a, the insulating layer 110b, the insulating layer 110d, and the insulating layer 110e be each formed using one or both of a silicon nitride film and a silicon nitride oxide film.

A silicon nitride film and a silicon nitride oxide film are suitable for the insulating layers 110b and 110d because they release fewer impurities (e.g., water and hydrogen) and are less likely to transmit oxygen and hydrogen. Depending on the film formation conditions (e.g., the film formation gas or the power at the time of film formation), a silicon nitride film and a silicon nitride oxide film can each be a film that releases much hydrogen; thus, a silicon nitride film and a silicon nitride oxide film can also be suitably used for the insulating layer 110a and the insulating layer 110e.

The insulating layer 110b and the insulating layer 110d may be formed using any of the above-described aluminum-containing films, for example. The insulating layer 110b and the insulating layer 110d are each preferably formed using, for example, an aluminum oxide film. An aluminum oxide film is suitable because it can have a lower hydrogen content than a silicon nitride film.

The conductive layers 112a and 112b are oxidized by oxygen contained in the insulating layer 110c and have high resistance in some cases. Providing the insulating layer 110b between the insulating layer 110c and the conductive layer 112a can inhibit the conductive layer 112a from being oxidized and having high resistance. In a similar manner, providing the insulating layer 110d between the insulating layer 110c and the conductive layer 112b can inhibit the conductive layer 112b from being oxidized and having high resistance and can also increase the amount of oxygen supplied from the insulating layer 110c to the semiconductor layer 108 to reduce the amount of oxygen vacancies in the semiconductor layer 108.

In the semiconductor layer 108, the region in contact with the insulating layer 110b preferably has higher resistance than the region in contact with the insulating layer 110a and lower resistance than the region in contact with the insulating layer 110c. In the semiconductor layer 108, the region in contact with the insulating layer 110b can be referred to as an n⁻-type region or an n⁻ region. In the semiconductor layer 108, oxygen supplied from the insulating layer 110c sometimes reaches not only the region in contact with the insulating layer 110c but also the region in contact with the insulating layer 110b and the vicinity of this region. Likewise, in the semiconductor layer 108, hydrogen supplied from the insulating layer 110a sometimes reaches not only the region in contact with the insulating layer 110a but also the region in contact with the insulating layer 110b and the vicinity of this region. Here, if the insulating layer 110a is not provided, the region of the semiconductor layer 108 that is in contact with the insulating layer 110b and the vicinity of the region would be supplied with oxygen from the insulating layer 110c to have relatively high resistance. When the semiconductor layer 108 includes such a high-resistance region between the channel formation region and the region that is in contact with the drain electrode, the on-state current of the transistor might decrease. In the case where the insulating layer 110a with a high hydrogen content is provided, by contrast, the hydrogen supply can inhibit an increase in the resistances of the region of the semiconductor layer 108 that is in contact with the insulating layer 110b and the vicinity of the region and thereby inhibit a reduction in the on-state current of the transistor.

The thickness of each of the insulating layer 110b and the insulating layer 110d is preferably greater than or equal to 5 nm and less than or equal to 150 nm, further preferably greater than or equal to 5 nm and less than or equal to 100 nm, still further preferably greater than or equal to 5 nm and less than or equal to 70 nm, yet still further preferably greater than or equal to 10 nm and less than or equal to 70 nm, yet still further preferably greater than or equal to 10 nm and less than or equal to 50 nm, yet still further preferably greater than or equal to 20 nm and less than or equal to 50 nm. When the thickness of each of the insulating layer 110b and the insulating layer 110d is in the above-described range, the amount of oxygen vacancies in the semiconductor layer 108, or specifically the channel formation region, can be reduced. Note that the insulating layer 110b and the insulating layer 110d may have the same thickness or different thicknesses.

It is preferable that, for example, the insulating layer 110a, the insulating layer 110b, the insulating layer 110d, and the insulating layer 110e be formed using silicon nitride films and the insulating layer 110c be formed using a silicon oxynitride film.

As described above, when the semiconductor layer 108 is provided in contact with the insulating layers 110a to 110e, the channel formation region of the semiconductor layer 108 can be in a position to which a gate electric field is sufficiently applied. Furthermore, the resistance of the offset region of the semiconductor layer 108 can be reduced. Thus, the field-effect mobility of the transistor 100 can be inhibited from decreasing, and the transistor 100 can have favorable electrical characteristics.

In the semiconductor layer 108, the region in contact with the insulating layer 110 is provided between the region in contact with the conductive layer 112a and the region in contact with the conductive layer 112b. In the structure of the insulating layer 110, the insulating layer 110b and the insulating layer 110d having a low hydrogen content are respectively provided below and above the insulating layer 110c so that the insulating layer 110c is held therebetween, and the insulating layer 110a and the insulating layer 110e having a high hydrogen content are respectively provided below and above the above three-layer structure so that the above three-layer structure is held therebetween. That is, the structure of the insulating layer 110 has symmetry with respect to a line perpendicular to the vertical direction (the stacking direction). This enables the semiconductor layer 108 to have an appropriate carrier concentration distribution in the channel length direction. Accordingly, the transistor can have favorable electrical characteristics and high reliability.

As shown in FIG. 1B, the shortest distance T1 from the top surface of the conductive layer 112a to the portion of the semiconductor layer 108 that is in contact with the insulating layer 110c is longer than the shortest distance T2 from the top surface of the conductive layer 112a to the bottom surface of the conductive layer 104. That is, in a cross-sectional view, the bottom surface of the conductive layer 104 inside the opening 141 is at a lower level (is closer to the substrate 102) than the portion of the insulating layer 110c that is in contact with the semiconductor layer 108 is. This makes it possible that application of a gate electric field to the channel formation region of the semiconductor layer 108 is ensured and the transistor has favorable electrical characteristics.

It can be said that the shortest distance T1 depends on the sum of the thickness of the insulating layer 110a and the thickness of the insulating layer 110b, and the shortest distance T2 depends on the sum of the thickness of the semiconductor layer 108 and the thickness of the insulating layer 106. Accordingly, it can be said that the sum of the thickness of the insulating layer 110a and the thickness of the insulating layer 110b is preferably larger than the sum of the thickness of the semiconductor layer 108 and the thickness of the insulating layer 106. The shortest distance T1 is preferably 0.5 or more times the shortest distance T2, further preferably 1.0 or more times the shortest distance T2, still further preferably more than 1.0 times the shortest distance T2.

The thickness of the insulating layer 110a can be set such that the above relationship between the shortest distances T1 and T2 is established. The thickness of each of the insulating layer 110a and the insulating layer 110e is preferably greater than or equal to 10 nm and less than or equal to 200 nm, further preferably greater than or equal to 20 nm and less than or equal to 150 nm, still further preferably greater than or equal to 50 nm and less than or equal to 100 nm. Note that the insulating layer 110a and the insulating layer 110e may have the same thickness or different thicknesses.

There is no limitation on the top-view shapes of the opening 141 and the opening 143, and the top-view shapes can each be a circle, an ellipse, a polygon such as a triangle, a quadrangle (including a rectangle, a rhombus, and a square), a pentagon, or a star polygon, or any of these polygons whose corners are rounded, for example. Note that the polygon may be a concave polygon (a polygon at least one of the interior angles of which is greater than 180°) or a convex polygon (a polygon all the interior angles of which are less than or equal to 180°). The top-view shapes of the opening 141 and the opening 143 are preferably circles as shown in FIG. 1A and the like. When the top-view shapes of the openings are circles, processing accuracy at the time of formation of the openings can be high, whereby the openings can be formed to have minute sizes. Note that in this specification and the like, a circle is not necessarily a perfect circle.

In this specification and the like, the top-view shape of the opening 141 refers to the shape of the end portion of the top surface of the insulating layer 110 on the opening 141 side. The top-view shape of the opening 143 refers to the shape of the end portion of the bottom surface of the conductive layer 112b on the opening 143 side.

As shown in FIG. 1A and the like, the opening 141 and the opening 143 can have the same top-view shape or substantially the same top-view shapes. In that case, it is preferable that the end portion of the bottom surface of the conductive layer 112b on the opening 143 side be aligned with or substantially aligned with the end portion of the top surface of the insulating layer 110 on the opening 141 side as shown in FIGS. 1B and 1C and the like. The bottom surface of the conductive layer 112b refers to the surface thereof on the insulating layer 110 side. The top surface of the insulating layer 110 refers to the surface thereof on the conductive layer 112b side.

Note that the opening 141 and the opening 143 do not necessarily have the same top-view shape (see a later-described transistor 100A shown in FIG. 5A and the like). In the case where the opening 141 and the opening 143 have circular top-view shapes, the opening 141 and the opening 143 may be, but not necessarily, concentrically arranged.

In the transistor of one embodiment of the present invention, the source electrode and the drain electrode are positioned at different heights, so that a current flows upward or downward in the semiconductor layer. In other words, the channel length direction includes a height (vertical) component, so that the transistor of one embodiment of the present invention can also be referred to as a vertical transistor, a vertical-channel transistor, a vertical channel-type transistor, or the like.

In the transistor of one embodiment of the present invention, the source electrode, the semiconductor layer, and the drain electrode can be provided to overlap with each other. Thus, the area occupied by the transistor can be significantly smaller than the area occupied by a so-called planar transistor in which a planar semiconductor layer is provided.

The conductive layers 112a, 112b, and 104 can function as wirings and the transistor 100 can be provided in the region where these wirings overlap with each other. That is, the areas occupied by the transistor 100 and the wirings can be reduced in the circuit including the transistor 100 and the wirings. Accordingly, the area occupied by the circuit can be reduced, which makes it possible to provide a small semiconductor device.

When the semiconductor device of one embodiment of the present invention is used for a pixel circuit of a display device, the area occupied by the pixel circuit can be reduced and the display device can have high resolution, for example. When the semiconductor device of one embodiment of the present invention is used for a driver circuit (e.g., one or both of a gate line driver circuit and a source line driver circuit) of a display device, the area occupied by the driver circuit can be reduced and the display device can have a narrow bezel, for example.

The channel length, channel width, and the like of the transistor 100 are described with reference to FIGS. 4A and 4B.

In the semiconductor layer 108, the region in contact with the conductive layer 112a functions as one of a source region and the drain region, the region in contact with the conductive layer 112b functions as the other of the source region and the drain region, and a region between the source region and the drain region functions as the channel formation region.

In the semiconductor layer 108, the region that is in contact with the insulating layer 110a and the region that is in contact with the insulating layer 110e each function as the low-resistance region, and the region that is in contact with the insulating layer 110c functions as the channel formation region. In the semiconductor layer 108, the region in contact with the insulating layer 110b sometimes has higher resistance than the region in contact with the insulating layer 110a and lower resistance than the region in contact with the insulating layer 110c. In the semiconductor layer 108, the region in contact with the insulating layer 110d sometimes has higher resistance than the region in contact with the insulating layer 110e and lower resistance than the region in contact with the insulating layer 110c. In this embodiment, the region of the semiconductor layer 108 that is in contact with the insulating layer 110*b* and the region of the semiconductor layer 108 that is in contact with the insulating layer 110*d* are described as not being included in the channel formation region; however, these regions may be included in the channel formation region. Alternatively, the region of the semiconductor layer 108 that is in contact with the insulating layer 110*b* and the region of the semiconductor layer 108 that is in contact with the insulating layer 110*d* may be referred to as low-resistance regions. Note that the low-resistance region may function as the source region or the drain region.

In FIG. 4B, the channel length L100 of the transistor 100 is indicated by a dashed double-headed arrow. It can be said that in a cross-sectional view, the channel length L100 is the shortest distance between the portion of the semiconductor layer 108 that is in contact with the insulating layer 110*b* and the portion of the semiconductor layer 108 that is in contact with the insulating layer 110*d*.

The channel length L100 of the transistor 100 corresponds to the length of the side surface of the insulating layer 110*c* on the opening 141 side in a cross-sectional view. In other words, the channel length L100 depends on the thickness T110 of the insulating layer 110*c* and the angle θ110 formed by the side surface of the insulating layer 110*c* on the opening 141 side and the formation surface of the insulating layer 110*c* (which is the top surface of the insulating layer 110*b* here). Thus, the channel length L100 can be a value smaller than that of the resolution limit of a light-exposure apparatus, for example, which enables the transistor to have a minute size. Specifically, it is possible to obtain a transistor with an extremely short channel length that could not be obtained with the use of a conventional light-exposure apparatus for mass production of flat panel displays (the minimum line width: approximately 2 μm or approximately 1.5 μm, for example). Moreover, it is also possible to obtain a transistor with a channel length shorter than 10 nm without using an extremely expensive light-exposure apparatus used in the latest LSI technology.

The channel length L100 can be, for example, greater than or equal to 5 nm, greater than or equal to 7 nm, or greater than or equal to 10 nm and less than 3 μm, less than or equal to 2.5 μm, less than or equal to 2 μm, less than or equal to 1.5 μm, less than or equal to 1.2 μm, less than or equal to 1 μm, less than or equal to 500 nm, less than or equal to 300 nm, less than or equal to 200 nm, less than or equal to 100 nm, less than or equal to 50 nm, less than or equal to 30 nm, or less than or equal to 20 nm. For example, the channel length L100 can be greater than or equal to 100 nm and less than or equal to 1 μm.

When the channel length L100 is small, the transistor 100 can have a high on-state current. With the use of the transistor 100, a circuit capable of high-speed operation can be manufactured. Furthermore, the area occupied by the circuit can be reduced. Therefore, a semiconductor device with a small size can be obtained. The application of the semiconductor device of one embodiment of the present invention to a large-sized or high-resolution display device would reduce signal delay in wirings and reduce display unevenness if the number of wirings is increased, for example. In addition, since the area occupied by the circuit can be reduced, the bezel of the display device can be narrowed.

By adjusting the thickness T110 of the insulating layer 110*c* and the angle θ110, the channel length L100 can be controlled. Note that in FIG. 4B, the thickness T110 of the insulating layer 110*c* is indicated by the dashed-dotted double-headed arrow.

The thickness T110 of the insulating layer 110*c* can be, for example, greater than or equal to 10 nm, greater than or equal to 50 nm, greater than or equal to 100 nm, greater than or equal to 150 nm, greater than or equal to 200 nm, greater than or equal to 300 nm, greater than or equal to 400 nm, or greater than or equal to 500 nm and less than 3.0 μm, less than or equal to 2.5 μm, less than or equal to 2.0 μm, less than or equal to 1.5 μm, less than or equal to 1.2 μm, or less than or equal to 1.0 μm.

The side surface of the insulating layer 110*c* on the opening 141 side preferably has a tapered shape. The angle θ110 between the side surface of the insulating layer 110*c* on the opening 141 side and the formation surface of the insulating layer 110*c* (which is the top surface of the insulating layer 110*b* here) is preferably less than or equal to 90°. When the angle θ110 is small, the coverage with the layer provided over the insulating layer 110*c* (e.g., the semiconductor layer 108) can be increased. The smaller the angle θ110 is, the larger the channel length L100 is. The larger the angle θ110 is, the smaller the channel length L100 is.

The angle θ110 can be, for example, greater than or equal to 30°, greater than or equal to 35°, greater than or equal to 40°, greater than or equal to 45°, greater than or equal to 50°, greater than or equal to 55°, greater than or equal to 60°, greater than or equal to 65°, or greater than or equal to 70° and less than or equal to 90°, less than or equal to 85°, or less than or equal to 80°. The angle θ110 may be less than or equal to less than or equal to 70°, less than or equal to 65°, or less than or equal to 60°.

In the case where the angle θ110 is greater than or equal to 80° and less than or equal to 90°, the film to cover the insulating layer 110 is preferably formed by a film formation method that enables favorable coverage. For example, it is preferable that the conductive layer 104 be formed by a CVD method and the insulating layer 106 and the semiconductor layer 108 be formed by an ALD method. For another example, it is preferable that the conductive layer 104, the insulating layer 106, and the semiconductor layer 108 be formed by an ALD method. In the case where the angle θ110 is greater than or equal to 60° and less than or equal to 85°, the film to cover the insulating layer 110 may be formed by a film formation method with higher productivity. For example, it is preferable that the semiconductor layer 108 be formed by a sputtering method.

The angle θ110 is defined with reference to the insulating layer 110*c* here but may be defined with reference to the whole insulating layer 110. In other words, the angle θ110 may be the angle between the side surface of the insulating layer 110 on the opening 141 side and the formation surface of the insulating layer 110 (which is the top surface of the conductive layer 112*a* here).

In the case where the region of the semiconductor layer 108 that is in contact with the insulating layer 110*b* and the region of the semiconductor layer 108 that is in contact with the insulating layer 110*d* are included in the channel formation region, it can be said that the channel length L100 is the shortest distance between the portion of the semiconductor layer 108 that is in contact with the insulating layer 110*a* and the portion of the semiconductor layer 108 that is in contact with the conductive layer 112*b* in a cross-sectional view. The channel length L100 corresponds to the sum of the lengths of the side surfaces of the insulating layers 110*b*, 110*c*, and 110*d* on the opening 141 side in a cross-sectional view.

In FIGS. 4A and 4B, the diameter D143 of the opening 143 is indicated by the dashed-two dotted double-headed arrow. In the example shown in FIG. 4A, the top-view shape of each of the opening 141 and the opening 143 is a circle having the diameter D143. Here, the channel width W100 of the transistor 100 is equal to the length of the circumference of this circle. That is, the channel width W100 is $\pi \times$D143. In the case where the opening 141 and the opening 143 have circular top-view shapes as described above, the channel width W100 of the transistor can be smaller than in the case where the opening 141 and the opening 143 have any other shape.

Note that the opening 141 and the opening 143 sometimes have different diameters. The diameter of each of the opening 141 and the opening 143 sometimes varies from position to position in the depth direction. As the diameter of the opening 141, for example, the average value of the following three diameters can be used: the diameter at the highest level of the insulating layer 110 (or the insulating layer 110c) in a cross-sectional view, the diameter at the lowest level of the insulating layer 110 (or the insulating layer 110c) in a cross-sectional view, and the diameter at the midpoint between these levels. For another example, any of the diameter at the highest level of the insulating layer 110 (or the insulating layer 110c) in a cross-sectional view, the diameter at the lowest level of the insulating layer 110 (or the insulating layer 110c) in a cross-sectional view, and the diameter at the midpoint between these levels can be used as the diameter of the opening 141. Likewise, any of the diameter at the highest level of the conductive layer 112b in a cross-sectional view, the diameter at the lowest level of the conductive layer 112b in a cross-sectional view, and the diameter at the midpoint between these levels or the average value of these three diameters can be used as the diameter of the opening 143, for example.

In the case where the opening 143 is formed by a photolithography method, the diameter D143 of the opening 143 is larger than or equal to the resolution limit of a light-exposure apparatus. The diameter D143 can be, for example, greater than or equal to nm, greater than or equal to 50 nm, greater than or equal to 100 nm, greater than or equal to 200 nm, greater than or equal to 300 nm, greater than or equal to 400 nm, or greater than or equal to 500 nm and less than 5.0 μm, less than or equal to 4.5 μm, less than or equal to 4.0 μm, less than or equal to 3.5 μm, less than or equal to 3.0 μm, less than or equal to 2.5 μm, less than or equal to 2.0 μm, less than or equal to 1.5 μm, or less than or equal to 1.0 μm.

[Semiconductor Layer 108]

There is no particular limitation on the semiconductor material used for the semiconductor layer 108. For example, a single-element semiconductor or a compound semiconductor can be used. Examples of the single-element semiconductor include silicon and germanium. Examples of the compound semiconductor include gallium arsenide and silicon germanium. Other examples of the compound semiconductor include an organic semiconductor, a nitride semiconductor, and an oxide semiconductor. These semiconductor materials may contain an impurity as a dopant.

There is no particular limitation on the crystallinity of the semiconductor material used for the semiconductor layer 108, and any of an amorphous semiconductor, a single crystal semiconductor, and a semiconductor having other crystallinity than single crystal (a microcrystalline semiconductor, a polycrystalline semiconductor, or a semiconductor partly including crystal regions) may be used. A single crystal semiconductor or a semiconductor having crystallinity is preferably used, in which case deterioration of the transistor characteristics can be inhibited.

The semiconductor layer 108 preferably includes a metal oxide exhibiting semiconductor characteristics (also referred to as an oxide semiconductor).

The band gap of a metal oxide used for the semiconductor layer 108 is preferably 2.0 eV or more, further preferably 2.5 eV or more.

Examples of the metal oxide that can be used for the semiconductor layer 108 include indium oxide, gallium oxide, and zinc oxide. The metal oxide preferably contains at least indium or zinc. The metal oxide preferably contains two or three selected from indium, an element M, and zinc. The element M is a metal element or metalloid element that has a high bonding energy with oxygen, such as a metal element or metalloid element whose bonding energy with oxygen is higher than that of indium. Specific examples of the element M include aluminum, gallium, tin, yttrium, titanium, vanadium, chromium, manganese, iron, cobalt, nickel, zirconium, molybdenum, hafnium, tantalum, tungsten, lanthanum, cerium, neodymium, magnesium, calcium, strontium, barium, boron, silicon, germanium, and antimony. The element M included in the metal oxide is preferably one or more of the above elements, further preferably one or more selected from aluminum, gallium, tin, and yttrium, and still further preferably gallium. In this specification and the like, a metal element and a metalloid element may be collectively referred to as a "metal element" and a "metal element" in this specification and the like may refer to a metalloid element.

For example, the semiconductor layer 108 can be formed using indium zinc oxide (also referred to as In—Zn oxide or IZO (registered trademark)), indium tin oxide (In—Sn oxide), indium titanium oxide (In—Ti oxide), indium gallium oxide (In—Ga oxide), indium gallium aluminum oxide (In—Ga—Al oxide), indium gallium tin oxide (In—Ga—Sn oxide), gallium zinc oxide (also referred to as Ga—Zn oxide or GZO), aluminum zinc oxide (also referred to as Al—Zn oxide or AZO), indium aluminum zinc oxide (also referred to as In—Al—Zn oxide or IAZO), indium tin zinc oxide (also referred to as In—Sn—Zn oxide or ITZO (registered trademark)), indium titanium zinc oxide (In—Ti—Zn oxide), indium gallium zinc oxide (also referred to as In—Ga—Zn oxide or IGZO), indium gallium tin zinc oxide (also referred to as In—Ga—Sn—Zn oxide or IGZTO), or indium gallium aluminum zinc oxide (also referred to as In—Ga—Al—Zn oxide, IGAZO, IGZAO, or IAGZO). Alternatively, indium tin oxide containing silicon, gallium tin oxide (Ga—Sn oxide), aluminum tin oxide (Al—Sn oxide), or the like can be used.

By increasing the proportion of the number of indium atoms in the total number of atoms of all the metal elements included in the metal oxide, the field-effect mobility of the transistor can be increased. In addition, the transistor can have a high on-state current.

Instead of indium or in addition to indium, the metal oxide may contain one or more kinds of metal elements whose period number in the periodic table is large. The larger the overlap between orbits of metal elements is, the more likely it is that the metal oxide will have high carrier conductivity. Thus, when a metal element with a large period number is included in the metal oxide, the field-effect mobility of the transistor can be increased in some cases. As examples of the metal element with a large period number, the metal elements belonging to Period 5 and those belonging to Period 6 are given. Specific examples of the metal element include yttrium, zirconium, silver, cadmium, tin, antimony, barium, lead, bismuth, lanthanum, cerium, praseodymium, neodymium, promethium, samarium, and europium. Note that lanthanum, cerium, praseodymium, neodymium, prome-thium, samarium, and europium are called light rare-earth elements.

The metal oxide may contain one or more kinds selected from nonmetallic elements. By containing a non-metallic element, the metal oxide sometimes has an increased carrier concentration, a reduced band gap, or the like, in which case the transistor can have increased field-effect mobility. Examples of the nonmetallic element include carbon, nitro-gen, phosphorus, sulfur, selenium, fluorine, chlorine, bro-mine, and hydrogen.

By increasing the proportion of the number of zinc atoms in the total number of atoms of all the metal elements included in the metal oxide, the metal oxide has high crystallinity, so that diffusion of impurities in the metal oxide can be inhibited. Consequently, a change in electrical characteristics of the transistor is suppressed and the tran-sistor can have high reliability.

By increasing the proportion of the number of element M atoms in the total number of atoms of all the metal elements included in the metal oxide, oxygen vacancies can be inhibited from being formed in the metal oxide. Accord-ingly, generation of carriers due to oxygen vacancies is inhibited, which makes the off-state current of the transistor low. Furthermore, changes in the electrical characteristics of the transistor can be reduced to improve the reliability of the transistor.

The composition of the metal oxide used for the semi-conductor layer 108 affects the electrical characteristics and reliability of the transistor. Therefore, by determining the composition of the metal oxide in accordance with the electrical characteristics and reliability required for the transistor, the semiconductor device can have both excellent electrical characteristics and high reliability.

When the metal oxide is an In-M-Zn oxide, the proportion of the number of In atoms is preferably higher than or equal to that of the number of M atoms in the In-M-Zn oxide. Examples of the atomic ratio of the metal elements of such an In-M-Zn oxide include In:M:Zn=1:1:1, In:M:Zn=1:1:1.2, In:M:Zn=2:1:3, In:M:Zn=3:1:1, In:M:Zn=3:1:2, In:M:Zn=4:2:3, In:M:Zn=4:2:4.1, In:M:Zn=5:1:3, In:M:Zn=5:1:6, In:M:Zn=5:1:7, In:M:Zn=5:1:8, In:M:Zn=6:1:6, and In:M:Zn=5:2:5 and a composition in the neighborhood of any of the above atomic ratios. Note that a composition in the neighborhood of an atomic ratio includes ±30% of an intended atomic ratio. By increasing the proportion of the number of indium atoms in the metal oxide, the on-state current, field-effect mobility, or the like of the transistor can be improved.

The proportion of the number of In atoms may be less than that of the number of M atoms in the In-M-Zn oxide. Examples of the atomic ratio of the metal elements of such an In-M-Zn oxide include In:M:Zn=1:3:2, In:M:Zn=1:3:3, and In:M:Zn=1:3:4 and a composition in the neighborhood of any of these atomic ratios. By increasing the proportion of the number of M atoms in the metal oxide, generation of oxygen vacancies can be suppressed.

In the case where a plurality of metal elements are contained as the element M, the sum of the proportions of the numbers of atoms of these metal elements can be used as the proportion of the number of element M atoms.

In this specification and the like, the proportion of the number of indium atoms in the total number of atoms of all the metal elements contained is sometimes referred to as indium content percentage. The same applies to other metal elements.

A sputtering method or an atomic layer deposition (ALD) method can be suitably used for forming a film of the metal oxide. Note that in the case where a film of the metal oxide is formed by a sputtering method, the composition of the formed metal oxide film may be different from the compo-sition of a target. In particular, the zinc content percentage of the formed metal oxide film may be reduced to approxi-mately 50% of that of the target.

The semiconductor layer 108 may have a stacked-layer structure of two or more metal oxide layers. The two or more metal oxide layers included in the semiconductor layer 108 may have the same composition or substantially the same compositions. Employing a stacked-layer structure of metal oxide layers having the same composition can reduce the manufacturing cost because the metal oxide layers can be formed using the same sputtering target.

The two or more metal oxide layers included in the semiconductor layer 108 may have different compositions. For example, a stacked-layer structure of a first metal oxide layer having In:M:Zn=1:3:4 [atomic ratio] or a composition in the neighborhood thereof and a second metal oxide layer having In:M:Zn=1:1:1 [atomic ratio] or a composition in the neighborhood thereof and being formed over the first metal oxide layer can be favorably employed. In particular, gal-lium, aluminum, or tin is preferably used as the element M. A stacked-layer structure of one selected from indium oxide, indium gallium oxide, and IGZO, and one selected from IAZO, IAGZO, and ITZO (registered trademark) may be employed, for example.

It is preferable that the semiconductor layer 108 include a metal oxide layer having crystallinity. Examples of the structure of a metal oxide having crystallinity include a c-axis aligned crystalline (CAAC) structure, a polycrystal-line structure, and a nano-crystal (nc) structure. By using a metal oxide layer having crystallinity as the semiconductor layer 108, the density of defect states in the semiconductor layer 108 can be reduced, which enables the semiconductor device to have high reliability.

The higher the crystallinity of the metal oxide layer used for the semiconductor layer 108 is, the lower the density of defect states in the semiconductor layer 108 can be. By contrast, the use of a metal oxide layer having low crystal-linity makes it possible that a high current flows in the transistor.

In the case where the metal oxide layer is formed by a sputtering method, the higher the substrate temperature (the stage temperature) in the formation is, the higher the crys-tallinity of the metal oxide layer can be. Furthermore, the higher the proportion of the flow rate of an oxygen gas to the total flow rate of the film formation gas (also referred to as an oxygen flow rate ratio) used in the formation is, the higher the crystallinity of the metal oxide layer can be.

The semiconductor layer 108 may have a stacked-layer structure of two or more metal oxide layers having different crystallinities. For example, a stacked-layer structure of a first metal oxide layer and a second metal oxide layer over the first metal oxide layer can be employed; the second metal oxide layer can include a region having higher crystallinity than the first metal oxide layer. Alternatively, the second metal oxide layer can include a region having lower crys-tallinity than the first metal oxide layer. In that case, the composition of the first metal oxide layer may be different from, the same as, or substantially the same as that of the second metal oxide layer.

The thickness of the semiconductor layer 108 is prefer-ably greater than or equal to 3 nm and less than or equal to 200 nm, further preferably greater than or equal to 3 nm and less than or equal to 100 nm, still further preferably greater than or equal to 5 nm and less than or equal to 100 nm, yet still further preferably greater than or equal to 10 nm and less than or equal to 100 nm, yet still further preferably greater than or equal to 10 nm and less than or equal to 70 nm, yet still further preferably greater than or equal to 15 nm and less than or equal to 70 nm, yet still further preferably greater than or equal to 15 nm and less than or equal to 50 nm, yet still further preferably greater than or equal to 20 nm and less than or equal to 50 nm.

In the case where the semiconductor layer 108 is formed using an oxide semiconductor, hydrogen contained in the oxide semiconductor reacts with oxygen bonded to a metal atom to be water, and thus sometimes forms an oxygen vacancy (Vo) in the oxide semiconductor. In some cases, a defect that is an oxygen vacancy into which hydrogen enters (hereinafter referred to as VoH) functions as a donor and generates an electron serving as a carrier. In other cases, bonding of part of hydrogen to oxygen bonded to a metal atom generates electrons serving as carriers. Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen in an oxide semiconductor might reduce the reliability of a transistor.

In the case where an oxide semiconductor is used for the semiconductor layer 108, the amount of VoH in the semiconductor layer 108 is preferably reduced as much as possible so that the semiconductor layer 108 becomes a highly purified intrinsic or substantially highly purified intrinsic semiconductor layer. In sufficiently reducing the amount of VoH in an oxide semiconductor, it is important to remove impurities such as water and hydrogen in the oxide semiconductor (which is sometimes described as dehydration or dehydrogenation treatment) and to repair oxygen vacancies by supplying oxygen to the oxide semiconductor. When an oxide semiconductor with a sufficiently reduced amount of impurities such as VoH is used for the channel formation region of the transistor, the transistor can have stable electrical characteristics. Note that repairing oxygen vacancies by supplying oxygen to an oxide semiconductor is sometimes referred to as oxygen adding treatment.

When an oxide semiconductor is used for the semiconductor layer 108, the carrier concentration of the oxide semiconductor in the region functioning as the channel formation region is preferably lower than or equal to $1\times10^{18}$ $cm^{-3}$, further preferably lower than $1\times10^{17}$ $cm^{-3}$, still further preferably lower than $1\times10^{16}$ $cm^{-3}$, yet still further preferably lower than $1\times10^{13}$ $cm^{-3}$, yet still further preferably lower than $1\times10^{12}$ $cm^{-3}$. The minimum carrier concentration of the oxide semiconductor in the region functioning as the channel formation region is not limited and can be $1\times10^{-9}$ $cm^{-3}$, for example.

A transistor including an oxide semiconductor (hereinafter referred to as an OS transistor) has much higher field-effect mobility than a transistor including amorphous silicon. In addition, the OS transistor has an extremely low off-state current, and charge accumulated in a capacitor that is connected in series to the transistor can be held for a long period. Furthermore, a semiconductor device can have lower power consumption by including the OS transistor.

A change in electrical characteristics of an OS transistor due to irradiation with radiation is small, i.e., an OS transistor has high resistance to radiation; thus, an OS transistor can be suitably used even in an environment where radiation can enter. It can also be said that an OS transistor has high reliability against radiation. For example, an OS transistor can be suitably used for a pixel circuit of an X-ray flat panel detector. Moreover, an OS transistor can be suitably used for a semiconductor device used in space. Examples of radiation include electromagnetic radiation (e.g., X-rays and gamma rays) and particle radiation (e.g., alpha rays, beta rays, a proton beam, and a neutron beam).

Examples of silicon that can be used for the semiconductor layer 108 include single crystal silicon, polycrystalline silicon, microcrystalline silicon, and amorphous silicon. An example of polycrystalline silicon is low-temperature polysilicon (LTPS).

The transistor including amorphous silicon in the semiconductor layer 108 can be formed over a large-sized glass substrate, thereby reducing the manufacturing cost. The transistor including polycrystalline silicon in the semiconductor layer 108 has high field-effect mobility and enables high-speed operation. The transistor including microcrystalline silicon in the semiconductor layer 108 has higher field-effect mobility and enables higher speed operation than the transistor including amorphous silicon.

The semiconductor layer 108 may include a layered material functioning as a semiconductor. The layered material generally refers to a group of materials having a layered crystal structure. In the layered crystal structure, layers formed by covalent bonding or ionic bonding are stacked with bonding such as the van der Waals binding, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for the channel formation region, the transistor can have a high on-state current.

Examples of the layered material include graphene, silicene, and chalcogenide. Chalcogenide is a compound containing chalcogen (an element belonging to Group 16). Examples of chalcogenide include transition metal chalcogenide and chalcogenide of Group 13 elements. Specific examples of the transition metal chalcogenide which can be used for a semiconductor layer of a transistor include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

[Conductive Layers 112a, 112b, and 104]

The conductive layers 112a, 112b, and 104 may each have a single-layer structure or a stacked-layer structure of two or more layers. The conductive layers 112a, 112b, and 104 can each be formed using, for example, one or more of chromium, copper, aluminum, gold, silver, zinc, tantalum, titanium, tungsten, manganese, nickel, iron, cobalt, molybdenum, and niobium, or an alloy containing one or more of these metals as its components. For the conductive layers 112a, 112b, and 104, a conductive material with low resistance that contains one or more of copper, silver, gold, and aluminum can be suitably used. Copper or aluminum is particularly preferable because of its high mass-productivity.

For the conductive layers 112a, 112b, and 104, a conductive metal oxide (also referred to as an oxide conductor) can be used. Examples of an oxide conductor (OC) include indium oxide, zinc oxide, In—Sn oxide (ITO), In—Zn oxide, In—W oxide, In—W—Zn oxide, In—Ti oxide, In—Ti—Sn oxide, In—Sn—Si oxide (also referred to as ITO containing silicon or ITSO), zinc oxide to which gallium is added, and In—Ga—Zn oxide. A conductive oxide containing indium is particularly preferable because of its high conductivity.

When an oxygen vacancy is formed in a metal oxide having semiconductor characteristics and hydrogen is added to the oxygen vacancy, a donor level is formed in the vicinity of the conduction band. As a result, the conductivity of the metal oxide is increased, and thus, the metal oxide becomes a conductor. The metal oxide having become a conductor can be referred to as an oxide conductor.

The conductive layers 112a, 112b, and 104 may each have a stacked-layer structure of a conductive film containing the above-described oxide conductor (metal oxide) and a conductive film containing a metal or an alloy. The use of the conductive film containing a metal or an alloy can reduce the wiring resistance.

A Cu—X alloy film (X is Mn, Ni, Cr, Fe, Co, Mo, Ta, or Ti) may be used for the conductive layers 112a, 112b, and 104. The use of a Cu—X alloy film results in lower manufacturing cost because the film can be processed by wet etching.

Note that the conductive layers 112a, 112b, and 104 may be formed using the same material or at least one of the conductive layers 112a, 112b, and 104 may be formed using a material different from the material used for the other layer(s).

Each of the conductive layers 112a and 112b includes a portion that is in contact with the semiconductor layer 108. When the semiconductor layer 108 is formed using an oxide semiconductor and the conductive layer 112a or 112b is formed using a metal that is likely to be oxidized such as aluminum, an insulating oxide (e.g., aluminum oxide) is formed between the conductive layer 112a or 112b and the semiconductor layer 108, which might inhibit continuity between the conductive layer 112a or 112b and the semiconductor layer 108. Therefore, the conductive layers 112a and 112b are preferably formed using a conductive material that is less likely to be oxidized, a conductive material that maintains low electric resistance even when oxidized, or an oxide conductive material.

For the conductive layers 112a and 112b, for example, titanium, tantalum nitride, titanium nitride, a nitride containing titanium and aluminum, a nitride containing tantalum and aluminum, ruthenium, ruthenium oxide, ruthenium nitride, an oxide containing strontium and ruthenium, or an oxide containing lanthanum and nickel is preferably used. These materials are preferable because they are conductive materials that are less likely to be oxidized or materials that maintain the conductivity even when oxidized. Note that in the case where the conductive layer 112a or 112b has a stacked-layer structure, at least the layer thereof that is in contact with the semiconductor layer 108 is preferably formed using a conductive material that is less likely to be oxidized.

The conductive layers 112a and 112b can each be formed using any of the above-described oxide conductors. Specifically, a conductive oxide such as indium oxide, zinc oxide, ITO, In—Zn oxide, In—W oxide, In—W—Zn oxide, In—Ti oxide, In—Ti—Sn oxide, In—Sn oxide containing silicon, or zinc oxide to which gallium is added can be used.

For the conductive layers 112a and 112b, a nitride conductor may be used. Examples of the nitride conductor include tantalum nitride and titanium nitride.

For example, the conductive layers 112a and 112b can each have a single-layer structure of an oxide conductor film, a stacked-layer structure of a metal film and an oxide conductor film, or a stacked-layer structure of metal films. Examples of the oxide conductor film include an ITSO film. The metal film may have, for example, a single-layer structure of a tungsten film, a single-layer structure of a titanium film, a single-layer structure of a copper film, or a three-layer structure of a titanium film, an aluminum film, and a titanium film.

It is preferable that the conductive layers 112a and 112b be each formed using an ITSO film, for example. It is preferable that the conductive layer 104 have a three-layer structure of a titanium film, an aluminum film, and a titanium film, for example.

[Insulating Layer 106]

The insulating layer 106 may have a single-layer structure or a stacked-layer structure of two or more layers. The insulating layer 106 preferably includes one or more inorganic insulating films. Examples of the inorganic insulating film include an oxide insulating film, a nitride insulating film, an oxynitride insulating film, and a nitride oxide insulating film. Specific examples of these inorganic insulating films are as described above.

The insulating layer 106 includes a portion that is in contact with the semiconductor layer 108. In the case where the semiconductor layer 108 is formed using an oxide semiconductor, at least the film of the insulating layer 106 that is in contact with the semiconductor layer 108 is preferably any of the above-described oxide insulating films and oxynitride insulating films. A film from which oxygen is released by heating is further preferably used for the insulating layer 106.

Specifically, in the case where the insulating layer 106 has a single-layer structure, the insulating layer 106 is preferably formed using a silicon oxide film or a silicon oxynitride film.

The insulating layer 106 can have a stacked-layer structure of an oxide insulating film or an oxynitride insulating film that is in contact with the semiconductor layer 108 and a nitride insulating film or a nitride oxide insulating film that is in contact with the conductive layer 104. As the oxide insulating film or the oxynitride insulating film, for example, a silicon oxide film or a silicon oxynitride film is preferably used. As the nitride insulating film or the nitride oxide insulating film, a silicon nitride film or a silicon nitride oxide film is preferably used.

A silicon nitride film and a silicon nitride oxide film are suitable for the insulating layer 106 because they release fewer impurities (e.g., water and hydrogen) and are less likely to transmit oxygen and hydrogen. Inhibiting diffusion of impurities from the insulating layer 106 to the semiconductor layer 108 results in favorable electrical characteristics and high reliability of the transistor.

A miniaturized transistor including a thin gate insulating layer may have a high leakage current. When a high dielectric constant material (also referred to as a high-k material) is used for the gate insulating layer, the voltage at the time of operation of the transistor can be reduced while the physical thickness is maintained. Examples of the high-k material usable for the insulating layer 106 include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

[Substrate 102]

There is no particular limitation on the properties of the material of the substrate 102 as long as the material has heat resistance high enough to withstand at least heat treatment to be performed later. For example, a single crystal semiconductor substrate or a polycrystalline semiconductor substrate of silicon or silicon carbide, a compound semiconductor substrate of silicon germanium or the like, an SOI substrate, a glass substrate, a ceramic substrate, a quartz substrate, a sapphire substrate, a ceramic substrate, or an organic resin substrate may be used as the substrate 102. The substrate 102 may be provided with a semiconductor element. Note that the shape of the semiconductor substrate and an insulating substrate may be circular or square.

A flexible substrate may be used as the substrate 102, and the transistor 100 and the like may be formed directly on the flexible substrate. Alternatively, a separation layer may be provided between the substrate 102 and the transistor 100 and the like. The separation layer can be used for separation of part or the whole of a semiconductor device completed thereover from the substrate 102 and transferring the part or the whole of the semiconductor device onto another substrate. In that case, the transistor 100 and the like can be transferred onto a substrate having low heat resistance or a flexible substrate as well.

[Variation Example of Transistor 100]

FIG. 5A to FIG. 11C show variation examples of the transistor 100.

[Transistor 100A]

Figures 5A, 5B, 5C:
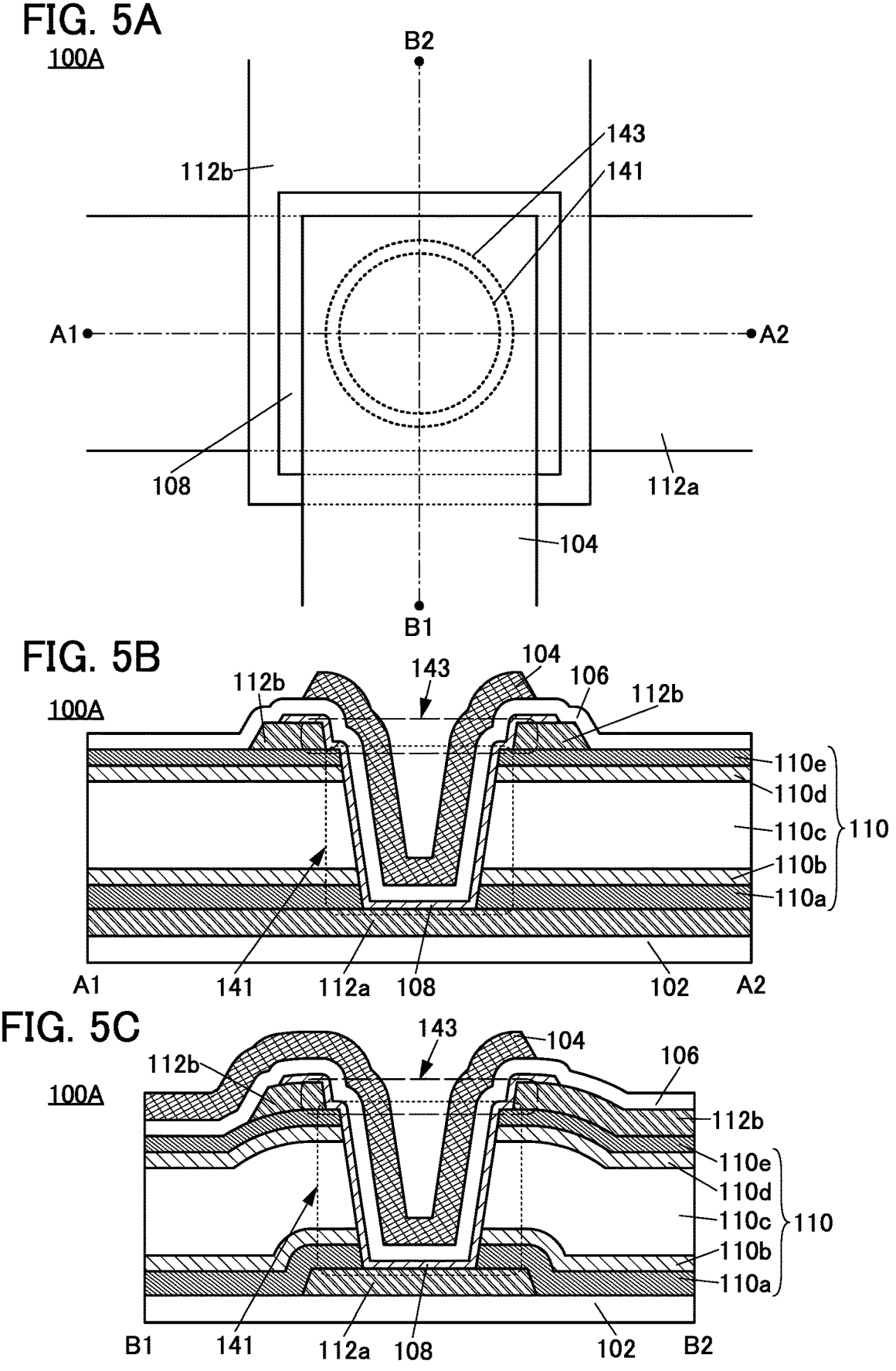
FIG. 5A is a top view showing an example of a semiconductor device.
FIGS. 5B and 5C are cross-sectional views showing the example of the semiconductor device.

FIG. 5A is a top view of the transistor 100A. FIG. 5B is a cross-sectional view along dashed-dotted line A1-A2 in FIG. 5A. FIG. 5C is a cross-sectional view along dashed-dotted line B1-B2 in FIG. 5A.

The transistor 100A is different from the transistor 100 mainly in that the opening 143 is larger than the opening 141 in a top view.

The end portion of the conductive layer 112b on the opening 143 side is located outward from the end portion of the insulating layer 110 on the opening 141 side.

The semiconductor layer 108 is in contact with the top surface and the side surface of the conductive layer 112b, the top surface and the side surface of the insulating layer 110e, the side surface of the insulating layer 110d, the side surface of the insulating layer 110c, the side surface of the insulating layer 110b, the side surface of the insulating layer 110a, and the top surface of the conductive layer 112a.

In the transistor 100A, the step height of the formation surface of the semiconductor layer 108 can be smaller and the coverage with the semiconductor layer 108 can be more favorable than in the transistor 100 in some cases.

[Transistor 100B]

Figures 6A, 6B, 6C:
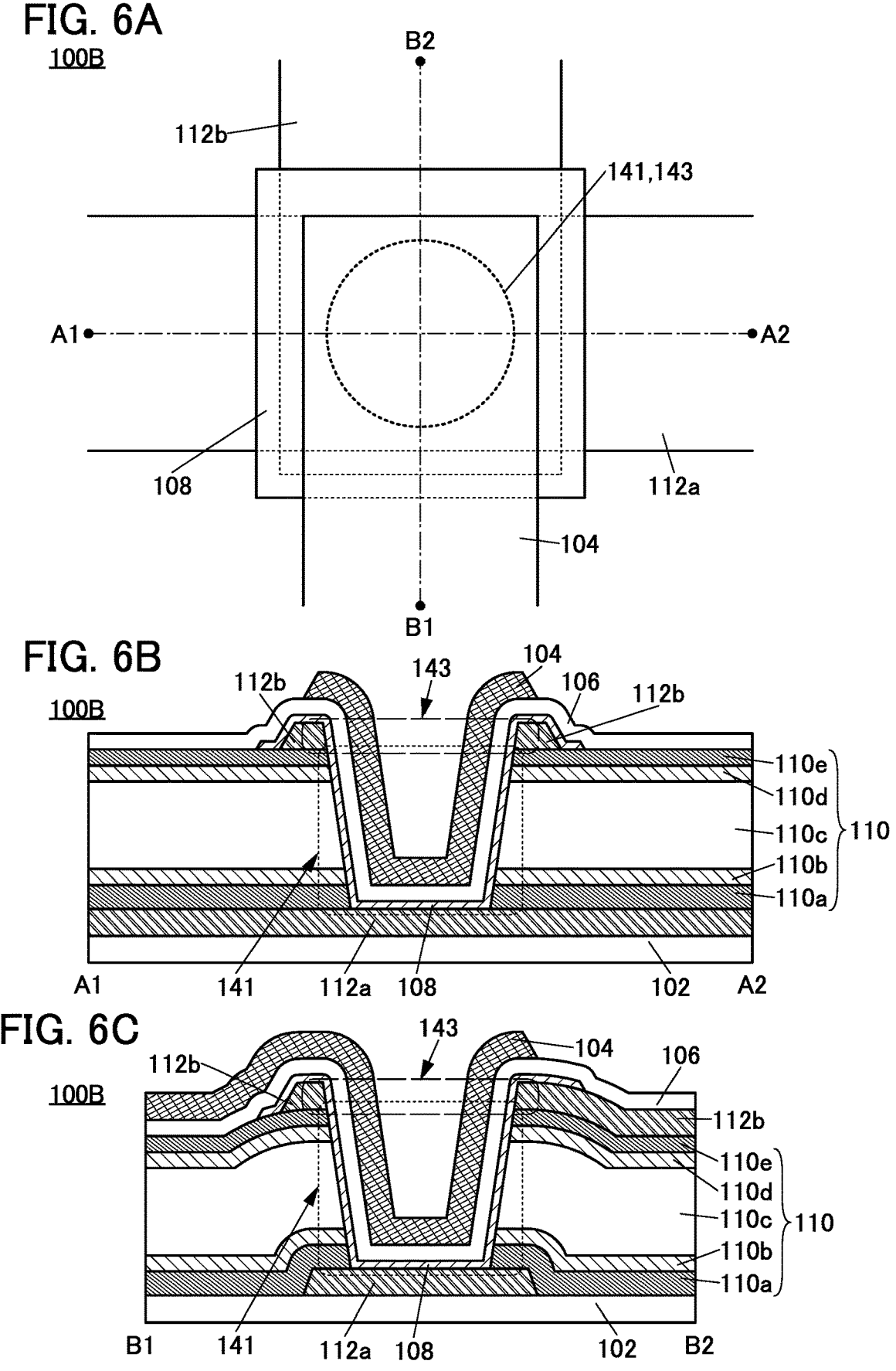
FIG. 6A is a top view showing an example of a semiconductor device.
FIGS. 6B and 6C are cross-sectional views showing the example of the semiconductor device.

FIG. 6A is a top view of the transistor 100B. FIG. 6B is a cross-sectional view taken along dashed-dotted line A1-A2 in FIG. 6A and FIG. 6C is a cross-sectional view taken along dashed-dotted line B1-B2 in FIG. 6A.

The transistor 100B is different from the transistor 100 in that the semiconductor layer 108 is in contact with the side surface of the conductive layer 112b on the side not facing the opening 143 (the side opposite to the opening 143).

There is no particular limitation on the top-view shapes and sizes of the semiconductor layer 108 and the conductive layer 112b. The end portion of the semiconductor layer 108 may be aligned with an end portion of the conductive layer 112b, located inward from the end portion of the conductive layer 112b, or located outward from the end portion of the conductive layer 112b.

As shown in FIG. 6B, the semiconductor layer 108 of the transistor 100B covers the side surface of the conductive layer 112b on the side not facing the opening 143. The end portion of the semiconductor layer 108 is located outward from the end portion of the conductive layer 112b and is in contact with the top surface of the insulating layer 110. On the left side in FIG. 6C, the end portion of the semiconductor layer 108 covers the end portion of the conductive layer 112b and is in contact with the top surface of the insulating layer 110. On the right side in FIG. 6C, the end portion of the semiconductor layer 108 is in contact with the top surface of the conductive layer 112b.

[Transistor 100C]

Figures 7A, 7B, 7C:
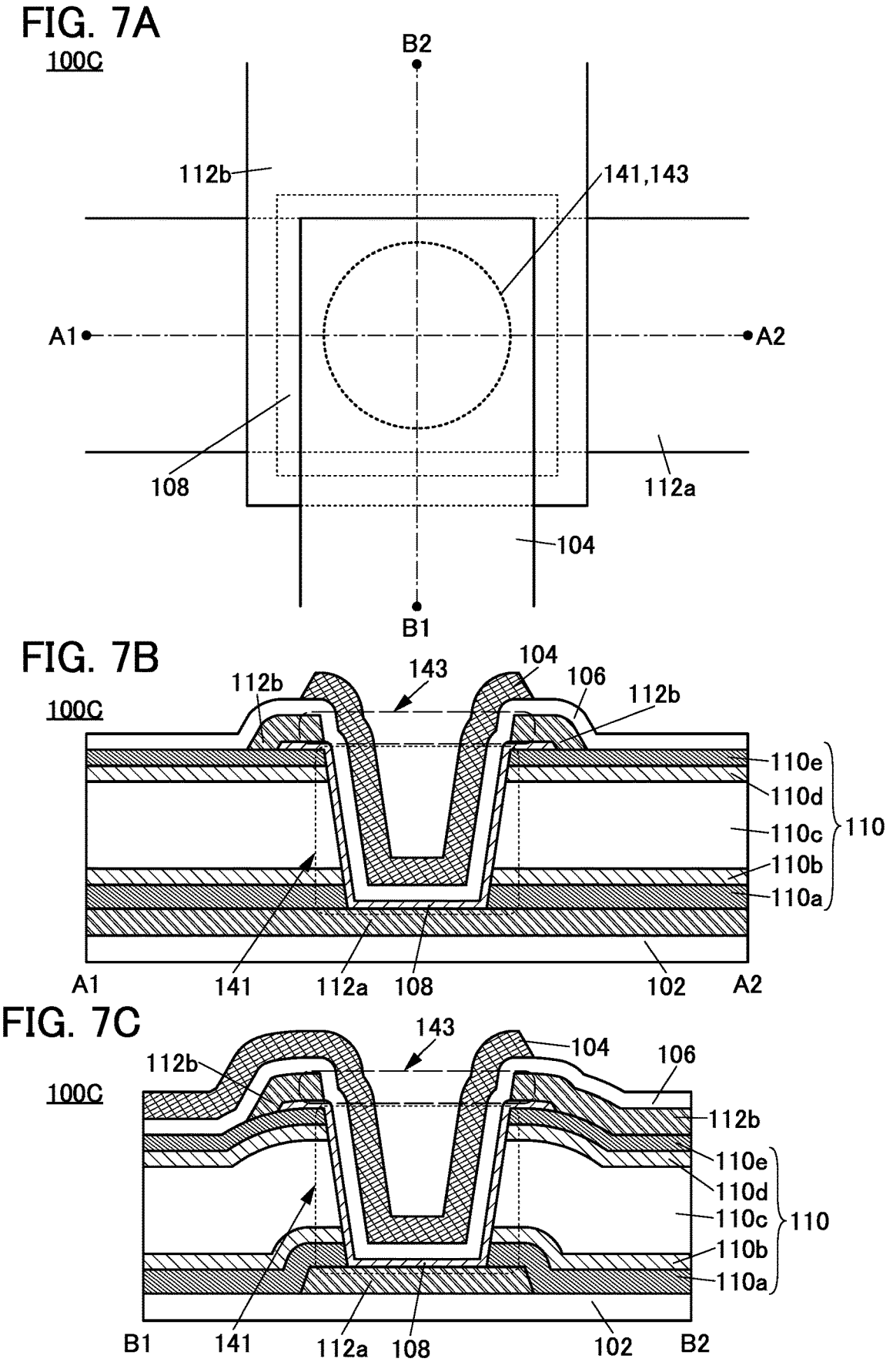
FIG. 7A is a top view showing an example of a semiconductor device.
FIGS. 7B and 7C are cross-sectional views showing the example of the semiconductor device.

FIG. 7A is a top view of a transistor 100C. FIG. 7B is a cross-sectional view taken along dashed-dotted line A1-A2 in FIG. 7A and FIG. 7C is a cross-sectional view taken along dashed-dotted line B1-B2 in FIG. 7A.

The transistor 100C is different from the transistor 100 in having a top-contact structure in which the conductive layer 112b is in contact with the top surface of the semiconductor layer.

As shown in FIG. 7B, the conductive layer 112b of the transistor 100C covers the top surface and the side surface of the semiconductor layer 108 positioned over the insulating layer 110 (the top surface and the side surface can also be regarded as the end portion of the semiconductor layer 108).

[Transistor 100D]

Figure 8A:
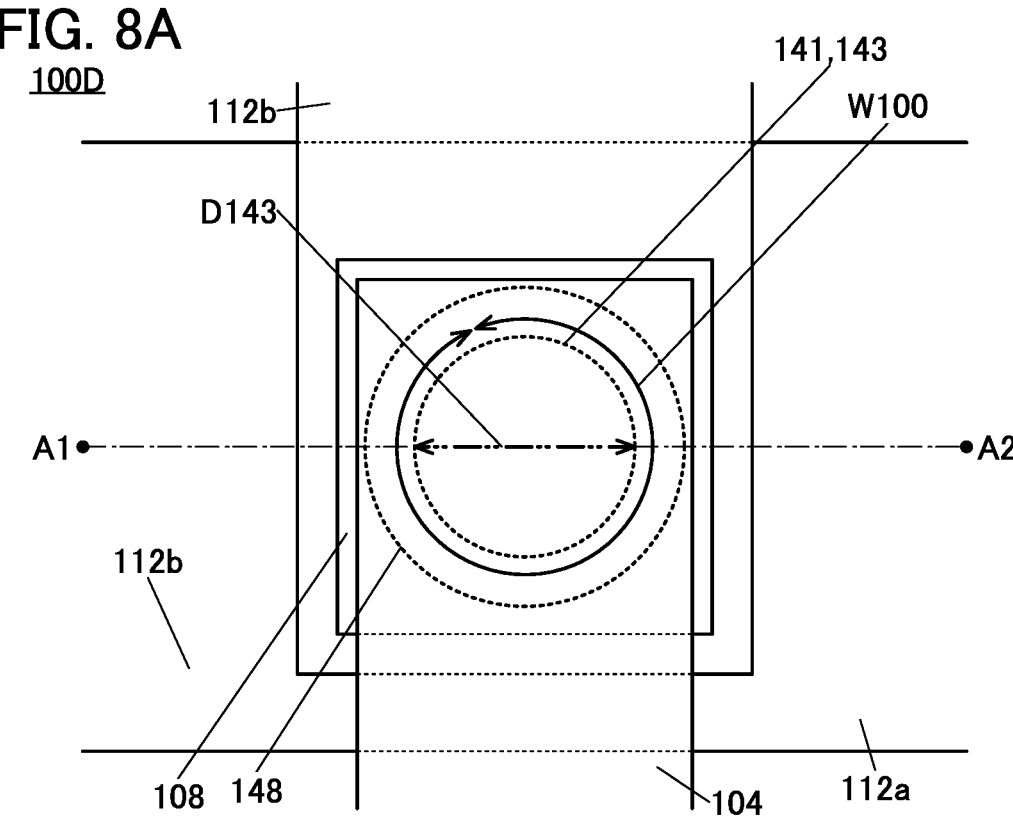
FIG. 8A is a top view showing an example of a semiconductor device.
Figure 8B:
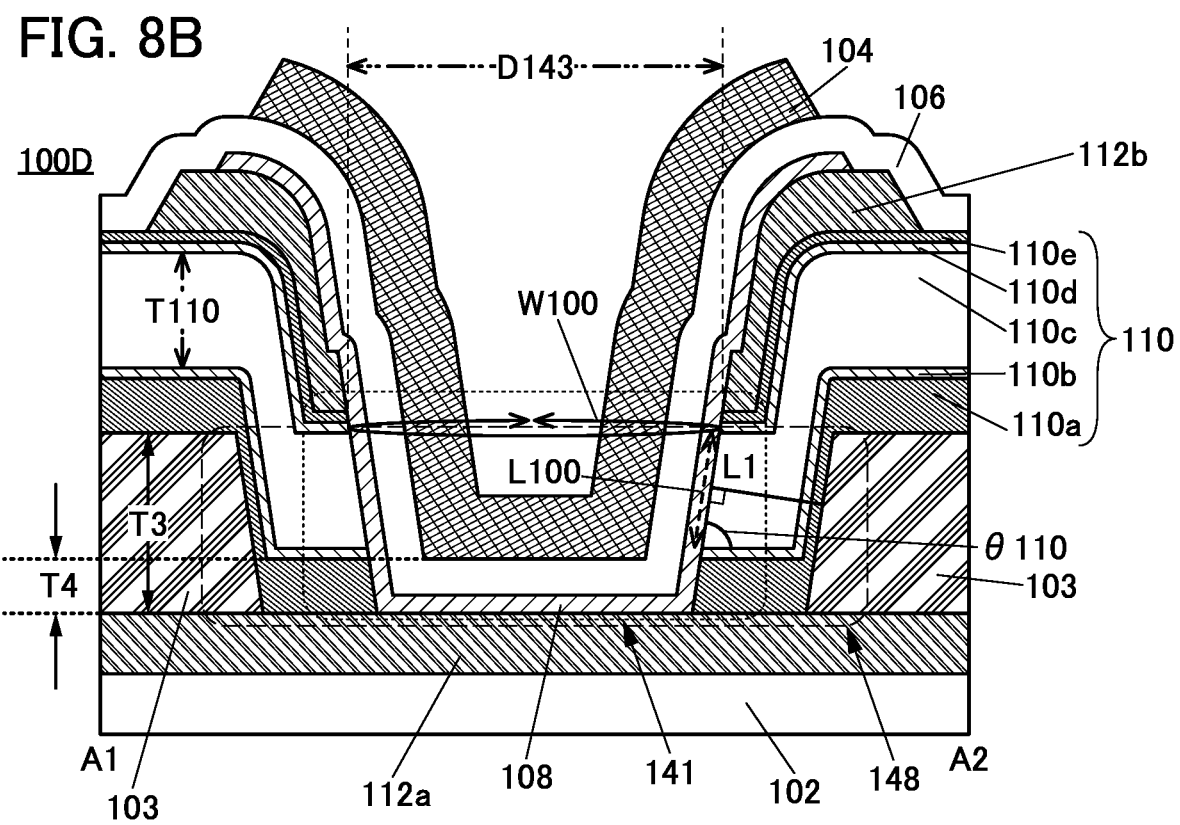
FIG. 8B is a cross-sectional view showing the example of the semiconductor device.

FIG. 8A is a top view of a transistor 100D. FIG. 8B is a cross-sectional view along dashed-dotted line A1-A2 in FIG. 8A.

The transistor 100D is different from the transistor 100 in that a conductive layer 103 is provided over the conductive layer 112a.

The conductive layer 103 is provided in contact with the top surface of the conductive layer 112a. The conductive layer 103 can function as an auxiliary wiring of the conductive layer 112a. The conductive layer 103 is provided with an opening 148 reaching the conductive layer 112a.

The insulating layer 110 is positioned over the substrate 102, the conductive layer 112a, and the conductive layer 103. The insulating layer 110 is provided to cover part of the opening 148. The insulating layer 110 is in contact with the conductive layer 112a in the opening 148. The opening 141 of the insulating layer 110, which reaches the conductive layer 112a, is positioned inside the opening 148.

It can be said that as shown in FIG. 8B, a thickness T3 of the conductive layer 103 is the shortest distance from the top surface of the conductive layer 112a to the top surface of the conductive layer 103. As shown in FIG. 8B, the thickness T3 of the conductive layer 103 is larger than a shortest distance T4 from the top surface of the conductive layer 112a to the bottom surface of the conductive layer 104 in the opening 141. That is, in a cross-sectional view, the bottom surface of the conductive layer 104 inside the opening 141 is at a lower level (is closer to the substrate 102) than the top surface of the conductive layer 103 is. Accordingly, a region of the semiconductor layer 108 overlaps with the conductive layer 104 with the insulating layer 106 provided between the region and the conductive layer 104, and overlaps with the conductive layer 103 with the insulating layer 110 provided between the region and the conductive layer 103. In other words, the conductive layer 103 can function as a back gate electrode (also referred to as a second gate electrode) of the transistor 100D. In this case, the insulating layer 110 functions as a back gate insulating layer (also referred to as a second gate insulating layer) of the transistor 100D.

Since the transistor 100D includes a back gate, the potential of the portion of the semiconductor layer 108 on the back gate side (also referred to as a back channel) can be fixed. Thus, the saturation of the $I_d$-$V_d$ characteristics of the transistor 100D can be improved.

Note that in this specification and the like, the state where the change in a current is small (i.e., the slope of the curve of the current is gentle) in the saturation region of the $I_d$-$V_d$ characteristics of a transistor is sometimes described using the expression "favorable saturation".

Since the back gate makes it possible to fix the potential of the back channel of the semiconductor layer, a negative shift of the threshold voltage of the transistor 100D can be inhibited. This can reduce a cutoff current, so that the transistor can have normally-off characteristics (i.e., the threshold voltage can have a positive value).

The conductive layer 103 and the conductive layer 112a, which are in contact with each other, are supplied with the same potential. The conductive layer 103, which functions as the back gate electrode, is preferably supplied with the lower of the source potential and the drain potential. Thus, in the case where the transistor 100D is an n-channel transistor, it is preferable that the conductive layer 112a function as a source electrode and the conductive layer 112b function as a drain electrode. In the case where the transistor 100D is a p-channel transistor, it is preferable that the conductive layer 112a function as the drain electrode and the conductive layer 112b function as the source electrode.

There is no limitation on the top-view shape of the opening 148. Note that the top-view shape of the opening 148 refers to the shape of the end portion of the top or bottom surface of the conductive layer 103 on the opening 148 side.

In the semiconductor layer 108, the region in contact with the conductive layer 112a functions as one of a source region and a drain region, and the region in contact with the conductive layer 112b functions as the other of the source region and the drain region. In the semiconductor layer 108, the region that is in contact with the insulating layer 110a and the region that is in contact with the insulating layer 110e each function as a low-resistance region, and the region that is in contact with the insulating layer 110c functions as a channel formation region.

In FIG. 8B, the channel length L100 of the transistor 100D is indicated by a dashed double-headed arrow. It can be said that in a cross-sectional view, the channel length L100 is the shortest distance between the portion of the semiconductor layer 108 that is in contact with the insulating layer 110b and the portion of the semiconductor layer 108 that is in contact with the insulating layer 110d.

The channel length L100 of the transistor 100D corresponds to the length of the side surface of the insulating layer 110c on the opening 141 side in a cross-sectional view. In the case where the region of the semiconductor layer 108 that is in contact with the insulating layer 110b and the region of the semiconductor layer 108 that is in contact with the insulating layer 110d are included in the channel formation region, the channel length L100 of the transistor 100D corresponds to the sum of the lengths of the side surfaces of the insulating layers 110b, 110c, and 110d on the opening 141 side in a cross-sectional view.

In general, a transistor with a short channel length tends to have poor saturation of $I_d$-$V_d$ characteristics; however, the transistor 100D can have favorable saturation despite its short channel length L100 because of including the back gate.

The favorable ranges of the values of the channel length L100, the thickness T110, the angle θ110, and the diameter D143 are as described above.

The thickness T3 of the conductive layer 103 is preferably 0.5 or more times the channel length L100, further preferably 1.0 or more times the channel length L100, still further preferably more than 1.0 times the channel length L100. In that case, a wider region of the semiconductor layer 108 overlaps with the conductive layer 104 with the insulating layer 106 provided between the region and the conductive layer 104, and overlaps with the conductive layer 103 with the insulating layer 110 provided between the region and the conductive layer 103. As a result, the electric field applied to the back channel of the semiconductor layer 108 can be controlled more reliably.

In a region of the transistor 100D, the conductive layer 103, the insulating layer 110, the semiconductor layer 108, the insulating layer 106, and the conductive layer 104 are stacked in this order in one direction with no any other layer provided between these layers. The one direction can be perpendicular to the channel length L100 direction. When the above region is wide, the electric field applied to the back channel of the semiconductor layer 108 can be controlled more reliably.

A distance L1, which is the shortest distance between the conductive layer 103 and the semiconductor layer 108, is preferably shorter than the channel length L100, further preferably 0.5 or less times the channel length L100, still further preferably 0.1 or less times the channel length L100. The shorter the distance between the conductive layer 103 and the semiconductor layer 108 is, the more favorable the saturation of the $I_d$-$V_d$ characteristics of the transistor 100D can be.

In a cross-sectional view, the shortest distance between the conductive layer 103 and the semiconductor layer 108 on the left side of the opening (the opening 141) of the insulating layer 110 may be different from the shortest distance between the conductive layer 103 and the semiconductor layer 108 on the right side of the opening of the insulating layer 110. In that case, the distance L1 is in the above-described range preferably on at least one of the left side and the right side of the opening, further preferably on both the left side and the right side of the opening. In a freely selected cross section, the shortest distance between the conductive layer 103 and the semiconductor layer 108 on the left side of the opening is preferably greater than or equal to 50% and less than or equal to 150%, further preferably greater than or equal to 30% and less than or equal to 130%, still further preferably greater than or equal to 10% and less than or equal to 110% of the shortest distance on the right side of the opening.

The conductive layer 103 may have a single-layer structure or a stacked-layer structure of two or more layers. The conductive layer 103 can be formed using the material that can be used for the conductive layer 112a, the conductive layer 112b, and the conductive layer 104.

The conductive layer 103 is preferably formed using a material having higher electrical conductivity than the conductive layer 112a. In that case, the conductive layer 103 can effectively function as the auxiliary wiring of the conductive layer 112a. For the conductive layer 103, one or more of copper, aluminum, titanium, tungsten, and molybdenum or an alloy containing one or more of these metals as its components can be suitably used, for example.

For example, it is preferable that the conductive layer 112a be formed using an ITSO film and the conductive layer 103 be formed using a tungsten film or a molybdenum film.

[Transistor 100E]

Figure 9A:
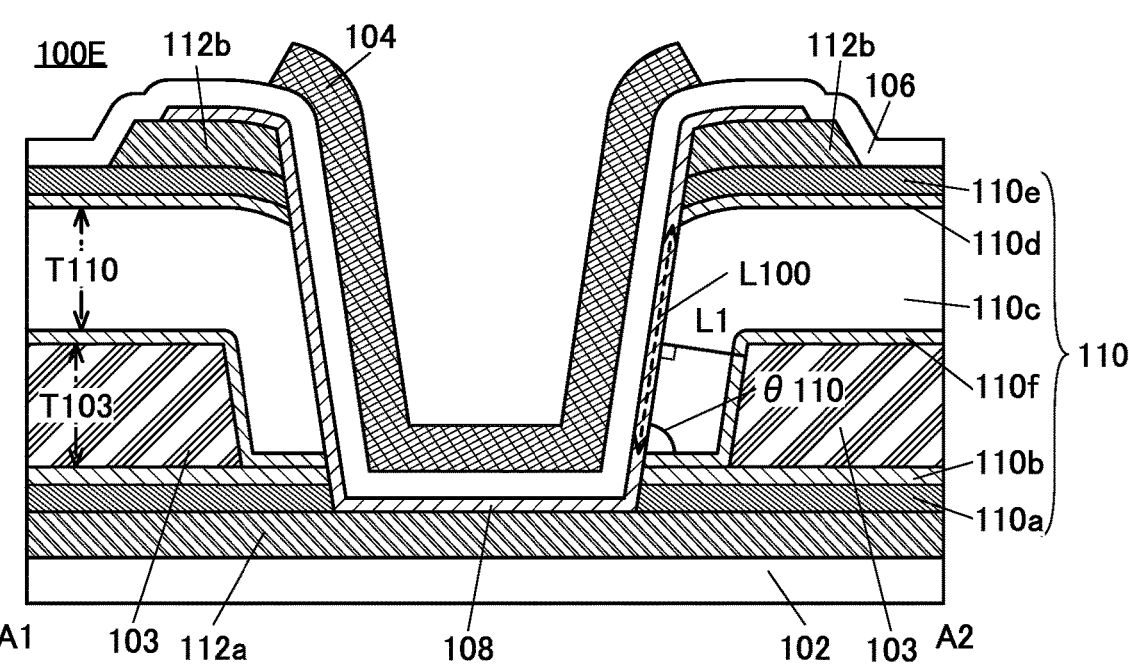
FIGS. 9A and 9B are cross-sectional views each showing an example of a semiconductor device.

FIG. 9A is a cross-sectional view of a transistor 100E. FIG. 9A is a cross-sectional view along dashed-dotted line A1-A2 in FIG. 8A.

The transistor 100E is different from the transistor 100D mainly in that the conductive layer 103 is electrically insulated from the conductive layer 112a and that the insulating layer 110 has a six-layer structure.

The conductive layer 103 is positioned over the insulating layer 110b. The conductive layer 112a and the conductive layer 103 are electrically insulated from each other by the insulating layer 110a and the insulating layer 110b. The conductive layer 103 is provided with an opening in a position overlapping with the conductive layer 112a.

The insulating layer 110 includes the insulating layer 110a over the conductive layer 112a, the insulating layer 110b over the insulating layer 110a, an insulating layer 110f over the insulating layer 110b and the conductive layer 103, the insulating layer 110c over the insulating layer 110f, the insulating layer 110d over the insulating layer 110c, and the insulating layer 110e over the insulating layer 110d.

The insulating layer 110f covers the top surface and the side surface of the conductive layer 103. The insulating layer 110f is provided to cover part of the opening provided in the conductive layer 103. The insulating layer 110f is in contact with the insulating layer 110b in the opening.

The structure of the insulating layer 110f is preferably similar to that of the insulating layer 110a, 110b, or 110d. Specifically, the insulating layer 110f is preferably formed using a film that does not easily allow diffusion of oxygen. The insulating layer 110f is preferably formed using a film that does not easily allow diffusion of hydrogen.

In the transistor 100E, a region of the semiconductor layer 108 overlaps with the conductive layer 104 with the insulating layer 106 provided between the region and the conductive layer 104 and overlaps with the conductive layer 103 with part (specifically, the insulating layers 110f and 110c) of the insulating layer 110 provided between the region and the conductive layer 103. In other words, the region of the semiconductor layer 108 is held between the conductive layer 104 and the conductive layer 103 with the insulating layer 106 provided between the region and the conductive layer 104 and with part (specifically, the insulating layers 110f and 110c) of the insulating layer 110 provided between the region and the conductive layer 103.

The conductive layer 103 functions as a back gate electrode of the transistor 100E. Part of the insulating layer 110 functions as a back gate insulating layer of the transistor 100E.

Since the transistor 100E includes the back gate electrode, the potential of a back channel of the semiconductor layer 108 can be fixed, so that the saturation of the $I_d$-$V_d$ characteristics of the transistor 100E can be improved.

Since the back gate electrode makes it possible to fix the potential of the back channel of the semiconductor layer 108, a negative shift of the threshold voltage of the transistor 100E can be inhibited. Thus, the transistor can have normally-off characteristics.

In the example shown in FIG. 9A, the thickness of the insulating layer 110b is uniform without varying from place to place. Note that the thickness of the insulating layer 110b in the region overlapping with the conductive layer 103 is sometimes different from the thickness of the insulating layer 110b in the region not overlapping with the conductive layer 103. For example, the insulating layer 110b in the region not overlapping with the conductive layer 103 is sometimes partly removed to have a reduced thickness at the time of processing of a film to be the conductive layer 103.

In the semiconductor layer 108, at least the region that is in contact with the insulating layer 110c functions as a channel formation region. In this embodiment, the region of the semiconductor layer 108 that is in contact with the insulating layer 110f is described as not being included in the channel formation region; however, this region may be included in the channel formation region.

In FIG. 9A, the channel length L100 of the transistor 100E is indicated by a dashed double-headed arrow. It can be said that in a cross-sectional view, the channel length L100 is the shortest distance between the portion of the semiconductor layer 108 that is in contact with the insulating layer 110f and the portion of the semiconductor layer 108 that is in contact with the insulating layer 110d.

As shown in FIG. 9A, the channel length L100 is sometimes affected by a thickness T103 of the conductive layer 103, depending on the distance L1 between the conductive layer 103 and the semiconductor layer 108.

The channel length L100 of the transistor 100E corresponds to the length of the side surface of the insulating layer 110c on the opening 141 side in a cross-sectional view. When the conductive layer 103 is close to the semiconductor layer 108 (i.e., when the distance L1 is short), the channel length L100 may be large, being affected by the thickness of the conductive layer 103. Thus, the channel length L100 can be 1 or more times the thickness T110, 1.5 or more times the thickness T110, or 2 or more times the thickness T110.

[Transistor 100F]

Figure 9B:
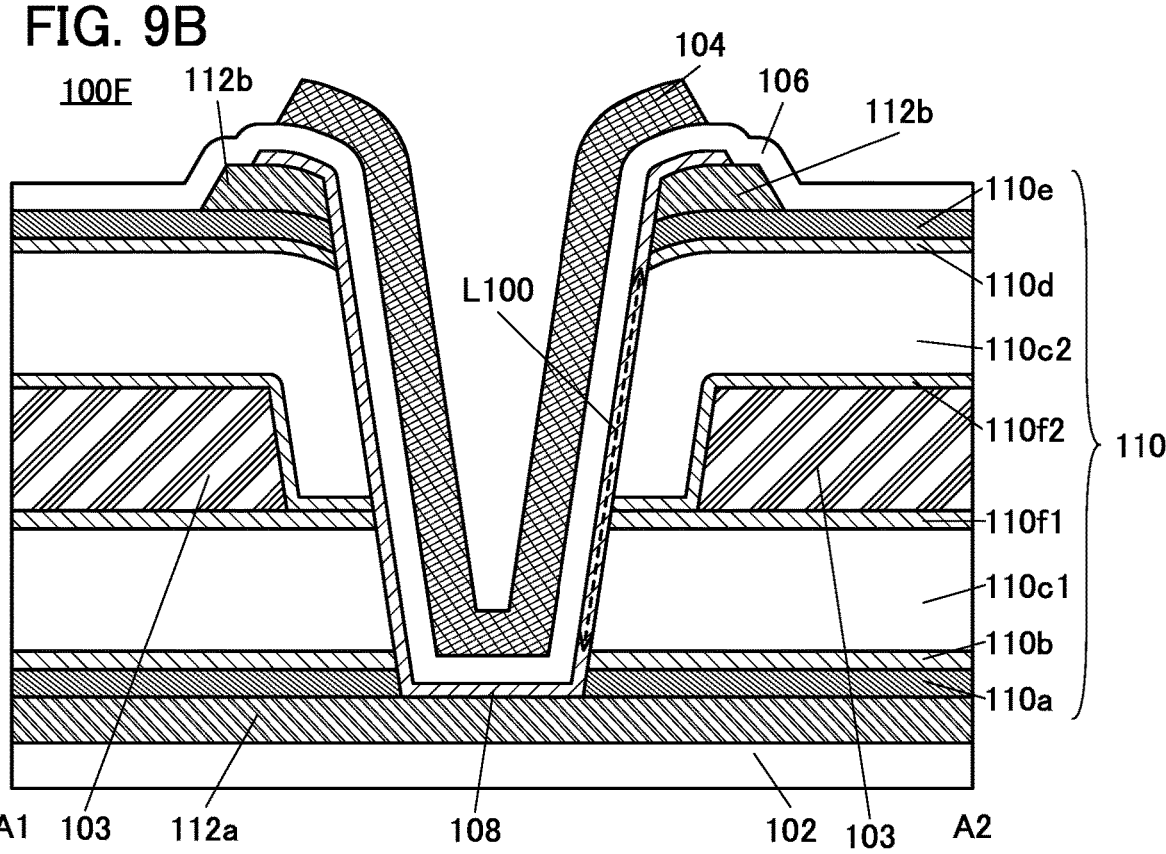

FIG. 9B is a cross-sectional view of a transistor 100F. FIG. 9B is a cross-sectional view along dashed-dotted line A1-A2 in FIG. 8A.

The transistor 100F is different from the transistor 100E mainly in that the insulating layer 110 has an eight-layer structure.

The insulating layer 110 includes the insulating layer 110a over the conductive layer 112a, the insulating layer 110b over the insulating layer 110a, an insulating layer 110c1 over the insulating layer 110b, an insulating layer 110f1 over the insulating layer 110c1, an insulating layer 110f2 over the insulating layer 110f1 and the conductive layer 103, an insulating layer 110c2 over the insulating layer 110f2, the insulating layer 110d over the insulating layer 110c2, and the insulating layer 110e over the insulating layer 110d.

The structures of the insulating layers 110c1 and 110c2 can each be similar to the structure applicable to the insulating layer 110c. Specifically, it is preferable that each of the insulating layers 110c1 and 110c2 contain oxygen and include a region having a higher oxygen content than at least one of the insulating layers 110a, 110b, 110d, 110e, 110f1, and 110f2.

The structures of the insulating layers 110f1 and 110f2 can each be similar to the structure applicable to the insulating layer 110f. Specifically, each of the insulating layers 110f1 and 110f2 is preferably formed using a film that does not easily allow diffusion of oxygen. Each of the insulating layers 110f1 and 110f2 is preferably formed using a film that does not easily allow diffusion of hydrogen.

To each of the insulating layers 110a, 110b, 110d, and 110e, the above-described structure can be applied.

It can be said that in FIG. 9B, the channel length L100 is the shortest distance between the portion of the semiconductor layer 108 that is in contact with the insulating layer 110b and the portion of the semiconductor layer 108 that is in contact with the insulating layer 110d.

In the above-described structure, the upper part and the lower part of the insulating layer 110 can be symmetric with respect to the conductive layer 103. Furthermore, both the insulating layer 110c1 and the insulating layer 110c2 can supply oxygen to the semiconductor layer 108; thus, the transistor can have improved characteristics.

[Transistor 100G]

Figure 10A:
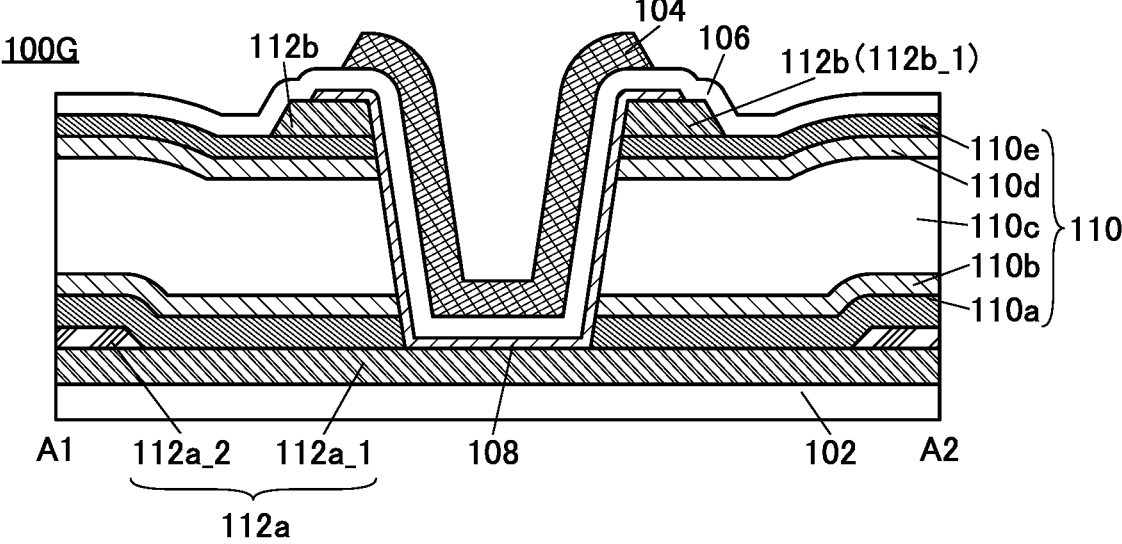
FIGS. 10A and 10B are cross-sectional views showing an example of a semiconductor device.
Figure 10B:
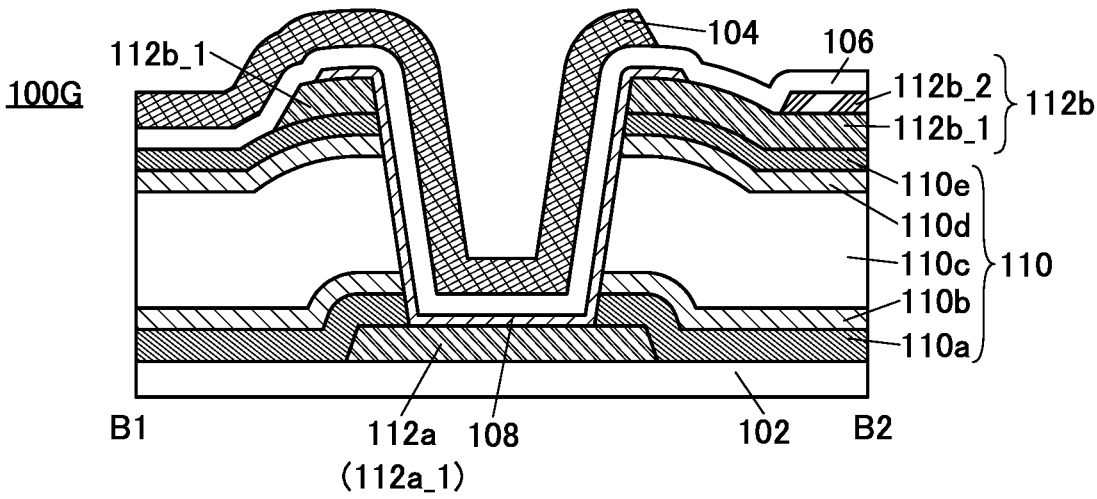

FIGS. 10A and 10B are cross-sectional views of a transistor 100G. FIG. 10A is a cross-sectional view taken along dashed-dotted line A1-A2 in FIG. 1A and FIG. 10B is a cross-sectional view taken along dashed-dotted line B1-B2 in FIG. 1A.

The transistor 100G is different from the transistor 100 in that the conductive layer 112a has a stacked-layer structure of a conductive layer 112a_1 and a conductive layer 112a_2 over the conductive layer 112a_1 and that the conductive layer 112b has a stacked-layer structure of a conductive layer 112b_1 and a conductive layer 112b_2 over the conductive layer 112b_1.

Each of the conductive layer 112a_1 and the conductive layer 112b_1 is provided to be in contact with the semiconductor layer 108. The conductive layer 112a_1 functions as one of a source electrode and a drain electrode of the transistor 100G and the conductive layer 112b_1 functions as the other of the source electrode and the drain electrode of the transistor 100G.

Each of the conductive layer 112a_2 and the conductive layer 112b_2 is provided so as not to be in contact with the semiconductor layer 108. The conductive layer 112a_2 and the conductive layer 112b_2 can each function as a wiring or an auxiliary wiring.

In the case where the semiconductor layer 108 is formed using an oxide semiconductor, the conductive layer 112a_1 and the conductive layer 112b_1, which are in contact with the semiconductor layer 108, are preferably formed using a material capable of maintaining conductivity even after being oxidized, such as an oxide conductor.

Meanwhile, to function as a wiring, each of the conductive layer 112a and the conductive layer 112b is preferably formed using a metal, an alloy, or any other material whose resistance is lower than that of an oxide conductor. In view of this, the conductive layer 112a_2 is preferably formed using a metal, an alloy, or any other material whose electrical conductivity is higher than that of the conductive layer 112a_1. Likewise, the conductive layer 112b_2 is preferably formed using a metal, an alloy, or any other material whose electrical conductivity is higher than that of the conductive layer 112b_1.

Note that the present invention is not limited to the exemplary transistor 100G in which each of the conductive layer 112a and the conductive layer 112b has a stacked-layer structure. In a transistor of one embodiment of the present invention, the conductive layer 112a may have a single-layer structure and the conductive layer 112b may have a stacked-layer structure. In a transistor of one embodiment of the present invention, the conductive layer 112a may have a stacked-layer structure and the conductive layer 112b may have a single-layer structure.

[Transistor 100H]

Figure 11A:
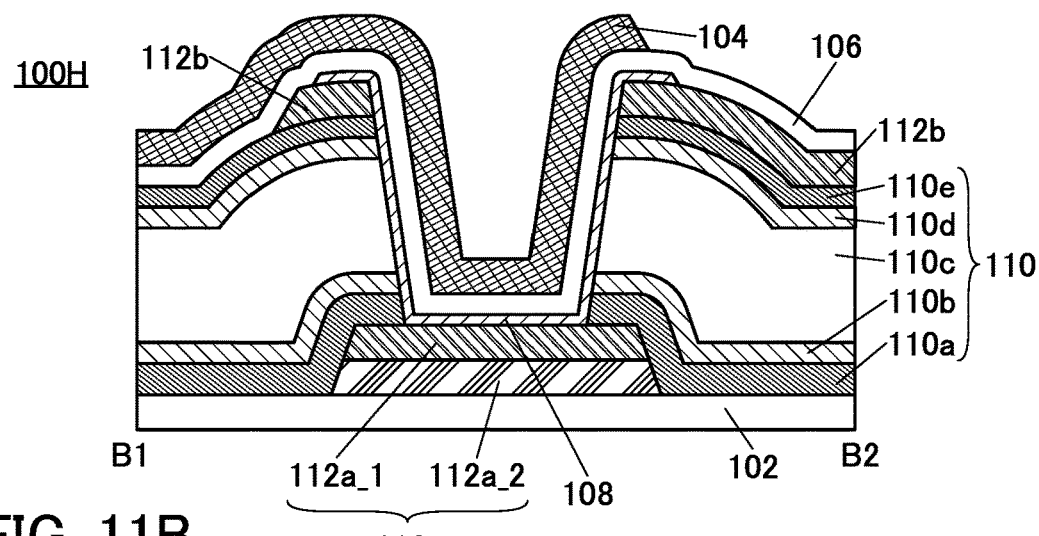
FIGS. 11A to 11C are cross-sectional views each showing an example of a semiconductor device.

FIG. 11A is a cross-sectional view of a transistor 100H. FIG. 11A is a cross-sectional view taken along dashed-dotted line B1-B2 in FIG. 1A.

The transistor 100H is different from the transistor 100 in that the conductive layer 112a has a stacked-layer structure of the conductive layer 112a_2 and the conductive layer 112a_1 over the conductive layer 112a_2.

The conductive layer 112a_1 is provided to be in contact with the semiconductor layer 108. The conductive layer 112a_1 functions as one of a source electrode and a drain electrode of the transistor 100H.

The conductive layer 112a_2 is positioned under the conductive layer 112a_1 and is provided so as not to be in contact with the semiconductor layer 108. The conductive layer 112a_2 can function as a wiring or an auxiliary wiring.

As described referring to the transistor 100G, in the case where the semiconductor layer 108 is formed using an oxide semiconductor, the conductive layer 112a_1, which is in contact with the semiconductor layer 108, is preferably formed using a material capable of maintaining conductivity even after being oxidized, such as an oxide conductor.

Meanwhile, to function as a wiring, the conductive layer 112a is preferably formed using a metal, an alloy, or any other material whose resistance is lower than that of an oxide conductor. In view of this, the conductive layer 112a_2 is preferably formed using a metal, an alloy, or any other material whose electrical conductivity is higher than that of the conductive layer 112a_1.

[Transistor 100I]

Figure 11B:
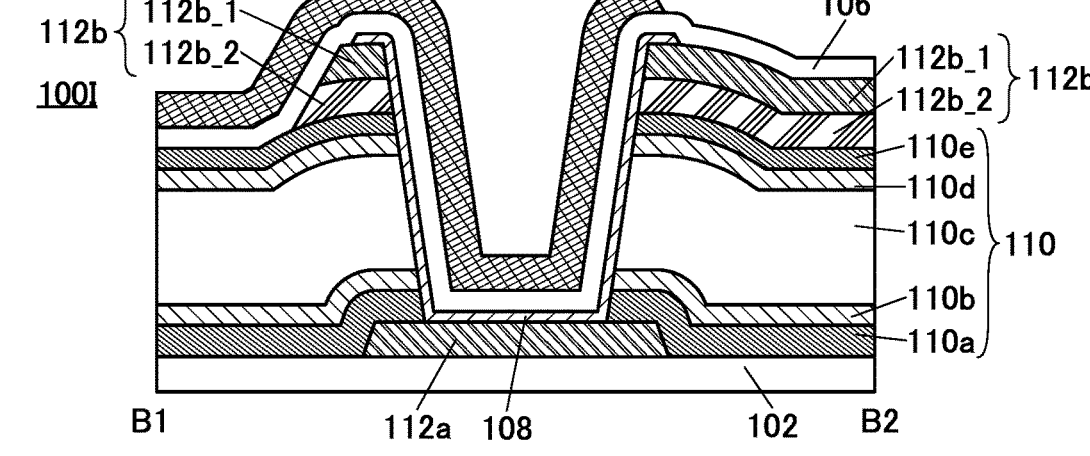

FIG. 11B is a cross-sectional view of a transistor 100I. FIG. 11B is a cross-sectional view taken along dashed-dotted line B1-B2 in FIG. 1A.

The transistor 100I is different from the transistor 100 in that the conductive layer 112b has a stacked-layer structure of the conductive layer 112b_2 and the conductive layer 112b_1 over the conductive layer 112b_2.

The conductive layer 112b_1 is provided to be in contact with the semiconductor layer 108. The conductive layer 112b_1 functions as the other of a source electrode and a drain electrode of the transistor 100I.

The conductive layer 112b_2 is positioned under the conductive layer 112b_1. The conductive layer 112b_2 can function as a wiring or an auxiliary wiring.

As described referring to the transistor 100G, in the case where the semiconductor layer 108 is formed using an oxide semiconductor, the conductive layer 112b_1, which is in contact with the semiconductor layer 108, is preferably formed using a material capable of maintaining conductivity even after being oxidized, such as an oxide conductor.

Meanwhile, to function as a wiring, the conductive layer 112b is preferably formed using a metal, an alloy, or any other material whose resistance is lower than that of an oxide conductor. In view of this, the conductive layer 112b_2 is preferably formed using a metal, an alloy, or any other material whose electrical conductivity is higher than that of the conductive layer 112b_1. Note that an oxide film is sometimes formed at the interface where the conductive layer 112b_2 is in contact with the semiconductor layer 108.

[Transistor 100J]

Figure 11C:
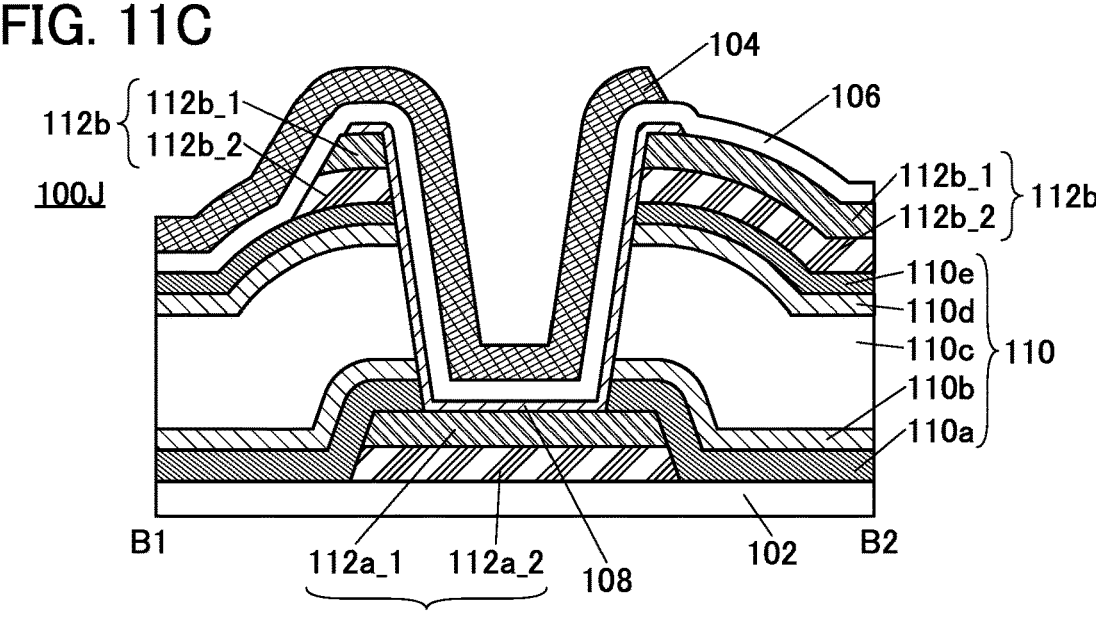

FIG. 11C is a cross-sectional view of a transistor 100J. FIG. 11C is a cross-sectional view taken along dashed-dotted line B1-B2 in FIG. 1A.

The transistor 100J is different from the transistor 100 in that the conductive layer 112a has a stacked-layer structure of the conductive layer 112a_2 and the conductive layer 112a_1 over the conductive layer 112a_2 and that the conductive layer 112b has a stacked-layer structure of the conductive layer 112b_2 and the conductive layer 112b_1 over the conductive layer 112b_2.

The conductive layer 112a of the transistor 100J has a structure similar to that of the conductive layer 112a of the transistor 100H, and the conductive layer 112b of the transistor 100J has a structure similar to that of the conductive layer 112b of the transistor 100I; thus, the above description can be referred to for the conductive layers 112a and 112b of the transistor 100J.

[Specific Example of Semiconductor Device]

FIGS. 12A to 12H show circuit diagrams of semiconductor devices of embodiments of the present invention. FIG. 13A to FIG. 19B are top views and cross-sectional views of the semiconductor devices of embodiments of the present invention. In the following description, the transistor 100 is used as an example of the transistor included in the semiconductor devices of embodiments of the present invention. A semiconductor device of one embodiment of the present invention may include any one or more of the transistors 100A to 100J described above, instead of the transistor 100.

[Semiconductor Device 10]

Figure 13A:
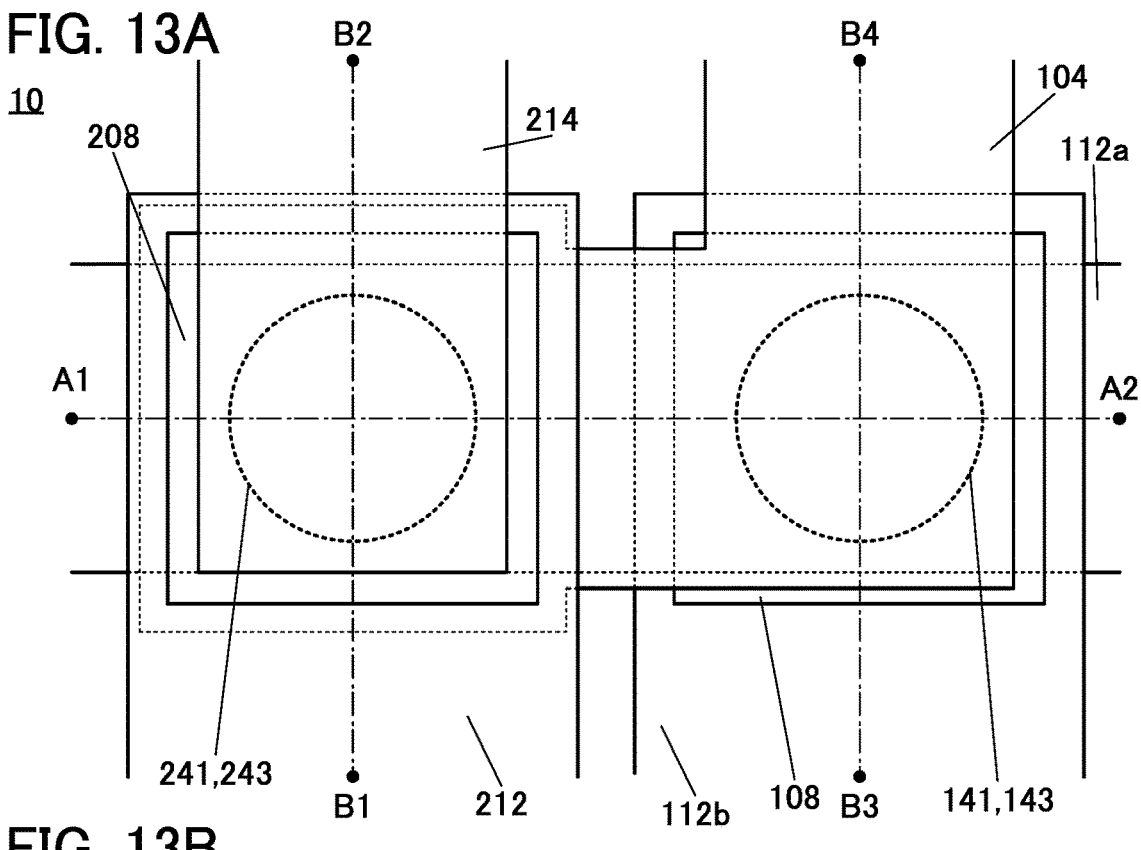
FIG. 13A is a top view showing an example of a semiconductor device.
Figure 13B:
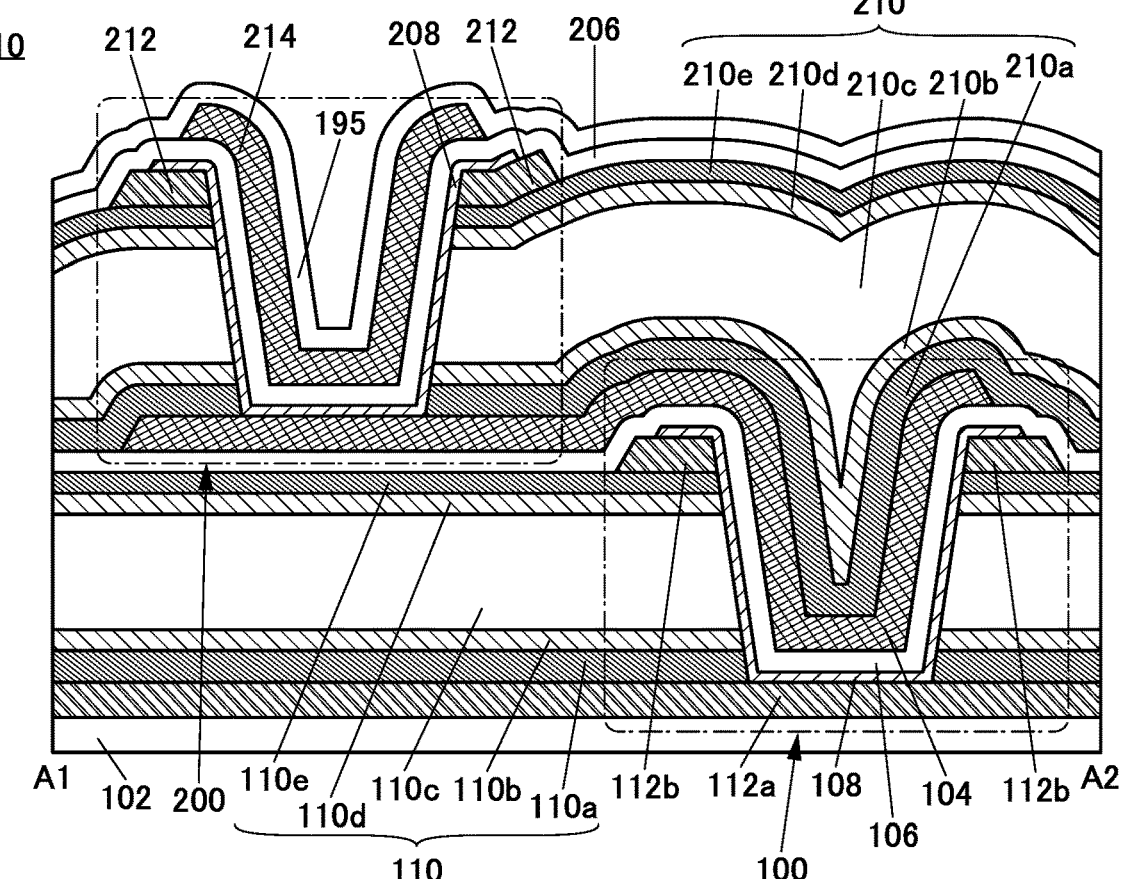
FIG. 13B is a cross-sectional view showing the example of the semiconductor device.
Figure 14:
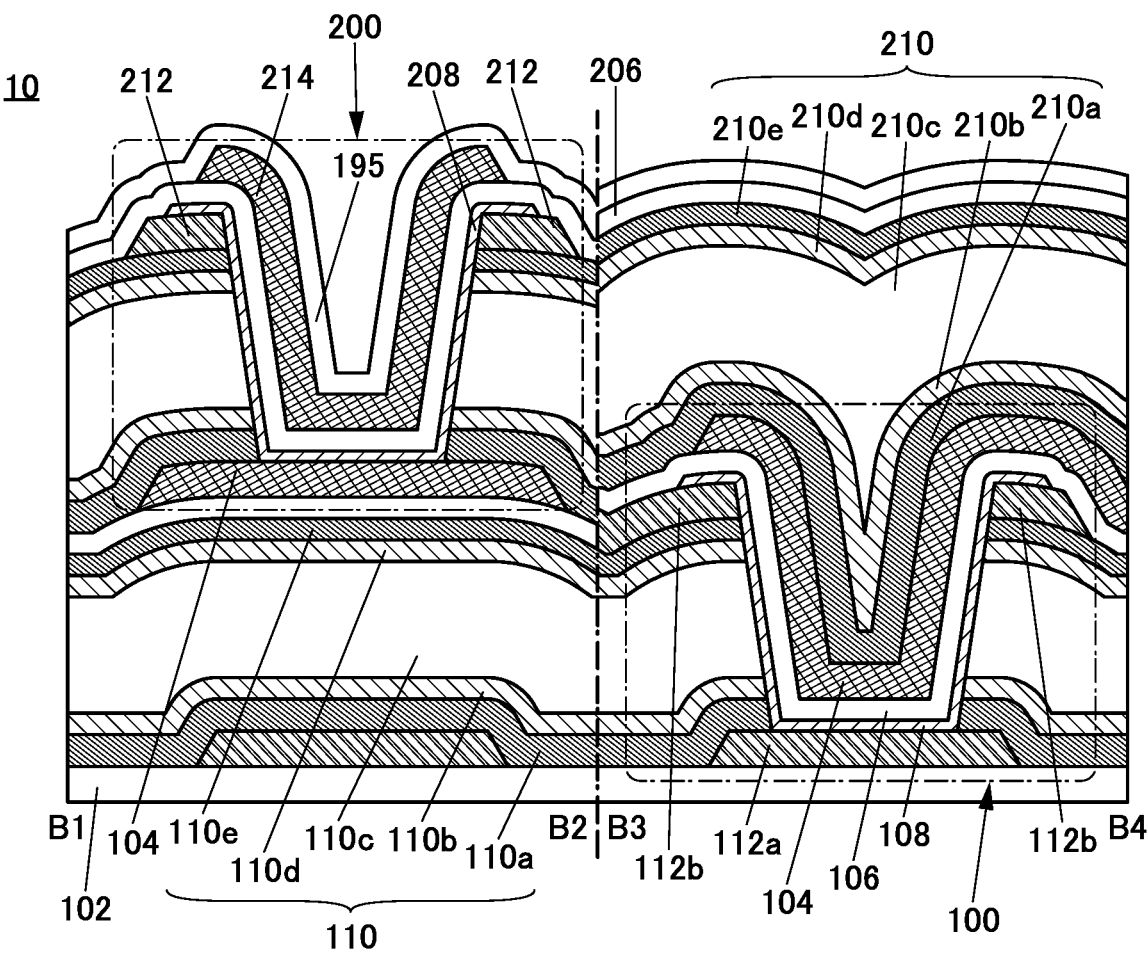
FIG. 14 is a cross-sectional view showing an example of a semiconductor device.

FIG. 12A is a circuit diagram of a semiconductor device 10. FIG. 13A is a top view of the semiconductor device 10. FIG. 13B is a cross-sectional view taken along dashed-dotted line A1-A2 in FIG. 13A, and FIG. 14 is a diagram showing a cross section taken along dashed-dotted line B1-B2 in FIG. 13A and a cross section taken along dashed-dotted line B3-B4 in FIG. 13A.

The semiconductor device 10 includes the transistor 100 and a transistor 200. One of a source and a drain of the transistor 200 is electrically connected to a gate of the transistor 100.

Although the transistor 100 and the transistor 200 are shown as n-channel transistors in FIGS. 12A to 12C, one embodiment of the present invention is not limited to these examples. One or both of the transistor 100 and the transistor 200 may be a p-channel transistor(s).

The transistor 100 is provided over the substrate 102. The transistor 100 has the above-described structure and thus, detailed description thereof is not repeated (see FIG. 1A to FIG. 4B).

The transistor 200 can have a structure similar to that of the transistor 100. The transistor 200 includes the conductive layer 104, an insulating layer 210 (insulating layers 210a, 210b, 210c, 210d, and 210e), a semiconductor layer 208, a conductive layer 212, an insulating layer 206, and a conductive layer 214. The layers constituting the transistor 200 may each have a single-layer structure or a stacked-layer structure.

The conductive layer 104 functions as the gate electrode of the transistor 100 and one of a source electrode and a drain electrode of the transistor 200. Since the transistor 100 and the transistor 200 share the conductive layer 104, the semiconductor device occupies a smaller area.

The insulating layer 210 is positioned over the insulating layer 106 and the conductive layer 104. The insulating layer 210 is in contact with the conductive layer 104. The insulating layer 210 includes an opening 241 reaching the conductive layer 104.

The insulating layer 210 can have a structure similar to that of the insulating layer 110. Specifically, the insulating layer 210a can have a structure similar to that of the insulating layer 110a; the insulating layer 210b can have a structure similar to that of the insulating layer 110b; the insulating layer 210c can have a structure similar to that of the insulating layer 110c; the insulating layer 210d can have a structure similar to that of the insulating layer 110d; and the insulating layer 210e can have a structure similar to that of the insulating layer 110e.

The conductive layer 212 is positioned over the insulating layer 210. The conductive layer 212 includes an opening 243 overlapping with the opening 241. The conductive layer 212 functions as the other of the source electrode and the drain electrode of the transistor 200.

The semiconductor layer 208 is in contact with the top surface of the conductive layer 104, the side surface of the insulating layer 210, and the top surface and the side surface of the conductive layer 212. The semiconductor layer 208 is provided in contact with the end portion of the insulating layer 210 on the opening 241 side and the end portion of the conductive layer 212 on the opening 243 side. The semiconductor layer 208 is in contact with the conductive layer 104 through the opening 241 and the opening 243.

Here, the semiconductor layer 108 and the semiconductor layer 208 may be formed using the same material or different materials. The composition of the material used for the semiconductor layer 108 may be different from that of the material used for the semiconductor layer 208. For example, the semiconductor layers 108 and 208 may be formed using In—Ga—Zn oxides having the same composition. Alternatively, the semiconductor layers 108 and 208 may be formed using In—Ga—Zn oxides having different compositions and the proportion of In atoms in one of the In—Ga—Zn oxides may be higher than that of In atoms in the other. Further alternatively, one of the semiconductor layer 108 and the semiconductor layer 208 may be formed using In—Ga—Zn oxide and the other may be formed using In—Zn oxide.

The insulating layer 206 is positioned over the insulating layer 210, the semiconductor layer 208, and the conductive layer 212. The insulating layer 206 is provided along the side wall of the opening 241 and the side wall of the opening 243 with the semiconductor layer 208 between the insulating layer 206 and the side walls. The insulating layer 206 functions as a gate insulating layer of the transistor 200.

The conductive layer 214 is positioned over the insulating layer 206. The conductive layer 214 overlaps with the semiconductor layer 208 with the insulating layer 206 provided therebetween, in a position overlapping with the opening 241 and the opening 243. The conductive layer 214 functions as a gate electrode of the transistor 200.

The semiconductor device 10 includes an insulating layer 195 covering the transistor 100 and the transistor 200.

The insulating layer 195 functions as a protective layer. The insulating layer 195 is preferably formed using a material that does not easily allow diffusion of impurities. Providing the insulating layer 195 can effectively inhibit diffusion of impurities into the transistors from the outside and increase the reliability of the semiconductor device. Examples of the impurities include water and hydrogen. The insulating layer 195 includes, for example, one or both of an inorganic insulating layer and an organic insulating layer. The insulating layer 195 may have a stacked-layer structure of an inorganic insulating layer and an organic insulating layer.

Examples of the inorganic insulating film usable for the insulating layer 195 include an oxide insulating film, a nitride insulating film, an oxynitride insulating film, and a nitride oxide insulating film. Specific examples of these inorganic films are as listed in the description of the insulating layer 110. Specifically, the insulating layer 195 can be formed using one or more of silicon nitride, silicon nitride oxide, silicon oxynitride, aluminum oxide, aluminum oxynitride, aluminum nitride, hafnium oxide, and hafnium aluminate. One or both of an acrylic resin and a polyimide resin, which are organic materials, can be used for the insulating layer 195.

The shape and size (e.g., diameter) of the opening 141 provided in the insulating layer 110 may be the same as or different from those of the opening 241 provided in the insulating layer 210. Likewise, the shape and size (e.g., diameter) of the opening 143 provided in the conductive layer 112b may be the same as or different from those of the opening 243 provided in the conductive layer 212.

[Semiconductor Device 10A]

Figure 15A:
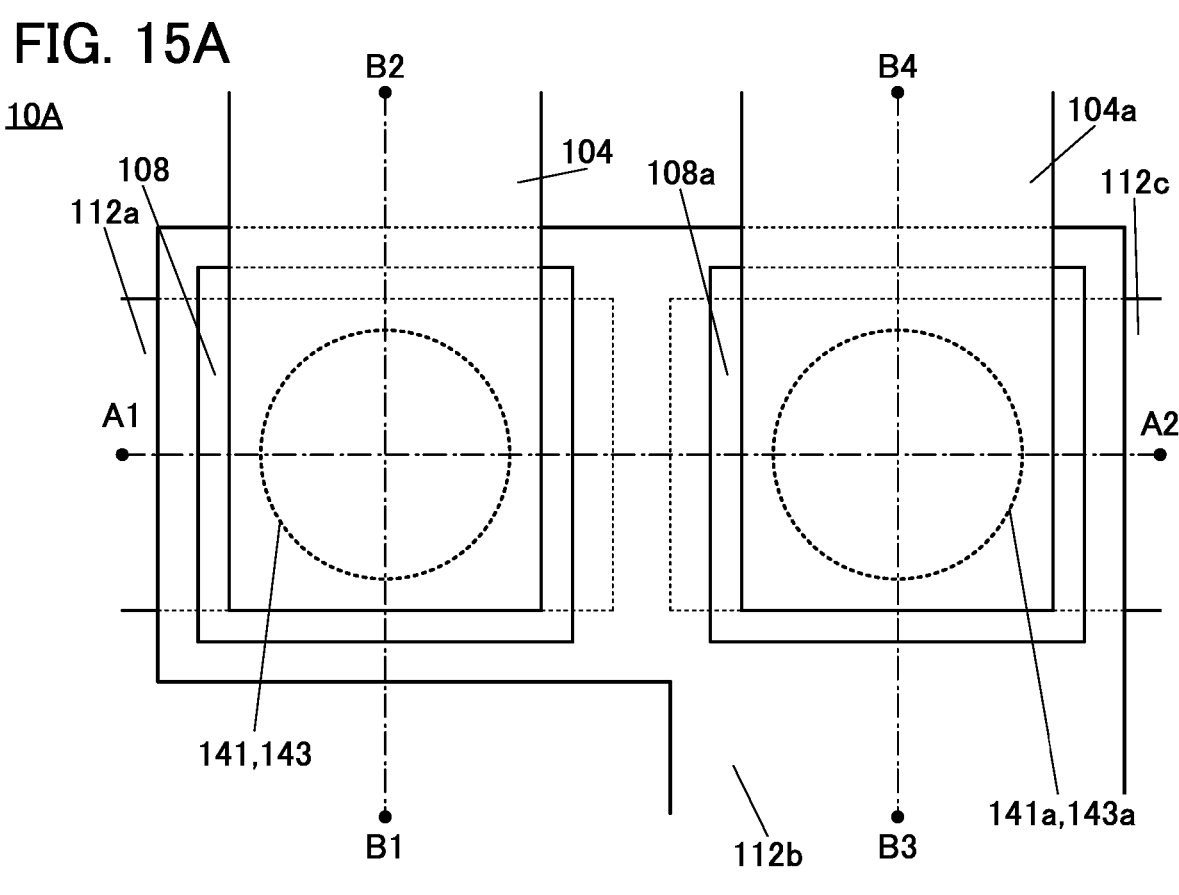
FIG. 15A is a top view showing an example of a semiconductor device.
Figure 15B:
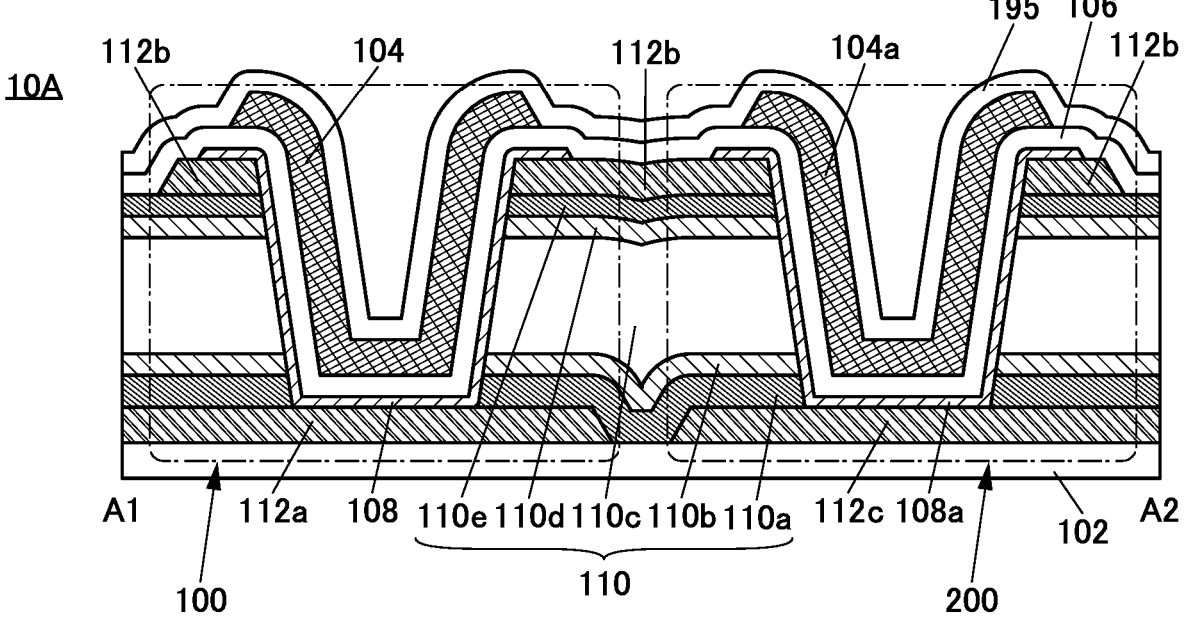
FIG. 15B is a cross-sectional view showing the example of the semiconductor device.
Figure 16A:
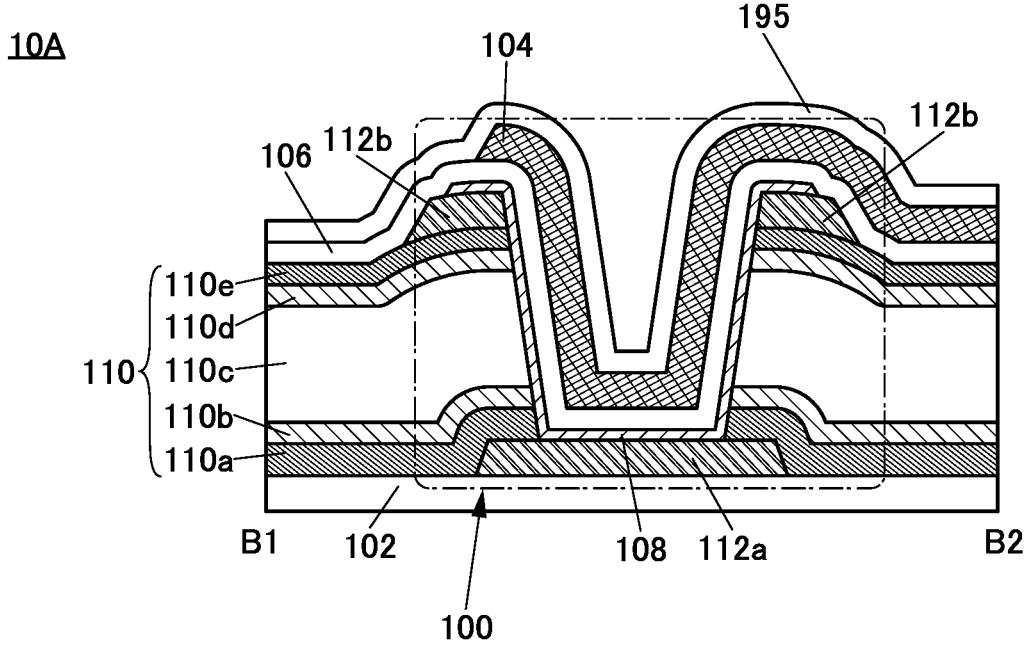
FIGS. 16A and 16B are cross-sectional views showing an example of a semiconductor device.
Figure 16B:
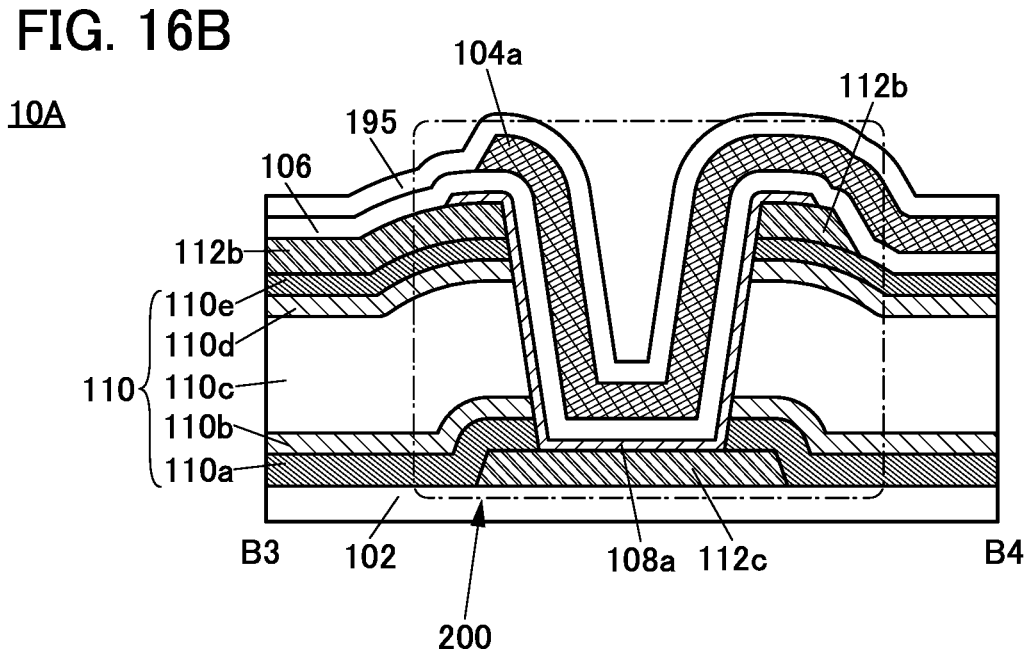

FIG. 12B is a circuit diagram of a semiconductor device 10A. FIG. 15A is a top view of the semiconductor device 10A. FIG. 15B is a cross-sectional view taken along dashed-dotted line A1-A2 in FIG. 15A, FIG. 16A is a cross-sectional view taken along dashed-dotted line B1-B2 in FIG. 15A, and FIG. 16B is a cross-sectional view taken along dashed-dotted line B3-B4 in FIG. 15A.

The semiconductor device 10A includes the transistor 100 and the transistor 200. The other of the source and the drain of the transistor 200 is electrically connected to the other of a source and a drain of the transistor 100.

The transistor 100 and the transistor 200 are provided over the substrate 102.

The transistor 100 has the above-described structure and thus, detailed description thereof is not repeated (see FIG. 1A to FIG. 4B).

The transistor 200 includes a conductive layer 112c, the insulating layer 110 (the insulating layers 110a, 110b, 110c, 110d, and 110e), a semiconductor layer 108a, the conductive layer 112b, the insulating layer 106, and a conductive layer 104a.

The conductive layer 112c functions as one of the source electrode and the drain electrode of the transistor 200. The conductive layer 112c and the conductive layer 112a can be formed using the same material in the same step.

The semiconductor layer 108a and the semiconductor layer 108 can be formed using the same material in the same step. Alternatively, the semiconductor layer 108 and the semiconductor layer 108a may be formed using different materials in different steps. For the structures of the semiconductor layer 108 and the semiconductor layer 108a, the description of the semiconductor layer 108 and the semiconductor layer 208 of the semiconductor device 10 can be referred to.

The conductive layer 112b functions as the other of the source electrode and the drain electrode of the transistor 100 and the other of the source electrode and the drain electrode of the transistor 200. Since the transistor 100 and the transistor 200 share the conductive layer 112b, the semiconductor device occupies a smaller area.

The conductive layer 104a functions as the gate electrode of the transistor 200. The conductive layer 104a and the conductive layer 104 can be formed using the same material in the same step.

The shape and size (e.g., diameter) of the opening 141 provided in the insulating layer 110 may be the same as or different from those of an opening 141a provided in the insulating layer 110. Likewise, the shape and size (e.g., diameter) of the opening 143 provided in the conductive layer 112b may be the same as or different from those of an opening 143a provided in the conductive layer 112b.

[Semiconductor Device 10B]

Figures 17A, 17B, 17C:
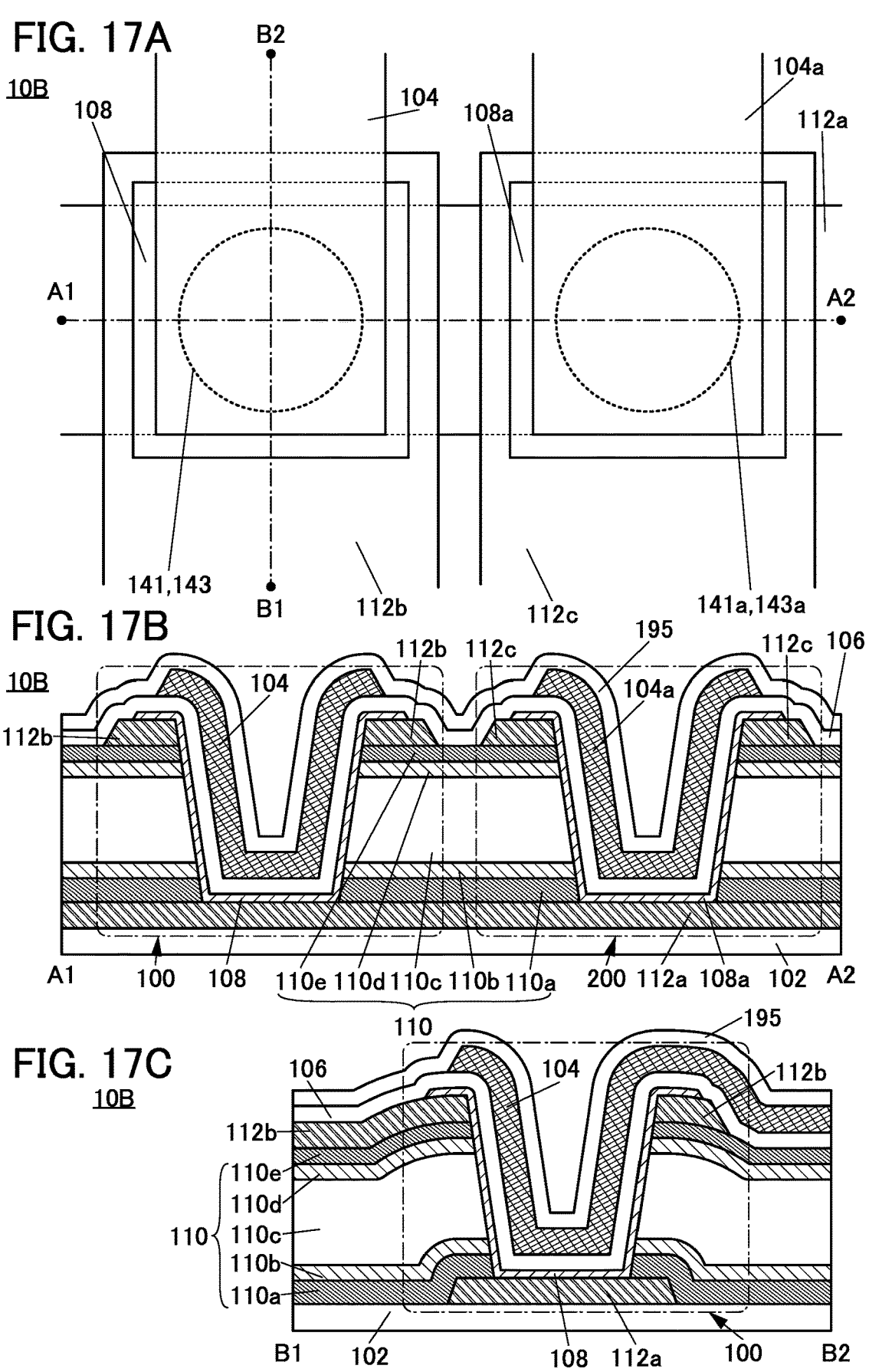
FIG. 17A is a top view showing an example of a semiconductor device.
FIGS. 17B and 17C are cross-sectional views showing the example of the semiconductor device.

FIG. 12C is a circuit diagram of a semiconductor device 10B. FIG. 17A is a top view of the semiconductor device 10B. FIG. 17B is a cross-sectional view taken along dashed-dotted line A1-A2 in FIG. 17A, and FIG. 17C is a cross-sectional view taken along dashed-dotted line B1-B2 in FIG. 17A.

The semiconductor device 10B includes the transistor 100 and the transistor 200. One of the source and the drain of the transistor 200 is electrically connected to one of the source and the drain of the transistor 100.

The transistor 100 and the transistor 200 are provided over the substrate 102.

The transistor 100 has the above-described structure and thus, detailed description thereof is not repeated (see FIG. 1A to FIG. 4B).

The transistor 200 includes the conductive layer 112a, the insulating layer 110 (the insulating layers 110a, 110b, 110c, 110d, and 110e), the semiconductor layer 108a, the conductive layer 112c, the insulating layer 106, and the conductive layer 104a.

The conductive layer 112c functions as the other of the source electrode and the drain electrode of the transistor 200. The conductive layer 112c and the conductive layer 112b can be formed using the same material in the same step.

The semiconductor layer 108a and the semiconductor layer 108 can be formed using the same material in the same step. Alternatively, the semiconductor layer 108 and the semiconductor layer 108a may be formed using different materials in different steps. For the structures of the semiconductor layer 108 and the semiconductor layer 108a, the description of the semiconductor layer 108 and the semiconductor layer 208 of the semiconductor device 10 can be referred to.

The conductive layer 112a functions as one of the source electrode and the drain electrode of the transistor 100 and one of the source electrode and the drain electrode of the transistor 200. Since the transistor 100 and the transistor 200 share the conductive layer 112a, the semiconductor device occupies a smaller area.

The conductive layer 104a functions as the gate electrode of the transistor 200. The conductive layer 104a and the conductive layer 104 can be formed using the same material in the same step.

The shape and size (e.g., diameter) of the opening 141 provided in the insulating layer 110 may be the same as or different from those of the opening 141a provided in the insulating layer 110. Likewise, the shape and size (e.g., diameter) of the opening 143 provided in the conductive layer 112b may be the same as or different from those of the opening 143a provided in the conductive layer 112c.

[Semiconductor Device 10C]

Figure 18A:
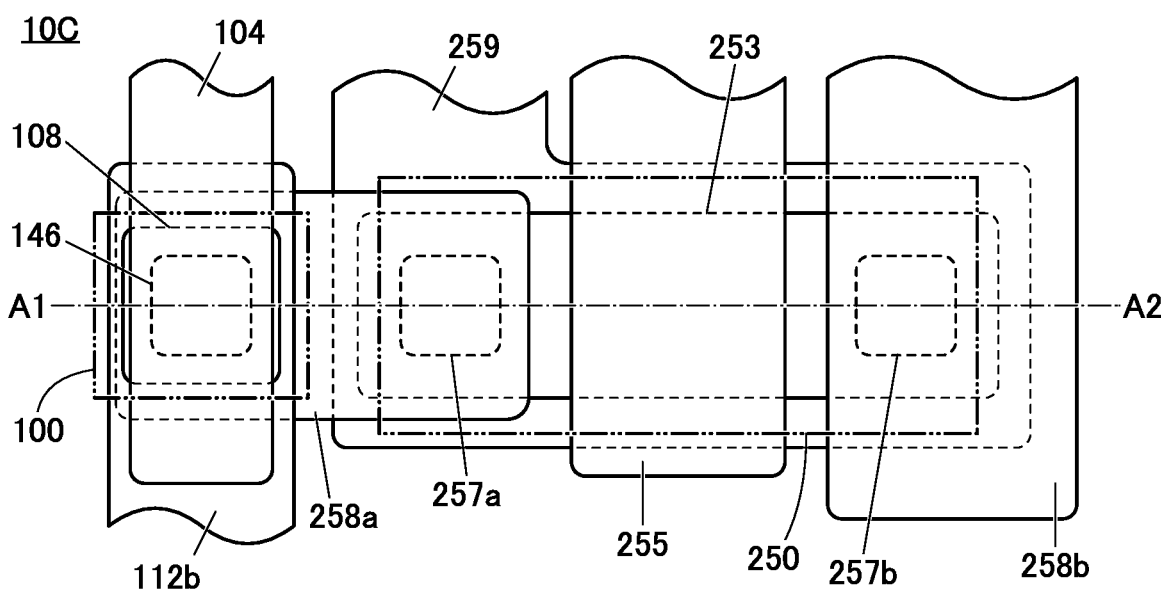
FIG. 18A is a top view showing an example of a semiconductor device.
Figure 18B:
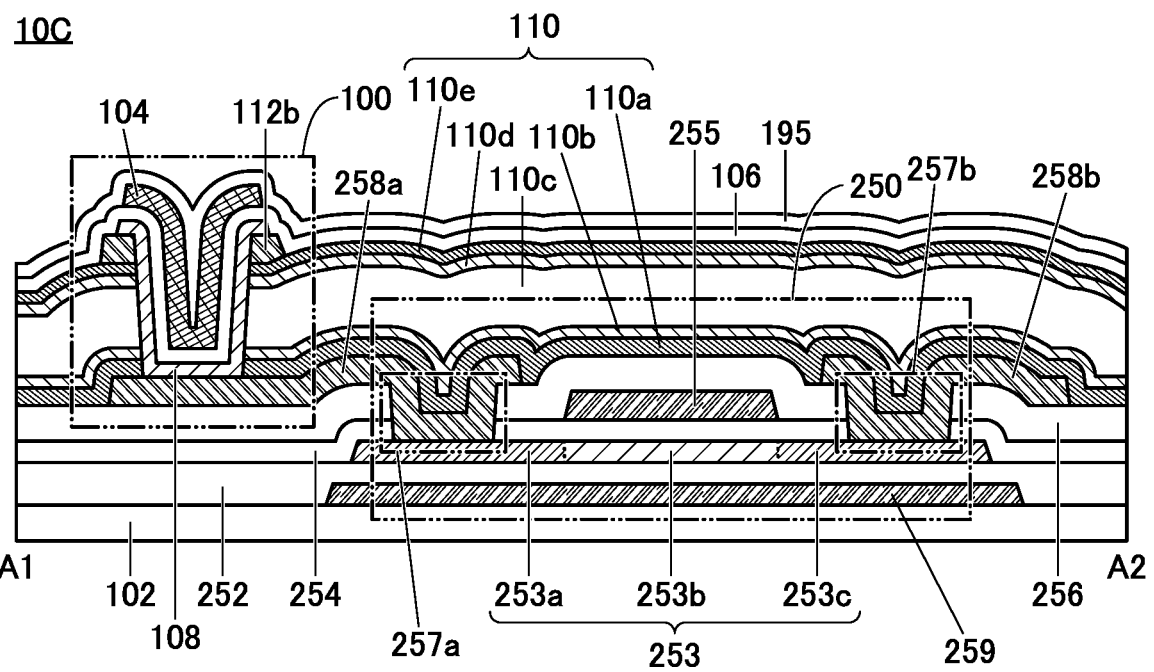
FIG. 18B is a cross-sectional view showing the example of the semiconductor device.

FIG. 12D is a circuit diagram of a semiconductor device 10C. FIG. 18A is a top view of the semiconductor device 10C. FIG. 18B is a cross-sectional view taken along dashed-dotted line A1-A2 in FIG. 18A.

The semiconductor device 10C includes the transistor 100 and a transistor 250. One of a source and a drain of the transistor 250 is electrically connected to one of the source and the drain of the transistor 100.

Although the transistor 100 is shown as an n-channel transistor and the transistor 250 is shown as a p-channel transistor in FIGS. 12D to 12H, one embodiment of the present invention is not limited to these examples. Both the transistor 100 and the transistor 250 may be n-channel transistors or p-channel transistors. Alternatively, the transistor 100 may be a p-channel transistor and the transistor 250 may be an n-channel transistor.

The transistor 100 and the transistor 250 are provided over the substrate 102.

The semiconductor device 10C includes a conductive layer 259 over the substrate 102, an insulating layer 252 over the substrate 102 and the conductive layer 259, and a semiconductor layer 253 over the insulating layer 252. The semiconductor device 10C also includes an insulating layer 254 over the insulating layer 252 and the semiconductor layer 253 and a conductive layer 255 over the insulating layer 254. The semiconductor layer 253 and the conductive layer 255 overlap with each other in a region.

Furthermore, an insulating layer 256 is provided over the insulating layer 254 and the conductive layer 255. The insulating layer 254 and the insulating layer 256 are provided with an opening 257a in a region overlapping with part of the semiconductor layer 253. The insulating layer 254 and the insulating layer 256 are provided with an opening 257b in a region overlapping with another part of the semiconductor layer 253.

A conductive layer 258a is provided over the insulating layer 256 and the opening 257a and a conductive layer 258b is provided over the insulating layer 256 and the opening 257b. The conductive layer 258a is electrically connected to the semiconductor layer 253 in the opening 257a. The conductive layer 258b is electrically connected to the semiconductor layer 253 in the opening 257b.

The semiconductor layer 253 includes a drain region 253a, a channel formation region 253b, and a source region 253c. The region of the semiconductor layer 253 that overlaps with the conductive layer 255 functions as the channel formation region 253b. The drain region 253a is electrically connected to the conductive layer 258a, and the source region 253c is electrically connected to the conductive layer 258b.

The insulating layer 110 (the insulating layers 110a, 110b, 110c, 110d, and 110e) is provided over the insulating layer 256, the conductive layer 258a, and the conductive layer 258b, and the conductive layer 112b is provided over the insulating layer 110.

In a region overlapping with part of the conductive layer 258a, the conductive layer 112b and the insulating layer 110 are provided with an opening 146 (FIG. 18A). The semiconductor layer 108 is provided in the opening 146.

The insulating layer 106 is provided over the insulating layer 110, the conductive layer 112b, and the semiconductor layer 108, and the conductive layer 104 is provided over the insulating layer 106. The insulating layer 195 is provided over the insulating layer 106 and the conductive layer 104.

The conductive layer 259 functions as a back gate electrode of the transistor 250. It is thus preferable that the conductive layer 259 overlap with the channel formation region 253b and extend beyond the end portion of the channel formation region 253b. That is, the conductive layer 259 is preferably larger than the channel formation region 253b. The conductive layer 259 preferably extends beyond the end portion of the semiconductor layer 253. That is, the conductive layer 259 is preferably larger than the semiconductor layer 253.

A back gate electrode is positioned such that a channel formation region of a semiconductor layer is interposed between a gate electrode and the back gate electrode. By changing the potential of the back gate electrode, the threshold voltage of a transistor can be changed. The potential of the back gate electrode may be a ground potential or a freely selected potential.

The back gate electrode is formed using a conductive layer and can function in a manner similar to that of the gate electrode. For example, the back gate electrode may have the same potential as the gate electrode.

The back gate electrode can be formed using a material and a method similar to those used for the gate electrode, a source electrode, a drain electrode, or the like. The gate electrode and the back gate electrode are conductive layers and thus each have a function of preventing an electric field generated outside the transistor from affecting the semiconductor layer in which the channel is formed (in particular, an electric field blocking function against static electricity). That is, the variation in the electrical characteristics of the transistor due to the influence of external electric field such as static electricity can be prevented. By providing the back gate electrode, the amount of change in threshold voltage of the transistor in a bias-temperature (BT) stress test can be reduced. By providing the back gate electrode, the variation in the characteristics of the transistor can be reduced and the reliability of a semiconductor device including the transistor can be increased.

In the transistor 250, the semiconductor layer 253 functions as a semiconductor layer where the channel is formed; the insulating layer 254 functions as a gate insulating layer; and the conductive layer 255 functions as a gate electrode. The conductive layer 258a and the conductive layer 258b respectively function as a drain electrode and a source electrode of the transistor 250.

Like the transistor 100, the transistor 250 may be an OS transistor.

Here, the semiconductor layer 108 and the semiconductor layer 253 may be formed using the same material or different materials. For the structures of the semiconductor layer 108 and the semiconductor layer 253, the description of the semiconductor layer 108 and the semiconductor layer 208 of the semiconductor device 10 can be referred to.

Alternatively, a transistor including silicon in its channel formation region (a Si transistor) may be used as the transistor 250.

Examples of silicon include single crystal silicon, polycrystalline silicon, and amorphous silicon. In particular, a transistor including LTPS in its semiconductor layer (hereinafter also referred to as an LTPS transistor) can be used. The LTPS transistor has high field-effect mobility and excellent frequency characteristics.

The structure of the transistor 100 is the same as the above-described structure (see FIG. 1A to FIG. 4B) except that the conductive layer 258a is provided instead of the conductive layer 112a.

The conductive layer 258a functions as one of the source electrode and the drain electrode of the transistor 100 and one of the source electrode and the drain electrode of the transistor 250. Since the transistor 100 and the transistor 250 share the conductive layer 258a, the semiconductor device occupies a smaller area.

As described above, the transistor 100 is a vertical channel-type transistor. Meanwhile, in the semiconductor layer of the transistor 250, a current flows in the horizontal direction, i.e., the direction parallel or substantially parallel to a surface of the substrate 102. Such a transistor can be called a lateral channel-type transistor or a lateral-channel transistor.

As described above, a semiconductor device of one embodiment of the present invention may include not only a vertical channel-type transistor but also a lateral channel-type transistor.

As shown in FIG. 12E, a back gate and a gate of the transistor 250 may be electrically connected to each other. As shown in FIG. 12F, the back gate of the transistor 250 and the source or drain thereof may be electrically connected to each other.

As shown in FIG. 12G, the transistor 250 without a back gate may be employed.

[Semiconductor Device 10D]

Figures 19A, 19B:
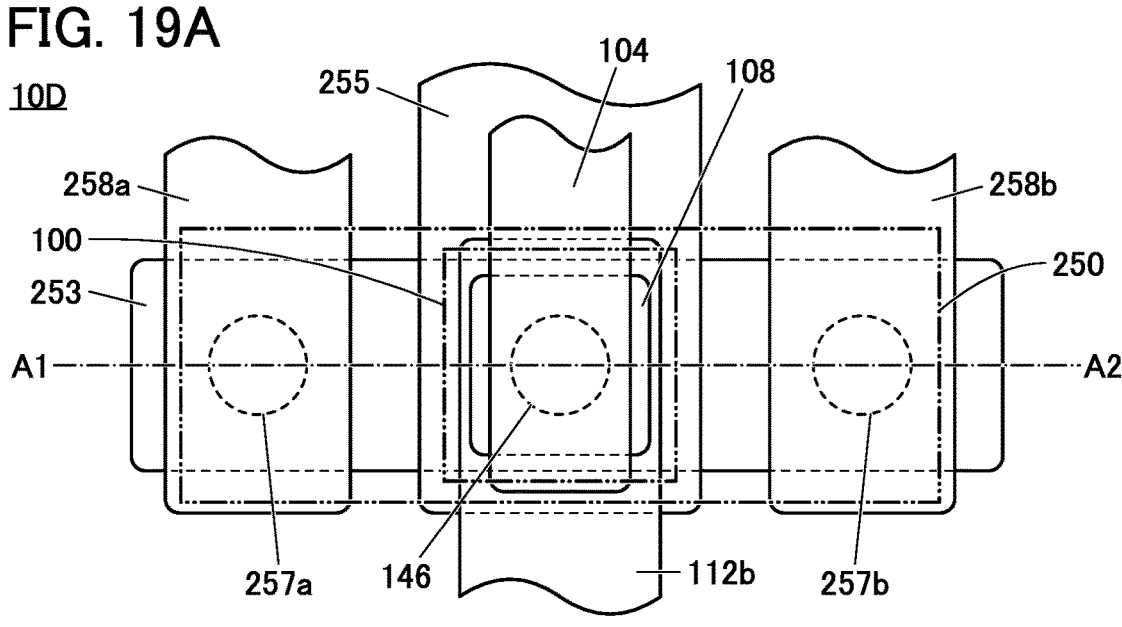
FIG. 19A is a top view showing an example of a semiconductor device.
FIG. 19B is a cross-sectional view showing the example of the semiconductor device.

FIG. 12H is a circuit diagram of a semiconductor device 10D. FIG. 19A is a top view of the semiconductor device 10D. FIG. 19B is a cross-sectional view taken along dashed-dotted line A1-A2 in FIG. 19A.

The semiconductor device 10D includes the transistor 100 and the transistor 250. The gate of the transistor 250 is electrically connected to one of the source and the drain of the transistor 100.

The semiconductor device 10D is different from the semiconductor device 10C in that the opening 146 overlaps with the conductive layer 255 functioning as the gate electrode of the transistor 250. Accordingly, in the semiconductor device 10D, the transistor 100 is provided over the gate electrode of the transistor 250. In the semiconductor device 10D, the opening 146 is formed by selectively removing part of the conductive layer 112b and part of the insulating layer 110 in a region overlapping with the conductive layer 255.

Although the opening 146 overlaps with the channel formation region 253b in FIGS. 19A and 19B, one embodiment of the present invention is not limited to this example. A structure may be employed in which the opening 146 does not overlap with the channel formation region 253b but overlaps with the conductive layer 255. In the semiconductor device 10D, the conductive layer 255 functions as the gate electrode of the transistor 250 and one of the source electrode and the drain electrode of the transistor 100.

When the transistor 100 and the transistor 250 overlap with each other, the semiconductor device occupies a smaller area.

The semiconductor device 10D is different from the semiconductor device 10C in the structures of the opening 257a, the opening 257b, the conductive layer 258a, and the conductive layer 258b.

In the semiconductor device 10D, the opening 257a is formed by selectively removing part of the insulating layer 254 and part of the insulating layer 110 in a region overlapping with the drain region 253a of the semiconductor layer 253. In the semiconductor device 10D, the opening 257b is formed by selectively removing part of the insulating layer 254 and part of the insulating layer 110 in a region overlapping with the source region 253c of the semiconductor layer 253.

In the semiconductor device 10D, the conductive layer 258a and the conductive layer 258b are provided over the insulating layer 110.

In the semiconductor device 10D, the conductive layers 258a and 258b and the conductive layer 112b can be formed using the same material in the same step. The conductive layers 258a and 258b do not need to be formed separately from the conductive layer 112b; thus, the manufacturing process of the semiconductor device can be shortened and the productivity of the semiconductor device can be increased.

In a transistor of one embodiment of the present invention, which is a kind of vertical transistor, a source electrode, a semiconductor layer, and a drain electrode can be provided to overlap with each other. Thus, the area occupied by the transistor can be significantly smaller than the area occupied by a planar transistor. Furthermore, combination of a planar p-channel Si transistor and a vertical n-channel OS transistor makes it possible to form a complementary metal oxide semiconductor (CMOS) circuit. When the planar transistor and the vertical transistor overlap with each other in this structure, the CMOS circuit occupies a smaller area.

In a transistor of one embodiment of the present invention, the positional relationship between a gate electrode and a channel formation region of a semiconductor layer is favorable and thus, the field-effect mobility is inhibited from decreasing. This can reduce a driving voltage. Accordingly, a semiconductor device can have reduced power consumption by including the transistor of one embodiment of the present invention.

In a semiconductor layer of a transistor of one embodiment of the present invention, a low-resistance region is provided between a channel formation region and a region that is in contact with a drain electrode. Thus, a high electric field is not easily generated in the vicinity of a drain region, and generation of hot carriers and degradation of the transistor are inhibited.

This embodiment can be combined with any of the other embodiments as appropriate. In this specification, in the case where a plurality of structure examples are shown in one embodiment, the structure examples can be combined as appropriate.

Embodiment 2

In this embodiment, a method for manufacturing the semiconductor device of one embodiment of the present invention will be described with reference to FIG. 20A1 to FIG. 24B2. Note that as for a material and a formation method of each component, portions similar to those described in Embodiment 1 are not described in some cases.

FIGS. 20A1 and 20B1, FIGS. 21A1 and 21B1, FIGS. 22A1 and 22B1, FIGS. 23A1 and 23B1, and FIGS. 24A1 and 24B1 are perspective views. Note that some components are not shown. FIGS. 20A2 and 20B2, FIGS. 21A2 and 21B2, FIGS. 22A2 and 22B2, FIGS. 23A2 and 23B2, and FIGS. 24A2 and 24B2 each show a cross-sectional view taken along dashed-dotted line A1-A2 in FIG. 1A and a cross-sectional view taken along dashed-dotted line B1-B2 in FIG. 1A.

Thin films included in the semiconductor device (e.g., insulating films, semiconductor films, and conductive films) can be formed by a sputtering method, a chemical vapor deposition (CVD) method, a vacuum evaporation method, a pulsed laser deposition (PLD) method, an ALD method, or the like. Examples of a CVD method include a PECVD method and a thermal CVD method. An example of a thermal CVD method is a metal organic CVD (MOCVD) method.

Alternatively, thin films included in the semiconductor device (e.g., insulating films, semiconductor films, and conductive films) can be formed by a wet process such as spin coating, dipping, spray coating, ink-jetting, dispensing, screen printing, offset printing, doctor blade coating, slit coating, roll coating, curtain coating, or knife coating.

In processing thin films included in the semiconductor device, a photolithography method or the like can be employed. Alternatively, the thin films may be processed by a nanoimprinting method, a sandblasting method, a lift-off method, or the like. Alternatively, island-shaped thin films may be directly formed by a film formation method using a shielding mask such as a metal mask.

There are two typical examples of photolithography methods. In one of the methods, a resist mask is formed over a thin film to be processed, the thin film is processed by etching or the like, and then the resist mask is removed. In the other method, a photosensitive thin film is formed and then processed into a desired shape by light exposure and development.

As light for exposure in a photolithography method, it is possible to use light with the i-line (wavelength: 365 nm), light with the g-line (wavelength: 436 nm), light with the h-line (wavelength: 405 nm), or light in which the i-line, the g-line, and the K-line are mixed. Alternatively, ultraviolet light, KrF laser light, ArF laser light, or the like can be used. Exposure may be performed by liquid immersion exposure technique. As the light for exposure, extreme ultraviolet (EUV) light or X-rays may also be used. Furthermore, instead of the light used for the exposure, an electron beam can also be used. EUV light, X-rays, or an electron beam is preferably used to enable extremely minute processing. Note that a photomask is not needed when light exposure is performed by scanning with a beam such as an electron beam.

For etching of thin films, a dry etching method, a wet etching method, a sandblast method, or the like can be used.

First, the conductive layer 112*a* is formed over the substrate 102 (FIGS. 20A1 and 20A2). Note that in the case of forming the transistor 100D shown in FIG. 8B, the conductive layer 103 is formed over the conductive layer 112*a*.

For the formation of a conductive film to be the conductive layer 112*a* and a conductive film to be the conductive layer 103, a sputtering method is suitable, for example. A conductive layer can be formed in the following manner: a resist mask is formed over a conductive film by a photolithography process and then, the conductive film is processed. The conductive film to be the conductive layer 103 may be formed after the formation of the conductive layer 112*a*, or the conductive film to be the conductive layer 112*a* may be processed after the formation of the conductive film to be the conductive layer 103. On the conductive film to be the conductive layer 103, a step of processing the conductive film into a desired shape such as an island shape and a step of providing the opening 148 may be performed at the same time; alternatively, one of these steps may be performed earlier than the other. The conductive film can be processed by a wet etching method and/or a dry etching method.

Then, an insulating film 110*af* to be the insulating layer 110*a*, an insulating film 110*bf* to be the insulating layer 110*b*, and an insulating film 110*cf* to be the insulating layer 110*c* are formed over the conductive layer 112*a* (FIGS. 20B1 and 20B2).

As already described above, the insulating layer 110*a* includes a region having a higher hydrogen content than the insulating layer 110*b*.

In the film formation gas for the insulating film 110*af*, the proportion of the flow rate of a NH₃ gas is preferably higher than that in the film formation gas for the insulating film 110*bf*. The film formation gas for the insulating film 110*bf* does not necessarily contain a NH₃ gas. When formed under the conductions where the proportion of the flow rate of a NH₃ gas to the total flow rate of the film formation gas is high, the insulating film 110*af* can have a high hydrogen content. In that case, the amount of hydrogen in the insulating layer 110*a* to be released by heating can be large. Furthermore, the amount of hydrogen in the insulating layer 110*b* to be released by heating can be small.

The amount of hydrogen in the insulating layer 110*a* to be released by heating can be adjusted by making the film formation conditions for the insulating film 110*af* different from those for the insulating film 110*bf*. Specifically, the film formation conditions for the insulating film 110*af* may be different from those for the insulating film 110*bf* in any one or more of a film formation power (film formation power density), a film formation pressure, the kind of a film formation gas, the flow rate ratio of a film formation gas, a film formation temperature, and the distance between the substrate and an electrode. For example, the film formation power density for the insulating film 110*af* may be lower than that for the insulating film 110*bf*, in which case the insulating film 110*af* can have a higher hydrogen content than the insulating film 110*bf*. In that case, the amount of hydrogen in the insulating layer 110*a* to be released by heating can be large.

For example, silicon nitride films are preferably formed as the insulating films 110*af* and 110*bf*. Alternatively, it is preferable that a silicon nitride film and an aluminum oxide film be formed as the insulating film 110*af* and the insulating film 110*bf*, respectively. For another example, it is preferable that a silicon oxide film or a silicon oxynitride film be formed as the insulating film 110*cf*.

A sputtering method or a PECVD method, for example, is suitable for the formation of the insulating film 110*af*, the insulating film 110*bf*, and the insulating film 110*cf*. It is particularly preferable that a PECVD method be used to facilitate the formation of both a film with a low hydrogen content and a film with a high hydrogen content. It is preferable that the insulating film 110*bf* be formed in a vacuum successively after the formation of the insulating film 110*af*, without exposure of a surface of the insulating film 110*af* to the air because the successive formation of the insulating film 110*af* and the insulating film 110*bf* inhibits attachment of atmospherically derived impurities to a surface of the insulating film 110*af*. Examples of the impurities include water and organic substances. For a similar reason, it is preferable that the insulating film 110*cf* be formed in a vacuum successively after the formation of the insulating film 110*bf*, without exposure of a surface of the insulating film 110*bf* to the air.

The substrate temperature at the time of forming the insulating films 110*af*, 110*bf*, and 110*cf* is preferably higher than or equal to 180° C. and lower than or equal to 450° C., further preferably higher than or equal to 200° C. and lower than or equal to 450° C., still further preferably higher than or equal to 250° C. and lower than or equal to 450° C., yet still further preferably higher than or equal to 300° C. and lower than or equal to 450° C., yet still further preferably higher than or equal to 300° C. and lower than or equal to 400° C., yet still further preferably higher than or equal to 350° C. and lower than or equal to 400° C. When the substrate temperature at the time of forming the insulating films 110*af*, 110*bf*, and 110*cf* is in the above range, impurities (e. g., water and hydrogen) released from the insulating films 110*af*, 110*bf*, and 110*cf* can be reduced, which inhibits the diffusion of the impurities to the semiconductor layer 108. Consequently, a transistor with favorable electrical characteristics and high reliability can be obtained.

Note that since the insulating films 110*af*, 110*bf*, and 110*cf* are formed earlier than the semiconductor layer 108, there is no need to consider the probability of oxygen release from the semiconductor layer 108 due to heat applied thereto at the time of the formation of the insulating films 110*af*, 110*bf*, and 110*cf*.

It is preferable that plasma treatment be performed in an oxygen-containing atmosphere successively after the formation of the insulating film 110*cf*, without exposure to the air (in-situ). For example, N₂O plasma treatment is preferably performed. Such plasma treatment enables oxygen supply to the insulating film 110*cf*.

Next, the metal oxide layer 149 is preferably formed over the insulating film 110*cf* (FIGS. 21A1 and 21A2). The formation of the metal oxide layer 149 enables oxygen supply to the insulating film 110*cf*.

There is no limitation on the conductivity of the metal oxide layer 149. For the metal oxide layer 149, at least one of an insulating film, a semiconductor film, and a conductive film can be used. For the metal oxide layer 149, aluminum oxide, hafnium oxide, hafnium aluminate, indium oxide, indium tin oxide (ITO), or indium tin oxide containing silicon (ITSO) can be used, for example.

An oxide material containing one or more elements contained in the semiconductor layer 108 is preferably used for the metal oxide layer 149. It is particularly preferable to use an oxide semiconductor material that can be used for the semiconductor layer 108.

At the time of forming the metal oxide layer 149, a larger amount of oxygen can be supplied into the insulating film 110cf with a higher proportion of the oxygen flow rate to the total flow rate of the film formation gas introduced into a treatment chamber of a film formation apparatus (i.e., with a higher oxygen flow rate ratio), or with a higher oxygen partial pressure in the treatment chamber. The oxygen flow rate ratio or the oxygen partial pressure is, for example, higher than or equal to 50% and lower than or equal to 100%, preferably higher than or equal to 65% and lower than or equal to 100%, further preferably higher than or equal to 80% and lower than or equal to 100%, still further preferably higher than or equal to 90% and lower than or equal to 100%. It is particularly preferred that the oxygen flow rate ratio be 100% and the oxygen partial pressure be as close to 100% as possible.

When the metal oxide layer 149 is formed by a sputtering method in an oxygen-containing atmosphere in the above manner, oxygen can be supplied to the insulating film 110cf and release of oxygen from the insulating film 110cf can be prevented during the formation of the metal oxide layer 149. As a result, a large amount of oxygen can be enclosed in the insulating film 110cf. Moreover, a large amount of oxygen can be supplied to the semiconductor layer 108 by heat treatment performed later. Thus, the amounts of oxygen vacancies and VoH in the semiconductor layer 108 can be reduced, whereby a transistor with favorable electrical characteristics and high reliability can be obtained.

Heat treatment is preferably performed after the metal oxide layer 149 is formed. By the heat treatment performed after the formation of the metal oxide layer 149, oxygen can be effectively supplied from the metal oxide layer 149 to the insulating film 110cf.

The heat treatment temperature is preferably higher than or equal to 150° C. and lower than the strain point of the substrate, further preferably higher than or equal to 200° C. and lower than or equal to 450° C., still further preferably higher than or equal to 250° C. and lower than or equal to 450° C., yet still further preferably higher than or equal to 300° C. and lower than or equal to 450° C., yet still further preferably higher than or equal to 300° C. and lower than or equal to 400° C., yet still further preferably higher than or equal to 350° C. and lower than or equal to 400° C. The heat treatment can be performed in an atmosphere containing one or more of a noble gas, nitrogen, and oxygen. As a nitrogen-containing atmosphere or an oxygen-containing atmosphere, clean dry air (CDA) may be used. Note that the content of hydrogen, water, or the like in the atmosphere is preferably as low as possible. As the atmosphere, a high-purity gas with a dew point of −60° C. or lower, preferably −100° C. or lower is preferably used. With the use of an atmosphere where the content of hydrogen, water, or the like is as low as possible, entry of hydrogen, water, or the like into the insulating film 110cf and the like can be prevented as much as possible. An oven, a rapid thermal annealing (RTA) apparatus, or the like can be used for the heat treatment. With the RTA apparatus, the heat treatment time can be shortened.

After the formation of the metal oxide layer 149 or the above-described heat treatment, oxygen may be further supplied to the insulating film 110cf through the metal oxide layer 149. Oxygen can be supplied by, for example, an ion implantation method, an ion doping method, a plasma immersion ion implantation method, or plasma treatment. For the plasma treatment in the method for manufacturing the semiconductor device of one embodiment of the present invention, an apparatus in which an oxygen gas is made to be plasma by high-frequency power can be suitably used. Examples of an apparatus in which a gas is made to be plasma by high-frequency power include a plasma etching apparatus and a plasma ashing apparatus.

Note that heat treatment may be performed after the formation of the insulating films 110af, 110bf, and 110cf before the formation of the metal oxide layer 149. By the heat treatment, water and hydrogen can be released from the surface and inside of the insulating film 110cf.

Next, the metal oxide layer 149 is removed (FIGS. 21B1 and 21B2).

There is no particular limitation on a method for removing the metal oxide layer 149, and a wet etching method can be suitably used. When a wet etching method is used, the insulating film 110cf can be inhibited from being etched at the time of the removal of the metal oxide layer 149. In that case, a reduction in the thickness of the insulating film 110cf can be inhibited and the thickness of the insulating layer 110c can be uniform.

Oxygen supply to the insulating film 110cf is not necessarily performed in the above-described manner. For example, an ion doping method, an ion implantation method, or plasma treatment can be employed to supply an oxygen radical, an oxygen atom, an oxygen atomic ion, an oxygen molecular ion, or the like to the insulating film 110cf. Furthermore, a film that suppresses oxygen release may be formed over the insulating film 110cf and then, oxygen may be supplied to the insulating film 110cf through the film. After the supply of oxygen, the film that suppresses oxygen release is preferably removed. The film that suppresses oxygen release can be a conductive film or a semiconductor film containing one or more of indium, zinc, gallium, tin, aluminum, chromium, tantalum, titanium, molybdenum, nickel, iron, cobalt, and tungsten.

Then, an insulating film 110df to be the insulating layer 110d and an insulating film 110ef to be the insulating layer 110e are formed over the insulating film 110cf (FIGS. 21B1 and 21B2).

As already described above, the insulating layer 110e includes a region having a higher hydrogen content than the insulating layer 110d.

In the film formation gas for the insulating film 110ef, the proportion of the flow rate of a $NH_3$ gas is preferably higher than that in the film formation gas for the insulating film 110df. The film formation gas for the insulating film 110df does not necessarily contain a $NH_3$ gas. When formed under the conductions where the proportion of the flow rate of a $NH_3$ gas to the total flow rate of the film formation gas is high, the insulating film 110ef can have a high hydrogen content. In that case, the amount of hydrogen in the insulating layer 110e to be released by heating can be large. Furthermore, the amount of hydrogen in the insulating layer 110d to be released by heating can be small.

The amount of hydrogen in the insulating layer 110e to be released by heating can be adjusted by making the film formation conditions for the insulating film 110ef different from those for the insulating film 110df. Specifically, the film formation conditions for the insulating film 110ef may be different from those for the insulating film 110df in any one or more of a film formation power (film formation power density), a film formation pressure, the kind of a film formation gas, the flow rate ratio of a film formation gas, a film formation temperature, and the distance between the substrate and an electrode. For example, the film formation power density for the insulating film 110ef may be lower than that for the insulating film 110df, in which case the insulating film 110ef can have a higher hydrogen content than the insulating film 110*df*. In that case, the amount of hydrogen in the insulating layer 110*e* to be released by heating can be large.

For example, silicon nitride films are preferably formed as the insulating films 110*df* and 110*ef*. Alternatively, it is preferable that an aluminum oxide film and a silicon nitride film be formed as the insulating film 110*df* and the insulating film 110*ef*, respectively.

For the other conditions of the formation of the insulating film 110*df*, the description of the formation of the insulating film 110*bf* can be referred to. Note that the film formation conditions for the insulating film 110*df* may be the same as or different from those for the insulating film 110*bf*.

Likewise, for the formation of the insulating film 110*ef*, the description of the formation of the insulating film 110*af* can be referred to. Note that the film formation conditions for the insulating film 110*ef* may be the same as or different from those for the insulating film 110*af*.

Then, a conductive film 112*f* to be the conductive layer 112*b* is formed over the insulating film 110*ef* (FIGS. 22A1 and 22A2). For the formation of the conductive film 112*f*, for example, a sputtering method is suitable.

Subsequently, the conductive layer 112*b* provided with the opening 143 is formed. In the example described in this embodiment, the conductive layer 112*b* is formed in the following manner: the conductive film 112*f* is processed into a conductive layer 112B having a desired shape such as an island shape as shown in FIGS. 22B1 and 22B2 and then, the opening 143 is formed in the conductive layer 112B as shown in FIGS. 23A1 and 23A2. Alternatively, the conductive layer 112*b* may be formed by forming the opening 143 in the conductive film 112*f* and processing the conductive film 112*f* into a desired shape. Here, in the case of forming the transistor 100D shown in FIG. 8B, the opening 143 is provided in a position that overlaps with the opening 148 of the conductive layer 103. In other words, the opening 143 is provided in a position that overlaps with the conductive layer 112*a* but does not overlap with the conductive layer 103.

For processing of the conductive film 112*f* (which can be regarded as the formation of the conductive layer 112B and the formation of the conductive layer 112*b*), a wet etching method and/or a dry etching method can be employed. A wet etching method is particularly suitable for the formation of the opening 143.

Then, the insulating layer 110 (the insulating layers 110*a*, 110*b*, 110*c*, 110*d*, and 110*e*) provided with the opening 141 is formed (FIGS. 23A1 and 23A2). Here, the opening 141 is provided in a position overlapping with the opening 143 of the conductive layer 112*b*. By providing the opening 141, the region of the conductive layer 112*a* that overlaps with the openings 141 and 143 is exposed.

For the formation of the opening 141, a wet etching method and/or a dry etching method can be used, and for example, a dry etching method can be suitably used.

The opening 141 can be formed using the resist mask used for the formation of the opening 143, for example. Specifically, the following process can be employed: a resist mask is formed over the conductive layer 112B, part of the conductive layer 112B is removed with the use of the resist mask to form the opening 143, and part of each of the insulating films 110*af*, 110*bf*, 110*cf*, 110*df*, and 110*ef* is removed with the use of the resist mask to form the opening 141. In the case where the opening 143 is formed to have a larger width than the resist mask, the transistor 100A shown in FIG. 5A and the like can be formed. The opening 143 may be formed using a resist mask that is different from the resist mask used for the formation of the opening 141.

Subsequently, a metal oxide film 108*f* to be the semiconductor layer 108 is formed to cover the opening 141 and the opening 143 (FIGS. 23B1 and 23B2). The metal oxide film 108*f* is provided to be in contact with the top surface and the side surface of the conductive layer 112*b*, the top surface and the side surface of the insulating layer 110, and the top surface of the conductive layer 112*a*.

The metal oxide film 108*f* is preferably formed to have a uniform thickness at the side surface of the insulating layer 110 in the opening 141 and the side surface of the conductive layer 112*b* in the opening 143. The metal oxide film 108*f* can be formed by, for example, a sputtering method or an ALD method.

The metal oxide film 108*f* is preferably formed by a sputtering method using a metal oxide target.

The metal oxide film 108*f* is preferably a dense film with as few defects as possible. The metal oxide film 108*f* is preferably a highly purified film in which impurities containing hydrogen elements are reduced as much as possible. It is particularly preferable to use a metal oxide film having crystallinity as the metal oxide film 108*f*.

In forming the metal oxide film 108*f*, an oxygen gas is preferably used. In the case of using an oxygen gas at the time of forming the metal oxide film 108*f*, oxygen can be favorably supplied into the insulating layer 110. For example, in the case where an oxide is used for the insulating layer 110*c*, oxygen can be favorably supplied into the insulating layer 110*c*.

The oxygen supply to the insulating layer 110*c* enables the semiconductor layer 108 to be supplied with oxygen in a later step, so that the amounts of oxygen vacancies and VoH in the semiconductor layer 108 can be reduced.

In forming the metal oxide film 108*f*, an oxygen gas and an inert gas (such as a helium gas, an argon gas, or a xenon gas) may be mixed. Note that when the oxygen flow rate ratio at the time of forming the metal oxide film 108*f* is higher, the crystallinity of the metal oxide film 108*f* can be higher and a transistor with higher reliability can be obtained. By contrast, when the oxygen flow rate ratio is lower, the crystallinity of the metal oxide film 108*f* is lower and a transistor with a higher on-state current can be obtained.

A higher substrate temperature during the formation of the metal oxide film 108*f* leads to higher crystallinity and higher density of the metal oxide film 108*f*. By contrast, a lower substrate temperature during the formation leads to lower crystallinity and higher electrical conductivity of the metal oxide film 108*f*.

The substrate temperature during the formation of the metal oxide film 108*f* is preferably higher than or equal to room temperature and lower than or equal to 250° C., further preferably higher than or equal to room temperature and lower than or equal to 200° C., still further preferably higher than or equal to room temperature and lower than or equal to 140° C. For example, the substrate temperature is preferably set to be higher than or equal to room temperature and lower than or equal to 140° C. to increase the productivity. When the metal oxide film 108*f* is formed with the substrate temperature set at room temperature or without heating the substrate, the metal oxide film 108*f* can have low crystallinity.

In the case of employing an ALD method, a film formation method such as a thermal ALD method or a plasma enhanced ALD (PEALD) method is preferably employed. A thermal ALD method is preferable because of its capability of forming a film with extremely high step coverage. A PEALD method is preferable because of its capability of forming a film at low temperatures, in addition to its capability of forming a film with high step coverage.

The metal oxide film 108f can be formed by an ALD method using an oxidizing agent and a precursor that contains a metal element to constitute the metal oxide film 108f, for example.

For example, a film of In—Ga—Zn oxide can be formed using a precursor containing indium, a precursor containing gallium, and a precursor containing zinc. Alternatively, a precursor containing indium and a precursor containing gallium and zinc may be used.

As examples of the precursor containing indium, triethylindium, tris(2,2,6,6-tetramethyl-3,5-heptanedionato)indium, cyclopentadienylindium, indium(III) chloride, and (3-(dimethylamino)propyl)dimethylindium can be given.

As examples of the precursor containing gallium, trimethylgallium, triethylgallium, tris(dimethylamide)gallium (III), gallium(III) acetyl acetonate, tris(2,2,6,6-tetramethyl-3,5-heptanedionato)gallium, dimethylchlorogallium, diethylchlorogallium, and gallium(III) chloride can be given.

As examples of the precursor containing zinc, dimethylzinc, diethylzinc, bis(2,2,6,6-tetramethyl-3,5-heptanedionato)zinc, and zinc chloride can be given.

As examples of the oxidizing agent, ozone, oxygen, and water can be given.

As an example of a method for controlling the composition of a film to be formed, adjusting the flow rate ratio, flowing time, flowing order, or the like of the source gases is given. By adjusting such conditions, a film whose composition is continuously changed can be formed. Furthermore, films having different compositions can be formed successively.

Before the formation of the metal oxide film 108f, at least one of treatment for desorbing water, hydrogen, an organic substance, and the like adsorbed on a surface of the insulating layer 110, and treatment for supplying oxygen into the insulating layer 110 is preferably performed. For example, heat treatment can be performed at a temperature higher than or equal to 70° C. and lower than or equal to 200° C. in a reduced-pressure atmosphere. Alternatively, plasma treatment in an oxygen-containing atmosphere may be performed. Alternatively, oxygen may be supplied to the insulating layer 110 by performing plasma treatment in an atmosphere containing an oxidizing gas such as dinitrogen monoxide (N$_2$O). When plasma treatment is performed using a dinitrogen monoxide gas, an organic substance on the surface of the insulating layer 110 can be favorably removed and oxygen can be supplied to the insulating layer 110. The metal oxide film 108f is preferably formed successively after such treatment without exposure of the surface of the insulating layer 110 to the air.

In the case where the semiconductor layer 108 has a stacked-layer structure, an upper metal oxide film is preferably formed successively after the formation of a lower metal oxide film without exposure of a surface of the lower metal oxide film to the air.

Next, the metal oxide film 108f is processed into an island shape to form the semiconductor layer 108 (FIGS. 24A1 and 24A2).

For the formation of the semiconductor layer 108, a wet etching method and/or a dry etching method can be used, and for example, a wet etching method can be suitably used. At this time, part of the conductive layer 112b in the region that does not overlap with the semiconductor layer 108 is etched and thinned in some cases. In a similar manner, part of the insulating layer 110 in the region that does not overlap with the semiconductor layer 108 or the conductive layer 112b is etched and thinned in some cases. For example, in some cases, the insulating layer 110e of the insulating layer 110 is removed by etching and a surface of the insulating layer 110d is exposed. Note that in etching of the metal oxide film 108f, a reduction in the thickness of the insulating layer 110e can be inhibited when a material having high etching selectivity is used for the insulating layer 110e.

It is preferable that heat treatment be performed after the metal oxide film 108f is formed or processed into the semiconductor layer 108. By the heat treatment, hydrogen or water contained in the metal oxide film 108f or the semiconductor layer 108 or adsorbed on a surface of the metal oxide film 108f or the semiconductor layer 108 can be removed. Furthermore, the film quality of the metal oxide film 108f or the semiconductor layer 108 is improved (e.g., the number of defects is reduced or the crystallinity is increased) by the heat treatment in some cases. It is further preferable that the heat treatment be performed before the metal oxide film 108f is processed into the semiconductor layer 108.

It is preferable that the heat treatment cause oxygen supply from the insulating layer 110c to at least part of the metal oxide film 108f or at least part of the semiconductor layer 108. The region of the semiconductor layer 108 that is in contact with the insulating layer 110c and the vicinity of the region function as a channel formation region. Oxygen supply to the region reduces the amount of oxygen vacancies in the channel formation region and lowers the carrier concentration therein. In other words, the channel formation region can be an i-type (intrinsic) or substantially i-type region. Accordingly, a transistor with stable electrical characteristics can be obtained.

It is preferable that the heat treatment cause hydrogen supply from the insulating layer 110a to part of the metal oxide film 108f or part of the semiconductor layer 108. The region of the semiconductor layer 108 that is in contact with the insulating layer 110a and the vicinity of the region are regions to which a gate electric field is not easily applied (offset regions). When supplied with hydrogen, these regions can have reduced resistance. Accordingly, a decrease in field-effect mobility due to the offset regions can be inhibited.

The above description can be referred to for the heat treatment; thus, the detailed description thereof is omitted.

Note that the heat treatment is not necessarily performed. The heat treatment is not necessarily performed in this step, and heat treatment performed in a later step may also serve as the heat treatment in this step. In some cases, treatment at a high temperature (e.g., film formation step) in a later step can serve as the heat treatment in this step.

Then, the insulating layer 106 is formed to cover the semiconductor layer 108, the conductive layer 112b, and the insulating layer 110 (FIGS. 24B1 and 24B2). For the formation of the insulating layer 106, for example, a PECVD method or an ALD method is suitable.

In the case where the semiconductor layer 108 is formed using an oxide semiconductor, the insulating layer 106 preferably functions as a barrier film that inhibits diffusion of oxygen. The insulating layer 106 having a function of inhibiting diffusion of oxygen inhibits diffusion of oxygen to the conductive layer 104 from above the insulating layer 106 and thus can inhibit oxidation of the conductive layer 104. Consequently, a transistor with favorable electrical characteristics and high reliability can be obtained.

Note that in this specification and the like, a barrier film refers to a film having a barrier property. For example, an insulating layer having a barrier property can be referred to as a barrier insulating layer. In this specification and the like, a barrier property means a function of inhibiting diffusion of a particular substance (or low permeability) and/or a function of capturing or fixing (also referred to as gettering) a particular substance.

When the temperature at the time of forming the insulating layer 106 functioning as a gate insulating layer is increased, defects in the insulating layer 106 can be reduced. However, the high temperature at the time of forming the insulating layer 106 sometimes allows release of oxygen from the semiconductor layer 108, which increases the amounts of oxygen vacancies and VoH in the semiconductor layer 108. The substrate temperature at the time of forming the insulating layer 106 is preferably higher than or equal to 180° C. and lower than or equal to 450° C., further preferably higher than or equal to 200° C. and lower than or equal to 450° C., still further preferably higher than or equal to 250° C. and lower than or equal to 450° C., yet still further preferably higher than or equal to 300° C. and lower than or equal to 450° C., yet still further preferably higher than or equal to 300° C. and lower than or equal to 400° C. When the substrate temperature at the time of forming the insulating layer 106 is in the above range, release of oxygen from the semiconductor layer 108 can be inhibited while the defects in the insulating layer 106 can be reduced. Consequently, a transistor with favorable electrical characteristics and high reliability can be obtained.

Before the formation of the insulating layer 106, a surface of the semiconductor layer 108 may be subjected to plasma treatment. By the plasma treatment, impurities such as water adsorbed on the surface of the semiconductor layer 108 can be reduced. Accordingly, impurities at the interface between the semiconductor layer 108 and the insulating layer 106 can be reduced, enabling formation of a highly reliable transistor. Performing the plasma treatment in this manner is particularly favorable in the case where the surface of the semiconductor layer 108 is exposed to the air after the formation of the semiconductor layer 108 before the formation of the insulating layer 106. The plasma treatment can be performed in an atmosphere of oxygen, ozone, nitrogen, dinitrogen monoxide, argon, or the like. The plasma treatment and the formation of the insulating layer 106 are preferably performed successively without exposure to the air.

Then, the conductive layer 104 is formed over the insulating layer 106 (FIGS. 24B1 and 24B2). A conductive film to be the conductive layer 104 can be favorably formed by a sputtering method, a thermal CVD method (including an MOCVD method), an ALD method, or the like. A resist mask is formed over the conductive film by a photolithography process and then, the conductive film is processed, so that the conductive layer 104 with an island shape, which functions as a gate electrode, can be formed.

Through the above steps, the semiconductor device of one embodiment of the present invention can be manufactured.

This embodiment can be combined with any of the other embodiments as appropriate.

Embodiment 3

In this embodiment, display devices of embodiments of the present invention are described with reference to FIG. 25 to FIG. 33F.

The display device in this embodiment can be a high-resolution display device or a large-sized display device. Accordingly, the display device in this embodiment can be used for display portions of electronic devices such as a digital camera, a digital video camera, a digital photo frame, a mobile phone, a portable game console, a portable information terminal, and an audio reproducing device, in addition to display portions of electronic devices with a relatively large screen, such as a television device, a desktop or notebook personal computer, a monitor of a computer or the like, digital signage, and a large game machine such as a pachinko machine.

The display device in this embodiment can be a high-resolution display device. Accordingly, the display device in this embodiment can be used for display portions of information terminals (wearable devices) such as watch-type and bracelet-type information terminals and display portions of wearable devices capable of being worn on a head, such as a VR device like a head-mounted display (HMD) and a glasses-type AR device.

The semiconductor device of one embodiment of the present invention can be used for a display device or a module including the display device. Examples of the module including the display device are a module in which a connector such as a flexible printed circuit board (hereinafter referred to as an FPC) or a tape carrier package (TCP) is attached to the display device, a module which is mounted with an integrated circuit (IC) by a chip on glass (COG) method, a chip on film (COF) method, or the like, and the like.

[Display Device 50A]

Figure 25:
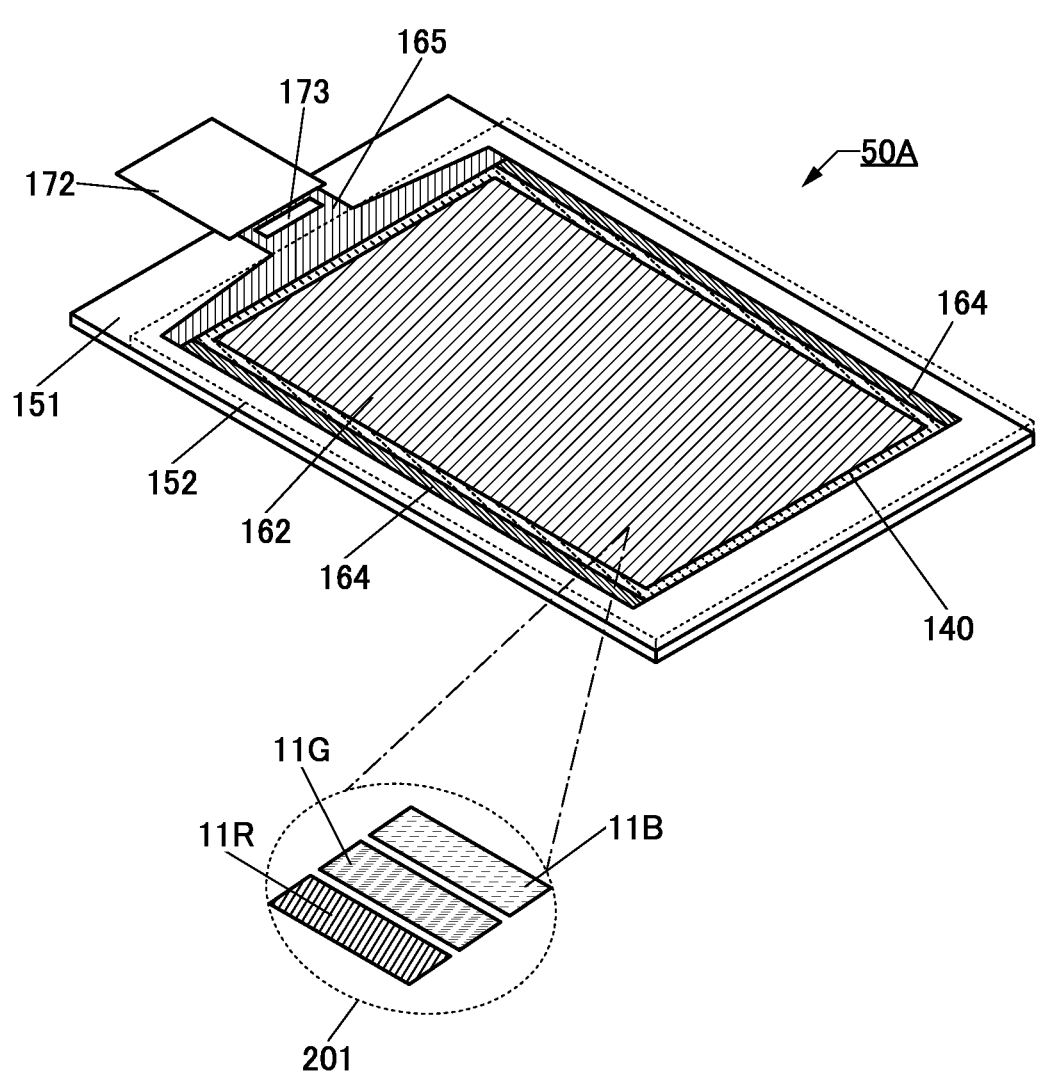
FIG. 25 is a perspective view showing an example of a display device.

FIG. 25 is a perspective view of a display device 50A.

In the display device 50A, a substrate 152 and a substrate 151 are bonded to each other. In FIG. 25, the substrate 152 is indicated by a dashed line.

The display device 50A includes a display portion 162, a connection portion 140, a circuit portion 164, a wiring 165, and the like. FIG. 25 illustrates an example where an IC 173 and an FPC 172 are implemented onto the display device 50A. Thus, the structure illustrated in FIG. 25 can be regarded as a display module including the display device 50A, the IC, and the FPC.

The connection portion 140 is provided outside the display portion 162. The connection portion 140 can be provided along one or more sides of the display portion 162. The number of connection portions 140 may be one or more. FIG. 25 illustrates an example where the connection portion 140 is provided to surround the four sides of the display portion. In the connection portion 140, a common electrode of a display element is electrically connected to a conductive layer so that a potential can be supplied to the common electrode.

The circuit portion 164 includes a scan line driver circuit (also referred to as a gate driver), for example. The circuit portion 164 may include both a scan line driver circuit and a signal line driver circuit (also referred to as a source driver).

The wiring 165 has a function of supplying a signal and power to the display portion 162 and the circuit portion 164. The signal and power are input to the wiring 165 from the outside through the FPC 172 or from the IC 173.

FIG. 25 illustrates an example where the IC 173 is provided on the substrate 151 by a COG method, a COF method, or the like. An IC including one or both of a scan line driver circuit and a signal line driver circuit can be used as the IC 173, for example. Note that the display device 50A and the display module are not necessarily provided with an IC. The IC may be mounted on the FPC by a COF method or the like.

The semiconductor device of one embodiment of the present invention can be used for one or both of the display portion 162 and the circuit portion 164 of the display device 50A, for example.

When the semiconductor device of one embodiment of the present invention is used for a pixel circuit of the display device, the area occupied by the pixel circuit can be reduced and the display device can have high resolution, for example. When the semiconductor device of one embodiment of the present invention is used for a driver circuit (e.g., one or both of a gate line driver circuit and a source line driver circuit) of the display device, the area occupied by the driver circuit can be reduced and the display device can have a narrow bezel, for example. Since the semiconductor device of one embodiment of the present invention has favorable electrical characteristics, a display device can have increased reliability by using the semiconductor device.

The display portion 162 of the display device 50A is a region where an image is to be displayed, and includes a plurality of pixels 201 that are periodically arranged. FIG. 25 shows an enlarged view of one of the pixels 201.

There is no particular limitation on the arrangement of the pixels in the display device of this embodiment, and any of a variety of arrangements can be employed. Examples of the arrangement of the pixels include stripe arrangement, S-stripe arrangement, matrix arrangement, delta arrangement, Bayer arrangement, and PenTile arrangement.

The pixel 201 illustrated in FIG. 25 includes a subpixel 11R that emits red light, a subpixel 11G that emits green light, and a subpixel 11B that emits blue light.

The subpixels 11R, 11G, and 11B each include a display element and a circuit for controlling the driving of the display element.

Any of a variety of elements can be used as the display element, and a liquid crystal element or a light-emitting element can be used, for example. Alternatively, a micro electro mechanical systems (MEMS) shutter element, an optical interference type MEMS element, or a display element using a microcapsule method, an electrophoretic method, an electrowetting method, an Electronic Liquid Powder (registered trademark) method, or the like can be used. Alternatively, a quantum-dot LED (QLED) employing a light source and color conversion technology using quantum dot materials may be used.

As examples of a display device that includes a liquid crystal element, a transmissive liquid crystal display device, a reflective liquid crystal display device, and a transflective liquid crystal display device can be given.

As the light-emitting element, a self-luminous light-emitting element such as a light-emitting diode (LED), an organic LED (OLED), or a semiconductor laser can be used. Examples of the LED include a mini LED and a micro LED.

Examples of a light-emitting substance contained in the light-emitting element include a substance exhibiting fluorescence (a fluorescent material), a substance exhibiting phosphorescence (a phosphorescent material), a substance exhibiting thermally activated delayed fluorescence (a thermally activated delayed fluorescent (TADF) material), and an inorganic compound (e.g., a quantum dot material).

The light-emitting element can emit infrared, red, green, blue, cyan, magenta, yellow, or white light, for example. When the light-emitting element has a microcavity structure, higher color purity can be achieved.

One of the pair of electrodes of the light-emitting element functions as an anode, and the other electrode functions as a cathode.

In this embodiment, the case where a light-emitting element is used as the display element is mainly described as an example.

The display device of one embodiment of the present invention can have any of the following structures: a top-emission structure in which light is emitted in a direction opposite to the substrate where the light-emitting element is formed, a bottom-emission structure in which light is emitted toward the substrate where the light-emitting element is formed, and a dual-emission structure in which light is emitted toward both surfaces.

Figure 26:
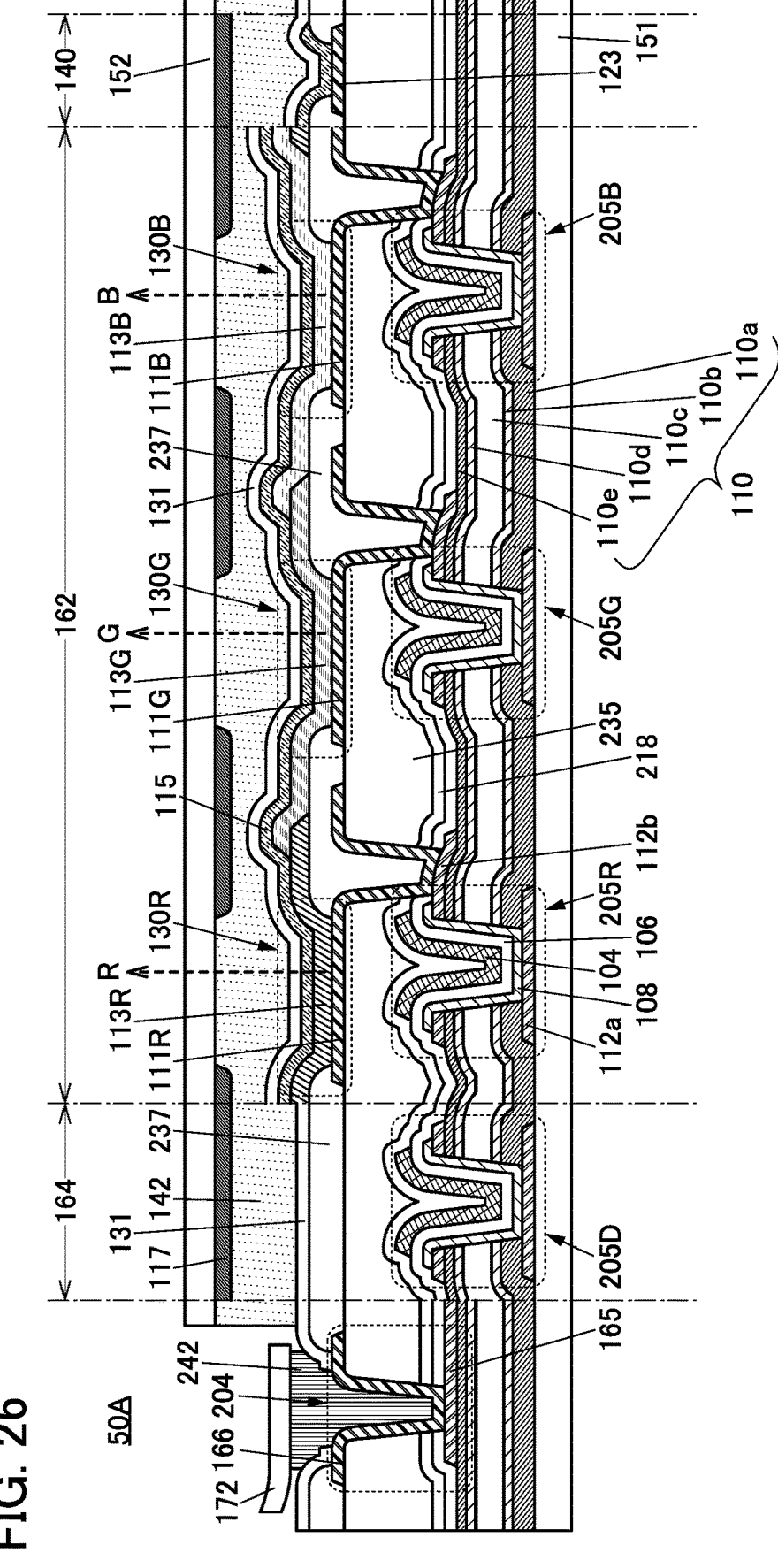
FIG. 26 is a cross-sectional view showing an example of a display device.

FIG. 26 illustrates an example of cross sections of part of a region including the FPC 172, part of the circuit portion 164, part of the display portion 162, part of the connection portion 140, and part of a region including the end portion of the display device 50A.

The display device 50A illustrated in FIG. 26 includes transistors 205D, 205R, 205G, and 205B, light-emitting elements 130R, 130G, and 130B, and the like between the substrates 151 and 152. The light-emitting elements 130R, 130G, and 130B are display elements included in the subpixel 11R that emits red light, the subpixel 11G that emits green light, and the subpixel 11B that emits blue light, respectively.

The display device 50A employs an SBS structure. The SBS structure can optimize materials and structures of light-emitting elements and thus can extend freedom of choice of materials and structures, whereby the luminance and the reliability can be easily improved.

The display device 50A has a top-emission structure. The aperture ratio of pixels in a top-emission structure can be higher than that of pixels in a bottom-emission structure because a transistor and the like can be provided so as to overlap with a light-emitting region of a light-emitting element in the top-emission structure.

All of the transistors 205D, 205R, 205G, and 205B are formed over the substrate 151. These transistors can be manufactured using the same material through the same process.

This embodiment describes an example where OS transistors are used as the transistors 205D, 205R, 205G, and 205B. Any of the transistors of embodiments of the present invention can be used as the transistors 205D, 205R, 205G, and 205B. In other words, the display device 50A includes any of the transistors of embodiments of the present invention in both the display portion 162 and the circuit portion 164. When the display portion 162 includes the transistor of one embodiment of the present invention, the pixel size can be reduced and high resolution can be achieved. When the circuit portion 164 includes the transistor of one embodiment of the present invention, the area occupied by the circuit portion 164 can be reduced and a narrower bezel can be achieved. The description in the above embodiment can be referred to for the transistor of one embodiment of the present invention.

Specifically, the transistors 205D, 205R, 205G, and 205B each include the conductive layer 104 functioning as a gate, the insulating layer 106 functioning as a gate insulating layer, the conductive layer 112a and the conductive layer 112b functioning as a source and a drain, the semiconductor layer 108 including a metal oxide, and the insulating layer 110 (the insulating layers 110a, 110b, 110c, 110d, and 110e). Here, a plurality of layers obtained by processing the same conductive film are shown with the same hatching pattern.

The insulating layer 110 is positioned between the conductive layer 112a and the semiconductor layer 108. The insulating layer 106 is positioned between the conductive layer 104 and the semiconductor layer 108.

Note that the transistor included in the display device of this embodiment is not limited to the transistor of one embodiment of the present invention. For example, the display device of this embodiment may include the transistor of one embodiment of the present invention and a transistor having another structure in combination.

The display device of this embodiment may include one or more of a planar transistor, a staggered transistor, and an inverted staggered transistor. A transistor included in the display device of this embodiment may have a top-gate structure or a bottom-gate structure. Gates may be provided above and below a semiconductor layer where a channel is formed.

A Si transistor may be included in the display device of this embodiment.

To increase the emission luminance of the light-emitting element included in the pixel circuit, it is necessary to increase the amount of current flowing through the light-emitting element. For this, it is necessary to increase the source-drain voltage of a driving transistor included in the pixel circuit. Since an OS transistor has a higher breakdown voltage between the source and the drain than a Si transistor, a high voltage can be applied between the source and the drain of the OS transistor. Thus, with the use of an OS transistor as a driving transistor included in the pixel circuit, the amount of current flowing through the light-emitting element can be increased, resulting in an increase in emission luminance of the light-emitting element.

When transistors operate in a saturation region, a change in source-drain current relative to a change in gate-source voltage can be smaller in an OS transistor than in a Si transistor. Accordingly, when an OS transistor is used as the driving transistor included in the pixel circuit, a current flowing between the source and the drain can be set minutely by a change in gate-source voltage; hence, the amount of current flowing through the light-emitting element can be controlled. Therefore, the number of gray levels in the pixel circuit can be increased.

Regarding saturation characteristics of a current flowing when a transistor operates in a saturation region, a current (saturation current) can flow more stably in an OS transistor than in a Si transistor even when the source-drain voltage gradually increases. Thus, with the use of an OS transistor as a driving transistor, a current can be made to flow stably through the light-emitting element, for example, even when a variation in current-voltage characteristics of the light-emitting element occurs. In other words, when the OS transistor operates in the saturation region, the source-drain current hardly changes with a change in the source-drain voltage; hence, the emission luminance of the light-emitting element can be stable.

The transistor included in the circuit portion 164 and the transistor included in the display portion 162 may have the same structure or different structures. One structure or two or more kinds of structures may be employed for a plurality of transistors included in the circuit portion 164. Similarly, one structure or two or more kinds of structures may be employed for a plurality of transistors included in the display portion 162.

All of the transistors included in the display portion 162 may be OS transistors or Si transistors. Alternatively, some of the transistors included in the display portion 162 may be OS transistors and the others may be Si transistors.

For example, when both an LTPS transistor and an OS transistor are used in the display portion 162, the display device can have low power consumption and high drive capability. Note that a structure in which an LTPS transistor and an OS transistor are used in combination is referred to as LTPO in some cases. As a favorable example, a structure is given in which an OS transistor is used as a transistor functioning as a switch for controlling electrical continuity and discontinuity between wirings and an LTPS transistor is used as a transistor for controlling a current.

For example, one transistor included in the display portion 162 functions as a transistor for controlling a current flowing through the light-emitting element and can also be referred to as a driving transistor. One of a source and a drain of the driving transistor is electrically connected to a pixel electrode of the light-emitting element. An LTPS transistor is preferably used as the driving transistor. In that case, the amount of current flowing through the light-emitting element can be increased in the pixel circuit.

By contrast, another transistor included in the display portion 162 functions as a switch for controlling selection or non-selection of a pixel and can also be referred to as a selection transistor. A gate of the selection transistor is electrically connected to a gate line, and one of a source and a drain thereof is electrically connected to a source line (signal line). An OS transistor is preferably used as the selection transistor. Accordingly, the gray level of the pixel can be maintained even with an extremely low frame frequency (e.g., 1 fps or lower); thus, power consumption can be reduced by stopping the driver in displaying a still image.

An insulating layer 218 is provided to cover the transistors 205D, 205R, 205G, and 205B and an insulating layer 235 is provided over the insulating layer 218.

The insulating layer 218 preferably functions as a protective layer of the transistors. A material that does not easily allow diffusion of impurities such as water and hydrogen is preferably used for the insulating layer 218. This is because the insulating layer 218 can function as a barrier layer. Such a structure can effectively inhibit diffusion of impurities into the transistors from the outside and increase the reliability of the display device.

The insulating layer 218 preferably includes one or more inorganic insulating films. Examples of the inorganic insulating film include an oxide insulating film, a nitride insulating film, an oxynitride insulating film, and a nitride oxide insulating film. Specific examples of these inorganic insulating films are as described above.

The insulating layer 235 preferably has a function of a planarization layer, and an organic insulating film is suitably used. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. Alternatively, the insulating layer 235 may have a stacked-layer structure of an organic insulating film and an inorganic insulating film. The outermost layer of the insulating layer 235 preferably functions as an etching protective layer. In that case, the formation of a depression in the insulating layer 235 can be inhibited in processing pixel electrodes 111R, 111G, and 111B, for example. Alternatively, a depression may be formed in the insulating layer 235 in processing the pixel electrodes 111R, 111G, and 111B, for example.

The light-emitting elements 130R, 130G, and 130B are provided over the insulating layer 235.

The light-emitting element 130R includes the pixel electrode 111R over the insulating layer 235, an EL layer 113R over the pixel electrode 111R, and a common electrode 115 over the EL layer 113R. The light-emitting element 130R illustrated in FIG. 26 emits red light (R). The EL layer 113R includes a light-emitting layer that emits red light.

The light-emitting element 130G includes the pixel electrode 111G over the insulating layer 235, an EL layer 113G over the pixel electrode 111G, and the common electrode 115 over the EL layer 113G. The light-emitting element 130G illustrated in FIG. 26 emits green light (G). The EL layer 113G includes a light-emitting layer that emits green light.

The light-emitting element 130B includes the pixel electrode 111B over the insulating layer 235, an EL layer 113B over the pixel electrode 111B, and the common electrode 115 over the EL layer 113B. The light-emitting element 130B illustrated in FIG. 26 emits blue light (B). The EL layer 113B includes a light-emitting layer that emits blue light.

Although the EL layers 113R, 113G, and 113B have the same thickness in FIG. 26, the present invention is not limited thereto. The EL layers 113R, 113G, and 113B may have different thicknesses. For example, the thicknesses of the EL layers 113R, 113G, and 113B are preferably set to match an optical path length that intensifies light emitted from each EL layer. In that case, a microcavity structure is obtained, and the color purity of light emitted from each light-emitting element can be improved.

The pixel electrode 111R is electrically connected to the conductive layer 112b included in the transistor 205R through an opening provided in the insulating layers 106, 218, and 235. In a similar manner, the pixel electrode 111G is electrically connected to the conductive layer 112b included in the transistor 205G and the pixel electrode 111B is electrically connected to the conductive layer 112b included in the transistor 205B.

End portions of the pixel electrodes 111R, 111G, and 111B are covered with an insulating layer 237. The insulating layer 237 functions as a partition. The insulating layer 237 can have a single-layer structure or a stacked-layer structure including one or both of an inorganic insulating material and an organic insulating material. A material that can be used for the insulating layer 218 and a material that can be used for the insulating layer 235 can be used for the insulating layer 237, for example. The insulating layer 237 can electrically isolate the pixel electrode and the common electrode. Furthermore, the insulating layer 237 can electrically isolate light-emitting elements adjacent to each other.

The insulating layer 237 is provided in at least the display portion 162. The insulating layer 237 may be provided in not only the display portion 162 but also the connection portion 140 and the circuit portion 164. The insulating layer 237 may be provided to extend to the end portion of the display device 50A.

The common electrode 115 is one continuous film shared by the light-emitting elements 130R, 130G, and 130B. The common electrode 115 shared by the light-emitting elements is electrically connected to a conductive layer 123 provided in the connection portion 140. The conductive layer 123 is preferably formed using a conductive layer formed using the same material through the same process as the pixel electrodes 111R, 111G, and 111B.

In the display device of one embodiment of the present invention, a conductive film that transmits visible light is used for the electrode through which light is extracted, which is either the pixel electrode or the common electrode.

A conductive film reflecting visible light is preferably used for the electrode through which light is not extracted.

A conductive film that transmits visible light may be used also for the electrode through which light is not extracted. In that case, this electrode is preferably provided between a reflective layer and the EL layer. In other words, light emitted by the EL layer may be reflected by the reflective layer to be extracted from the display device.

As the material of the pair of electrodes of the light-emitting element, a metal, an alloy, an electrically conductive compound, a mixture thereof, or the like can be used as appropriate. Specific examples of the material include metals such as aluminum, magnesium, titanium, chromium, manganese, iron, cobalt, nickel, copper, gallium, zinc, indium, tin, molybdenum, tantalum, tungsten, palladium, gold, platinum, silver, yttrium, and neodymium, and an alloy containing any of these metals in appropriate combination. Other examples of the material include indium tin oxide (also referred to as In—Sn oxide or ITO), In—Si—Sn oxide (also referred to as ITSO), indium zinc oxide (In—Zn oxide), and In—W—Zn oxide. Other examples of the material include an alloy containing aluminum (aluminum alloy), such as an alloy of aluminum, nickel, and lanthanum (Al—Ni—La), and an alloy containing silver, such as an alloy of silver and magnesium and an alloy of silver, palladium, and copper (also referred to as Ag—Pd—Cu or APC). Other examples of the material include an element belonging to Group 1 or Group 2 of the periodic table that is not described above (e.g., lithium, cesium, calcium, or strontium), a rare earth metal such as europium or ytterbium, an alloy containing an appropriate combination of any of these elements, and graphene.

The light-emitting element preferably employs a microcavity structure. Therefore, one of the pair of electrodes of the light-emitting element preferably includes an electrode having properties of transmitting and reflecting visible light (a transflective electrode), and the other preferably includes an electrode having a property of reflecting visible light (a reflective electrode). When the light-emitting element has a microcavity structure, light obtained from the light-emitting layer can be resonated between the electrodes, whereby light emitted from the light-emitting element can be intensified.

The transparent electrode has a light transmittance higher than or equal to 40%. For example, an electrode having a visible light (light with wavelengths greater than or equal to 400 nm and less than 750 nm) transmittance higher than or equal to 40% is preferably used as the transparent electrode of the light-emitting element. The transflective electrode has a visible light reflectance higher than or equal to 10% and lower than or equal to 95%, preferably higher than or equal to 30% and lower than or equal to 80%. The reflective electrode has a visible light reflectance higher than or equal to 40% and lower than or equal to 100%, preferably higher than or equal to 70% and lower than or equal to 100%. These electrodes preferably have a resistivity lower than or equal to $1 \times 10^{-2}$ Ωcm.

The EL layers 113R, 113G, and 113B are each provided to have an island shape. In FIG. 26, end portions of the EL layers 113R and 113G adjacent to each other overlap with each other, end portions of the EL layers 113G and 113B adjacent to each other overlap with each other, and end portions of the EL layers 113R and 113B adjacent to each other overlap with each other. When island-shaped EL layers are formed using a fine metal mask, end portions of the EL layers adjacent to each other may overlap with each other as illustrated in FIG. 26; however, the present invention is not limited thereto. That is, it is also possible that the EL layers adjacent to each other do not overlap with each other and are apart from each other. It is also possible that the display device includes both a portion where the EL layers adjacent to each other overlap with each other and a portion where the EL layers adjacent to each other do not overlap with each other and are apart from each other.

Each of the EL layers 113R, 113G, and 113B includes at least a light-emitting layer. The light-emitting layer contains one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

The light-emitting layer may contain one or more kinds of organic compounds (e.g., a host material or an assist material) in addition to the light-emitting substance (a guest material). As one or more kinds of organic compounds, one or both of a substance with a good hole-transport property (a hole-transport material) and a substance with a good electron-transport property (an electron-transport material) can be used. As the one or more kinds of organic compounds, a substance with a bipolar property (a substance with a good electron-transport property and a good hole-transport property) or a TADF material may be used.

The light-emitting layer preferably includes a phosphorescent material and a combination of a hole-transport material and an electron-transport material that easily forms an exciplex, for example. With such a structure, light emission can be efficiently obtained by exciplex-triplet energy transfer (ExTET), which is energy transfer from the exciplex to the light-emitting substance (the phosphorescent material). When a combination of materials is selected so as to form an exciplex that emits light whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of the light-emitting element can be achieved at the same time.

In addition to the light-emitting layer, the EL layer can include one or more of a layer containing a substance having a good hole-injection property (a hole-injection layer), a layer containing a hole-transport material (a hole-transport layer), a layer containing a substance having a good electron-blocking property (an electron-blocking layer), a layer containing a substance having a good electron-injection property (an electron-injection layer), a layer containing an electron-transport material (an electron-transport layer), and a layer containing a substance having a good hole-blocking property (a hole-blocking layer). The EL layer may further include one or both of a bipolar substance and a TADF material.

Either a low molecular compound or a high molecular compound can be used in the light-emitting element, and an inorganic compound may also be included. Each layer included in the light-emitting element can be formed by any of the following methods: an evaporation method (including a vacuum evaporation method), a transfer method, a printing method, an inkjet method, a coating method, and the like.

The light-emitting element may employ a single structure (a structure including only one light-emitting unit) or a tandem structure (a structure including a plurality of light-emitting units). The light-emitting unit includes at least one light-emitting layer. In a tandem structure, a plurality of light-emitting units are connected in series with a charge-generation layer therebetween. The charge-generation layer has a function of injecting electrons into one of two light-emitting units and injecting holes to the other when a voltage is applied between the pair of electrodes. A tandem structure enables a light-emitting element capable of emitting light with high luminance. Furthermore, the amount of current needed for obtaining a predetermined luminance can be smaller in a tandem structure than in a single structure; thus, a tandem structure enables higher reliability. A tandem structure may be referred to as a stack structure.

In the case of using a tandem light-emitting element in FIG. 26, the EL layer 113R preferably includes a plurality of light-emitting units that emit red light, the EL layer 113G preferably includes a plurality of light-emitting units that emit green light, and the EL layer 113B preferably includes a plurality of light-emitting units that emit blue light.

A protective layer 131 is provided over the light-emitting elements 130R, 130G, and 130B. The protective layer 131 and the substrate 152 are bonded to each other with an adhesive layer 142. The substrate 152 is provided with a light-blocking layer 117. A solid sealing structure, a hollow sealing structure, or the like can be employed to seal the light-emitting elements. In FIG. 26, a solid sealing structure is employed, in which a space between the substrate 152 and the substrate 151 is filled with the adhesive layer 142. Alternatively, a hollow sealing structure may be employed, in which the space is filled with an inert gas (e.g., nitrogen or argon). In that case, the adhesive layer 142 may be provided not to overlap with the light-emitting element. Alternatively, the space may be filled with a resin other than the frame-shaped adhesive layer 142.

The protective layer 131 is provided at least in the display portion 162, and preferably provided to cover the entire display portion 162. The protective layer 131 is preferably provided to cover not only the display portion 162 but also the connection portion 140 and the circuit portion 164. It is further preferable that the protective layer 131 be provided to extend to the end portion of the display device 50A. Meanwhile, a connection portion 204 has a portion not provided with the protective layer 131 so that the FPC 172 and a conductive layer 166 are electrically connected to each other.

By providing the protective layer 131 over the light-emitting elements 130R, 130G, and 130B, the reliability of the light-emitting elements can be increased.

The protective layer 131 may have a single-layer structure or a stacked-layer structure of two or more layers. There is no limitation on the conductivity of the protective layer 131. For the protective layer 131, at least one of an insulating film, a semiconductor film, and a conductive film can be used.

The protective layer 131 including an inorganic film can inhibit deterioration of the light-emitting elements by preventing oxidation of the common electrode 115 and inhibiting entry of impurities (e.g., moisture and oxygen) into the light-emitting elements, for example; thus, the reliability of the display device can be improved.

For the protective layer 131, an inorganic insulating film such as an oxide insulating film, a nitride insulating film, an oxynitride insulating film, or a nitride oxide insulating film can be used, for example. Specific examples of these inorganic insulating films are as described above. In particular, the protective layer 131 preferably includes a nitride insulating film or a nitride oxide insulating film, and further preferably includes a nitride insulating film.

An inorganic film containing ITO, In—Zn oxide, Ga—Zn oxide, Al—Zn oxide, IGZO, or the like can be used for the protective layer 131. The inorganic film preferably has high resistance, specifically, higher resistance than the common electrode 115. The inorganic film may further contain nitrogen.

When light emitted from the light-emitting element is extracted through the protective layer 131, the protective layer 131 preferably has a good visible-light-transmitting property. For example, ITO, IGZO, and aluminum oxide are preferable because they are inorganic materials having a good visible-light-transmitting property.

The protective layer 131 can be, for example, a stack of an aluminum oxide film and a silicon nitride film over the aluminum oxide film, or a stack of an aluminum oxide film and an IGZO film over the aluminum oxide film. Such a stacked-layer structure can inhibit entry of impurities (e.g., water and oxygen) into the EL layer.

Furthermore, the protective layer 131 may include an organic film. For example, the protective layer 131 may include both an organic film and an inorganic film. Examples of an organic film that can be used for the protective layer 131 include organic insulating films that can be used for the insulating layer 235.

The connection portion 204 is provided in a region of the substrate 151 not overlapping with the substrate 152. In the connection portion 204, the wiring 165 is electrically connected to the FPC 172 through the conductive layer 166 and a connection layer 242. In this example, the wiring 165 is a conductive layer obtained by processing the same conductive film as the conductive layer 112*b*. In this example, the conductive layer 166 is a conductive layer obtained by processing the same conductive film as the pixel electrodes 111R, 111G, and 111B. On the top surface of the connection portion 204, the conductive layer 166 is exposed. Thus, the connection portion 204 and the FPC 172 can be electrically connected to each other through the connection layer 242.

The display device 50A has a top-emission structure. Light from the light-emitting element is emitted toward the substrate 152. For the substrate 152, a material having a good visible-light-transmitting property is preferably used. The pixel electrodes 111R, 111G, and 111B contain a material that reflects visible light, and the counter electrode (the common electrode 115) contains a material that transmits visible light.

The light-blocking layer 117 is preferably provided on the surface of the substrate 152 on the substrate 151 side. The light-blocking layer 117 can be provided over a region between adjacent light-emitting elements, in the connection portion 140, in the circuit portion 164, and the like.

A coloring layer such as a color filter may be provided on the surface of the substrate 152 on the substrate 151 side or over the protective layer 131. When the color filter is provided so as to overlap with the light-emitting element, the color purity of light emitted from the pixel can be increased.

The coloring layer is a colored layer that selectively transmits light in a specific wavelength range and absorbs light in the other wavelength ranges. For example, a red (R) color filter for transmitting light in the red wavelength range, a green (G) color filter for transmitting light in the green wavelength range, a blue (B) color filter for transmitting light in the blue wavelength range, or the like can be used. Each coloring layer can be formed using one or more of a metal material, a resin material, a pigment, and a dye. Each coloring layer is formed in a desired position by a printing method, an ink-jet method, an etching method using a photolithography method, or the like.

Moreover, a variety of optical members can be provided on the outer surface of the substrate 152 (the surface opposite to the substrate 151). Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, an impact-absorbing layer, or the like may be provided as a surface protective layer on the outer surface of the substrate 152. For example, a glass layer or a silica layer ($SiO_x$ layer) is preferably provided as the surface protective layer to inhibit the surface contamination and damage. The surface protective layer may be formed using diamond like carbon (DLC), aluminum oxide ($AlO_x$), a polyester-based material, a polycarbonate-based material, or the like. For the surface protective layer, a material having a high visible light transmittance is preferably used. The surface protective layer is preferably formed using a material with high hardness.

For each of the substrates 151 and 152, glass, quartz, ceramic, sapphire, a resin, a metal, an alloy, a semiconductor, or the like can be used. The substrate on the side from which light from the light-emitting element is extracted is formed using a material that transmits the light. When a flexible material is used for the substrates 151 and 152, the display device can have increased flexibility and a flexible display can be obtained. Furthermore, a polarizing plate may be used as at least one of the substrates 151 and 152.

For each of the substrates 151 and 152, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used as at least one of the substrates 151 and 152.

In the case where a circularly polarizing plate overlaps with the display device, a highly optically isotropic substrate is preferably used as the substrate included in the display device. A highly optically isotropic substrate has a low birefringence (in other words, a small amount of birefringence). Examples of the film having high optical isotropy include a triacetyl cellulose (TAC, also referred to as cellulose triacetate) film, a cycloolefin polymer (COP) film, a cycloolefin copolymer (COC) film, and an acrylic film.

The adhesive layer 142 can be formed using any of a variety of curable adhesives, e.g., a reactive curable adhesive, a thermosetting curable adhesive, an anaerobic adhesive, or a photocurable adhesive such as an ultraviolet curable adhesive. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. A two-component-mixture-type resin may be used. An adhesive sheet or the like may be used.

For the connection layer 242, an anisotropic conductive film (ACF), an anisotropic conductive paste (ACP), or the like can be used.

[Display Device 50B]

Figure 27:
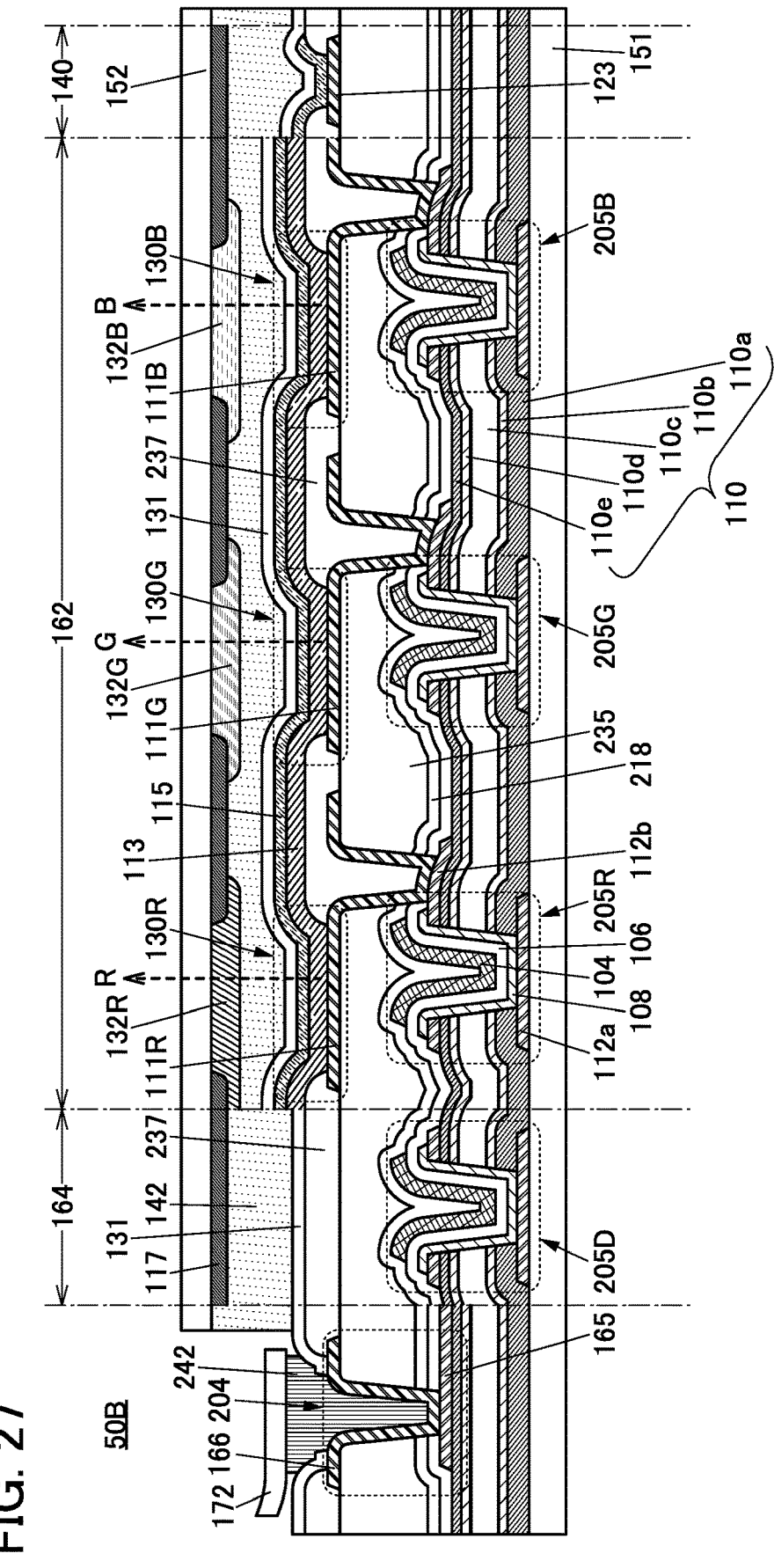
FIG. 27 is a cross-sectional view showing an example of a display device.

A display device 50B illustrated in FIG. 27 is different from the display device mainly in that the subpixels of different colors include respective coloring layers (color filters or the like) and the light-emitting elements that share an EL layer 113. Note that in the following description of display devices, the description of portions similar to those of the above-described display device may be omitted.

In the display device 50B illustrated in FIG. 27, the transistors 205D, 205R, 205G, and 205B, the light-emitting elements 130R, 130G, and 130B, a coloring layer 132R transmitting red light, a coloring layer 132G transmitting green light, a coloring layer 132B transmitting blue light, and the like are provided between the substrates 151 and 152.

The light-emitting element 130R includes the pixel electrode 111R, the EL layer 113 over the pixel electrode 111R, and the common electrode 115 over the EL layer 113. Light emitted from the light-emitting element 130R is extracted as red light to the outside of the display device 50B through the coloring layer 132R.

The light-emitting element 130G includes the pixel electrode 111G, the EL layer 113 over the pixel electrode 111G, and the common electrode 115 over the EL layer 113. Light emitted from the light-emitting element 130G is extracted as green light to the outside of the display device 50B through the coloring layer 132G.

The light-emitting element 130B includes the pixel electrode 111B, the EL layer 113 over the pixel electrode 111B, and the common electrode 115 over the EL layer 113. Light emitted from the light-emitting element 130B is extracted as blue light to the outside of the display device 50B through the coloring layer 132B.

The EL layer 113 and the common electrode 115 are shared between the light-emitting elements 130R, 130G, and 130B. The number of manufacturing steps can be smaller in the case where the EL layer 113 is shared between the subpixels of different colors than the case where the subpixels of different colors include different EL layers.

The light-emitting elements 130R, 130G, and 130B illustrated in FIG. 27 emit white light, for example. When white light emitted from the light-emitting elements 130R, 130G, and 130B passes through the coloring layers 132R, 132G, and 132B, light of desired colors can be obtained.

In the light-emitting element that emits white light, two or more light-emitting layers are preferably included. When two light-emitting layers are used to obtain white light, two light-emitting layers that emit light of complementary colors are selected. For example, when the emission colors of the first light-emitting layer and the second light-emitting layer are made complementary, the light-emitting element can be configured to emit white light as a whole. In the case where three or more light-emitting layers are used to obtain white light, the light-emitting element is configured to emit white light as a whole by combining emission colors of the three or more light-emitting layers.

For example, the EL layer 113 preferably includes a light-emitting layer containing a light-emitting substance that emits blue light and a light-emitting layer containing a light-emitting substance that emits visible light having a longer wavelength than blue light. The EL layer 113 preferably includes a light-emitting layer that emits yellow light and a light-emitting layer that emits blue light, for example. Alternatively, the EL layer 113 preferably includes a light-emitting layer that emits red light, a light-emitting layer that emits green light, and a light-emitting layer that emits blue light, for example.

A light-emitting element that emits white light preferably has a tandem structure. Specific examples include a two-unit tandem structure including a light-emitting unit that emits yellow light and a light-emitting unit that emits blue light; a two-unit tandem structure including a light-emitting unit that emits red light and green light and a light-emitting unit that emits blue light; a three-unit tandem structure in which a light-emitting unit that emits blue light, a light-emitting unit that emits yellow, yellow-green, or green light, and a light-emitting unit that emits blue light are stacked in this order; and a three-unit tandem structure in which a light-emitting unit that emits blue light, a light-emitting unit that emits yellow, yellow-green, or green light and red light, and a light-emitting unit that emits blue light are stacked in this order. Examples of the number of stacked light-emitting units and the order of colors from the anode side include a two-unit structure of B and Y; a two-unit structure of B and a light-emitting unit X; a three-unit structure of B, Y, and B; and a three-unit structure of B, X, and B. Examples of the number of light-emitting layers stacked in the light-emitting unit X and the order of colors from an anode side include a two-layer structure of R and Y; a two-layer structure of R and G; a two-layer structure of G and R; a three-layer structure of G, R, and G; and a three-layer structure of R, G, and R. Another layer may be provided between two light-emitting layers.

In the case where the light-emitting element configured to emit white light has a microcavity structure, light with a specific wavelength (e.g., red, green, or blue) is sometimes intensified to be emitted.

Alternatively, the light-emitting elements 130R, 130G, and 130B illustrated in FIG. 27 emit blue light, for example. In this case, the EL layer 113 includes one or more light-emitting layers that emit blue light. In the subpixel 11B that emits blue light, blue light emitted from the light-emitting element 130B can be extracted. In each of the subpixel 11R that emits red light and the subpixel 11G that emits green light, a color conversion layer is provided between the light-emitting element 130R or 130G and the substrate 152 so that blue light emitted from the light-emitting element 130R or 130G is converted into light with a longer wavelength, whereby red light or green light can be extracted. Furthermore, it is preferable that over the light-emitting element 130R, the coloring layer 132R be provided between the color conversion layer and the substrate 152 and over the light-emitting element 130G, the coloring layer 132G be provided between the color conversion layer and the substrate 152. In some cases, part of light emitted from the light-emitting element is transmitted through the color conversion layer without being converted. When light transmitted through the color conversion layer is extracted through the coloring layer, light other than light of the intended color can be absorbed by the coloring layer, and color purity of light exhibited by a subpixel can be improved.

[Display Device 50C]

Figure 28:
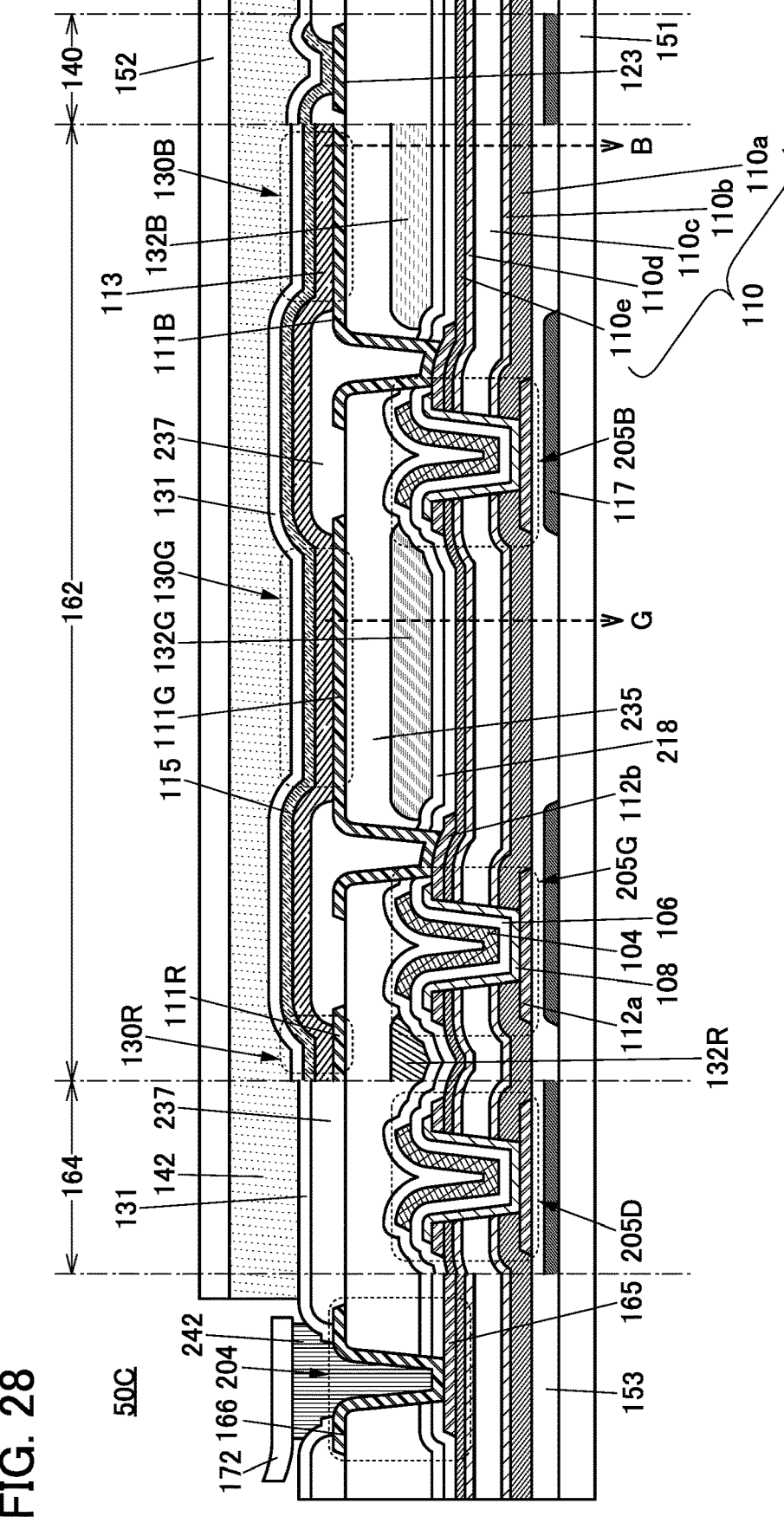
FIG. 28 is a cross-sectional view showing an example of a display device.

A display device 50C illustrated in FIG. 28 is different from the display device mainly in having a bottom-emission structure.

Light from the light-emitting element is emitted toward the substrate 151. For the substrate 151, a material having a good visible-light-transmitting property is preferably used. By contrast, there is no limitation on the light-transmitting property of a material used for the substrate 152.

The light-blocking layer 117 is preferably formed between the substrate 151 and the transistor. FIG. 28 illustrates an example where the light-blocking layers 117 are provided over the substrate 151, the insulating layer 153 is provided over the light-blocking layers 117, and the transistors 205D, 205R (not illustrated), 205G, and 205B and the like are provided over the insulating layer 153. In addition, the coloring layers 132R, 132G, and 132B are provided over the insulating layer 218 and the insulating layer 235 is provided over the coloring layers 132R, 132G, and 132B.

The light-emitting element 130R overlapping with the coloring layer 132R includes the pixel electrode 111R, the EL layer 113, and the common electrode 115.

The light-emitting element 130G overlapping with the coloring layer 132G includes the pixel electrode 111G, the EL layer 113, and the common electrode 115.

The light-emitting element 130B overlapping with the coloring layer 132B includes the pixel electrode 111B, the EL layer 113, and the common electrode 115.

A material having a good visible-light-transmitting property is used for each of the pixel electrodes 111R, 111G, and 111B. A material that reflects visible light is preferably used for the common electrode 115. In the display device having a bottom-emission structure, a metal or the like having low resistance can be used for the common electrode 115; thus, a voltage drop due to the resistance of the common electrode 115 can be suppressed and the display quality can be high.

The transistor of one embodiment of the present invention can be miniaturized and the area occupied by the transistor can be reduced, so that the aperture ratio of the pixel can be increased or the pixel size can be reduced in the display device having a bottom-emission structure.

[Display Device 50D]

Figures 29A, 29B, 29C:
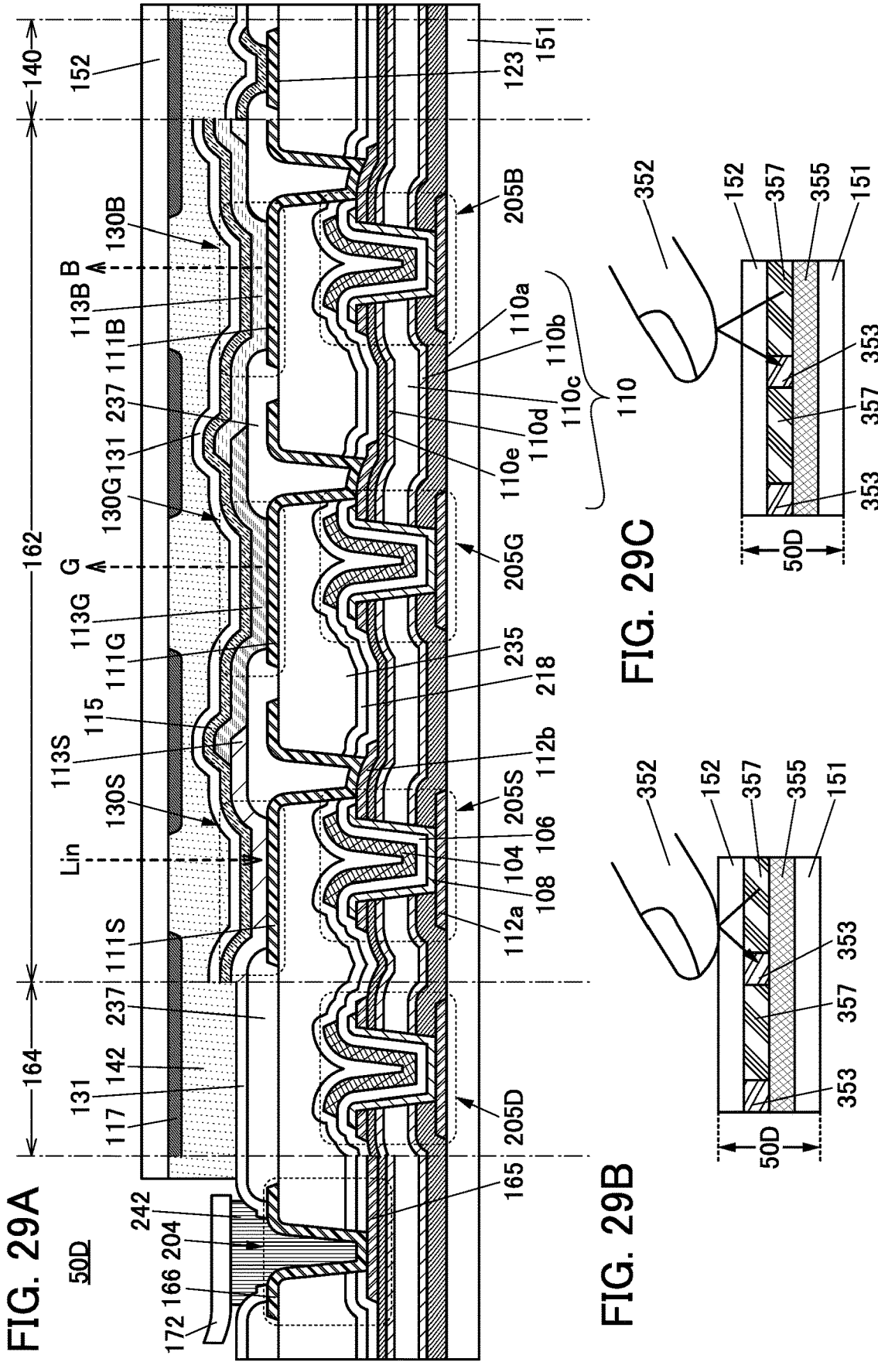
FIGS. 29A to 29C are cross-sectional views showing examples of a display device.

A display device 50D illustrated in FIG. 29A is different from the display device mainly in including a light-receiving element 130S.

The display device 50D includes light-emitting elements and a light-receiving element in a pixel. In the display device 50D, organic EL elements are preferably used as the light-emitting elements and an organic photodiode is preferably used as the light-receiving element. The organic EL elements and the organic photodiodes can be formed over the same substrate. Thus, the organic photodiodes can be incorporated in a display device including the organic EL elements.

The display device 50D can detect the touch or approach of an object while displaying an image because the pixel includes the light-emitting element and the light-receiving element and thus has a light-receiving function. Accordingly, the display portion 162 has one or both of an image capturing function and a sensing function in addition to a function of displaying an image. For example, an image can be displayed by using all the subpixels included in the display device 50D; or light can be emitted by some of the subpixels as a light source, light can be detected by some other subpixels, and an image can be displayed by using the remaining subpixels.

Accordingly, a light-receiving portion and a light source do not need to be provided separately from the display device 50D; hence, the number of components of an electronic device can be reduced. For example, a biometric authentication device provided in the electronic device or a capacitive touch panel for scroll operation or the like is not necessarily provided separately. Thus, with the use of the display device 50D, the electronic device can be provided at lower manufacturing costs.

When the light-receiving elements are used for an image sensor, the display device 50D can capture an image using the light-receiving elements. For example, image capturing for personal authentication with the use of a fingerprint, a palm print, the iris, the shape of a blood vessel (including the shape of a vein and the shape of an artery), a face, or the like is possible by using the image sensor.

Moreover, the light-receiving element can be used in a touch sensor (also referred to as a direct touch sensor), a contactless sensor (also referred to as a hover sensor, a hover touch sensor, or a touchless sensor), or the like. The touch sensor can detect an object (e.g., a finger, a hand, or a pen) when the display device and the object come in direct contact with each other. Furthermore, the contactless sensor can detect the object even when the object is not in contact with the display device.

The light-receiving element 130S includes a pixel electrode 111S over the insulating layer 235, a functional layer 113S over the pixel electrode 111S, and the common electrode 115 over the functional layer 113S. The functional layer 113S is irradiated with light Lin coming from the outside of the display device 50D.

The pixel electrode 111S is electrically connected to the conductive layer 112$b$ included in a transistor 205S through an opening provided in the insulating layers 106, 218, and 235.

An end portion of the pixel electrode 111S is covered with the insulating layer 237.

The common electrode 115 is one continuous film shared by the light-receiving element 130S and the light-emitting elements 130R (not illustrated), 130G, and 130B. The common electrode 115 shared by the light-emitting elements and the light-receiving element is electrically connected to the conductive layer 123 provided in the connection portion 140.

The functional layer 113S includes at least an active layer (also referred to as a photoelectric conversion layer). The active layer includes a semiconductor. Examples of the semiconductor include an inorganic semiconductor such as silicon and an organic semiconductor including an organic compound. This embodiment illustrates an example where an organic semiconductor is used as the semiconductor included in the active layer. An organic semiconductor is preferably used, in which case the light-emitting layer and the active layer can be formed by the same method (e.g., a vacuum evaporation method) and thus the same manufacturing apparatus can be used.

In addition to the active layer, the functional layer 113S may further include a layer containing a substance having a good hole-transport property, a substance having a good electron-transport property, a substance having a bipolar property, or the like. Without limitation to the above, the functional layer 113S may further include a layer containing a substance having a good hole-injection property, a hole-blocking material, a substance having a good electron-injection property, an electron-blocking material, or the like. The functional layer 113S can be formed using a material that can be used for the light-emitting element.

Either a low molecular compound or a high molecular compound can be used in the light-receiving element, and an inorganic compound may also be included. Each layer included in the light-receiving element can be formed by any of the following methods: an evaporation method (including a vacuum evaporation method), a transfer method, a printing method, an inkjet method, a coating method, and the like.

In the display device 50D illustrated in FIGS. 29B and 29C, a layer 353 including a light-receiving element, a circuit layer 355, and a layer 357 including a light-emitting element are provided between the substrates 151 and 152.

The layer 353 includes the light-receiving element 130S, for example. The layer 357 includes the light-emitting elements 130R, 130G, and 130B, for example.

The circuit layer 355 includes a circuit for driving a light-receiving element and a circuit for driving a light-emitting element. The circuit layer 355 includes the transistors 205R, 205G, and 205B, for example. The circuit layer 355 can further include one or more of a switch, a capacitor, a resistor, a wiring, a terminal, and the like.

FIG. 29B illustrates an example where the light-receiving element 130S is used as a touch sensor. Light emitted from the light-emitting element in the layer 357 is reflected by a finger 352 that touches the display device 50D as illustrated in FIG. 29B; then, the light-receiving element in the layer 353 senses the reflected light. Thus, the touch of the finger 352 on the display device 50D can be detected.

FIG. 29C illustrates an example where the light-receiving element 130S is used as a contactless sensor. Light emitted from the light-emitting element in the layer 357 is reflected by the finger 352 that is close to (i.e., that does not touch) the display device as illustrated in FIG. 29C; then, the light-receiving element in the layer 353 senses the reflected light.

[Display Device 50E]

Figure 30:
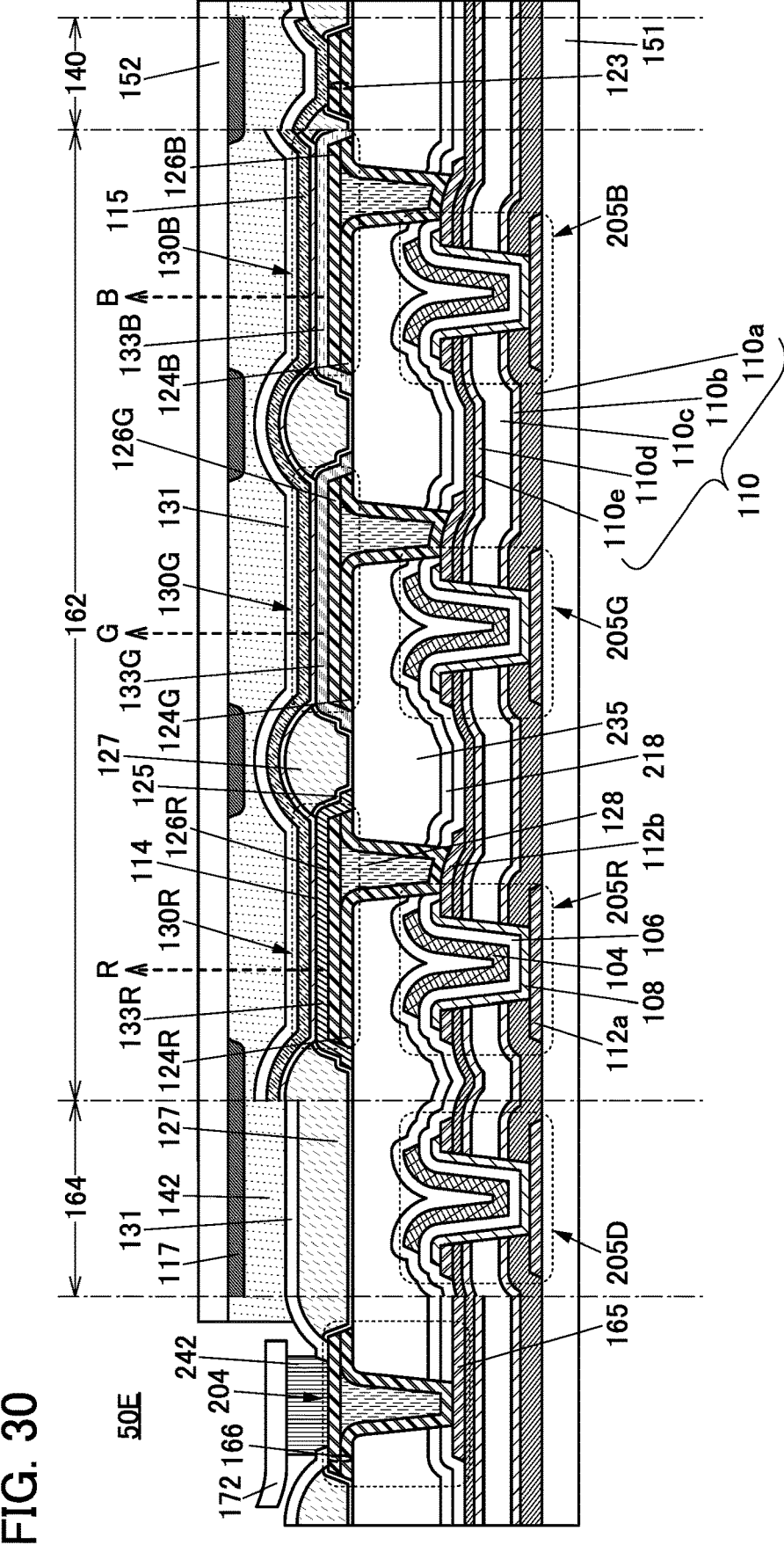
FIG. 30 is a cross-sectional view showing an example of a display device.

A display device 50E illustrated in FIG. 30 is an example of a display device having a metal maskless (MML) structure. In other words, the display device 50E includes a light-emitting element that is formed without using a fine metal mask. The stacked-layer structure from the substrate 151 to the insulating layer 235 and the stacked-layer structure from the protective layer 131 to the substrate 152 are similar to those in the display device 50A; therefore, description thereof is omitted.

In FIG. 30, the light-emitting elements 130R, 130G, and 130B are provided over the insulating layer 235.

The light-emitting element 130R includes a conductive layer 124R over the insulating layer 235, a conductive layer 126R over the conductive layer 124R, a layer 133R over the conductive layer 126R, a common layer 114 over the layer 133R, and the common electrode 115 over the common layer 114. The light-emitting element 130R illustrated in FIG. 30 emits red light (R). The layer 133R includes a light-emitting layer that emits red light. In the light-emitting element 130R, the layer 133R and the common layer 114 can be collectively referred to as an EL layer. One or both of the conductive layer 124R and the conductive layer 126R can be referred to as a pixel electrode.

The light-emitting element 130G includes a conductive layer 124G over the insulating layer 235, a conductive layer 126G over the conductive layer 124G, a layer 133G over the conductive layer 126G, the common layer 114 over the layer 133G, and the common electrode 115 over the common layer 114. The light-emitting element 130G illustrated in FIG. 30 emits green light (G). The layer 133G includes a light-emitting layer that emits green light. In the light-emitting element 130G, the layer 133G and the common layer 114 can be collectively referred to as an EL layer. One or both of the conductive layer 124G and the conductive layer 126G can be referred to as a pixel electrode.

The light-emitting element 130B includes a conductive layer 124B over the insulating layer 235, a conductive layer 126B over the conductive layer 124B, a layer 133B over the conductive layer 126B, the common layer 114 over the layer 133B, and the common electrode 115 over the common layer 114. The light-emitting element 130B illustrated in FIG. 30 emits blue light (B). The layer 133B includes a light-emitting layer that emits blue light. In the light-emitting element 130B, the layer 133B and the common layer 114 can be collectively referred to as an EL layer. One or both of the conductive layer 124B and the conductive layer 126B can be referred to as a pixel electrode.

In this specification and the like, in the EL layers included in the light-emitting elements, the island-shaped layer provided in each light-emitting element is referred to as the layer 133B, the layer 133G, or the layer 133R, and the layer shared by the light-emitting elements is referred to as the common layer 114. Note that in this specification and the like, only the layers 133R, 133G, and 133B are sometimes referred to as island-shaped EL layers, EL layers formed in an island shape, or the like, in which case the common layer 114 is not included in the EL layer. Note that the light-emitting element does not necessarily include the common layer 114, and all the layers constituting the EL layer may be island-shaped layers.

The layers 133R, 133G, and 133B are isolated from each other. When the EL layer is provided to have an island shape for each light-emitting element, a leakage current between adjacent light-emitting elements can be inhibited. This can prevent crosstalk-induced unintended light emission, so that a display device with extremely high contrast can be obtained.

Although the layers 133R, 133G, and 133B have the same thickness in FIG. 30, the present invention is not limited thereto. The layers 133R, 133G, and 133B may have different thicknesses.

The conductive layer 124R is electrically connected to the conductive layer 112b included in the transistor 205R through an opening provided in the insulating layers 106, 218, and 235. In a similar manner, the conductive layer 124G is electrically connected to the conductive layer 112b included in the transistor 205G and the conductive layer 124B is electrically connected to the conductive layer 112b included in the transistor 205B.

The conductive layers 124R, 124G, and 124B are formed to cover the openings provided in the insulating layer 235. A layer 128 is embedded in each of the depressions of the conductive layers 124R, 124G, and 124B.

The layer 128 has a function of filling the depressions of the conductive layers 124R, 124G, and 124B. The conductive layers 126R, 126G, and 126B electrically connected to the conductive layers 124R, 124G, and 124B, respectively, are provided over the conductive layers 124R, 124G, and 124B and the layer 128. Thus, regions overlapping with the depressions of the conductive layers 124R, 124G, and 124B can also be used as the light-emitting regions, increasing the aperture ratio of the pixels. The conductive layer 124R and the conductive layer 126R each preferably include a conductive layer functioning as a reflective electrode.

The layer 128 may be an insulating layer or a conductive layer. Any of a variety of inorganic insulating materials, organic insulating materials, and conductive materials can be used for the layer 128 as appropriate. Specifically, the layer 128 is preferably formed using an insulating material and is particularly preferably formed using an organic insulating material. For the layer 128, an organic insulating material that can be used for the insulating layer 237 can be used, for example.

Although FIG. 30 illustrates an example where the top surface of the layer 128 includes a flat portion, the shape of the layer 128 is not particularly limited. The top surface of the insulating layer 128 may include at least one of a convex surface, a concave surface, and a flat surface.

The level of the top surface of the layer 128 and the level of the top surface of the conductive layer 124R may be the same or substantially the same, or may be different from each other. For example, the level of the top surface of the layer 128 may be either lower or higher than the level of the top surface of the conductive layer 124R.

An end portion of the conductive layer 126R may be aligned with an end portion of the conductive layer 124R or may cover the side surface of the end portion of the conductive layer 124R. The end portions of the conductive layers 124R and 126R each preferably have a tapered shape. Specifically, the end portions of the conductive layers 124R and 126R each preferably have a tapered shape with a taper angle greater than 0° and less than 90°. In the case where the end portions of the pixel electrodes have a tapered shape, the layer 133R provided along the side surfaces of the pixel electrodes has an inclined portion. When the side surface of the pixel electrode has a tapered shape, coverage with an EL layer provided along the side surface of the pixel electrode can be improved.

Since the conductive layers 124G and 126G and the conductive layers 124B and 126B are similar to the conductive layers 124R and 126R, the detailed description thereof is omitted.

In this example, the conductive layer 123 and the conductive layer 166 each have a stacked-layer structure of a conductive layer obtained by processing the same conductive film as the conductive layers 124R, 124G, and 124B and a conductive layer obtained by processing the same conductive film as the conductive layers 126R, 126G, and 126B.

The top and side surfaces of the conductive layer 126R are covered with the layer 133R. Similarly, the top and side surfaces of the conductive layers 126G are covered with the layer 133G, and the top and side surfaces of the conductive layers 126B are covered with the layer 133B. Accordingly, regions provided with the conductive layers 126R, 126G, and 126B can be entirely used as the light-emitting regions of the light-emitting elements 130R, 130G, and 130B, thereby increasing the aperture ratio of the pixels.

The side surface and part of the top surface of each of the layers 133R, 133G, and 133B are covered with the insulating layers 125 and 127. The common layer 114 is provided over the layers 133R, 133G, and 133B and the insulating layers 125 and 127, and the common electrode 115 is provided over the common layer 114. The common layer 114 and the common electrode 115 are each one continuous film shared by a plurality of light-emitting elements.

In FIG. 30, the insulating layer 237 illustrated in FIG. 26 or the like is not provided between the conductive layer 126R and the layer 133R. That is, an insulating layer (also referred to as a partition wall, a bank, a spacer, or the like) covering and in contact with an upper end portion of the pixel electrode is not provided in the display device 50E. Thus, the interval between adjacent light-emitting elements can be extremely shortened. Accordingly, the display device can have high resolution or high definition. In addition, a mask for forming the insulating layer is not needed, which leads to a reduction in manufacturing cost of the display device.

As described above, the layers 133R, 133G, and 133B each include the light-emitting layer. The layers 133R, 133G, and 133B each preferably include the light-emitting layer and a carrier-transport layer (an electron-transport layer or a hole-transport layer) over the light-emitting layer. Alternatively, the layers 133R, 133G, and 133B each preferably include a light-emitting layer and a carrier-blocking layer (a hole-blocking layer or an electron-blocking layer) over the light-emitting layer. Alternatively, the layers 133R, 133G, and 133B each preferably include a light-emitting layer, a carrier-blocking layer over the light-emitting layer, and a carrier-transport layer over the carrier-blocking layer.

Since surfaces of the layers 133R, 133G, and 133B are exposed in the manufacturing process of the display device, providing one or both of the carrier-transport layer and the carrier-blocking layer over the light-emitting layer inhibits the light-emitting layer from being exposed on the outermost surface, so that damage to the light-emitting layer can be reduced. Thus, the reliability of the light-emitting element can be increased.

The common layer 114 includes, for example, an electron-injection layer or a hole-injection layer. Alternatively, the common layer 114 may be a stack of an electron-transport layer and an electron-injection layer, or may be a stack of a hole-transport layer and a hole-injection layer. The common layer 114 is shared by the light-emitting elements 130R, 130G, and 130B.

The side surfaces of the layers 133R, 133G, and 133B are each covered with the insulating layer 125. The insulating layer 127 covers the side surfaces of the layers 133R, 133G, and 133B with the insulating layer 125 therebetween.

The side surfaces (and part of the top surfaces) of the layers 133R, 133G, and 133B are covered with at least one of the insulating layer 125 and the insulating layer 127, so that the common layer 114 (or the common electrode 115) can be inhibited from being in contact with the side surfaces of the pixel electrodes and the layers 133R, 133G, and 133B, leading to inhibition of a short circuit of the light-emitting elements. Thus, the reliability of the light-emitting element can be increased.

The insulating layer 125 is preferably in contact with the side surfaces of the layers 133R, 133G, and 133B. The insulating layer 125 in contact with the layers 133R, 133G, and 133B can prevent film separation of the layers 133R, 133G, and 133B, whereby the reliability of the light-emitting element can be increased.

The insulating layer 127 is provided over the insulating layer 125 to fill a depression of the insulating layer 125. The insulating layer 127 preferably covers at least part of the side surface of the insulating layer 125.

The insulating layers 125 and 127 can fill a gap between adjacent island-shaped layers, whereby the formation surface of the layers (e.g., the carrier-injection layer and the common electrode) provided over the island-shaped layers can have higher flatness with small unevenness. Consequently, coverage with the carrier-injection layer, the common electrode, and the like can be improved.

The common layer 114 and the common electrode 115 are provided over the layer 133R, the layer 133G, the layer 133B, the insulating layer 125, and the insulating layer 127. Before the insulating layer 125 and the insulating layer 127 are provided, a step is generated due to a level difference between a region where the pixel electrode and the island-shaped EL layer are provided and a region where neither the pixel electrode nor the island-shaped EL layer is provided (a region between the light-emitting elements). In the display device of one embodiment of the present invention, the step can be planarized with the insulating layer 125 and the insulating layer 127, and the coverage with the common layer 114 and the common electrode 115 can be improved. Thus, connection defects caused by step disconnection can be inhibited. In addition, an increase in electric resistance, which is caused by local thinning of the common electrode 115 due to the step, can be inhibited.

The top surface of the insulating layer 127 preferably has a shape with high flatness. The top surface of the insulating layer 127 may include at least one of a flat surface, a convex surface, and a concave surface. For example, the top surface of the insulating layer 127 preferably has a smooth convex shape with high flatness.

The insulating layer 125 can be formed using an inorganic material. For the insulating layer 125, an inorganic insulating film such as an oxide insulating film, a nitride insulating film, an oxynitride insulating film, or a nitride oxide insulating film can be used, for example. Specific examples of these inorganic insulating films are as described above. The insulating layer 125 may have a single-layer structure or a stacked-layer structure. In particular, aluminum oxide is preferably used because it has high selectivity with respect to the EL layer in etching and has a function of protecting the EL layer in forming the insulating layer 127 which is to be described later. In particular, when an inorganic insulating film such as an aluminum oxide film, a hafnium oxide film, or a silicon oxide film is formed by an ALD method as the insulating layer 125, the insulating layer 125 can have few pinholes and an excellent function of protecting the EL layer. The insulating layer 125 may have a stacked-layer structure of a film formed by an ALD method and a film formed by a sputtering method. The insulating layer 125 may have a stacked-layer structure of an aluminum oxide film formed by an ALD method and a silicon nitride film formed by a sputtering method, for example.

The insulating layer 125 preferably has a function of a barrier insulating layer against at least one of water and oxygen. The insulating layer 125 preferably has a function of inhibiting diffusion of at least one of water and oxygen. Alternatively, the insulating layer 125 preferably has a function of capturing or fixing (also referred to as gettering) at least one of water and oxygen.

When the insulating layer 125 has a function of the barrier insulating layer, entry of impurities (typically, at least one of water and oxygen) that would be diffused into the light-emitting elements from the outside can be inhibited. With this structure, a highly reliable light-emitting element and a highly reliable display device can be provided.

The insulating layer 125 preferably has a low impurity concentration. Accordingly, degradation of the EL layer, which is caused by entry of impurities into the EL layer from the insulating layer 125, can be inhibited. In addition, when the impurity concentration is reduced in the insulating layer 125, a barrier property against at least one of water and oxygen can be increased. For example, the insulating layer 125 preferably has a sufficiently low hydrogen concentration or a sufficiently low carbon concentration, and further preferably has both a sufficiently low hydrogen concentration and a sufficiently low carbon concentration.

The insulating layer 127 provided over the insulating layer 125 has a function of filling large unevenness of the insulating layer 125, which is formed between the adjacent light-emitting elements. In other words, the insulating layer 127 has an effect of improving the planarity of the formation surface of the common electrode 115.

As the insulating layer 127, an insulating layer containing an organic material can be favorably used. As the organic material, a photosensitive organic resin is preferably used, and for example, a photosensitive resin composite containing an acrylic resin is preferably used. Note that in this specification and the like, an acrylic resin refers to not only a polymethacrylic acid ester or a methacrylic resin, but also all the acrylic polymer in a broad sense in some cases.

Alternatively, the insulating layer 127 may be formed using an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like. The insulating layer 127 may be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin. A photoresist may be used as the photosensitive organic resin. As the photosensitive organic resin, either a positive-type material or a negative-type material may be used.

The insulating layer 127 may be formed using a material absorbing visible light. When the insulating layer 127 absorbs light emitted from the light-emitting element, light leakage (stray light) from the light-emitting element to the adjacent light-emitting element through the insulating layer 127 can be suppressed. Thus, the display quality of the display device can be improved. Since no polarizing plate is required to improve the display quality of the display device, the weight and thickness of the display device can be reduced.

Examples of the material absorbing visible light include a material containing a pigment of black or any other color, a material containing a dye, a light-absorbing resin material (e.g., polyimide), and a resin material that can be used for color filters (a color filter material). Using a resin material obtained by stacking or mixing color filter materials of two or three or more colors is particularly preferred to enhance the effect of blocking visible light. In particular, mixing color filter materials of three or more colors enables the formation of a black or nearly black resin layer.

[Display Device 50F]

Figure 31:
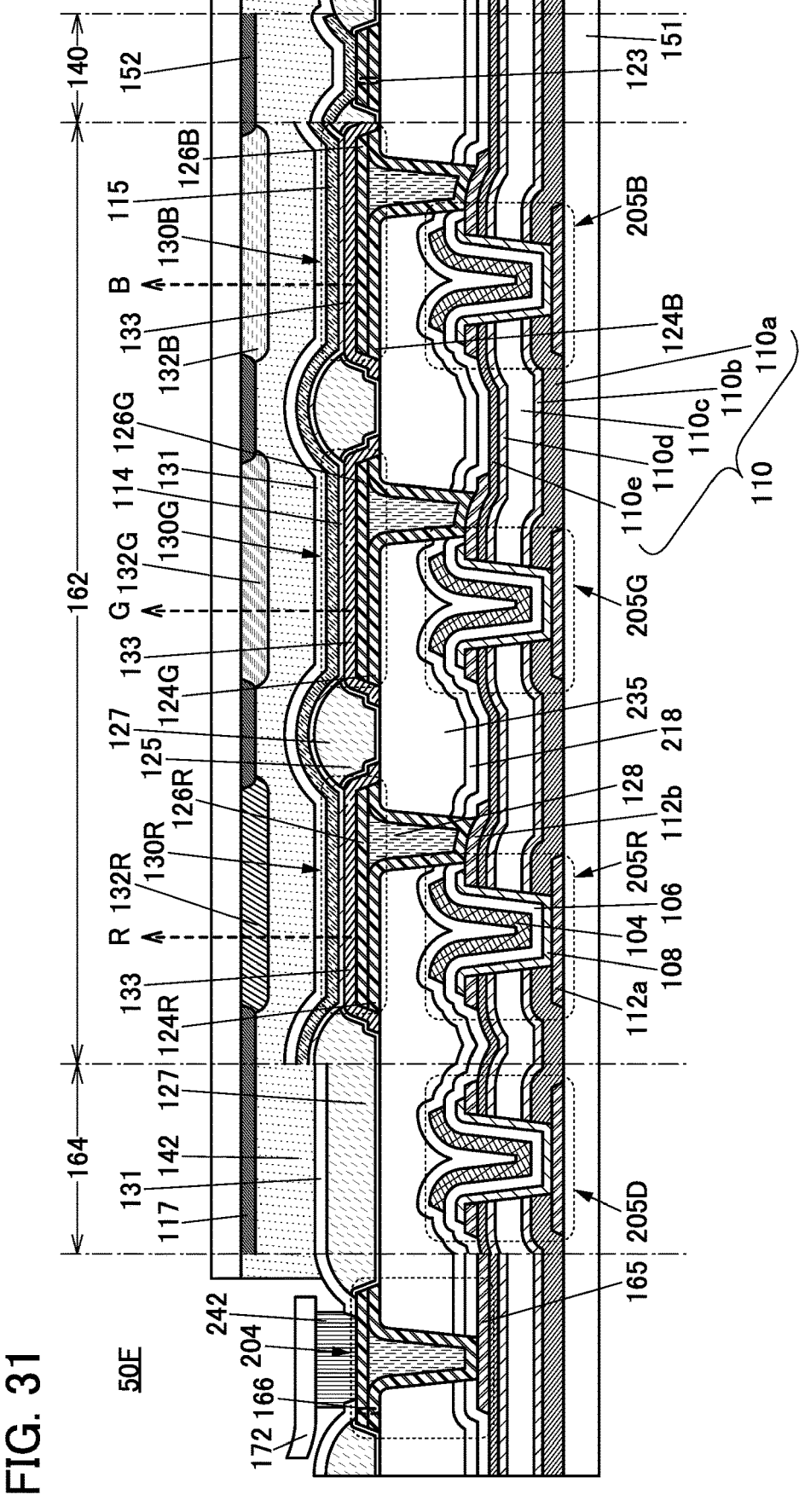
FIG. 31 is a cross-sectional view showing an example of a display device.

A display device 50F illustrated in FIG. 31 is different from the display device mainly in that the subpixels of different colors include respective coloring layers (color filters or the like) and respective layers 133 in the light-emitting elements.

In the display device 50F illustrated in FIG. 31, the transistors 205D, 205R, 205G, and 205B, the light-emitting elements 130R, 130G, and 130B, the coloring layer 132R transmitting red light, the coloring layer 132G transmitting green light, the coloring layer 132B transmitting blue light, and the like are provided between the substrates 151 and 152.

Light emitted from the light-emitting element 130R is extracted as red light to the outside of the display device 50F through the coloring layer 132R. Similarly, light emitted from the light-emitting element 130G is extracted as green light to the outside of the display device 50F through the coloring layer 132G. Light emitted from the light-emitting element 130B is extracted as blue light to the outside of the display device 50F through the coloring layer 132B.

The light-emitting elements 130R, 130G, and 130B each include the layer 133. The three layers 133 are formed using the same process and the same material. The three layers 133 are isolated from each other. When the EL layer is provided to have an island shape for each light-emitting element, a leakage current between adjacent light-emitting elements can be inhibited. This can prevent crosstalk-induced unintended light emission, so that a display device with extremely high contrast can be obtained.

The light-emitting elements 130R, 130G, and 130B illustrated in FIG. 31 emit white light, for example. When white light emitted from the light-emitting elements 130R, 130G, and 130B passes through the coloring layers 132R, 132G, and 132B, light of desired colors can be obtained.

Alternatively, the light-emitting elements 130R, 130G, and 130B illustrated in FIG. 31 emit blue light, for example. In this case, the layer 133 includes one or more light-emitting layers that emit blue light. In the subpixel 11B that emits blue light, blue light emitted from the light-emitting element 130B can be extracted. In each of the subpixel 11R that emits red light and the subpixel 11G that emits green light, a color conversion layer is provided between the light-emitting element 130R or 130G and the substrate 152 so that blue light emitted from the light-emitting element 130R or 130G is converted into light with a longer wavelength, whereby red light or green light can be extracted. Furthermore, it is preferable that over the light-emitting element 130R, the coloring layer 132R be provided between the color conversion layer and the substrate 152 and over the light-emitting element 130G, the coloring layer 132G be provided between the color conversion layer and the substrate 152. When light transmitted through the color conversion layer is extracted through the coloring layer, light other than light of the intended color can be absorbed by the coloring layer, and color purity of light exhibited by a subpixel can be improved.

[Display Device 50G]

Figure 32:
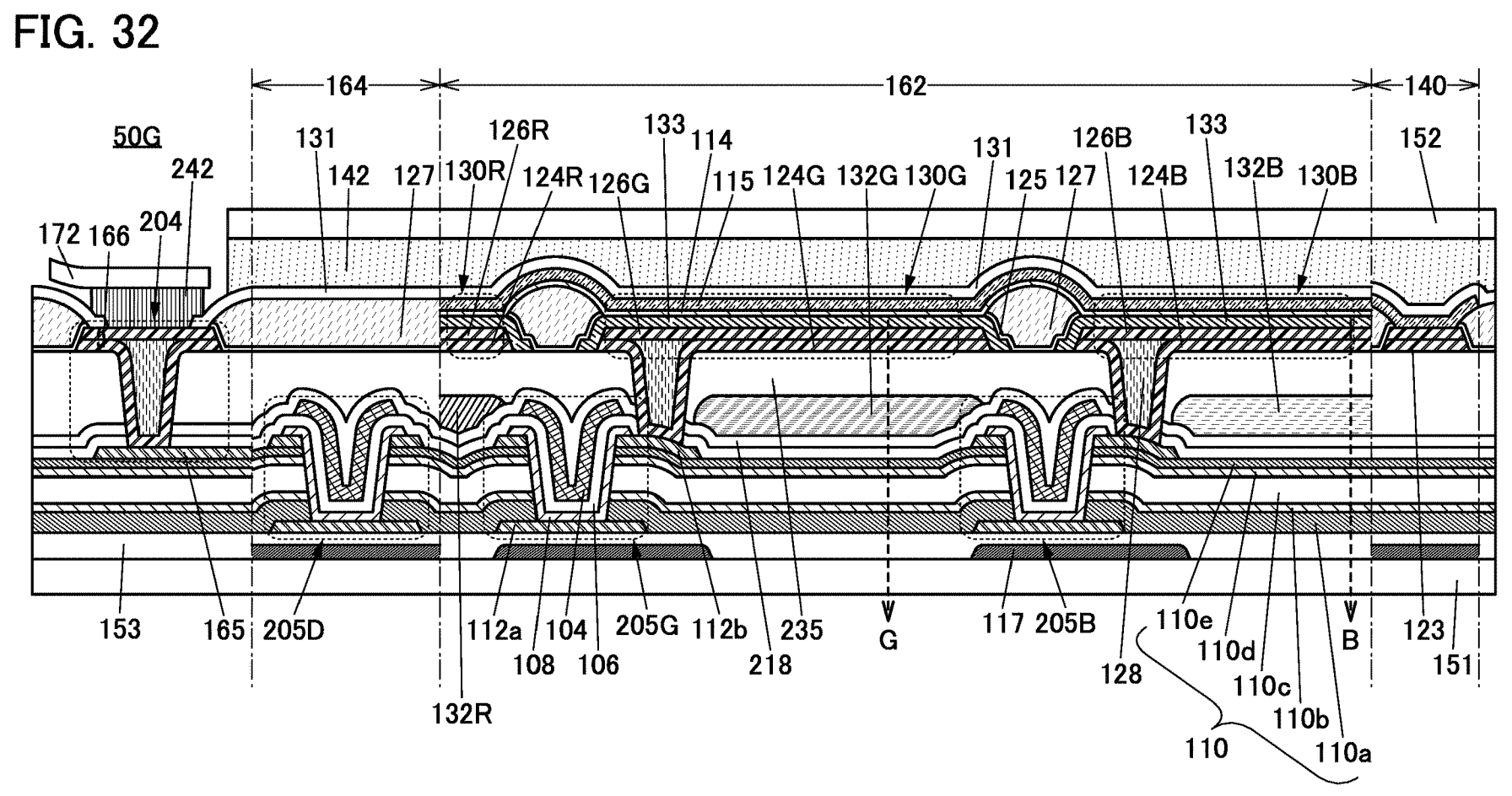

A display device 50G illustrated in FIG. 32 is different from the display device 50F mainly in having a bottom-emission structure.

Light from the light-emitting element is emitted toward the substrate 151. For the substrate 151, a material having a good visible-light-transmitting property is preferably used. By contrast, there is no limitation on the light-transmitting property of a material used for the substrate 152.

The light-blocking layer 117 is preferably formed between the substrate 151 and the transistor. FIG. 32 illustrates an example where the light-blocking layers 117 are provided over the substrate 151, the insulating layer 153 is provided over the light-blocking layers 117, and the transistors 205D, 205R (not illustrated), 205G, and 205B and the like are provided over the insulating layer 153. In addition, the coloring layers 132R, 132G, and 132B are provided over the insulating layer 218 and the insulating layer 235 is provided over the coloring layers 132R, 132G, and 132B.

The light-emitting element 130R overlapping with the coloring layer 132R includes the conductive layer 124R, the conductive layer 126R, the layer 133, the common layer 114, and the common electrode 115.

The light-emitting element 130G overlapping with the coloring layer 132G includes the conductive layer 124G, the conductive layer 126G, the layer 133, the common layer 114, and the common electrode 115.

The light-emitting element 130B overlapping with the coloring layer 132B includes the conductive layer 124B, the conductive layer 126B, the layer 133, the common layer 114, and the common electrode 115.

A material having a good visible-light-transmitting property is used for each of the conductive layers 124R, 124G, 124B, 126R, 126G, and 126B. A material that reflects visible light is preferably used for the common electrode 115. In the display device having a bottom-emission structure, a metal or the like having low resistance can be used for the common electrode 115; thus, a voltage drop due to the resistance of the common electrode 115 can be suppressed and the display quality can be high.

The transistor of one embodiment of the present invention can be miniaturized and the area occupied by the transistor can be reduced, so that the aperture ratio of the pixel can be increased or the pixel size can be reduced in the display device having a bottom-emission structure.

[Manufacturing Method Example of Display Device]

A method for manufacturing a display device having a metal maskless (MML) structure will be described below with reference to FIGS. 33A to 33F. Here, steps of manufacturing light-emitting elements without using a fine metal mask will be described in detail. FIGS. 33A to 33F are cross-sectional views of three light-emitting elements included in the display portion 162 and the connection portion 140 in the manufacturing steps.

For manufacture of the light-emitting elements, a vacuum process such as an evaporation method and a solution process such as a spin coating method or an inkjet method can be used. Examples of an evaporation method include physical vapor deposition methods (PVD methods) such as a sputtering method, an ion plating method, an ion beam evaporation method, a molecular beam evaporation method, and a vacuum evaporation method, and a chemical vapor deposition method (CVD method). Specifically, functional layers (e.g., a hole-injection layer, a hole-transport layer, a hole-blocking layer, a light-emitting layer, an electron-blocking layer, an electron-transport layer, an electron-injection layer, and a charge-generation layer) included in the EL layer can be formed by an evaporation method (e.g., a vacuum evaporation method), a coating method (e.g., a dip coating method, a die coating method, a bar coating method, a spin coating method, or a spray coating method), a printing method (e.g., ink-jetting, screen printing (stencil), offset printing (planography), flexography (relief printing), gravure printing, or micro-contact printing), or the like.

In the method described below for manufacturing the display device, the island-shaped layer (the layer including the light-emitting layer) is formed not by using a fine metal mask but by forming a light-emitting layer on the entire surface and processing the light-emitting layer by a photolithography method. Accordingly, a high-resolution display device or a display device with a high aperture ratio, which has been difficult to be formed so far, can be obtained. Moreover, light-emitting layers can be formed separately for the respective colors, enabling the display device to perform extremely clear display with high contrast and high display quality. Moreover, providing a sacrificial layer over the light-emitting layer can reduce damage to the light-emitting layer in the manufacturing process of the display device, resulting in an increase in reliability of the light-emitting element.

For example, in the case where the display device includes three kinds of light-emitting elements, which are a light-emitting element that emits blue light, a light-emitting element that emits green light, and a light-emitting element that emits red light, three kinds of island-shaped light-emitting layers can be formed by forming a light-emitting layer and performing processing three times by photolithography.

Figure 33A:
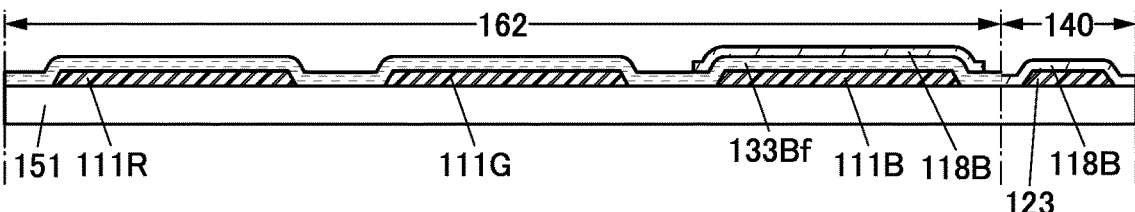
FIGS. 33A to 33F are cross-sectional views showing an example of a method for manufacturing a display device.

First, the pixel electrodes 111R, 111G, and 111B and the conductive layer 123 are formed over the substrate 151 provided with the transistors 205R, 205G, and 205B and the like (not illustrated) (FIG. 33A).

A conductive film to be the pixel electrodes can be formed by a sputtering method or a vacuum evaporation method, for example. A resist mask is formed over the conductive film by a photolithography process, and then the conductive film is processed, whereby the pixel electrodes 111R, 111G, and 111B and the conductive layer 123 can be formed. The conductive film can be processed by a wet etching method and/or a dry etching method.

Next, a film 133Bf to be the layer 133B later is formed over the pixel electrodes 111R, 111G, and 111B (FIG. 33A). The film 133Bf (to be the layer 133B later) includes a light-emitting layer that emits blue light.

In an example described in this embodiment, an island-shaped EL layer included in the light-emitting element that emits blue light is formed first, and then island-shaped EL layers included in the light-emitting elements that emit light of the other colors are formed.

In the formation process of the island-shaped EL layers, the pixel electrode of the light-emitting element of the color formed second or later is sometimes damaged by the preceding step. In this case, the driving voltage of the light-emitting element of the color formed second or later might be high.

In view of this, in manufacture of the display device of one embodiment of the present invention, it is preferable that an island-shaped EL layer of a light-emitting element that emits light with the shortest wavelength (e.g., the blue-light-emitting element) be formed first. For example, it is preferable that the island-shaped EL layers be formed for the blue-, green-, and red-light-emitting elements in this order or the blue-, red-, and green-light-emitting elements in this order.

This enables the blue-light-emitting element to keep the favorable state of the interface between the pixel electrode and the EL layer and to be inhibited from having an increased driving voltage. In addition, the blue-light-emitting element can have a longer lifetime and higher reliability. Note that the red-light-emitting element and the green-light-emitting element have a smaller increase in driving voltage or the like than the blue-light-emitting element, resulting in a lower driving voltage and higher reliability of the whole display device.

Note that the formation order of the island-shaped EL layers is not limited to the above; for example, the island-shaped EL layers may be formed for the red-, green-, and blue-light-emitting elements in this order.

As illustrated in FIG. 33A, the film 133Bf is not formed over the conductive layer 123. The film 133Bf can be formed only in a desired region using an area mask, for example. Employing a film formation step using an area mask and a processing step using a resist mask enables a light-emitting element to be manufactured by a relatively easy process.

The heat resistance temperature of the compounds contained in the film 133Bf is preferably higher than or equal to 100° C. and lower than or equal to 180° C., further preferably higher than or equal to 120° C. and lower than or equal to 180° C., still further preferably higher than or equal to 140° C. and lower than or equal to 180° C. Thus, the reliability of the light-emitting element can be increased. In addition, the upper limit of the temperature that can be applied in the manufacturing process of the display device can be increased. Therefore, the range of choices of the materials and the manufacturing method of the display device can be widened, thereby improving the manufacturing yield and the reliability.

Examples of the heat resistance temperature include the glass transition point, the softening point, the melting point, the thermal decomposition temperature, and the 5% weight loss temperature, and the lowest one among the temperatures is preferable.

The film 133Bf can be formed by an evaporation method, specifically a vacuum evaporation method, for example. The film 133Bf may be formed by a transfer method, a printing method, an inkjet method, a coating method, or the like.

Next, a sacrificial layer 118B is formed over the film 133Bf and the conductive layer 123 (FIG. 33A). A resist mask is formed over a film to be the sacrificial layer 118B by a photolithography process, and then the film is processed, whereby the sacrificial layer 118B can be formed.

Providing the sacrificial layer 118B over the film 133Bf can reduce damage to the film 133Bf in the manufacturing process of the display device, resulting in an increase in reliability of the light-emitting element.

The sacrificial layer 118B is preferably provided to cover the end portions of the pixel electrodes 111R, 111G, and 111B. Accordingly, the end portion of the layer 133B formed in a later step is positioned outward from the end portion of the pixel electrode 111B. The entire top surface of the pixel electrode 111B can be used as a light-emitting region, so that the aperture ratio of the pixel can be increased. The end portion of the layer 133B might be damaged in a step after the formation of the layer 133B, and thus is preferably positioned outward from the end portion of the pixel electrode 111B, i.e., not used as the light-emitting region. This can suppress a variation in the characteristics of the light-emitting elements and can improve reliability.

When the layer 133B covers the top and side surfaces of the pixel electrode 111B, the steps after the formation of the layer 133B can be performed without exposing the pixel electrode 111B. When the end portion of the pixel electrode 111B is exposed, corrosion might occur in the etching step or the like. When corrosion of the pixel electrode 111B is inhibited, the yield and characteristics of the light-emitting element can be improved.

The sacrificial layer 118B is preferably provided also at a position overlapping with the conductive layer 123. This can inhibit the conductive layer 123 from being damaged during the manufacturing process of the display device.

As the sacrificial layer 118B, a film that is highly resistant to the process conditions for the film 133Bf, specifically, a film having high etching selectivity with respect to the film 133Bf is used.

The sacrificial layer 118B is formed at a temperature lower than the heat resistance temperature of each compound included in the film 133Bf. The typical substrate temperature in the formation of the sacrificial layer 118B is lower than or equal to 200° C., preferably lower than or equal to 150° C., further preferably lower than or equal to 120° C., still further preferably lower than or equal to 100° C., yet still further preferably lower than or equal to 80° C.

The heat resistance temperature of the compound included in the film 133Bf is preferably high, in which case the film formation temperature of the sacrificial layer 118B can be high. For example, the substrate temperature in formation of the sacrificial layer 118B can be higher than or equal to 100° C., higher than or equal to 120° C., or higher than or equal to 140° C. An inorganic insulating film formed at a higher temperature can be denser and have a better barrier property. Therefore, forming the sacrificial layer at such a temperature can further reduce damage to the film 133Bf and improve the reliability of the light-emitting element.

Note that the same can be applied to the film formation temperature of another layer formed over the film 133Bf (e.g., an insulating film 125f).

The sacrificial layer 118B can be formed by a sputtering method, an ALD method (including a thermal ALD method and a PEALD method), a CVD method, or a vacuum evaporation method, for example. Alternatively, the sacrificial layer 118B may be formed by the above-described wet process.

The sacrificial layer 118B (or a layer that is in contact with the film 133Bf in the case where the sacrificial layer 118B has a stacked-layer structure) is preferably formed by a formation method that causes less damage to the film 133Bf.

For example, the sacrificial layer 118B is preferably formed by an ALD method or a vacuum evaporation method rather than a sputtering method.

The sacrificial layer 118B can be processed by a wet etching method or a dry etching method. The sacrificial layer 118B is preferably processed by anisotropic etching.

In the case of employing a wet etching method, damage to the film 133Bf in processing of the sacrificial layer 118B can be reduced as compared to the case of employing a dry etching method. In the case of employing a wet etching method, it is preferable to use a developer, a tetramethyl-ammonium hydroxide (TMAH) aqueous solution, dilute hydrofluoric acid, oxalic acid, phosphoric acid, acetic acid, nitric acid, or a mixed solution containing two or more of these acids, for example. In the case of employing a wet etching method, a mixed acid chemical solution containing water, phosphoric acid, diluted hydrofluoric acid, and nitric acid may be used. A chemical solution used for the wet etching treatment may be alkaline or acid.

As the sacrificial layer 118B, one or more of a metal film, an alloy film, a metal oxide film, a semiconductor film, an inorganic insulating film, and an organic insulating film can be used, for example.

For the sacrificial layer 118B, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used, for example.

The sacrificial layer 118B can be formed using a metal oxide such as In—Ga—Zn oxide, indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or indium tin oxide containing silicon.

In addition, in place of gallium described above, the element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used.

For example, a semiconductor material such as silicon or germanium can be used as a material with excellent compatibility with the semiconductor manufacturing process. Alternatively, an oxide or a nitride of the semiconductor material can be used. Alternatively, a non-metallic material such as carbon or a compound thereof can be used. Alternatively, a metal such as titanium, tantalum, tungsten, chromium, or aluminum, or an alloy containing one or more of these metals can be used. Alternatively, an oxide containing the above-described metal, such as titanium oxide or chromium oxide, or a nitride such as titanium nitride, chromium nitride, or tantalum nitride can be used.

For the sacrificial layer 118B, any of a variety of inorganic insulating films that can be used as the protective layer 131 can be used. In particular, an oxide insulating film is preferable because its adhesion to the film 133Bf is higher than that of a nitride insulating film. For example, an inorganic insulating material such as aluminum oxide, hafnium oxide, or silicon oxide can be used for the sacrificial layer 118B. For the sacrificial layer 118B, an aluminum oxide film can be formed by an ALD method, for example. An ALD method is preferably used, in which case damage to a base (in particular, the film 133Bf) can be reduced.

For example, a stacked-layer structure of an inorganic insulating film (e.g., an aluminum oxide film) formed by an ALD method and an inorganic film (e.g., an In—Ga—Zn oxide film, a silicon film, or a tungsten film) formed by a sputtering method can be employed for the sacrificial layer 118B.

Note that the same inorganic insulating film can be used for both the sacrificial layer 118B and the insulating layer 125 that is to be formed later. For example, an aluminum oxide film formed by an ALD method can be used for both the sacrificial layer 118B and the insulating layer 125. For the sacrificial layer 118B and the insulating layer 125, the same film formation condition may be used or different film formation conditions may be used. For example, when the sacrificial layer 118B is formed under conditions similar to those of the insulating layer 125, the sacrificial layer 118B can be an insulating layer having a good barrier property against at least one of water and oxygen. Meanwhile, since the sacrificial layer 118B is a layer a large part or the whole of which is to be removed in a later step, it is preferable that the processing of the sacrificial layer 118B be easy. Therefore, the sacrificial layer 118B is preferably formed with a substrate temperature lower than that for formation of the insulating layer 125.

An organic material may be used for the sacrificial layer 118B. For example, as the organic material, a material that can be dissolved in a solvent chemically stable with respect to at least the uppermost film of the film 133Bf may be used. Specifically, a material that is dissolved in water or alcohol can be suitably used. In forming a film of such a material, it is preferable to apply the material dissolved in a solvent such as water or alcohol by a wet process and then perform heat treatment for evaporating the solvent. At this time, the heat treatment is preferably performed under a reduced-pressure atmosphere, in which case the solvent can be removed at a low temperature in a short time and thermal damage to the film 133Bf can be accordingly reduced.

The sacrificial layer 118B may be formed using an organic resin such as polyvinyl alcohol (PVA), polyvinyl butyral, polyvinylpyrrolidone, polyethylene glycol, polyglycerin, pullulan, water-soluble cellulose, an alcohol-soluble polyamide resin, or a fluororesin like perfluoropolymer.

For example, a stacked-layer structure of an organic film (e.g., a PVA film) formed by an evaporation method or the above wet process and an inorganic film (e.g., a silicon nitride film) formed by a sputtering method can be employed for the sacrificial layer 118B.

Note that in the display device of one embodiment of the present invention, part of the sacrificial film remains as the sacrificial layer in some cases.

Figure 33B:
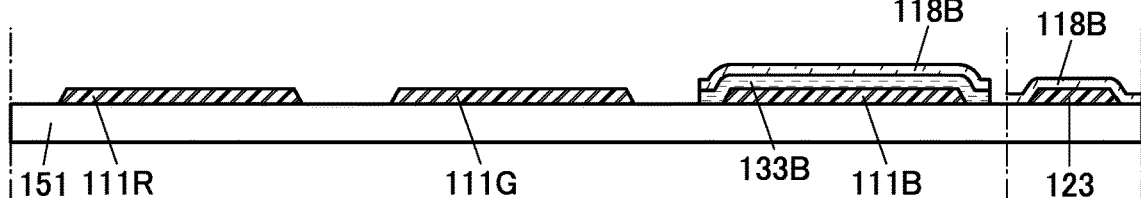

Then, the film 133Bf is processed using the sacrificial layer 118B as a hard mask, so that the layer 133B is formed (FIG. 33B).

Accordingly, as illustrated in FIG. 33B, the stacked-layer structure of the layer 133B and the sacrificial layer 118B remains over the pixel electrode 111B. In addition, the pixel electrodes 111R and 111G are exposed. In a region corresponding to the connection portion 140, the sacrificial layer 118B remains over the conductive layer 123.

The film 133Bf is preferably processed by anisotropic etching. Anisotropic dry etching is particularly preferable. Alternatively, wet etching may be employed.

Figure 33C:
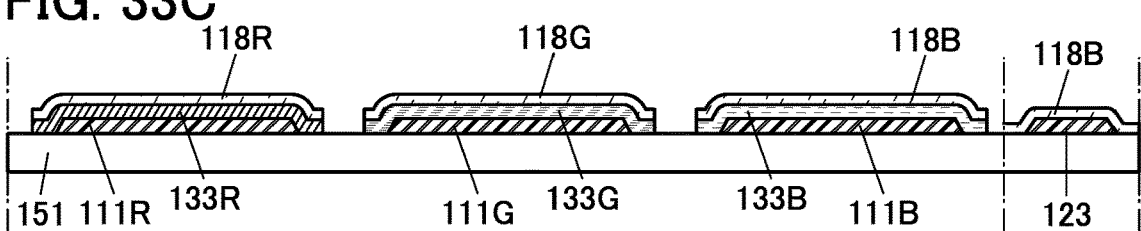

After that, steps similar to the formation step of the film 133Bf, the formation step of the sacrificial layer 118B, and the formation step of the layer 133B are repeated twice under the condition where at least light-emitting substances are changed, whereby a stacked-layer structure of the layer 133R and a sacrificial layer 118R is formed over the pixel electrode 111R and a stacked-layer structure of the layer 133G and a sacrificial layer 118G is formed over the pixel electrode 111G (FIG. 33C). Specifically, the layer 133R and the layer 133G are formed to include a light-emitting layer that emits red light and a light-emitting layer that emits green light, respectively. The sacrificial layers 118R and 118G can be formed using a material that can be used for the sacrificial layer 118B. The sacrificial layers 118R and 118G may be formed using the same material or different materials.

Note that the side surfaces of the layers 133B, 133G, and 133R are preferably perpendicular or substantially perpendicular to their formation surfaces. For example, the angle between the formation surfaces and these side surfaces is preferably greater than or equal to 60° and less than or equal to 90°.

As described above, the distance between two adjacent layers among the layers 133B, 133G, and 133R formed by a photolithography method can be shortened to less than or equal to 8 μm, less than or equal to 5 μm, less than or equal to 3 μm, less than or equal to 2 μm, or less than or equal to 1 μm. Here, the distance can be determined by, for example, the distance between opposite end portions of two adjacent layers among the layers 133B, 133G, and 133R. When the distance between the island-shaped EL layers is shortened in this manner, a high-resolution display device with a high aperture ratio can be provided.

Figure 33D:
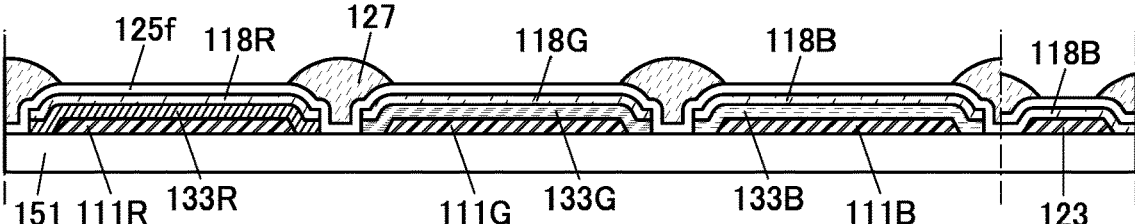

Next, the insulating film 125f to be the insulating layer 125 later is formed to cover the pixel electrodes, the layers 133B, 133G, and 133R, and the sacrificial layers 118B, 118G, and 118R, and then the insulating layer 127 is formed over the insulating film 125f (FIG. 33D).

The insulating film 125f is preferably formed to have a thickness greater than or equal to 3 nm, greater than or equal to 5 nm, or greater than or equal to 10 nm and less than or equal to 200 nm, less than or equal to 150 nm, less than or equal to 100 nm, or less than or equal to 50 nm.

The insulating film 125f is preferably formed by an ALD method, for example. An ALD method is preferably used, in which case damage during film formation is reduced and a film with good coverage can be formed. As the insulating film 125f, an aluminum oxide film is preferably formed by an ALD method, for example.

Alternatively, the insulating film 125f may be formed by a sputtering method, a CVD method, or a PECVD method that provides a higher film formation rate than an ALD method. In this case, a highly reliable display device can be manufactured with high productivity.

For example, the insulating film to be the insulating layer 127 is preferably formed by the aforementioned wet process (e.g., spin coating) using a photosensitive resin composite containing an acrylic resin. After the formation, heat treatment (also referred to as pre-baking) is preferably performed to eliminate a solvent contained in the insulating film. Next, part of the insulating film is irradiated with visible light or ultraviolet rays as light exposure. Next, the region of the insulating film exposed to light is removed by development. Then, heat treatment (also referred to as post-baking) is performed. Accordingly, the insulating layer 127 illustrated in FIG. 33D can be formed. Note that the shape of the insulating layer 127 is not limited to the shape illustrated in FIG. 33D. For example, the top surface of the insulating layer 127 can include one or more of a convex surface, a concave surface, and a flat surface. The insulating layer 127 may cover the side surface of an end portion of at least one of the insulating layer 125, the sacrificial layer 118B, the sacrificial layer 118G, and the sacrificial layer 118R.

Figure 33E:
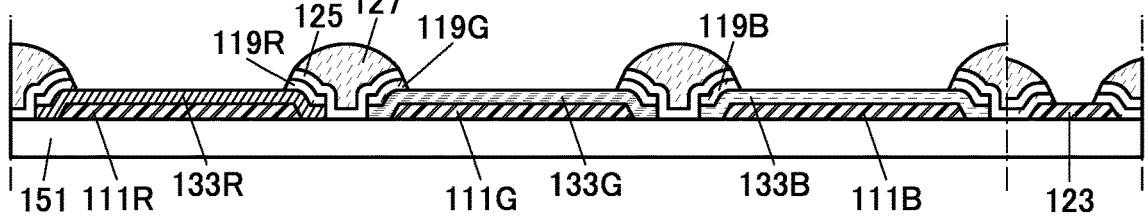

Next, as illustrated in FIG. 33E, etching treatment is performed using the insulating layer 127 as a mask to remove portions of the insulating film 125f and the sacrificial layers 118B, 118G, and 118R. Consequently, openings are formed in the sacrificial layers 118B, 118G, and 118R, and the top surfaces of the layer 133B, the layer 133G, the layer 133R, and the conductive layer 123 are exposed. Note that portions of the sacrificial layers 118B, 118G, and 118R may remain in positions overlapping with the insulating layers 127 and 125 (see sacrificial layers 119B, 119G, and 119R).

The etching treatment can be performed by dry etching or wet etching. Note that the insulating film 125f is preferably formed using a material similar to that for the sacrificial layers 118B, 118G, and 118R, in which case etching treatment can be performed collectively.

As described above, by providing the insulating layer 127, the insulating layer 125, and the sacrificial layers 118R, 118G, and 118B, poor connection due to a disconnected portion and an increase in electric resistance due to a locally thinned portion can be inhibited from occurring in the common layer 114 and the common electrode 115 between the light-emitting elements. Thus, the display device of one embodiment of the present invention can have improved display quality.

Figure 33F:
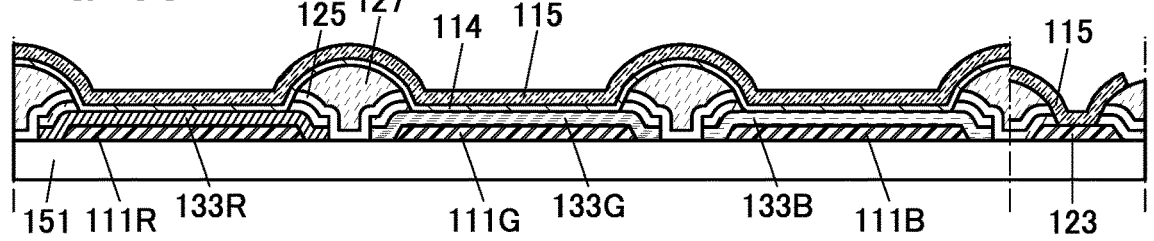

Next, the common layer 114 and the common electrode 115 are formed in this order over the insulating layer 127 and the layers 133B, 133G, and 133R (FIG. 33F).

The common layer 114 can be formed by an evaporation method (including a vacuum evaporation method), a transfer method, a printing method, an inkjet method, a coating method, or the like.

The common electrode 115 can be formed by a sputtering method or a vacuum evaporation method, for example. Alternatively, a film formed by an evaporation method and a film formed by a sputtering method may be stacked.

As described above, in the method for manufacturing the display device of one embodiment of the present invention, the island-shaped layers 133R, 133G, and 133B are formed not by using a fine metal mask but by forming a film on the entire surface and processing the film; thus, the island-shaped layers can be formed to have a uniform thickness. Consequently, a high-resolution display device or a display device with a high aperture ratio can be obtained. Furthermore, even when the resolution or the aperture ratio is high and the distance between the subpixels is extremely short, the layers 133R, 133G, and 133B can be inhibited from being in contact with each other in the adjacent subpixels. As a result, generation of a leakage current between the subpixels can be inhibited. This can prevent crosstalk-induced unintended light emission, so that a display device with extremely high contrast can be obtained.

The insulating layer 127 having a tapered end portion and being provided between adjacent island-shaped EL layers can prevent step disconnection and a locally thinned portion to be formed in the common electrode 115 at the time of forming the common electrode 115. Thus, a connection defect due to a disconnection portion and an increase in electric resistance due to a locally thinned portion can be inhibited from occurring in the common layer 114 and the common electrode 115. Hence, the display device of one embodiment of the present invention achieves both high resolution and high display quality.

This embodiment can be combined with any of the other embodiments as appropriate.

Embodiment 4

In this embodiment, electronic devices of embodiments of the present invention will be described with reference to FIGS. 34A to 34D, FIGS. 35A to 35F, and FIGS. 36A to 36G.

Electronic devices in this embodiment are each provided with the display device of one embodiment of the present invention in a display portion. The display device of one embodiment of the present invention can be easily increased in resolution and definition. Thus, the display device of one embodiment of the present invention can be used for a display portion of a variety of electronic devices.

A semiconductor device of one embodiment of the present invention can also be applied to any other portion of an electronic device than a display portion. For example, the semiconductor device of one embodiment of the present invention is preferably used for a control portion or the like of an electronic device to enable lower power consumption.

Examples of the electronic devices include a digital camera, a digital video camera, a digital photo frame, a mobile phone, a portable game console, a portable information terminal, and an audio reproducing device, in addition to electronic devices with a relatively large screen, such as a television device, desktop and notebook personal computers, a monitor of a computer and the like, digital signage, and a large game machine such as a pachinko machine.

In particular, the display device of one embodiment of the present invention can have a high resolution, and thus can be favorably used for an electronic device having a relatively small display portion. Examples of such an electronic device include watch-type and bracelet-type information terminal devices (wearable devices) and wearable devices capable of being worn on a head, such as a VR device like a head-mounted display, a glasses-type AR device, and an MR device.

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, a definition of 4K, 8K, or higher is preferable. The pixel density (resolution) of the display device of one embodiment of the present invention is preferably 100 ppi or higher, further preferably 300 ppi or higher, still further preferably 500 ppi or higher, yet still further preferably 1000 ppi or higher, yet still further preferably 2000 ppi or higher, yet still further preferably 3000 ppi or higher, yet still further preferably 5000 ppi or higher, yet still further preferably 7000 ppi or higher. The use of the display device having one or both of such high definition and high resolution can further increase realistic sensation, sense of depth, and the like. There is no particular limitation on the screen ratio (aspect ratio) of the display device of one embodiment of the present invention. For example, the display device is compatible with a variety of screen ratios such as 1:1 (a square), 4:3, 16:9, and 16:10.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device in this embodiment can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of head-mounted wearable devices will be described with reference to FIGS. 34A to 34D. The wearable devices have at least one of a function of displaying AR contents, a function of displaying VR contents, a function of displaying SR contents, and a function of displaying MR contents. The electronic device having a function of displaying contents of at least one of AR, VR, SR, MR, and the like enables the user to feel a higher level of immersion.

Figure 34A:
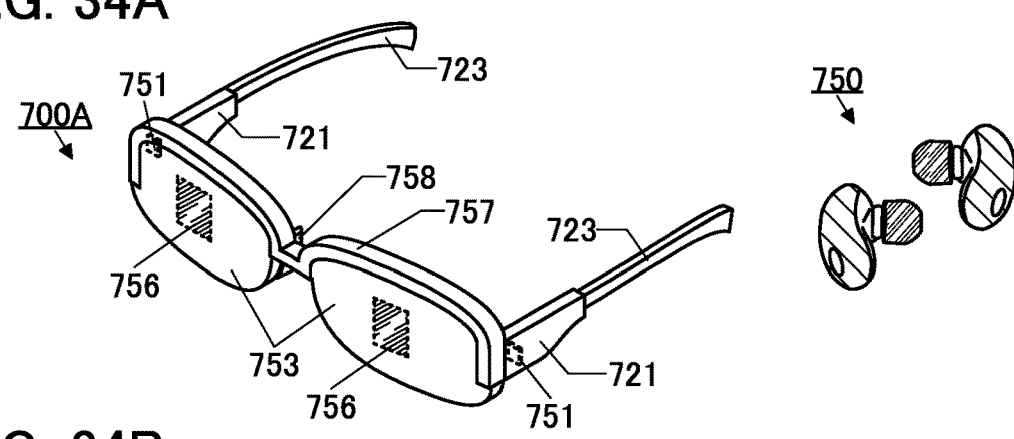
FIGS. 34A to 34D show examples of electronic devices.
Figure 34B:
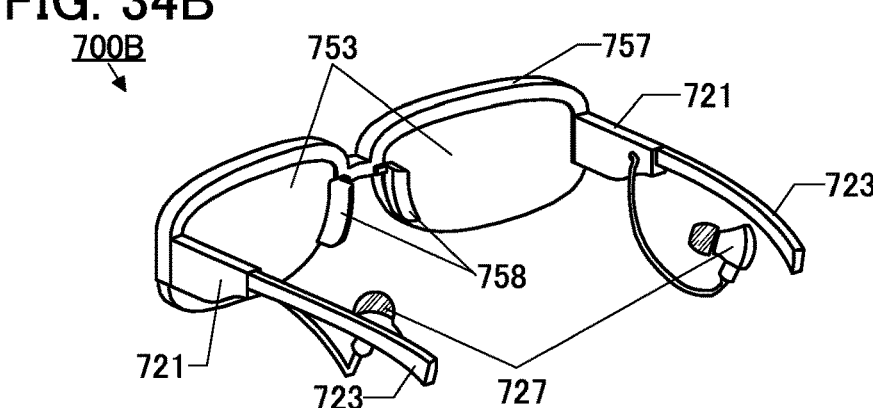

An electronic device 700A illustrated in FIG. 34A and an electronic device 700B illustrated in FIG. 34B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display device of one embodiment of the present invention can be used for the display panels 751. Thus, the electronic devices are capable of performing ultrahigh-resolution display.

The electronic devices 700A and 700B can each project images displayed on the display panels 751 onto display regions 756 of the optical members 753. Since the optical members 753 have a light-transmitting property, the user can see images displayed on the display regions, which are superimposed on transmission images seen through the optical members 753. Accordingly, the electronic devices 700A and 700B are electronic devices capable of AR display.

In the electronic devices 700A and 700B, a camera capable of capturing images of the front side may be provided as the image capturing portion. Furthermore, when the electronic devices 700A and 700B are provided with an acceleration sensor such as a gyroscope sensor, the orientation of the user's head can be sensed and an image corresponding to the orientation can be displayed on the display regions 756.

The communication portion includes a wireless communication device, and a video signal and the like can be supplied by the wireless communication device. Instead of or in addition to the wireless communication device, a connector that can be connected to a cable for supplying a video signal and a power supply potential may be provided.

The electronic devices 700A and 700B are each provided with a battery so that they can be charged wirelessly and/or by wire.

A touch sensor module may be provided in the housing 721. The touch sensor module has a function of detecting a touch on the outer surface of the housing 721. Detecting a tap operation, a slide operation, or the like by the user with the touch sensor module enables various types of processing. For example, a video can be paused or restarted by a tap operation, and can be fast-forwarded or fast-reversed by a slide operation. When the touch sensor module is provided in each of the two housings 721, the range of the operation can be increased.

Various touch sensors can be applied to the touch sensor module. For example, any of touch sensors of the following types can be used: a capacitive type, a resistive type, an infrared type, an electromagnetic induction type, a surface acoustic wave type, and an optical type. In particular, a capacitive sensor or an optical sensor is preferably used for the touch sensor module.

In the case of using an optical touch sensor, a photoelectric conversion element can be used as a light-receiving element. One or both of an inorganic semiconductor and an organic semiconductor can be used for an active layer of the photoelectric conversion element.

Figure 34C:
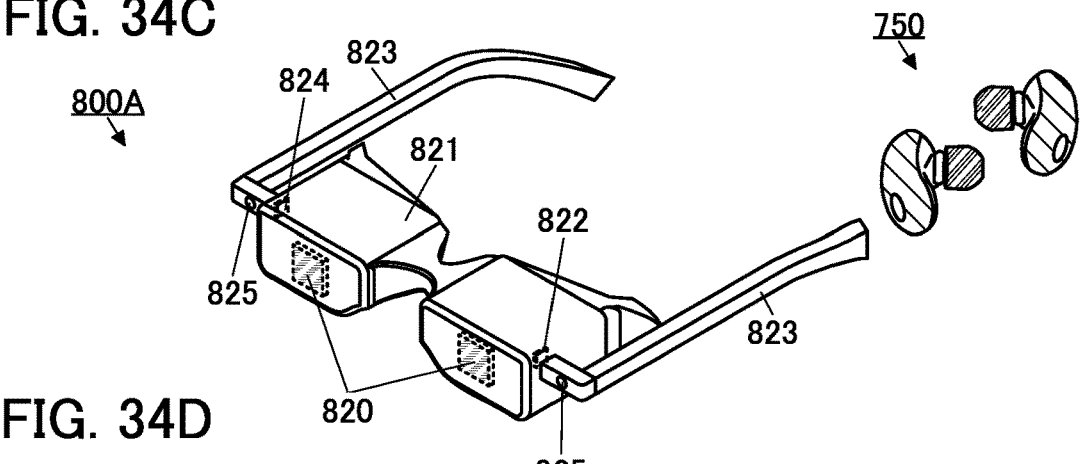
Figure 34D:
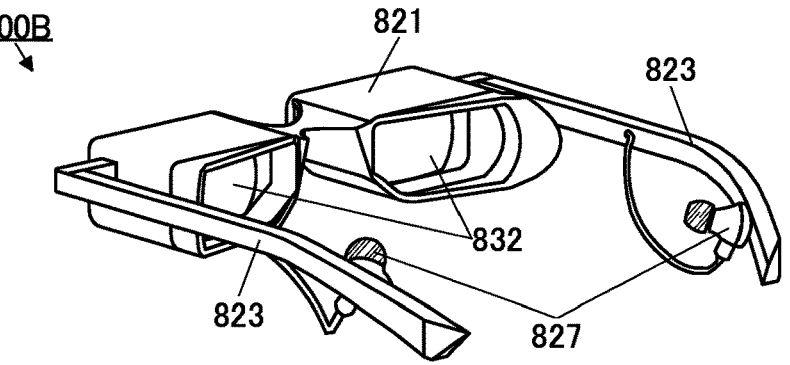

An electronic device 800A illustrated in FIG. 34C and an electronic device 800B illustrated in FIG. 34D each include a pair of display portions 820, a housing 821, a communication portion 822, a pair of wearing portions 823, a control portion 824, a pair of image capturing portions 825, and a pair of lenses 832.

The display device of one embodiment of the present invention can be used in the display portions 820. Thus, the electronic devices are capable of performing ultrahigh-resolution display. Such electronic devices provide a high sense of immersion to the user.

The display portions 820 are positioned inside the housing 821 so as to be seen through the lenses 832. When the pair of display portions 820 display different images, three-dimensional display using parallax can be performed.

The electronic devices 800A and 800B can be regarded as electronic devices for VR. The user who wears the electronic device 800A or the electronic device 800B can see images displayed on the display portions 820 through the lenses 832.

The electronic devices 800A and 800B preferably include a mechanism for adjusting the lateral positions of the lenses 832 and the display portions 820 so that the lenses 832 and the display portions 820 are positioned optimally in accordance with the positions of the user's eyes. Moreover, the electronic devices 800A and 800B preferably include a mechanism for adjusting focus by changing the distance between the lenses 832 and the display portions 820.

The electronic device 800A or the electronic device 800B can be mounted on the user's head with the wearing portions 823. FIG. 34C and the like illustrate examples where the wearing portion 823 has a shape like a temple of glasses; however, one embodiment of the present invention is not limited thereto. The wearing portion 823 may have any shape with which the user can wear the electronic device, such as a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to cover a plurality of fields of view, such as a telescope field of view and a wide field of view.

Although an example where the image capturing portion 825 is provided is shown here, a range sensor (hereinafter also referred to as a sensing portion) capable of measuring a distance between the user and an object just needs to be provided. In other words, the image capturing portion 825 is one embodiment of the sensing portion. As the sensing portion, an image sensor or a range image sensor such as a light detection and ranging (LiDAR) sensor can be used, for example. By using images obtained by the camera and images obtained by the range image sensor, more information can be obtained and a gesture operation with higher accuracy is possible.

The electronic device 800A may include a vibration mechanism that functions as a bone-conduction earphone.

For example, at least one of the display portion 820, the housing 821, and the wearing portion 823 can include the vibration mechanism. Thus, without additionally requiring an audio device such as headphones, earphones, or a speaker, the user can enjoy images and sound only by wearing the electronic device 800A.

The electronic devices 800A and 800B may each include an input terminal. To the input terminal, a cable for supplying a video signal from a video output device or the like, power for charging the battery provided in the electronic device, and the like can be connected.

The electronic device of one embodiment of the present invention may have a function of performing wireless communication with earphones 750. The earphones 750 include a communication portion (not illustrated) and have a wireless communication function. The earphones 750 can receive information (e.g., audio data) from the electronic device with the wireless communication function. For example, the electronic device 700A in FIG. 34A has a function of transmitting information to the earphones 750 with the wireless communication function. As another example, the electronic device 800A in FIG. 34C has a function of transmitting information to the earphones 750 with the wireless communication function.

The electronic device may include an earphone portion. The electronic device 700B in FIG. 34B includes earphone portions 727. For example, the earphone portion 727 can be connected to the control portion by wire. Part of a wiring that connects the earphone portion 727 and the control portion may be positioned inside the housing 721 or the mounting portion 723.

Similarly, the electronic device 800B in FIG. 34D includes earphone portions 827. For example, the earphone portion 827 can be connected to the control portion 824 by wire. Part of a wiring that connects the earphone portion 827 and the control portion 824 may be positioned inside the housing 821 or the mounting portion 823. Alternatively, the earphone portions 827 and the mounting portions 823 may include magnets. This is preferable because the earphone portions 827 can be fixed to the mounting portions 823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of a headset by including the audio input mechanism.

As described above, both the glasses-type device (e.g., the electronic devices 700A and 700B) and the goggles-type device (e.g., the electronic devices 800A and 800B) are preferable as the electronic device of one embodiment of the present invention.

The electronic device of one embodiment of the present invention can transmit information to earphones by wire or wirelessly.

An electronic device 6500 illustrated in FIG. 35A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

FIG. 35B is a schematic cross-sectional view including an end portion of the housing 6501 on the microphone 6506 side.

A protection member 6510 having a light-transmitting property is provided on the display surface side of the housing 6501. A display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. In that case, an extremely lightweight electronic device can be obtained. Since the display panel 6511 is extremely thin, the battery 6518 with high capacity can be mounted without an increase in the thickness of the electronic device. Moreover, part of the display panel 6511 is folded back so that a connection portion with the FPC 6515 is provided on the back side of the pixel portion, whereby an electronic device with a narrow bezel can be obtained.

FIG. 35C illustrates an example of a television device. In a television device 7100, a display portion 7000 is incorporated in a housing 7101. Here, the housing 7101 is supported by a stand 7103.

The display device of one embodiment of the present invention can be used in the display portion 7000.

Operation of the television device 7100 illustrated in FIG. 35C can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be controlled and videos displayed on the display portion 7000 can be controlled.

Note that the television device 7100 includes a receiver, a modem, and the like. A general television broadcast can be received with the receiver. When the television device is connected to a communication network by wire or wirelessly via the modem, one-way (from a transmitter to a receiver) or two-way (between a transmitter and a receiver or between receivers, for example) data communication can be performed.

FIG. 35D illustrates an example of a notebook personal computer. The notebook personal computer 7200 includes a housing 7211, a keyboard 7212, a pointing device 7213, an external connection port 7214, and the like. The display portion 7000 is incorporated in the housing 7211.

The display device of one embodiment of the present invention can be used in the display portion 7000.

FIGS. 35E and 35F illustrate examples of digital signage.

Digital signage 7300 illustrated in FIG. 35E includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 35F illustrates digital signage 7400 attached to a cylindrical pillar 7401. The digital signage 7400 includes the display portion 7000 provided along a curved surface of the pillar 7401.

The display device of one embodiment of the present invention can be used in the display portion 7000 illustrated in each of FIGS. 35E and 35F.

A larger area of the display portion 7000 can increase the amount of information that can be provided at a time. The larger display portion 7000 attracts more attention, so that the effectiveness of the advertisement can be increased, for example.

A touch panel is preferably used in the display portion 7000, in which case intuitive operation by a user is possible in addition to display of an image or a moving image on the display portion 7000. Moreover, for an application for providing information such as route information or traffic information, usability can be enhanced by intuitive operation.

As illustrated in FIGS. 35E and 35F, it is preferable that the digital signage 7300 or the digital signage 7400 can work with an information terminal 7311 or an information terminal 7411, such as a smartphone that a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIGS. 36A to 36G include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

In FIGS. 36A to 36G, the display device of one embodiment of the present invention can be used in the display portion 9001.

The electronic devices illustrated in FIGS. 36A to 36G have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may be provided with a camera or the like and have a function of capturing a still image or a moving image, a function of storing the captured image in a storage medium (an external storage medium or a storage medium incorporated in the camera), a function of displaying the captured image on the display portion, and the like.

The electronic devices in FIGS. 36A to 36G will be described in detail below.

Figure 36A:
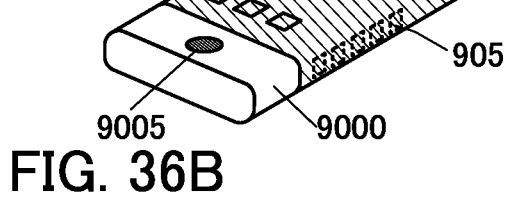
FIGS. 36A to 36G show examples of electronic devices.

FIG. 36A is a perspective view of a portable information terminal 9101. The portable information terminal 9101 can be used as a smartphone, for example. The portable information terminal 9101 may include the speaker 9003, the connection terminal 9006, the sensor 9007, or the like. The portable information terminal 9101 can display text and image information on its plurality of surfaces. FIG. 36A illustrates an example where three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

Figure 36B:
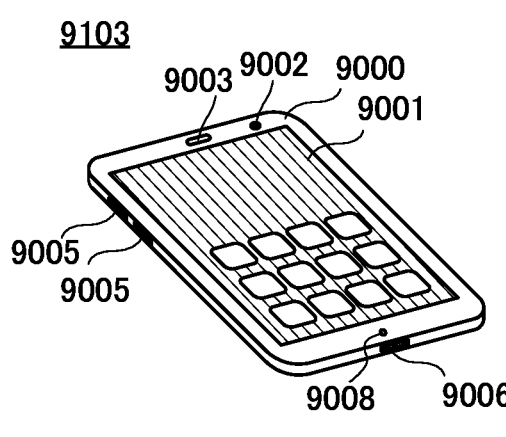

FIG. 36B is a perspective view of a portable information terminal 9102. The portable information terminal 9102 has a function of displaying information on three or more surfaces of the display portion 9001. Here, information 9052, information 9053, and information 9054 are displayed on different surfaces. For example, the user of the portable information terminal 9102 can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

Figure 36C:
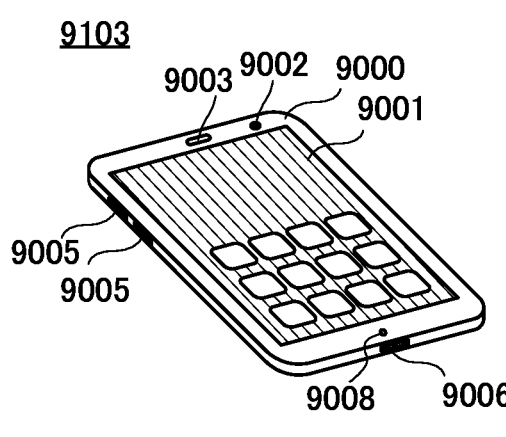

FIG. 36C is a perspective view of a tablet terminal 9103. The tablet terminal 9103 is capable of executing a variety of applications such as mobile phone calls, e-mailing, viewing and editing texts, music reproduction, Internet communication, and a computer game, for example. The tablet terminal 9103 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 36D:
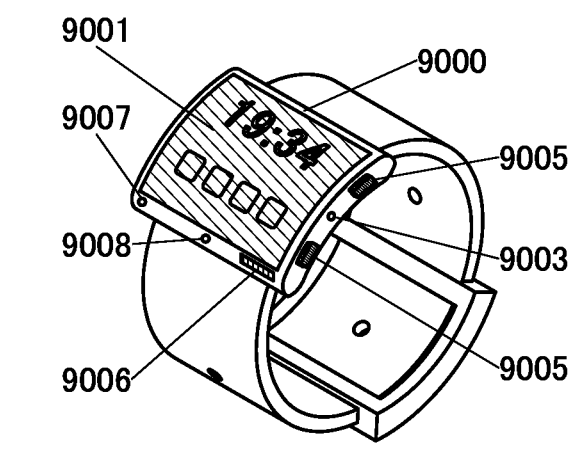

FIG. 36D is a perspective view of a watch-type portable information terminal 9200. The portable information terminal 9200 can be used as a Smartwatch (registered trademark), for example. The display surface of the display portion 9001 is curved, and an image can be displayed on the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 36E:
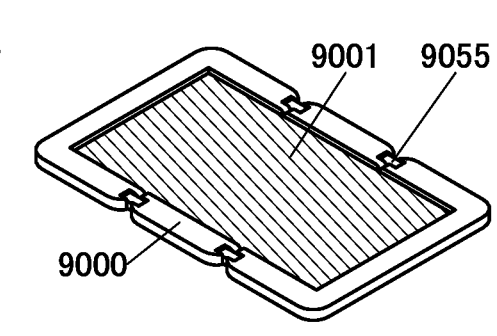
Figure 36F:
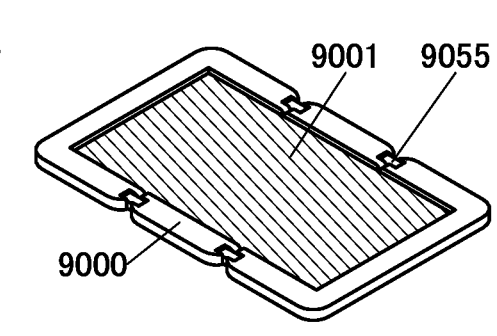
Figure 36G:
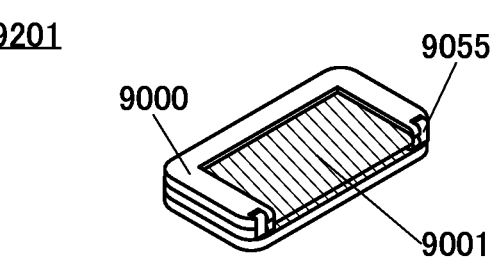

FIGS. 36E to 36G are perspective views of a foldable portable information terminal 9201. FIG. 36E is a perspective view illustrating the portable information terminal 9201 that is opened. FIG. 36G is a perspective view illustrating the portable information terminal 9201 that is folded. FIG. 36F is a perspective view illustrating the portable information terminal 9201 that is shifted from one of the states in FIGS. 36E and 36G to the other. The portable information terminal 9201 is highly portable in the folded state and is highly browsable in the opened state because of a seamless large display region. The display portion 9001 of the portable information terminal 9201 is supported by three housings 9000 joined together by hinges 9055. The display portion 9001 can be folded with a radius of curvature greater than or equal to 0.1 mm and less than or equal to 150 mm, for example.

This embodiment can be combined with any of the other embodiments as appropriate.

Example 1

In this example, transistors of embodiments of the present invention were manufactured and evaluated, and the evaluation results will be described.

The transistors manufactured in this example each had a structure corresponding to the structure of the transistor 100 in FIGS. 1A to 1C and the like. Specifically, the conductive layer 112a, the insulating layer 110 (the insulating layers 110a, 110b, 110c, 110d, and 110e), the conductive layer 112b, the semiconductor layer 108, the insulating layer 106, and the conductive layer 104 were formed over a substrate. Furthermore, an insulating layer (not shown) covering the transistor was formed.

In this example, two kinds of transistors differing from each other in the material of the semiconductor layer 108 were manufactured. Specifically, Transistors A in each of which an In—Ga—Zn oxide film was used for the semiconductor layer 108 and Transistors B in each of which an In—Zn oxide film was used for the semiconductor layer 108 were manufactured in this example.

The manufacturing method of the transistors will be described in detail below with reference to FIG. 20A1 to FIG. 24B2.

First, an approximately 100-nm-thick ITSO film was formed over a glass substrate (corresponding to the substrate 102) by a sputtering method and processed, so that the conductive layer 112a was formed (FIGS. 20A1 and 20A2).

Then, the insulating films 110af, 110bf, and 110cf were formed in this order over the substrate 102 and the conductive layer 112a (FIGS. 20B1 and 20B2).

As the insulating film 110af, an approximately 70-nm-thick silicon nitride film was formed by a PECVD method. Specifically, the insulating film 110af was formed under the conditions where the flow rates of a $SiH_4$ gas, a $N_2$ gas, and a $NH_3$ gas were respectively 200 sccm, 2000 sccm, and 2000 sccm, the pressure was 200 Pa, the power supply was 2000 W, and the substrate temperature was 350° C.

As the insulating film 110bf, an approximately 100-nm-thick silicon nitride film was formed by a PECVD method. Specifically, the insulating film 110bf was formed under the conditions where the flow rates of a $SiH_4$ gas and a $N_2$ gas were respectively 40 sccm and 1000 sccm, the pressure was 100 Pa, the power supply was 400 W, and the substrate temperature was 350° C.

As described above, a $NH_3$ gas was used for the formation of the insulating film 110af but was not used for the formation of the insulating film 110bf, i.e., the insulating film 110af was formed under the conditions such that the insulating film 110af had a higher hydrogen content than the insulating film 110bf.

As the insulating film 110cf, an approximately 500-nm-thick silicon oxynitride film was formed by a PECVD method. Specifically, the insulating film 110cf was formed under the conditions where the flow rates of a $SiH_4$ gas and a N$_2$O gas were respectively 200 sccm and 6000 sccm, the pressure was 200 Pa, the power supply was 1200 W, and the substrate temperature was 350° C.

Then, an approximately 5-nm-thick In—Ga—Zn oxide film was formed as the metal oxide layer 149 over the insulating film 110*cf* (FIGS. 21A1 and 21A2). The In—Ga—Zn oxide film was formed by a sputtering method using a metal oxide target whose atomic ratio was In:Ga:Zn=4:2:3 with an oxygen flow rate ratio of 100% and at a substrate temperature of 130° C. After the formation of the In—Ga—Zn oxide film, plasma treatment was performed in an oxygen-containing atmosphere (treatment time: 300 seconds). Subsequently, the metal oxide layer 149 was removed by a wet etching method.

Then, the insulating films 110*df* and 110*ef* were formed over the insulating film 110*cf* (FIGS. 21B1 and 21B2).

As the insulating film 110*df*, an approximately 50-nm-thick silicon nitride film was formed by a PECVD method. Specifically, the insulating film 110*df* was formed under the conditions where the flow rates of a SiH$_4$ gas and a N$_2$ gas were respectively 40 sccm and 1000 sccm, the pressure was 100 Pa, the power supply was 400 W, and the substrate temperature was 350° C.

As the insulating film 110*ef*, an approximately 100-nm-thick silicon nitride film was formed by a PECVD method. Specifically, the insulating film 110*ef* was formed under the conditions where the flow rates of a SiH$_4$ gas, a N$_2$ gas, and a NH$_3$ gas were respectively 200 sccm, 2000 sccm, and 2000 sccm, the pressure was 200 Pa, the power supply was 2000 W, and the substrate temperature was 350° C.

As described above, a NH$_3$ gas was used for the formation of the insulating film 110*ef* but was not used for the formation of the insulating film 110*df*, i.e., the insulating film 110*ef* was formed under the conditions such that the insulating film 110*ef* had a higher hydrogen content than the insulating film 110*df*.

Subsequently, an approximately 100-nm-thick ITSO film was formed over the insulating film 110*df* by a sputtering method (see the conductive film 112*f* in FIGS. 22A1 and 22A2) and was processed, so that the conductive layer 112B was formed (FIGS. 22B1 and 22B2).

Then, the conductive layer 112B was processed by a wet etching method, so that the conductive layer 112*b* including the opening 143 was formed. Furthermore, the insulating films 110*af*, 110*bf*, 110*cf*, 110*df*, and 110*ef* were processed by a dry etching method, so that the insulating layer 110 (the insulating layers 110*a*, 110*b*, 110*c*, 110*d*, and 110*e*) including the opening 141 was formed (FIGS. 23A1 and 23A2).

Subsequently, the metal oxide film 108*f* was formed over the insulating layer 110*d* and the conductive layer 112*b* (FIGS. 23B1 and 23B2).

As the metal oxide film 108*f* of Transistor A, an approximately 20-nm-thick In—Ga—Zn oxide film was formed. The In—Ga—Zn oxide film was formed by a sputtering method using a metal oxide target whose atomic ratio was In:Ga:Zn=1:1:1 under the conditions where the oxygen flow rate ratio was 10% and the substrate temperature was room temperature. Hereinafter, this In—Ga—Zn oxide film is sometimes referred to as an IGZO(1:1:1) film. After the formation of the In—Ga—Zn oxide film, heat treatment was performed at 350° C. in a CDA atmosphere for two hours.

As the metal oxide film 108*f* of Transistor B, an approximately 20-nm-thick In—Zn oxide film was formed. The In—Zn oxide film was formed by a sputtering method using a metal oxide target whose atomic ratio was In:Zn=4:1 under the conditions where the oxygen flow rate ratio was 10% and the substrate temperature was room temperature. Hereinafter, this In—Zn oxide film is sometimes referred to as an IZO(4:1) film. After the formation of the In—Zn oxide film, heat treatment was performed at 350° C. in a CDA atmosphere for two hours.

Then, the metal oxide film 108*f* was processed to form the semiconductor layer 108 (FIGS. 24A1 and 24A2).

Next, plasma treatment was performed for 20 seconds in an atmosphere containing a N$_2$O gas and then, the insulating layer 106 was formed over the insulating layer 110*d*, the conductive layer 112*b*, and the semiconductor layer 108 (FIGS. 24B1 and 24B2).

As the insulating layer 106, an approximately 50-nm-thick silicon oxynitride film was formed by a PECVD method. Specifically, the insulating layer 106 was formed under the conditions where the flow rates of a SiH$_4$ gas and a N$_2$O gas were respectively 50 sccm and 18000 sccm, the pressure was 200 Pa, the power supply was 250 W, and the substrate temperature was 350° C. The insulating layer 106 was formed at a lower film formation rate than the insulating film 110*cf*.

Then, films to be the conductive layer 104 were formed over the insulating layer 106 and were processed, so that the conductive layer 104 was formed (FIGS. 24B1 and 24B2).

As the films to be the conductive layer 104, an approximately 50-nm-thick titanium film, an approximately 200-nm-thick aluminum film, and an approximately 50-nm-thick titanium film were formed in this order by a sputtering method.

After that, as the insulating layer covering the transistor, an approximately 300-nm-thick silicon nitride oxide film was formed by a PECVD method. Subsequently, heat treatment was performed at 300° C. in a CDA atmosphere for one hour. After that, an approximately 1.5-μm-thick polyimide film was formed as a planarization film (not shown) and heat treatment was performed at 250° C. in a nitrogen atmosphere for one hour.

Figure 37:
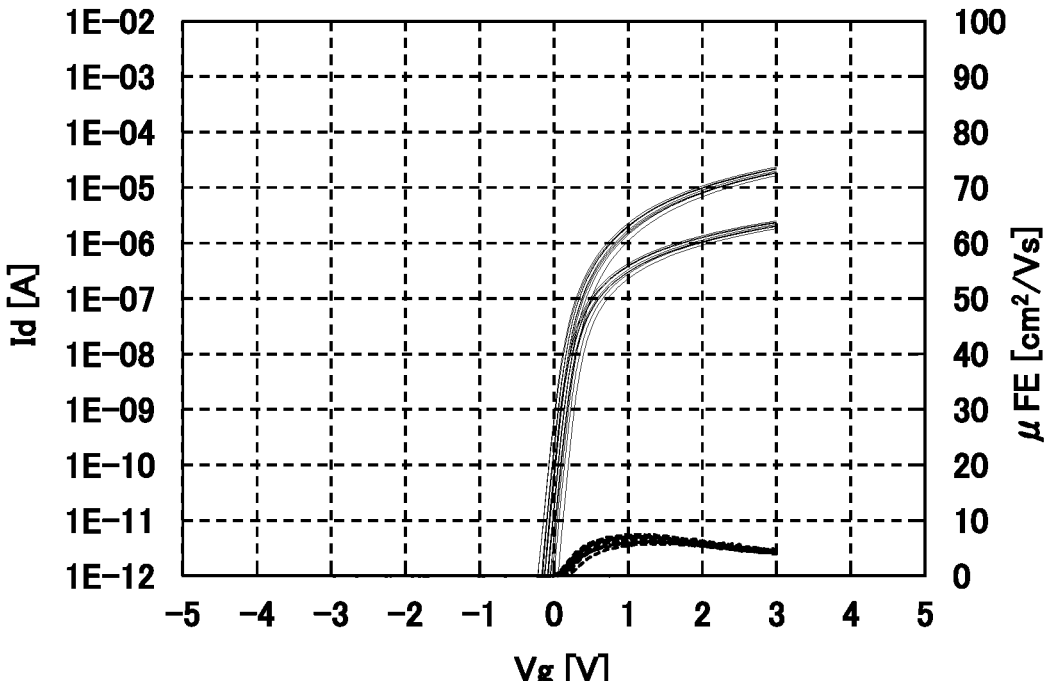
FIG. 37 is a graph showing $I_d$-$V_g$ characteristics and field-effect mobility of transistors in Example 1.
Figure 38:
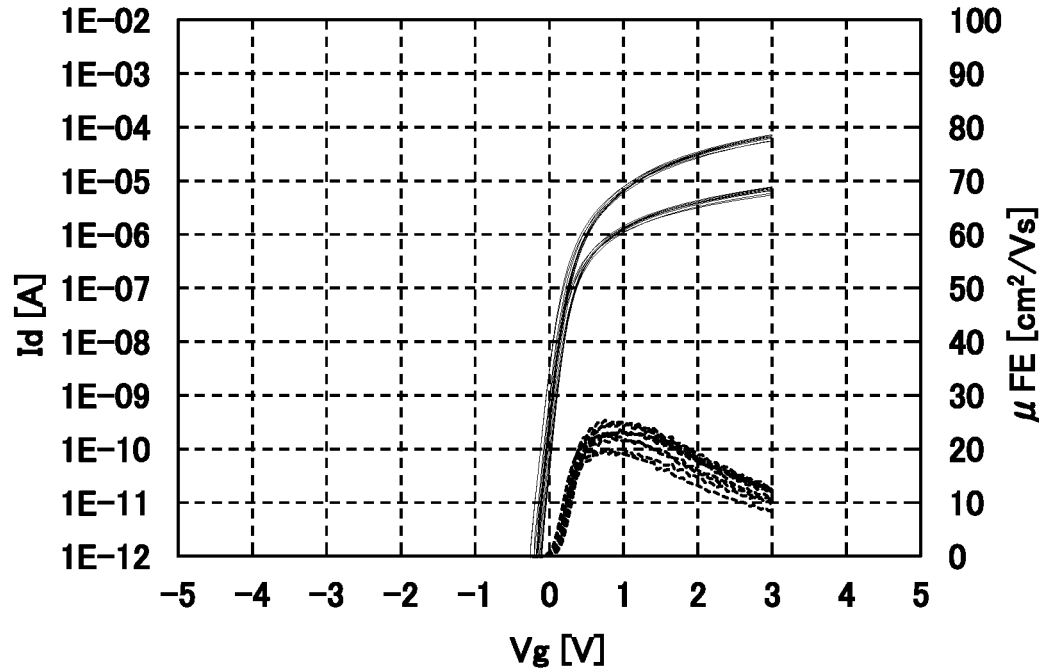
FIG. 38 is a graph showing $I_d$-$V_g$ characteristics and field-effect mobility of transistors in Example 1.

Next, the I$_d$-V$_g$ characteristics of the transistors manufactured in this example were measured. FIG. 37 shows the I$_d$-V$_g$ characteristics of Transistors A (in each of which the In—Ga—Zn oxide film was used for the semiconductor layer 108). FIG. 38 shows the I$_d$-V$_g$ characteristics of Transistors B (in each of which the In—Zn oxide film was used for the semiconductor layer 108).

The results shown in FIG. 37 and FIG. 38 were obtained when the conductive layer 112*b* served as a source electrode.

In each of FIG. 37 and FIG. 38, the vertical axes represent a drain current (I$_d$ (A)) and field-effect mobility (μFE (cm$^2$/Vs)) and the horizontal axis represents a gate voltage (V$_g$(V)). In each of FIG. 37 and FIG. 38, the solid lines indicate the I$_d$-V$_g$ characteristics and the dotted lines indicate the field-effect mobility. In each of FIG. 37 and FIG. 38, the I$_d$-V$_g$ characteristics and the field-effect mobility of ten transistors are superimposed.

Each of the transistors in this example was manufactured as an n-channel transistor such that its channel length (L) was 0.5 μm and its channel width (W) was 6.3 μm (opening diameter: 2 μmϕ).

The I$_d$-V$_g$ characteristics of the transistors were measured under the following conditions. The voltage applied to the conductive layer 104 (gate voltage (V$_g$)) was changed from −3 V to +3 V in increments of 0.1 V. The voltage applied to the source electrode (source voltage (V$_s$)) was 0 V (common), and the voltage applied to the drain electrode (drain voltage (V$_d$)) was 0.1 V or 1.2 V.

It was confirmed that the transistors manufactured in this example had favorable switching characteristics and high on-state currents as shown in FIG. 37 and FIG. 38.

The average threshold voltage ($V_{th}$) was 0.2 V in Transistors A and was 0.12 V in Transistors B. Furthermore, the $3\sigma$ of $V_{th}$ was 0.17 V in Transistors A and was 0.11 V in Transistors B. Note that $\sigma$ represents a standard deviation.

The average subthreshold swing value (S value) was 0.07 V/dec in Transistors A and Transistors B. Here, the S value means the amount of change in gate voltage in the subthreshold region when the drain voltage keeps constant and the drain current changes by one order of magnitude.

The average field-effect mobility ($\mu FE$) was 6.7 cm²/Vs in Transistors A and was 23.0 cm²/Vs in Transistors B.

Figure 39:
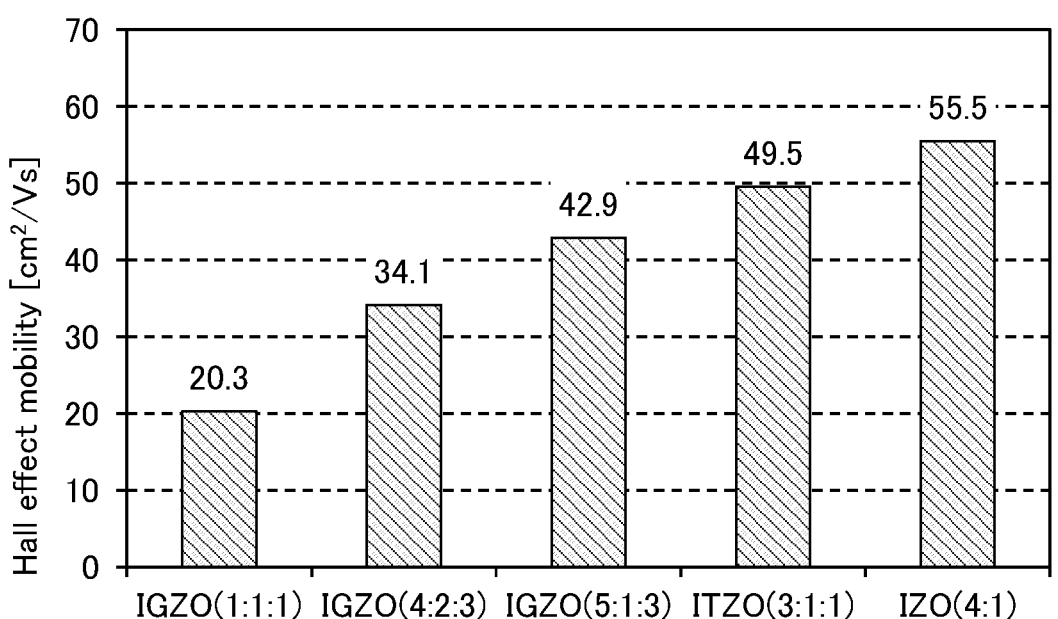
FIG. 39 is a graph showing Hall effect mobility of metal oxides in Example 1.

Hall effect measurement was performed on approximately 40-nm-thick metal oxide films each formed over a glass substrate. FIG. 39 shows the measured Hall effect mobility of the materials of the metal oxide films.

In FIG. 39, IGZO(1:1:1), IGZO(4:2:3), and IGZO(5:1:3) respectively indicate the films formed using metal oxide targets with atomic ratios of In:Ga:Zn=1:1:1, 4:2:3, and 5:1:3 by a sputtering method. ITZO(3:1:1) indicates the film formed by a sputtering method using a metal oxide target with an atomic ratio of In:Sn:Zn=3:1:1. IZO(4:1) indicates the film formed by a sputtering method using a metal oxide target with an atomic ratio of In:Zn=4:1.

As shown in FIG. 39, the Hall effect mobility of IZO(4:1) was almost 3 times that of IGZO(1:1:1).

As described above, the average field-effect mobility of Transistors B in each of which the IZO(4:1) film was used for the semiconductor layer 108 was approximately 3 times that of Transistors A in each of which the IGZO(1:1:1) film was used for the semiconductor layer 108, which was substantially consistent with the results of measuring the Hall effect mobility.

Under the conditions where $V_d$=5 V and $V_g$=10 V, the on-state current of Transistor A was approximately 72 $\mu A/\mu m$ and that of Transistor B was approximately 175 $\mu A/\mu m$.

The results of this example showed that Transistor A in which the In—Ga—Zn oxide film was used for the semiconductor layer 108 and Transistor B in which the In—Zn oxide film was used for the semiconductor layer 108 had favorable switching characteristics. In particular, Transistor B including the In—Zn oxide film had a higher on-state current than Transistor A including the In—Ga—Zn oxide film, and the field-effect mobility of Transistor B was approximately 3 times that of Transistor A.

Example 2

In this example, a transistor of one embodiment of the present invention was manufactured and evaluated, and the evaluation results will be described.

The transistor manufactured in this example had a structure corresponding to the structure of the transistor 100 in FIGS. 1A to 1C and the like. Specifically, the conductive layer 112a, the insulating layer 110 (the insulating layers 110a, 110b, 110c, 110d, and 110e), the conductive layer 112b, the semiconductor layer 108, the insulating layer 106, and the conductive layer 104 were formed over a substrate. Furthermore, an insulating layer (not shown) covering the transistor was formed.

Example 1 can be referred to for the method for manufacturing the transistor in this example; thus, the detailed description thereof is omitted.

In this example, an In—Ga—Zn oxide film was used for the semiconductor layer 108.

In this example, as the insulating film 110af, an approximately 70-nm-thick silicon nitride film was formed by a PECVD method. As the insulating film 110bf, an approximately 100-nm-thick silicon nitride film was formed by a PECVD method. The insulating film 110af was formed under the conditions such that the insulating film 110af had a higher hydrogen content than the insulating film 110bf. The film formation gas used for the insulating film 110af and that used for the insulating film 110bf in this example each contained a $NH_3$ gas. The proportion of the flow rate of a $NH_3$ gas was higher in the formation of the insulating film 110af than in the formation of the insulating film 110bf.

In this example, as the insulating film 110cf, an approximately 500-nm-thick silicon oxynitride film was formed by a PECVD method. After the formation of the insulating film 110cf, plasma treatment was performed successively without exposure to the air (in other words, in-situ plasma treatment was performed).

As the metal oxide layer 149, an approximately 20-nm-thick In—Ga—Zn oxide film was formed. The In—Ga—Zn oxide film was formed by a sputtering method using a metal oxide target whose atomic ratio was In:Ga:Zn=1:1:1 under the conditions where the oxygen flow rate ratio was 100% and the substrate temperature was room temperature. After the formation of the metal oxide layer 149, heat treatment was performed at 250° C. in a CDA atmosphere for one hour.

As the insulating film 110df, an approximately 50-nm-thick silicon nitride film was formed by a PECVD method. As the insulating film 110ef, an approximately 100-nm-thick silicon nitride film was formed by a PECVD method. The insulating film 110ef was formed under the conditions such that the insulating film 110ef had a higher hydrogen content than the insulating film 110df. The film formation gas used for the insulating film 110df and that used for the insulating film 110ef in this example each contained a $NH_3$ gas. The proportion of the flow rate of a $NH_3$ gas was higher in the formation of the insulating film 110ef than in the formation of the insulating film 110df.

Figure 40:
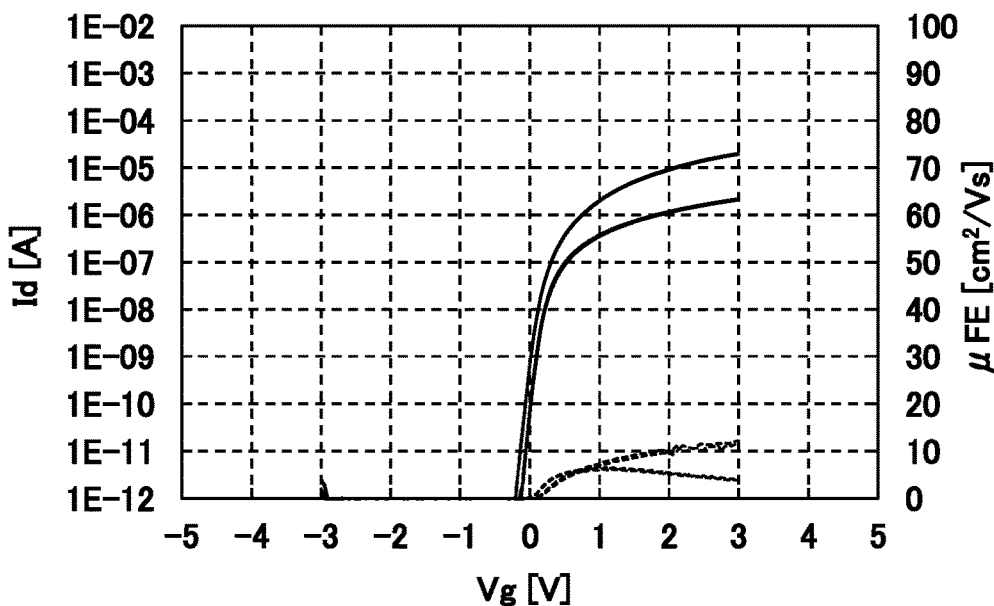
FIG. 40 is a graph showing $I_d$-$V_g$ characteristics and field-effect mobility of a transistor in Example 2.
Figure 41:
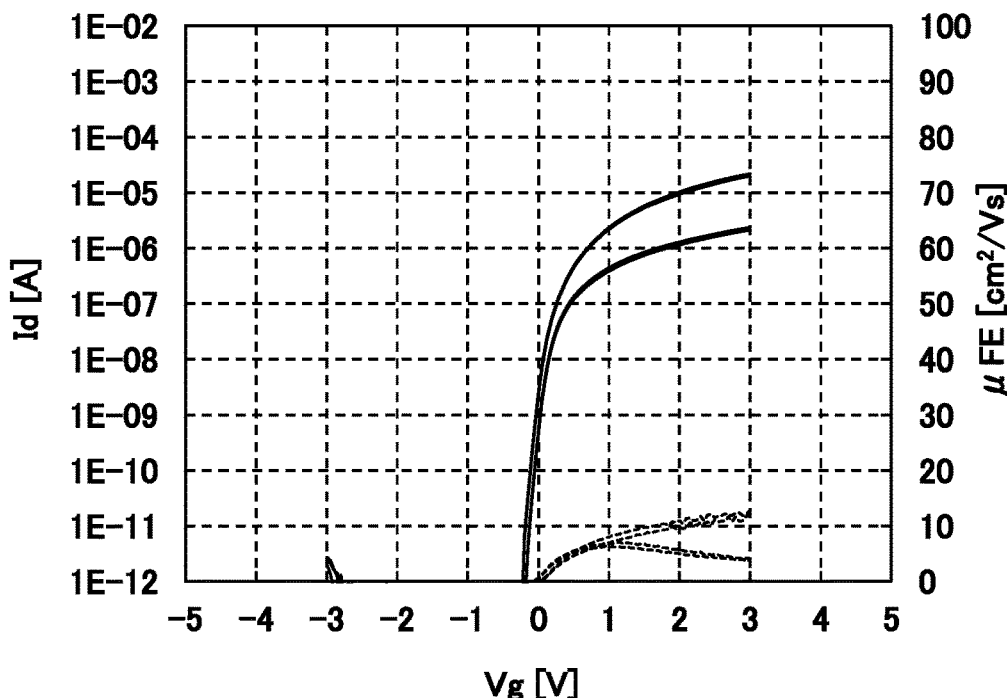
FIG. 41 is a graph showing $I_d$-$V_g$ characteristics and field-effect mobility of a transistor in Example 2.

Next, the $I_d$-$V_g$ characteristics of the transistor manufactured in this example were measured. FIG. 40 and FIG. 41 show the $I_d$-$V_g$ characteristics of the transistor.

The results shown in FIG. 40 were obtained when the conductive layer 112b served as a source electrode, and the results shown in FIG. 41 were obtained when the conductive layer 112a served as the source electrode.

In each of FIG. 40 and FIG. 41, the vertical axes represent a drain current ($I_d$ (A)) and field-effect mobility ($\mu FE$ (cm²/$V_s$)) and the horizontal axis represents a gate voltage ($V_g$ (V)). In each of FIG. 40 and FIG. 41, the solid lines indicate the $I_d$-$V_g$ characteristics and the dotted lines indicate the field-effect mobility.

In each of FIG. 40 and FIG. 41, the $I_d$-$V_g$ characteristics obtained before $I_d$-$V_d$ characteristics measurement and the $I_d$-$V_g$ characteristics obtained after the $I_d$-$V_d$ characteristics measurement are superimposed. In the $I_d$-$V_d$ characteristics measurement, the $I_d$-$V_d$ characteristics with gate voltages of 2 V, 4 V, and 6 V were measured in the drain voltage ($V_d$) range of 0 V to 15 V.

The transistor in this example was manufactured as an n-channel transistor such that its channel length (L) was 0.5 $\mu m$ and its channel width (W) was 6.3 $\mu m$ (opening diameter: 2 $\mu m\phi$).

The $I_d$-$V_g$ characteristics of the transistor were measured under the following conditions. The voltage applied to the conductive layer 104 (gate voltage ($V_g$)) was changed from −3 V to +3 V in increments of 0.1 V. The voltage applied to the source electrode (source voltage ($V_s$)) was 0 V (common), and the voltage applied to the drain electrode (drain voltage ($V_d$)) was 0.1 V or 1.2 V.

The transistor manufactured in this example had favorable switching characteristics in both the case where the conductive layer 112*a* served as the source electrode and the case where the conductive layer 112*b* served as the source electrode, as shown in FIG. 40 and FIG. 41.

It was also confirmed that as shown in FIG. 40 and FIG. 41, the $I_d$-$V_g$ characteristics did not change significantly before and after the $I_d$-$V_d$ characteristics measurement, meaning that the degradation of the transistor was inhibited. In the transistor in this example, the presence of the insulating layer 110*a* and the insulating layer 110*e* probably caused the formation of a low-resistance region between a channel formation region of the semiconductor layer 108 and the region of the semiconductor layer 108 in contact with the drain electrode. This presumably inhibited generation of a high electric field in the vicinity of a drain region and resultantly inhibited generation of hot carriers and degradation of the transistor.

This application is based on Japanese Patent Application Serial No. 2022-121215 filed with Japan Patent Office on Jul. 29, 2022, the entire contents of which are hereby incorporated by reference.

What is claimed is:

1. A semiconductor device comprising:
a semiconductor layer;
a first conductive layer;
a second conductive layer;
a third conductive layer;
a first insulating layer;
a second insulating layer;
a third insulating layer;
a fourth insulating layer;
a fifth insulating layer; and
a sixth insulating layer,
wherein the first insulating layer is in contact with a top surface of the first conductive layer,
wherein the second insulating layer is in contact with a top surface of the first insulating layer,
wherein the third insulating layer is in contact with a top surface of the second insulating layer,
wherein the fourth insulating layer is in contact with a top surface of the third insulating layer,
wherein the fifth insulating layer is in contact with a top surface of the fourth insulating layer,
wherein the second conductive layer is over the fifth insulating layer,
wherein the semiconductor layer is in contact with the top surface of the first conductive layer, a side surface of the first insulating layer, a side surface of the second insulating layer, a side surface of the third insulating layer, a side surface of the fourth insulating layer, a side surface of the fifth insulating layer, and the second conductive layer,
wherein the sixth insulating layer is over the semiconductor layer,
wherein the third conductive layer is over the sixth insulating layer and overlaps with the semiconductor layer with the sixth insulating layer between the third conductive layer and the semiconductor layer,
wherein the first insulating layer comprises a region having a higher hydrogen content than the second insulating layer,
wherein the fifth insulating layer comprises a region having a higher hydrogen content than the fourth insulating layer, and
wherein the third insulating layer comprises oxygen.

2. The semiconductor device according to claim 1, wherein in a transmitted electron image obtained with a scanning transmission electron microscope, the first insulating layer has higher lightness than the second insulating layer.

3. The semiconductor device according to claim 1, wherein in a transmitted electron image obtained with a scanning transmission electron microscope, the fifth insulating layer has higher lightness than the fourth insulating layer.

4. The semiconductor device according to claim 1,
wherein each of the first insulating layer and the fifth insulating layer is a layer from which hydrogen is released by heating, and
wherein the third insulating layer is a layer from which oxygen is released by heating.

5. The semiconductor device according to claim 1, wherein the third insulating layer comprises a region having a higher oxygen content than the second insulating layer.

6. The semiconductor device according to claim 1, wherein the third insulating layer is an oxide insulating layer or an oxynitride insulating layer.

7. The semiconductor device according to claim 1,
wherein each of the first insulating layer, the second insulating layer, the fourth insulating layer, and the fifth insulating layer is a silicon nitride layer or a silicon nitride oxide layer, and
wherein the third insulating layer is a silicon oxide layer or a silicon oxynitride layer.

8. The semiconductor device according to claim 1,
wherein each of the first insulating layer and the fifth insulating layer is a silicon nitride layer or a silicon nitride oxide layer,
wherein each of the second insulating layer and the fourth insulating layer is an aluminum oxide layer, and
wherein the third insulating layer is a silicon oxide layer or a silicon oxynitride layer.

9. The semiconductor device according to claim 1, wherein the semiconductor layer is in contact with a top surface and a side surface of the second conductive layer.

10. The semiconductor device according to claim 1, wherein the semiconductor layer comprises a metal oxide.

11. A semiconductor device comprising:
a semiconductor layer;
a first conductive layer;
a second conductive layer;
a third conductive layer;
a first insulating layer;
a second insulating layer;
a third insulating layer;
a fourth insulating layer;
a fifth insulating layer; and
a sixth insulating layer,
wherein the first insulating layer is in contact with a top surface of the first conductive layer,
wherein the second insulating layer is in contact with a top surface of the first insulating layer,
wherein the third insulating layer is in contact with a top surface of the second insulating layer,
wherein the fourth insulating layer is in contact with a top surface of the third insulating layer,
wherein the fifth insulating layer is in contact with a top surface of the fourth insulating layer,
wherein the second conductive layer is over the fifth insulating layer,
wherein the first insulating layer, the second insulating layer, the third insulating layer, the fourth insulating layer, the fifth insulating layer, and the second conductive layer comprise an opening reaching the first conductive layer, wherein, in the opening, the semiconductor layer is in contact with the top surface of the first conductive layer, a side surface of the first insulating layer, a side surface of the second insulating layer, a side surface of the third insulating layer, a side surface of the fourth insulating layer, and a side surface of the fifth insulating layer and is in contact with the second conductive layer, wherein the sixth insulating layer is over the semiconductor layer, wherein the third conductive layer is over the sixth insulating layer, wherein, in a position overlapping with the opening, the third conductive layer overlaps with the semiconductor layer with the sixth insulating layer between the third conductive layer and the semiconductor layer, wherein the first insulating layer comprises a region having a higher hydrogen content than the second insulating layer, wherein the fifth insulating layer comprises a region having a higher hydrogen content than the fourth insulating layer, and wherein the third insulating layer comprises oxygen.

12. The semiconductor device according to claim 11, wherein in a transmitted electron image obtained with a scanning transmission electron microscope, the first insulating layer has higher lightness than the second insulating layer.

13. The semiconductor device according to claim 11, wherein in a transmitted electron image obtained with a scanning transmission electron microscope, the fifth insulating layer has higher lightness than the fourth insulating layer.

14. The semiconductor device according to claim 11,
wherein each of the first insulating layer and the fifth insulating layer is a layer from which hydrogen is released by heating, and
wherein the third insulating layer is a layer from which oxygen is released by heating.

15. The semiconductor device according to claim 11, wherein the third insulating layer comprises a region having a higher oxygen content than the second insulating layer.

16. The semiconductor device according to claim 11, wherein the third insulating layer is an oxide insulating layer or an oxynitride insulating layer.

17. The semiconductor device according to claim 11,
wherein each of the first insulating layer, the second insulating layer, the fourth insulating layer, and the fifth insulating layer is a silicon nitride layer or a silicon nitride oxide layer, and
wherein the third insulating layer is a silicon oxide layer or a silicon oxynitride layer.

* * * * *